(12) United States Patent  
Henrichs

(10) Patent No.: US 7,738,522 B2  
(45) Date of Patent: *Jun. 15, 2010

(54) OPTICAL PHASE CONJUGATION LASER DIODE

(76) Inventor: Joseph Reid Henrichs, 641 NE. Swann Cir., Lee's Summit, MO (US) 64086

( * ) Notice: Subject to any disclaimer, the term of this patent is extended or adjusted under 35 U.S.C. 154(b) by 24 days.

This patent is subject to a terminal disclaimer.

(21) Appl. No.: 12/009,755

(22) Filed: Jan. 22, 2008

(65) Prior Publication Data

US 2008/0205461 A1   Aug. 28, 2008

Related U.S. Application Data

(63) Continuation of application No. 11/074,342, filed on Mar. 7, 2005, now Pat. No. 7,376,169.

(51) Int. Cl.  
*H01S 5/00* (2006.01)
(52) U.S. Cl. ............... 372/43.01; 372/50.11; 372/29.02
(58) Field of Classification Search .............. 372/43.01, 372/50.11  
See application file for complete search history.

(56) References Cited

U.S. PATENT DOCUMENTS

| | | |
|---|---|---|
| 4,255,717 A | 3/1981 | Scifres et al. |
| RE31,806 E | 1/1985 | Scifres et al. |
| 4,624,000 A | 11/1986 | Streifer et al. |
| 4,949,350 A | 8/1990 | Jewell et al. |
| 5,031,187 A | 7/1991 | Orenstein et al. |
| 5,457,709 A | 10/1995 | Capasso et al. |
| 5,461,637 A | 10/1995 | Mooradian et al. |
| 5,480,764 A | 1/1996 | Gal et al. |
| 5,509,025 A | 4/1996 | Capasso et al. |
| 5,627,853 A | 5/1997 | Mooradian et al. |
| 5,727,016 A | 3/1998 | Paxton |
| 5,901,168 A | 5/1999 | Baillargeon et al. |
| 5,904,994 A | 5/1999 | Dodabalapur et al. |
| 6,055,257 A | 4/2000 | Baillargeon et al. |
| 6,071,652 A | 6/2000 | Feldman et al. |
| 6,377,386 B1 | 4/2002 | Korn |
| 6,628,407 B2 | 9/2003 | Atia et al. |

(Continued)

OTHER PUBLICATIONS

Twu et al., "High Power Coupled Ridge Waveguide Semiconductor Laser Arrays", Applied Physics Letters, Oct. 1, 1984, vol. 45, No. 7, pp. 709-711.

(Continued)

*Primary Examiner*—Dung T Nguyen  
(74) *Attorney, Agent, or Firm*—K&L Gates LLP

(57) ABSTRACT

A phase-conjugating resonator that includes a semiconductor laser diode apparatus that comprises a phase-conjugating array of retro-reflecting hexagon apertured hexahedral shaped corner-cube prisms, an electrically and/or optically pumped gain-region, a distributed bragg reflecting mirror-stack, a gaussian mode providing hemispherical shaped laser-emission-output metalized mirror. Wherein, optical phase conjugation is used to neutralize the phase perturbating contribution of spontaneous-emission, acoustic phonons, quantum-noise, gain-saturation, diffraction, and other intracavity aberrations and distortions that typically destabilize any stimulated-emission made to undergo amplifying oscillation within the inventions phase-conjugating resonator. Resulting in stabilized high-power laser-emission-output into a single low-order fundamental transverse cavity mode and reversal of intra-cavity chirp that provides for high-speed internal modulation capable of transmitting data at around 20-Gigabits/ps.

33 Claims, 53 Drawing Sheets

U.S. PATENT DOCUMENTS

| | | |
|---|---|---|
| 6,704,336 B1 | 3/2004 | Henrichs |
| 6,792,026 B2 | 9/2004 | Henrichs |
| 6,813,420 B1 | 11/2004 | Korn |
| 6,819,701 B2 | 11/2004 | Henrichs |
| 6,822,992 B2 | 11/2004 | Henrichs |
| 6,879,615 B2 | 4/2005 | Henrichs |
| 6,885,688 B2 | 4/2005 | Henrichs |
| 7,376,169 B2 * | 5/2008 | Henrichs .................... 372/99 |
| 2003/0007442 A1 | 1/2003 | Henrichs |
| 2003/0160254 A1 | 8/2003 | Henrichs |
| 2003/0161245 A1 | 8/2003 | Henrichs |
| 2003/0185265 A1 | 10/2003 | Henrichs |
| 2003/0185266 A1 | 10/2003 | Henrichs |
| 2004/0066821 A1 | 4/2004 | Henrichs |

OTHER PUBLICATIONS

Mukai et al., "Fundamental Mode Oscillation of a Buried Ridge Waveguide Laser Array", Applied Physics Letters, Oct. 15, 1984, vol. 45, No. 8, pp. 834-835.

Macomber et al., "Surface-Emitting Distributed Feedback Semiconductor Laser", Applied Physics Letters, Aug. 17, 1987, vol. 51, No. 7, pp. 472-474.

Jewell et al., "Vertical Cavity Lasers for Optical Interconnects", SPIE International Conference on Advances in Interconnection and Packaging, 1990, vol. 1389, pp. 401-407.

Yoo et al., "Fabrication of a Two-Dimensional Phased Array of Vertical-Cavity Surface-Emitting Lasers", Applied Physics Letters, Mar. 26, 1990, vol. 56, No. 13, pp. 1198-1200.

Deppe et al., "Phase-Coupled Two-Dimensional $Al_xGa_{1-x}As$-GaAs Vertical-Cavity Surface-Emitting Laser Array", Applied Physics Letters, May 21, 1990, vol. 56, No. 21, pp. 2089-2091.

Orenstein et al., "Vertical-Cavity Surface-Emitting InGaAs/GaAs Lasers with Planar Lateral Definition", Applied Physics Letters, Jun. 11, 1990, vol. 56, No. 24, pp. 2384-2386.

Hadley et al., "High Single-Transverse-Mode Output From External-Cavity Surface-Emitting Laser Diodes", Applied Physics Letters, Sep. 20, 1993, vol. 63, No. 12, pp. 1607-1609.

Guel-Sandoval et al., "Novel High-Power and Coherent Semiconductor Laser with a Shaped Unstable Resonator", Applied Physics Letters, Apr. 17, 1995, vol. 66, No. 16, pp. 2048-2050.

Sirtori et al., "Continuous Wave Operation of Midinfrared (7.4-8.6 μm) Quantum Cascade Lasers Up to 110 K Temperature", Applied Physics Letters, Mar. 25, 1996, vol. 68, No. 13, pp. 1745-1747.

Faist et al., "High Power Mid-Infrared ($\lambda$~5 μm) Quantum Cascade Lasers Operating Above Room Temperature", Applied Physics Letters, Jun. 24, 1996, vol. 68, No. 26, pp. 3680-3682.

Köck et al., "Single-Mode and Single-Beam Emission from Surface Emitting Laser Diodes Based on Surface-Mode Emission", Applied Physics Letters, Dec. 9, 1996, vol. 69, No. 24, pp. 3638-3640.

Koch et al., "Single-Mode Vertical Cavity Surface Emitting Laser by Graded-Index Lens Spatial Filtering", Applied Physics Letters, May 5, 1997, vol. 70, No. 18, pp. 2359-2361.

Faist et al., "Distributed Feedback Quantum Cascade Lasers", Applied Physics Letters, May 19, 1997, vol. 70, No. 20, pp. 2670-2672.

Gmachl et al., "Continuous-Wave and High-Power Pulsed Operation of Index-Coupled Distributed Feedback Quantum Cascade Laser at $\lambda$ = 8.5 μm", Applied Physics Letters, Jul. 25, 2007, vol. 72, No. 12, pp. 1430-1432.

Van Exter et al., "Characterizing and Understanding VCSEL Polarization Noise", Proceedings of SPIE, 2000, vol. 3946, pp. 58-68.

McInerney et al., "Novel 980 nm and 490 nm Light Sources Using Vertical Cavity Lasers with Extended Coupled Cavities", Proceedings of SPIE, 2003, vol. 4942, pp. 1-12.

Shchegrov et al., "488nm Coherent Emission by Intracavity Frequency Doubling of Extended Cavity Surface-Emitting Diode Lasers," Proceedings of SPIE, 2003, vol. 4994, pp. 197-205.

Panajotov et al., "Polarization Behavior and Mode Structure of Vertical-Cavity Surface-Emitting Lasers with Elliptical Surface Relief", Proceedings of SPIE, 2003, vol. 4994, pp. 127-138.

* cited by examiner

Section A-A

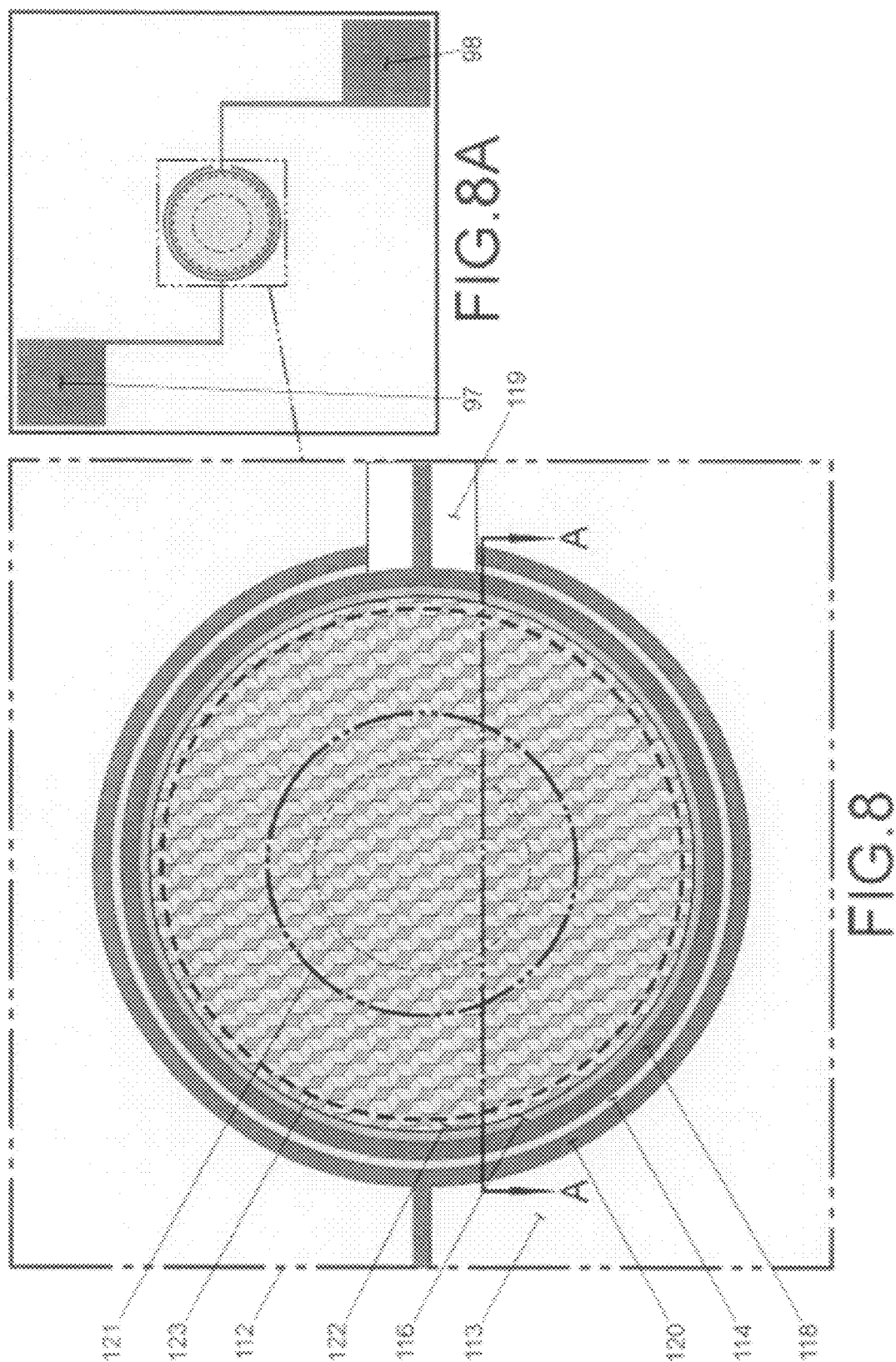

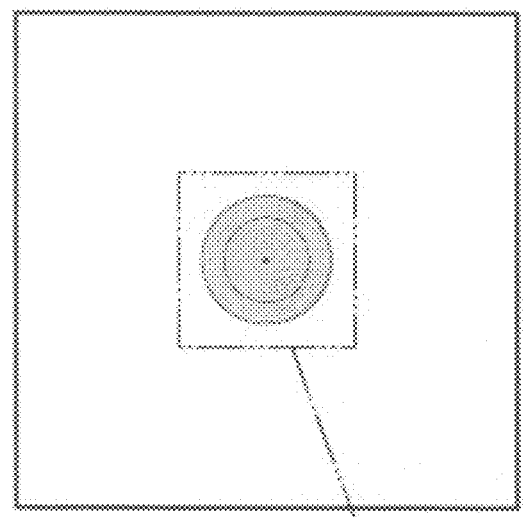
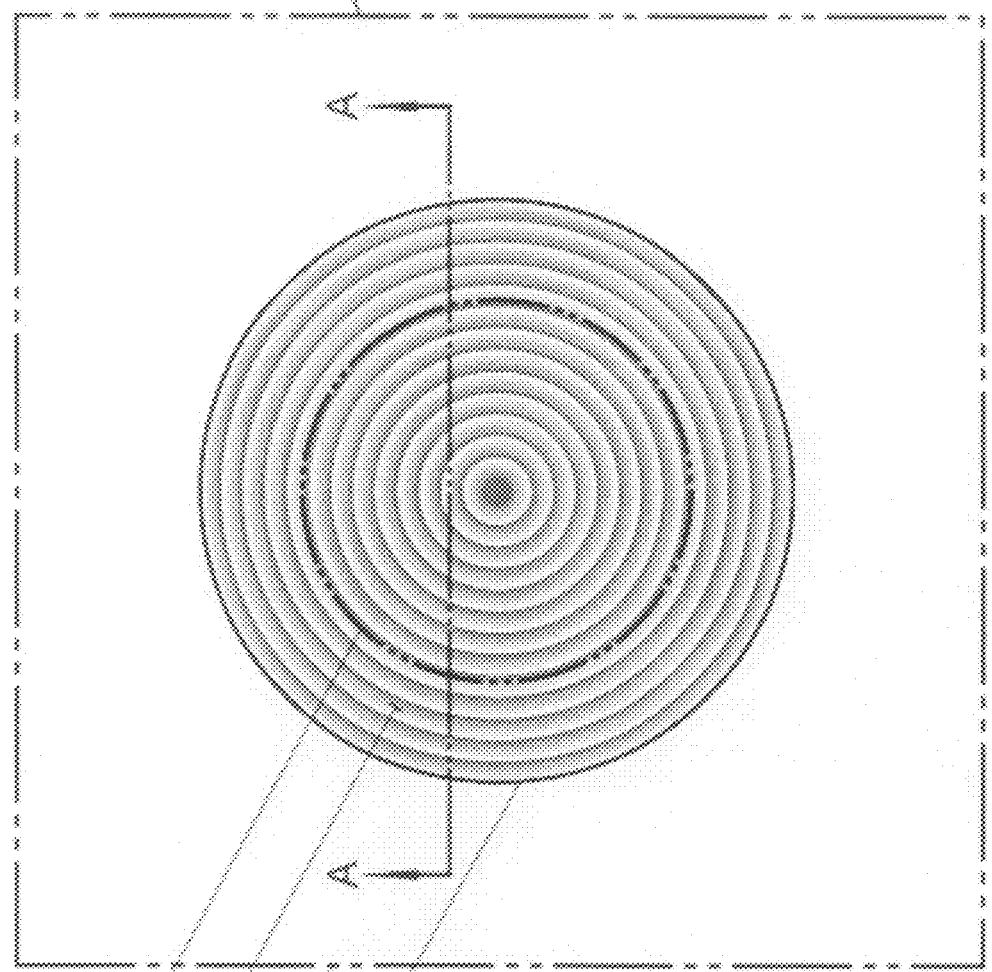

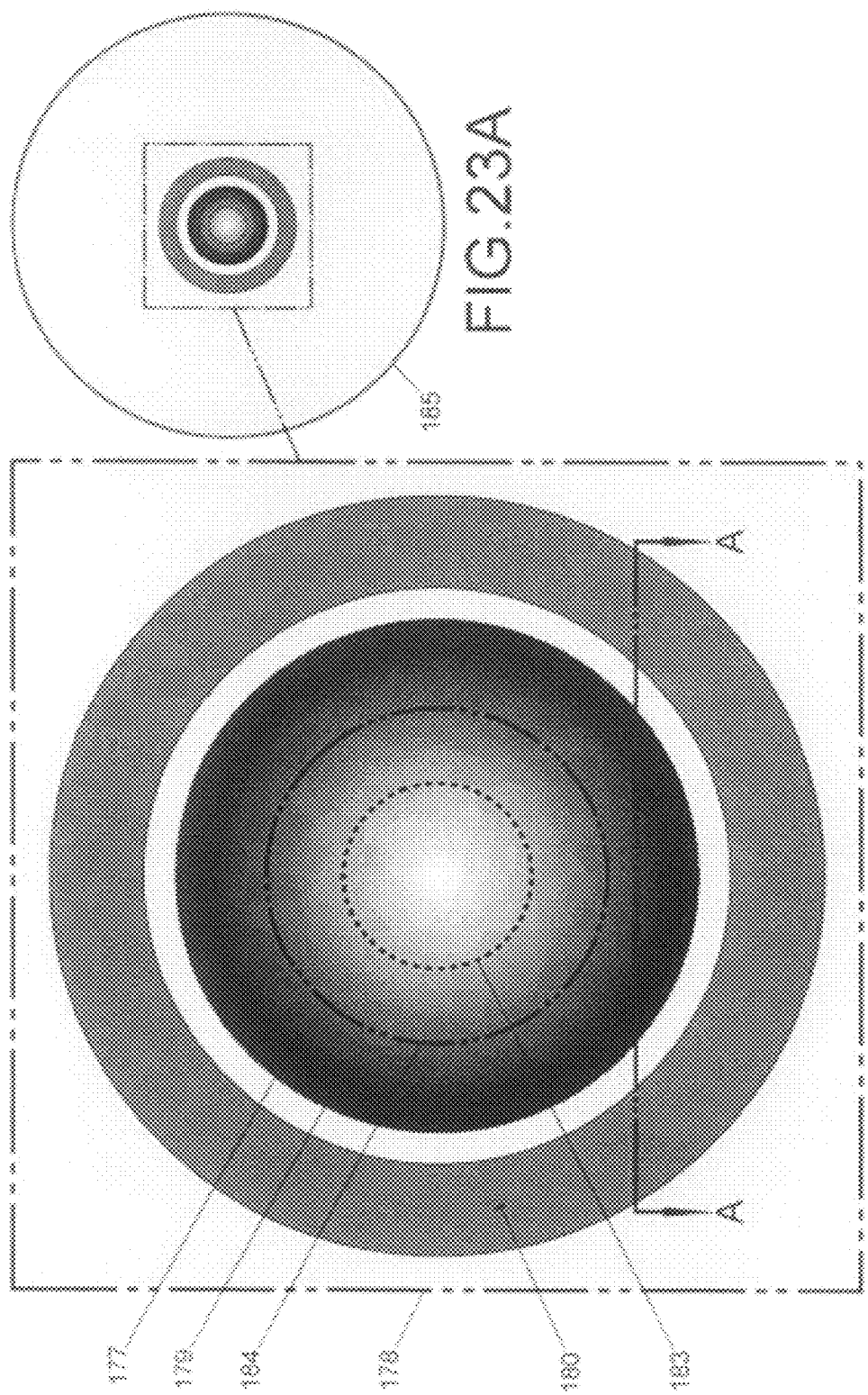

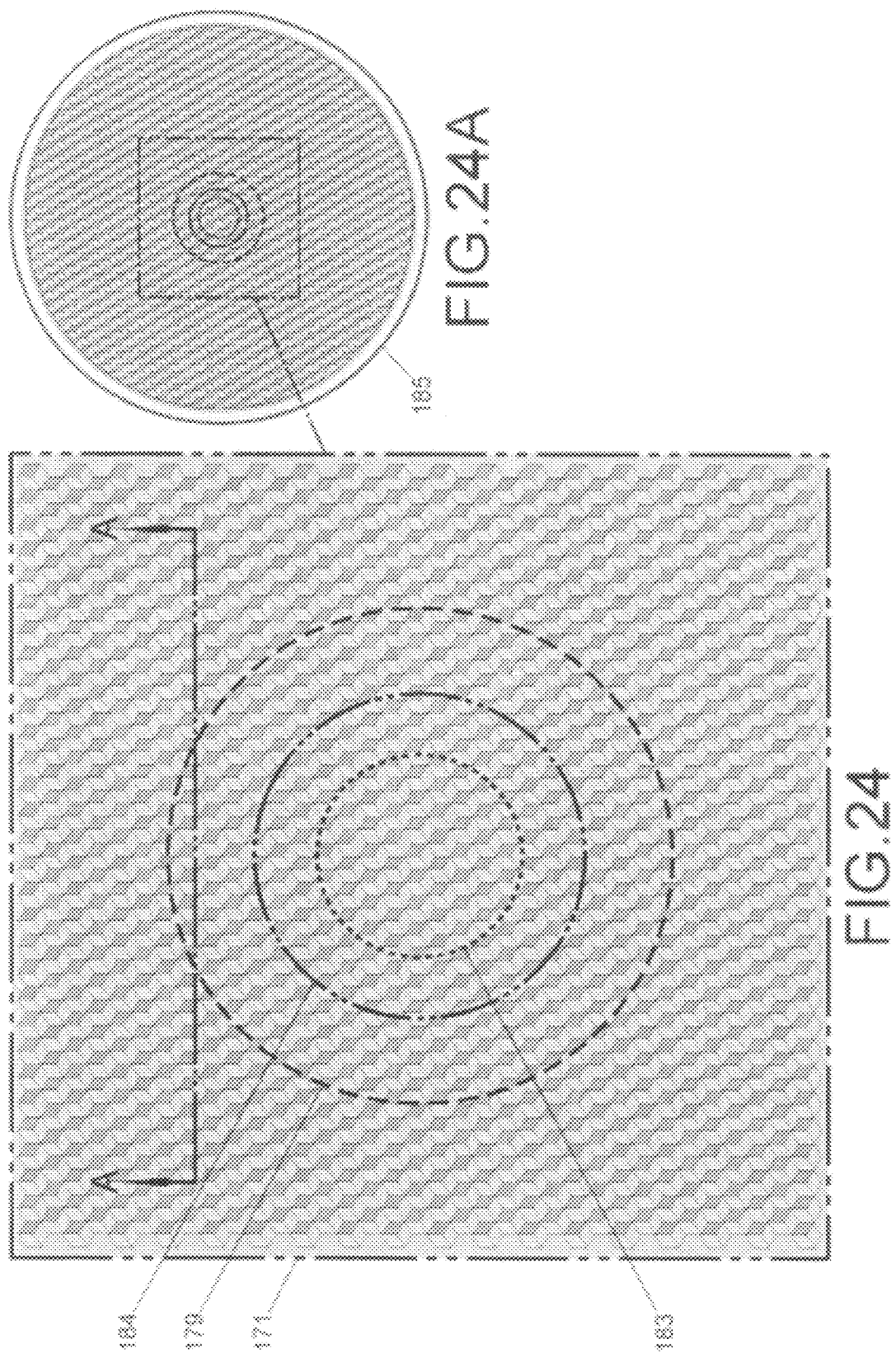

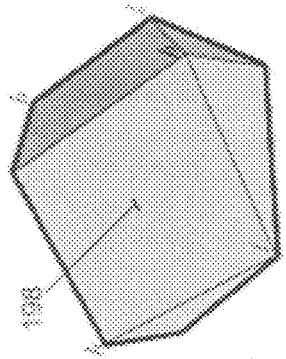
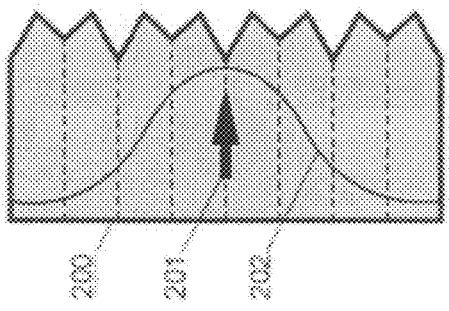
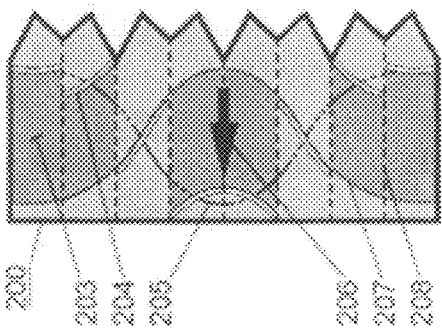
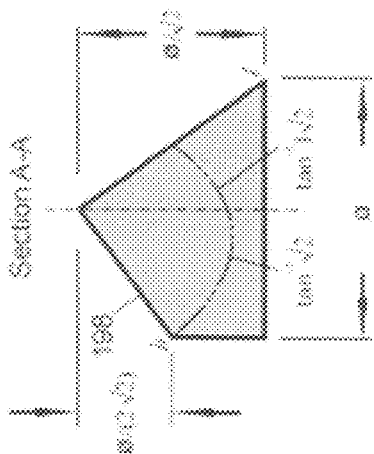
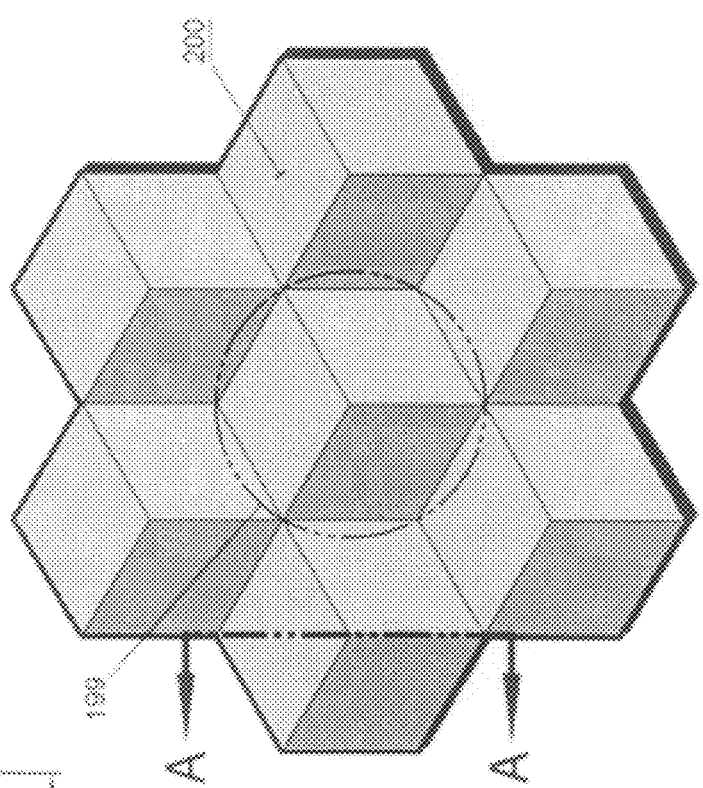
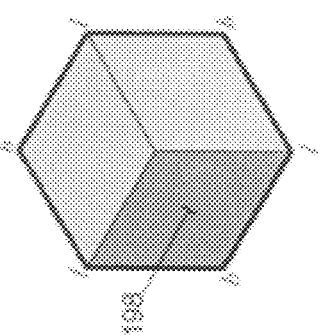

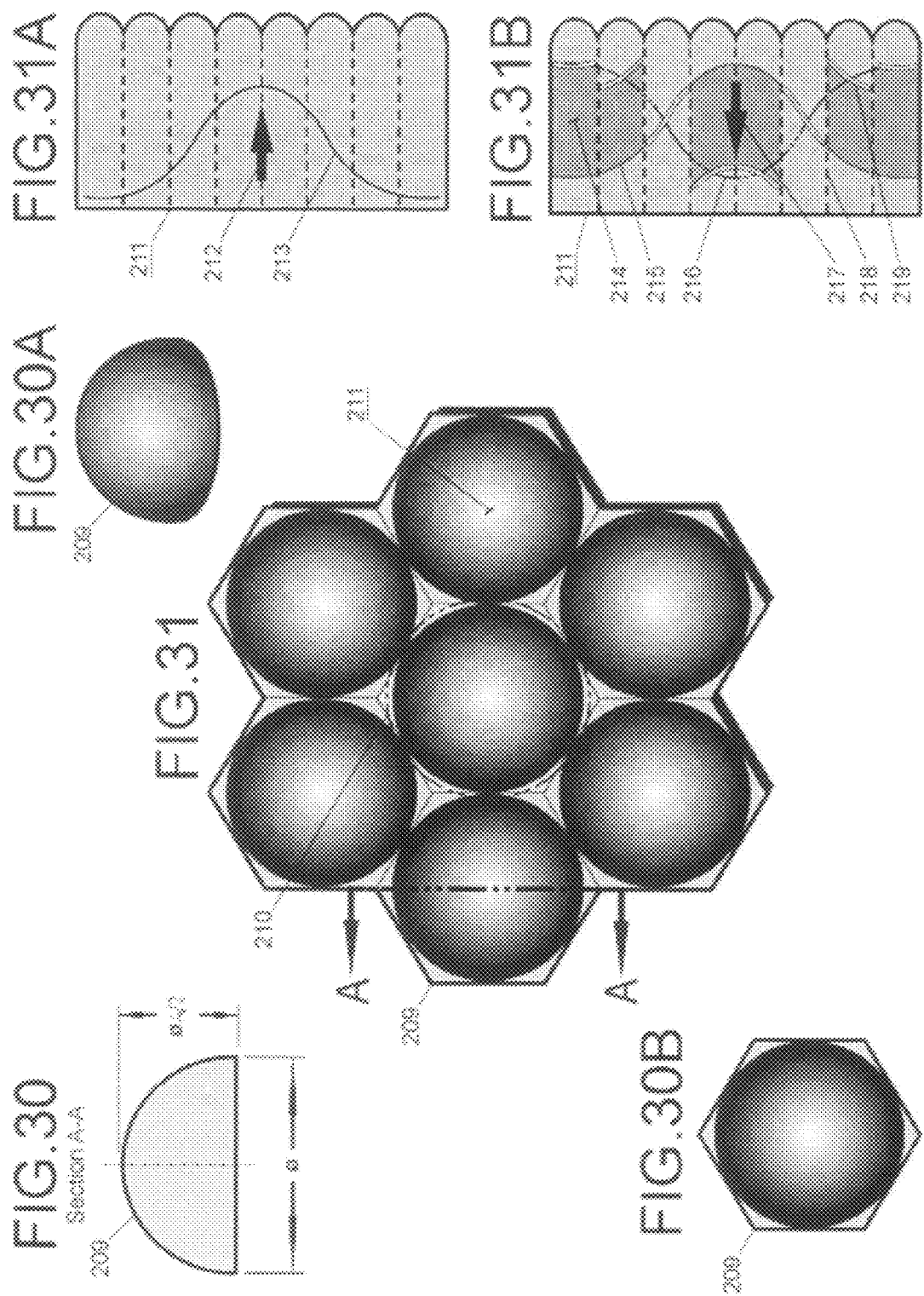

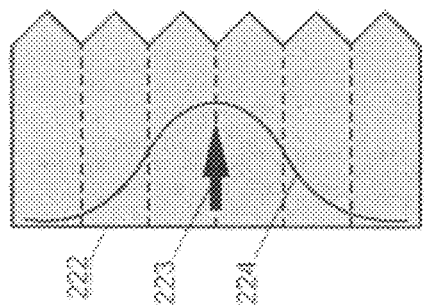
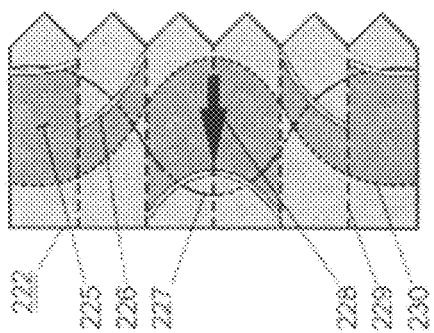
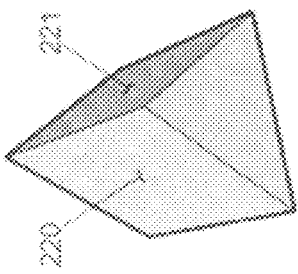
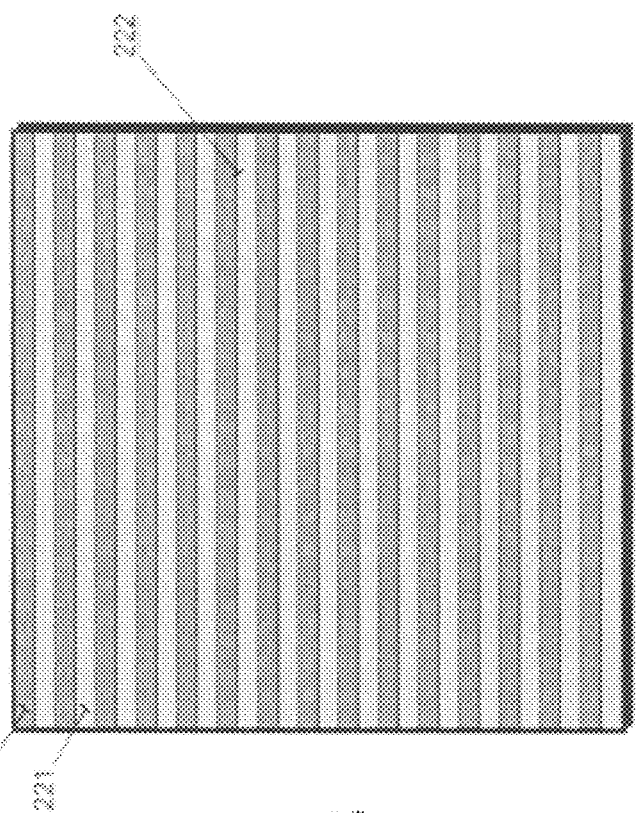
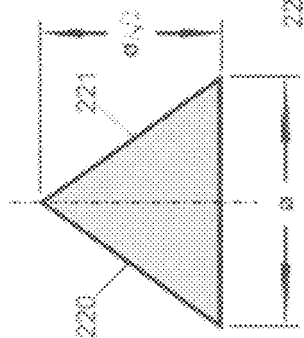
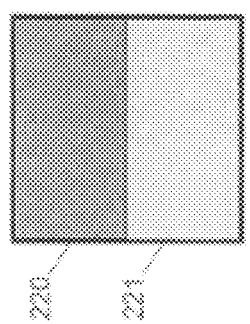

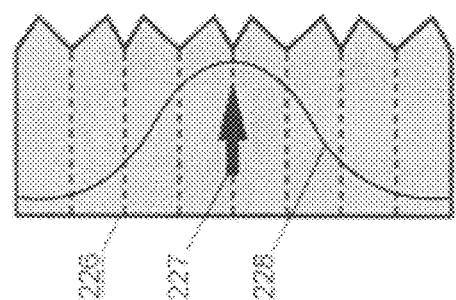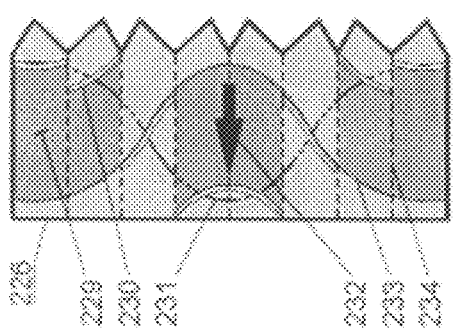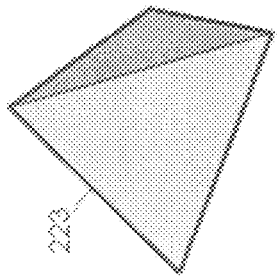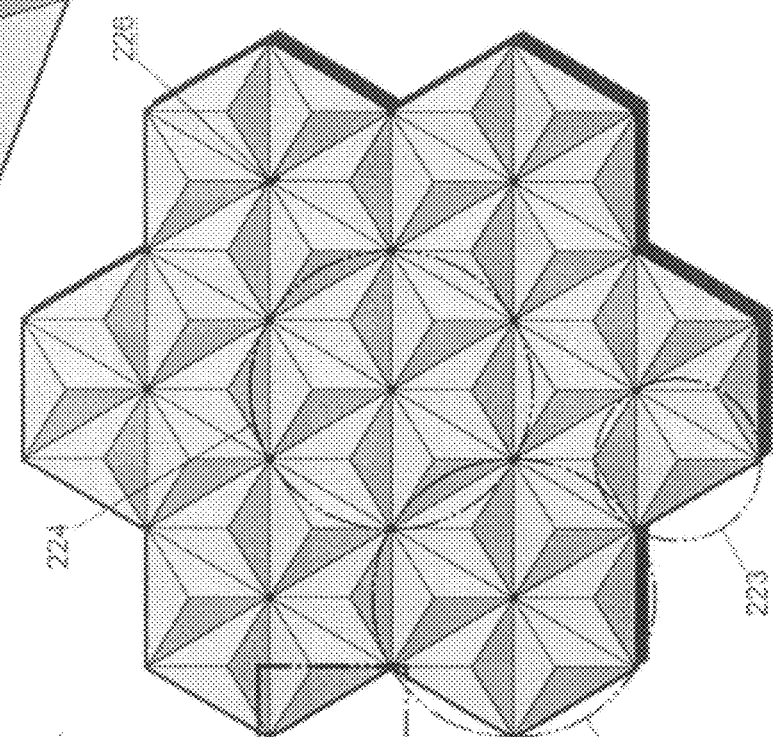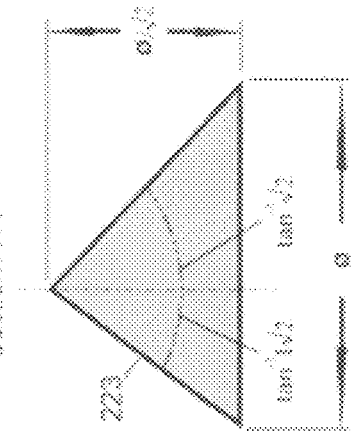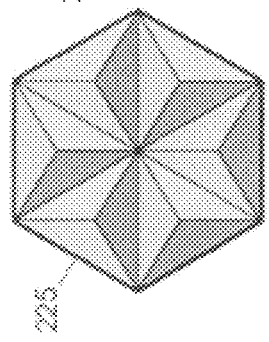

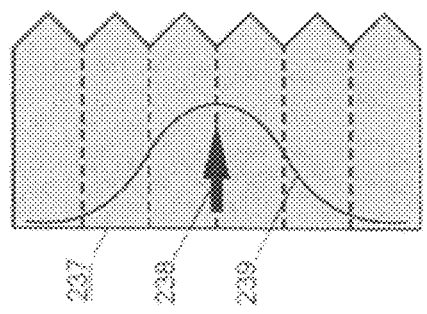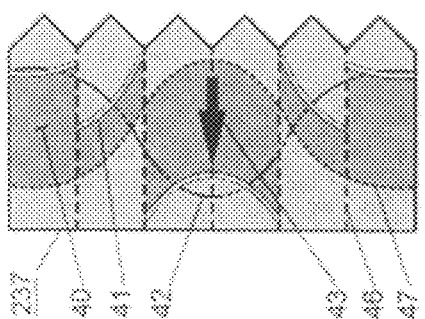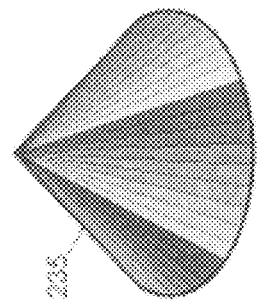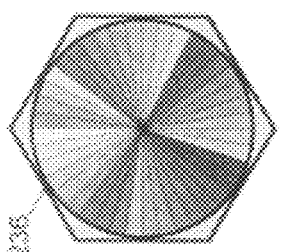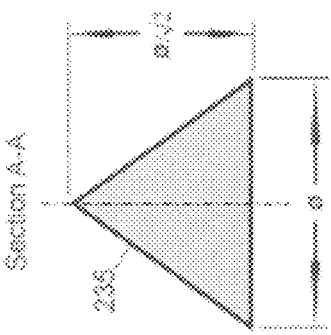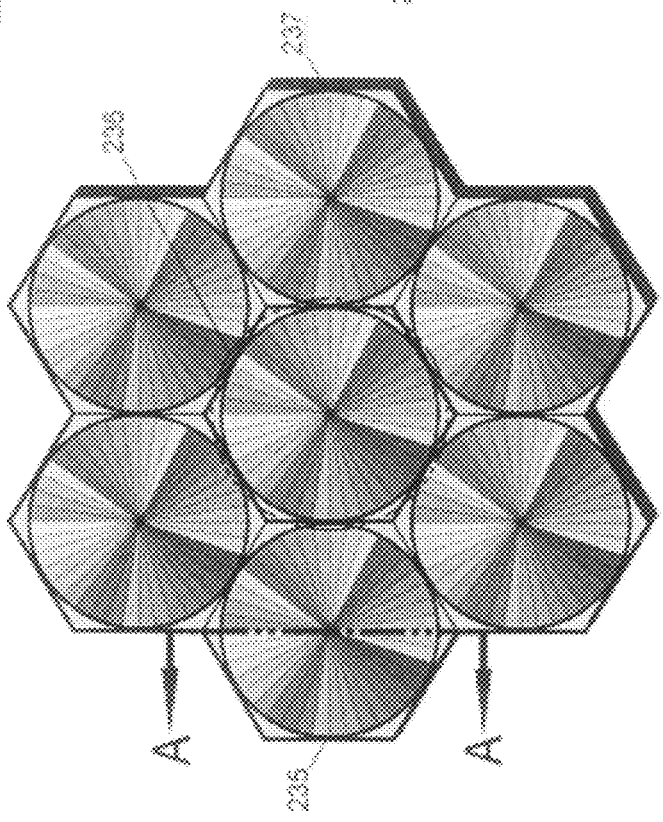

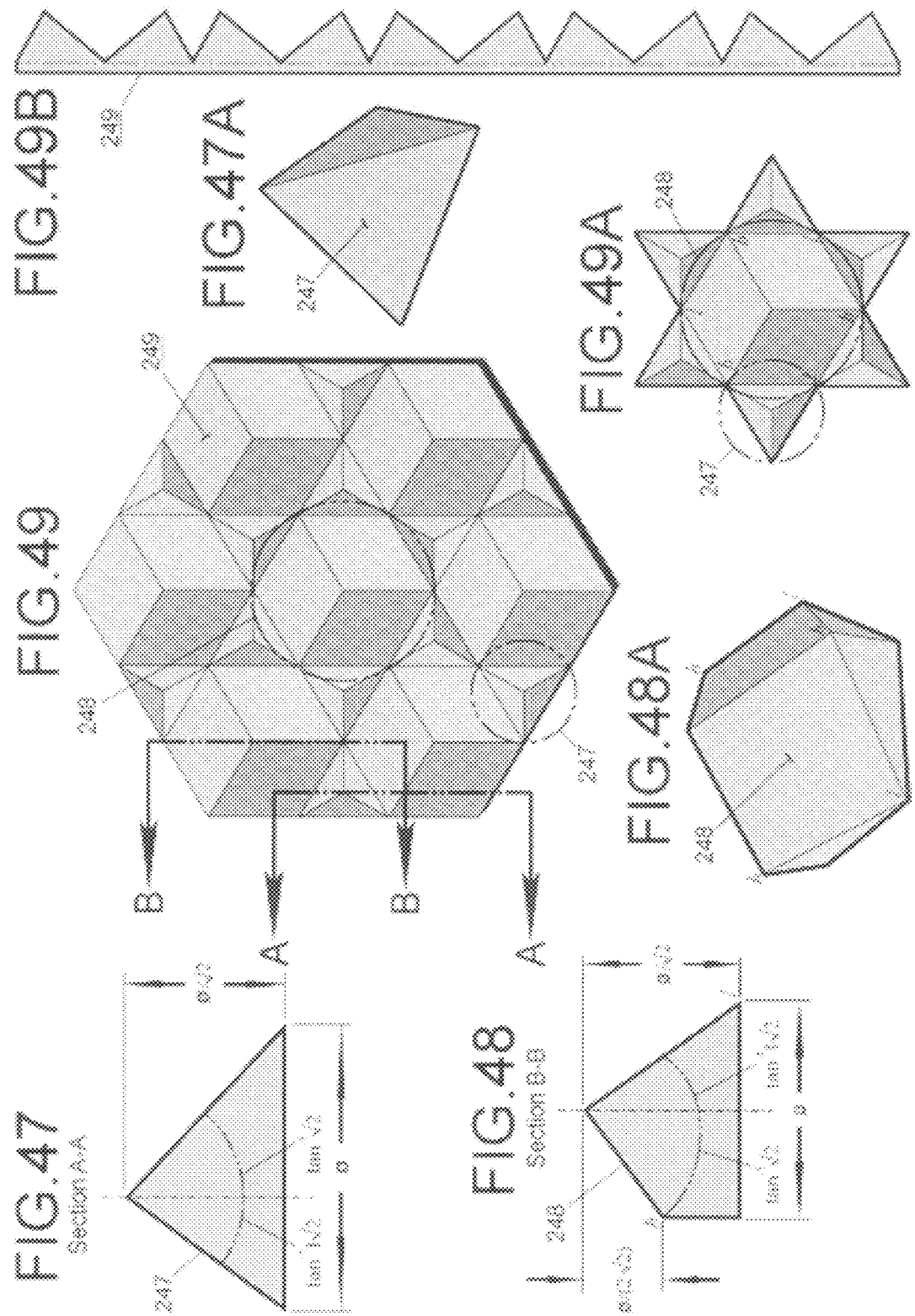

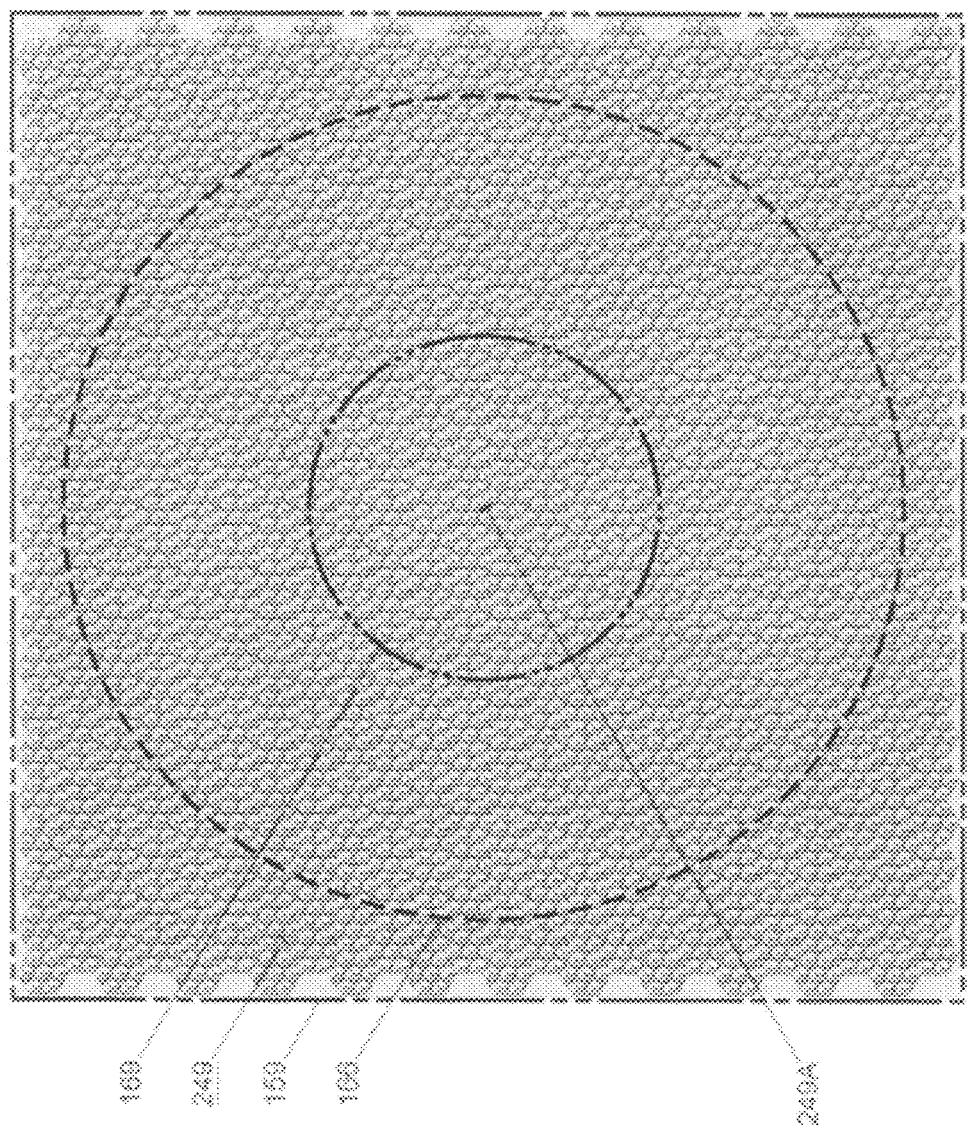

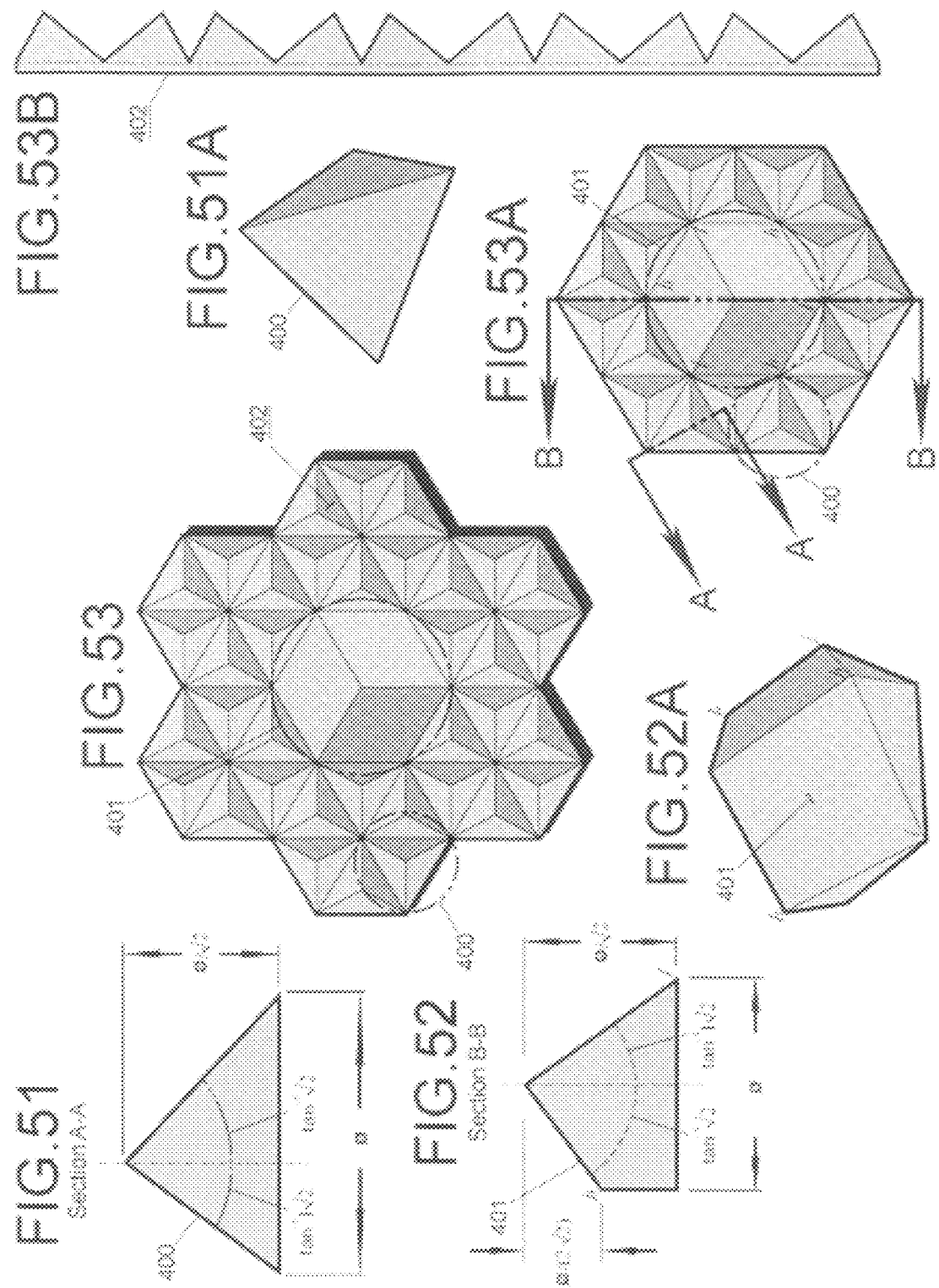

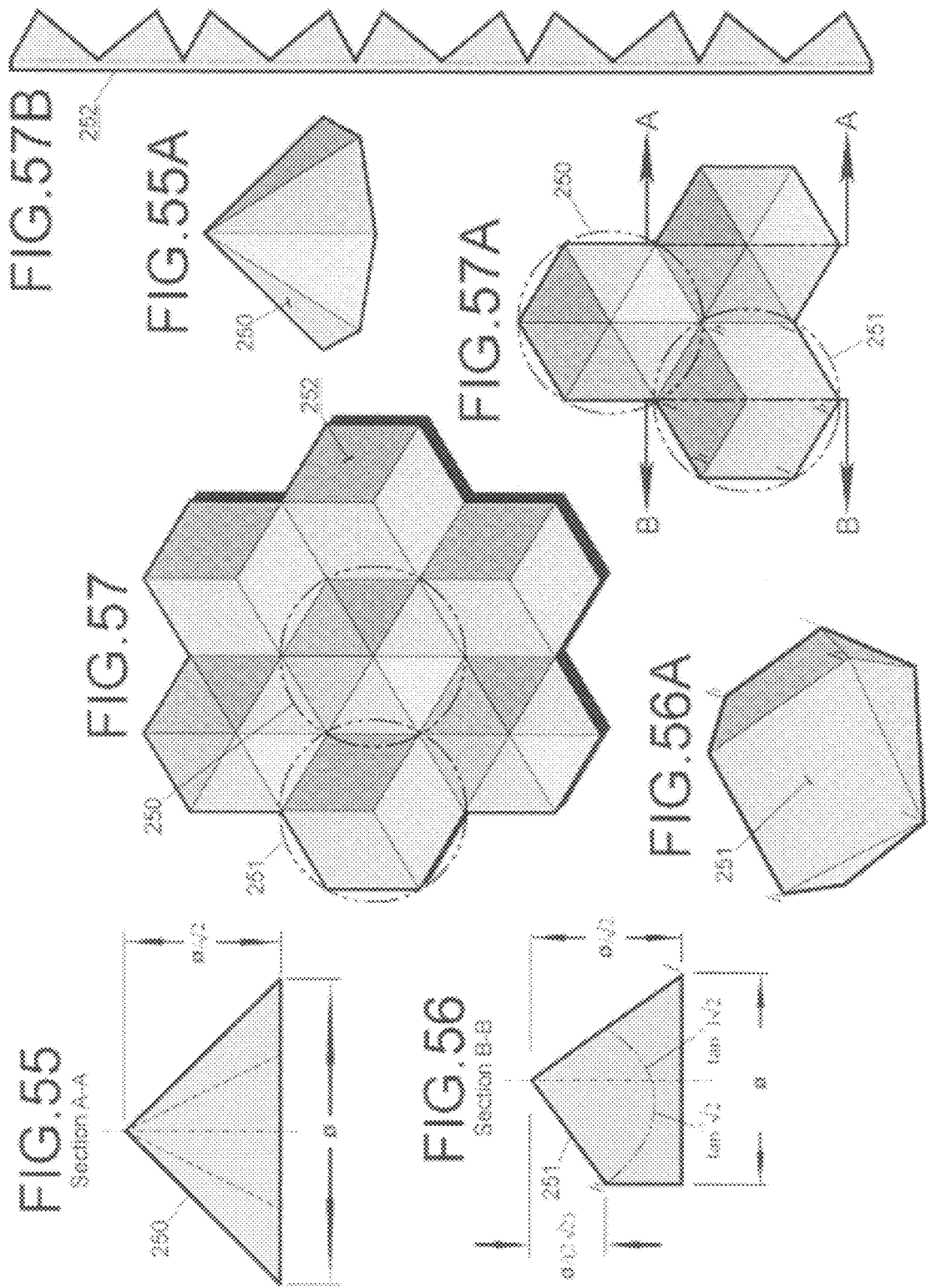

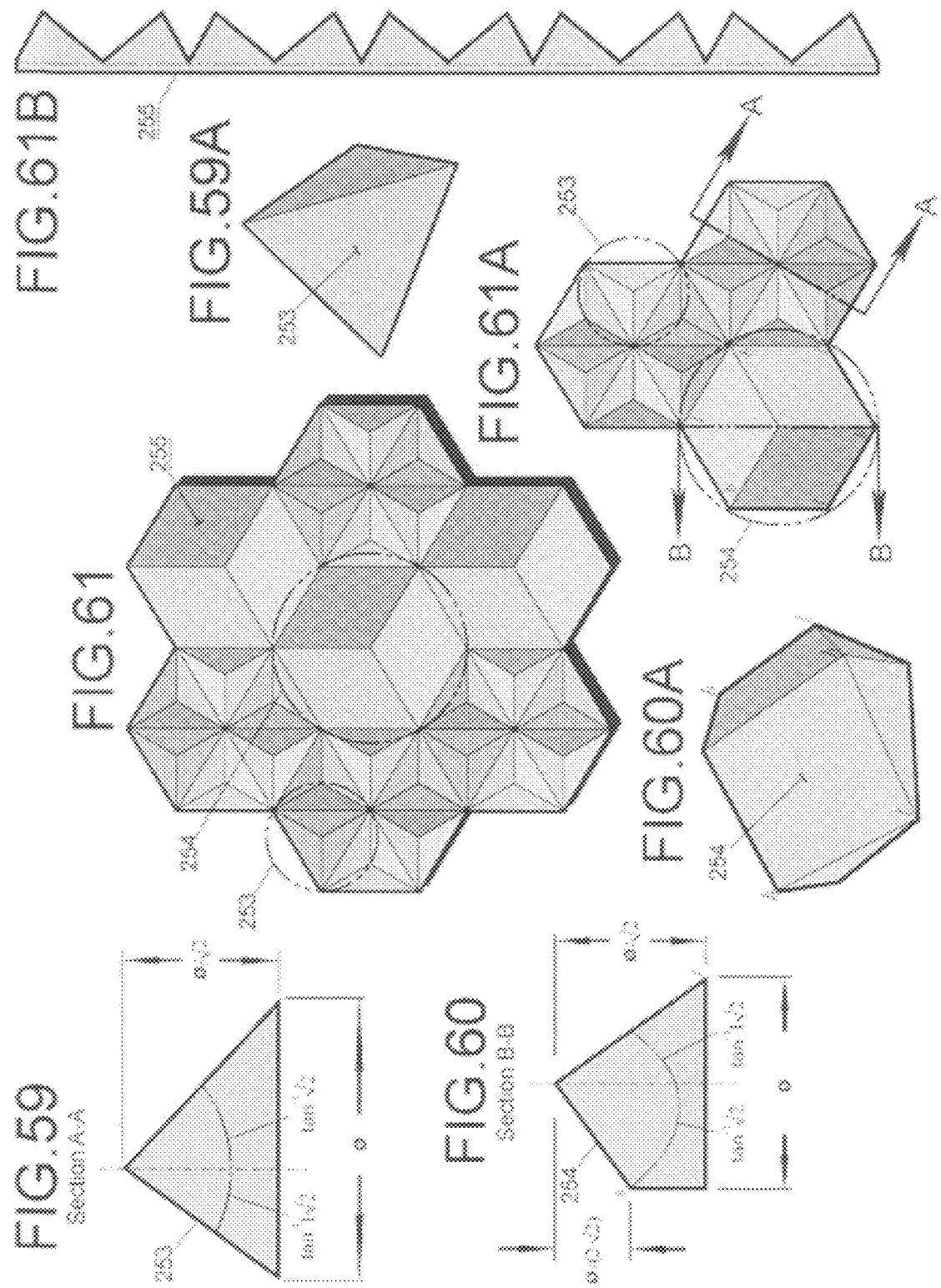

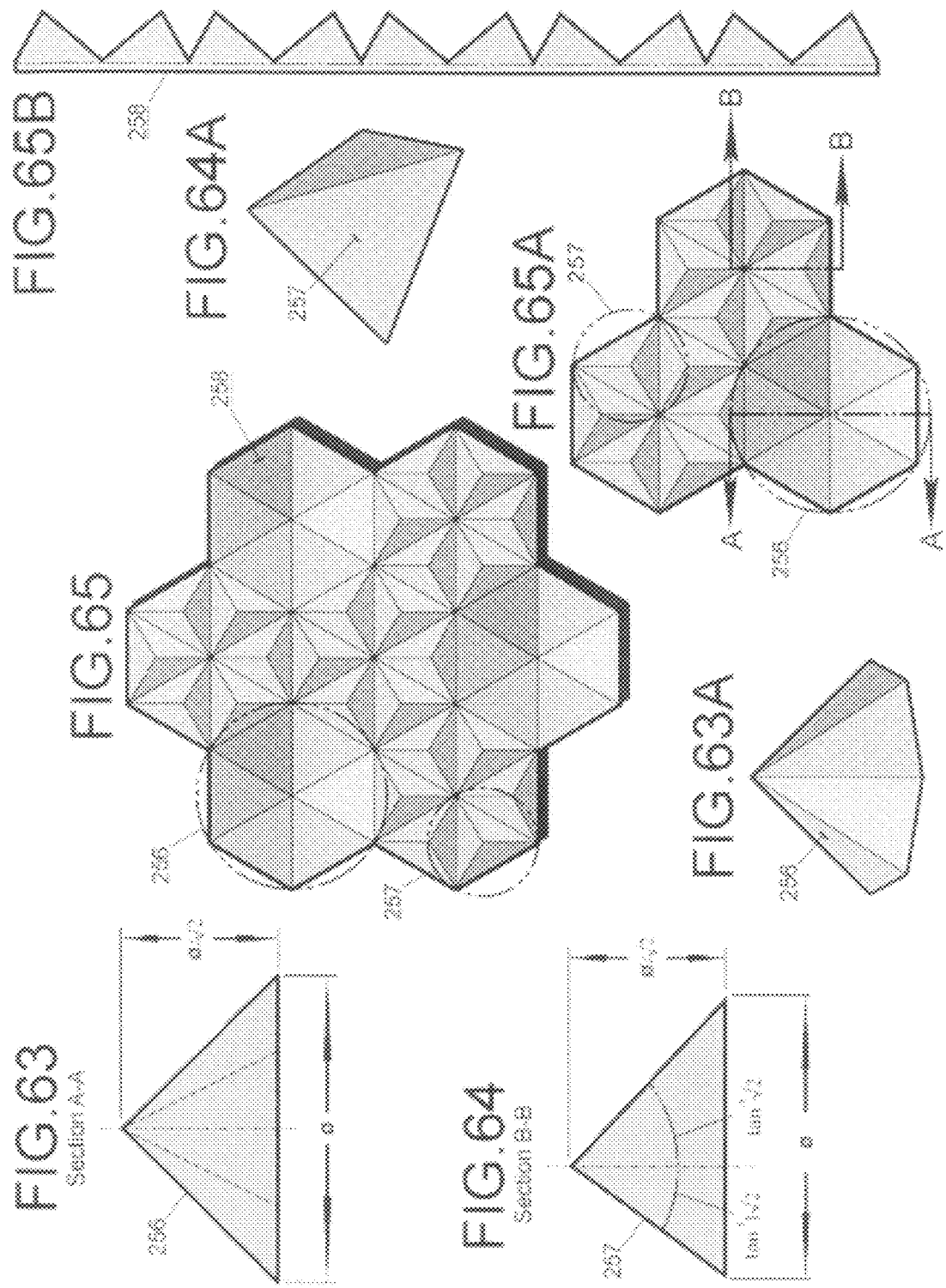

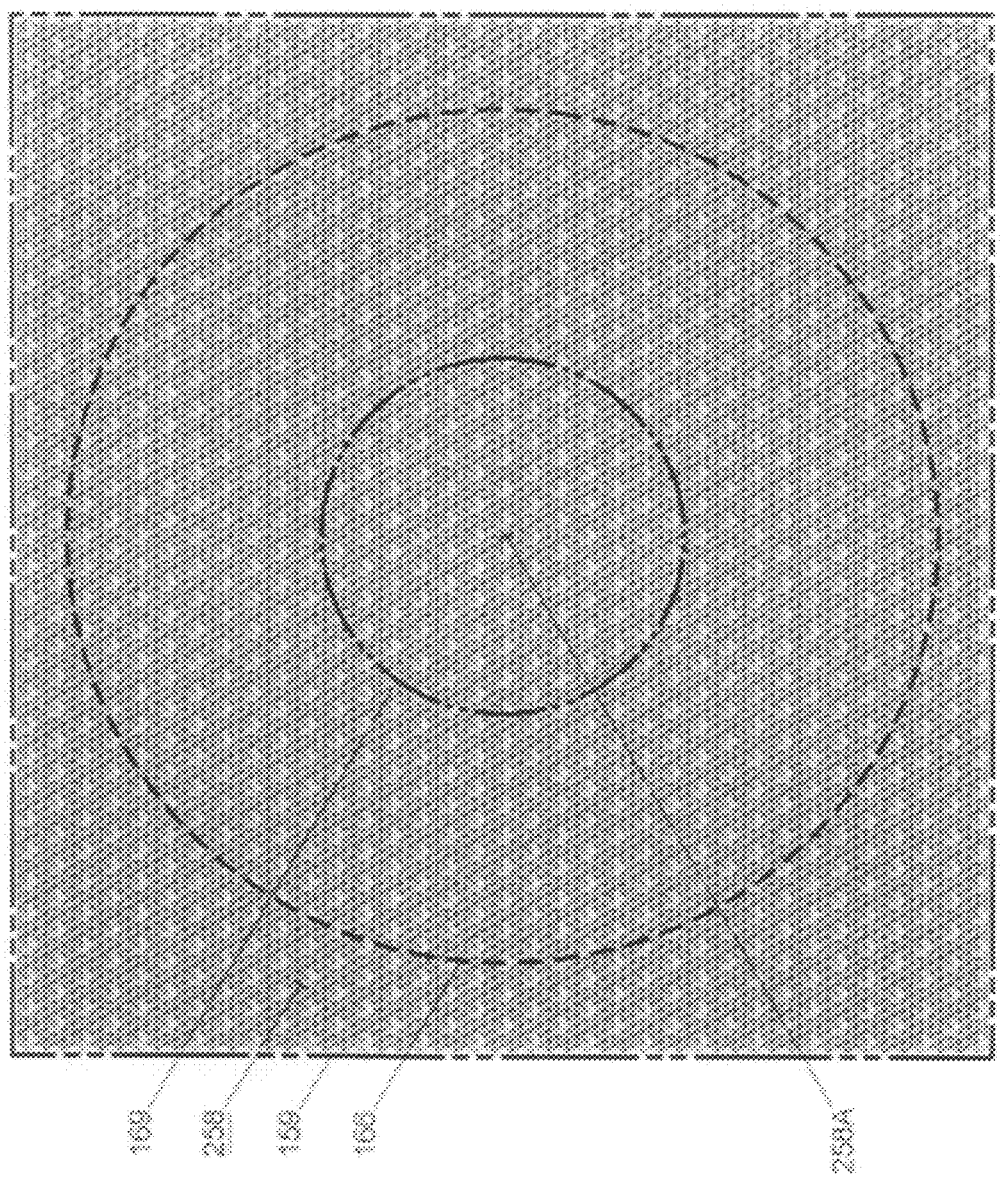

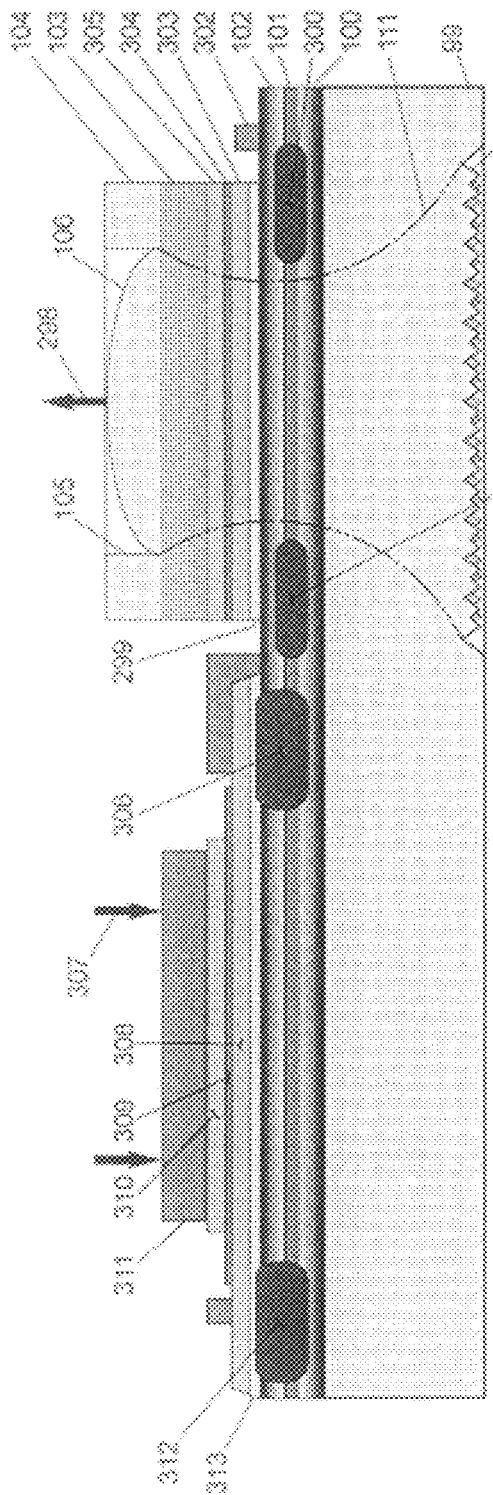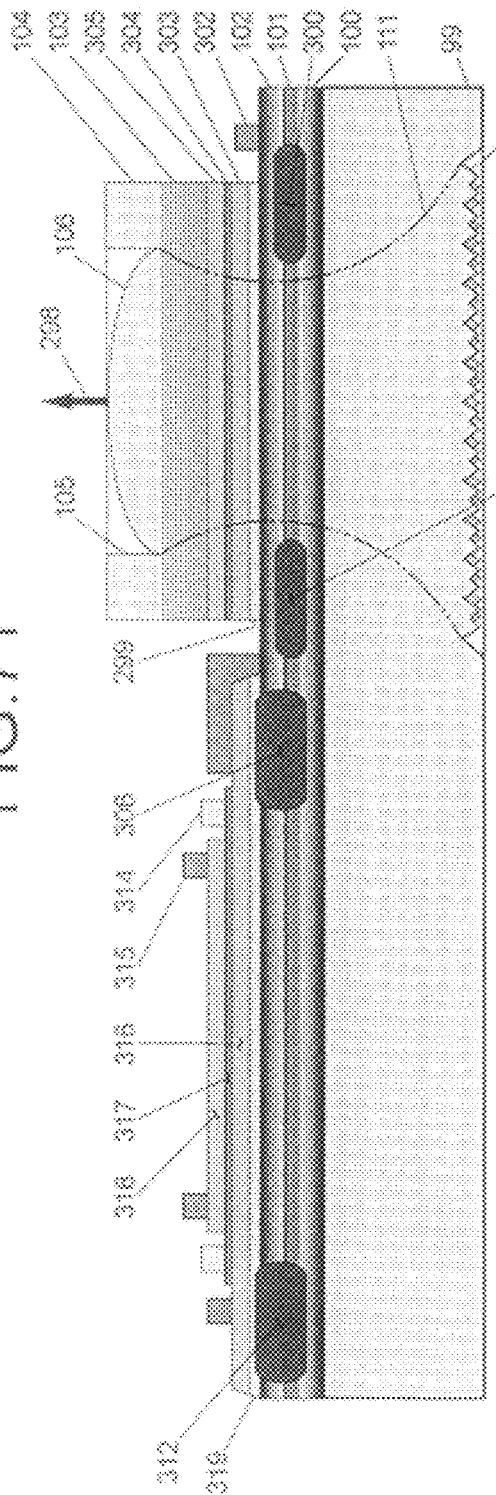

OPTICAL PHASE CONJUGATION LASER DIODE

CROSS-REFERENCE TO RELATED APPLICATIONS

The present application is a continuation of U.S. patent application Ser. No. 11/074,342, filed Mar. 7, 2005.

STATEMENT REGARDING FEDERALLY SPONSORED RESEARCH OR DEVELOPMENT

Not Applicable

INCORPORATION-BY-REFERENCE OF MATERIAL SUBMITTED ON A COMPACT DISC

Not Applicable

REFERENCE TO A MICROFICHE APPENDIX

Not Applicable

BACKGROUND OF THE INVENTION

1. Field of the Invention

This invention relates generally to semiconductor "Laser Diode" (LD) devices, and more specifically to broad-area "Edge-Emitting Laser" (EEL) diode and broad-area "Surface-Emitting Laser" (SEL) diode devices.

2. Description of Related Art

Semiconductor laser diodes, as coherent light sources, have been adopted for a large variety of different applications in a remarkably short amount of time; e.g., for use in "Gigabit Ethernet Local Area Network" (GELAN) applications. Almost all semiconductor laser diodes in common use today can be divided into two main design categories:

(i) "Edge-Emitting Laser" (EEL) diode designs, and
(ii) "Surface-Emitting Laser" (SEL) diode designs.

Regardless current market successes, semiconductor laser diodes, because they typically exhibit a high-degree of 'Inhomogeneous Broadening', have an uncertain future in several high-value market applications. This is particularly true for SEL based laser diode configurations; e.g., such as the "Vertical Cavity Surface-Emitting Laser" (VCSEL). Further, inhomogeneous broadening occurs when the environment or properties of particles in an emitting sample are non-identical. Moreover, for all semiconductor-based material, the presence of imperfections and impurities within crystalline structures alters the physical environment of the atoms that make up their crystalline structure from one lattice site to another. The random distribution of lattice point environments leads ultimately to a distribution of particles whose center frequencies are shifted in a random way throughout the crystalline lattice of semiconductor material used in the construction of laser diode devices (particularly a laser diode's gain-region), which results in an inhomogeneously broadened gain of the laser diode's gain-medium.

Additionally, when any particular semiconductor material, being crystalline in its molecular structure, has introduced to it an electromagnetic field (e.g., during electrical pumping), the crystallographic organizing molecules that comprise the semiconductor material begin to oscillate, which in turn results in the formation of acoustic packets of discrete energy (called phonons). Further, the collisions of phonons with particles that comprise a semiconductor's underlying crystalline lattice results in the perturbation for the phase of excited emissions present within same material; e.g., excited emissions such as "Spontaneous-Emission" (SE) and "Stimulated-Emission" (STE).

Consequently, when phonons collide with SE present with the semiconductor it undergoes a perturbation of its phase, which results in it becomes arbitrarily distributed relative to the laser field (stimulated emission), which in turn causes the oscillating STE undergoing amplification (via resonance) within the cavity of the laser diode, to destabilize; thereby, causing all kinds of instabilities to manifest for the laser-emission-output.

Consequently, parameters such as 'low threshold current' and 'slope efficiency' are commonly used as performance indicators in order to help laser diode designers to determine the degree of instability that is or might be present within any particular laser diode device. Further, low threshold current is a particularly important parameter to strive and watch for in semiconductor laser diodes because it reduces the total input electrical power that is not being converted into laser radiation; wherein, threshold current density depends upon the two things:

The configuration of a laser diode's resonator (i.e., via mirror and/or facet reflectivities, cavity length, confinement factor, and active-layer thickness), and The configuration of a laser diode's gain-region and construction material used (i.e., via gain coefficient, carrier-density at transparency, carrier decay-rates). In terms of the latter, a quantum-well comprised gain-medium is found to be better (i.e., more efficient) than a bulk comprised gain-medium, while a gain-medium comprising a strain-layer quantum-well is even more efficient than an unstrained one.

Moreover, the slope efficiency, which is the laser efficiency excluding the injection power needed to achieve threshold, is typically high in semiconductor laser diodes when compared to other types of lasers. For, example quantum-well laser slope efficiencies typically equal around 50%. This translates to 1-photon produced for every 2-injection electrons, after threshold is reached. This is an impressive number, which makes semiconductor laser diodes competitive in many opto-electrical applications. It is also an interesting number because it indicates an efficient extraction of electrical power that is only possible when the laser field is able to interact with essentially the entire carrier distribution. In other words, a quantum-well comprised semiconductor gain-medium saturates more or less homogeneously, even though its band structure contributes large inhomogeneous broadening.

Moreover, please note that at high injection current semiconductor laser diodes comprising quantum-well gain-mediums show noticeable gain roll-over. Heating of the laser diode appears to be the culprit behind this particular degradation because the degree of roll-over is proportional to pulse duration, i.e. a longer pulse duration equals a lower threshold for the gain roll-over. Laser performance can also degrade with increasing ambient temperature.

Moreover, regarding the increasing ambient temperature, the degradation is specifically in the increase in lasing threshold. Therefore, we can quantify the temperature sensitivity of the semiconductor laser diode by a $T_0$ parameter, which is given as $$I_{th}(T_2) = I_{th}(T_1)\exp\left[\frac{T_2 - T_1}{T_0}\right] \qquad (1)$$

wherein, $I_{th}(T_1)$ and $I_{th}(T_2)$ are the threshold currents at temperatures $T_1$ and $T_2$, respectively. At present, high $T_0$ laser diodes tend to be configured as single "Graded-Index" (GRIN) quantum-well comprising laser diode devices. Further, the previously mentioned graded-index structure helps to capture and trap injected carriers in the active-region of the laser diode, and this is especially important at high temperature levels where the injection electrons are, on the average, much more energetic than normal. Consequently, the quantum-well structure itself also helps in increasing $T_0$, because of its two dimensional band structure, which makes laser performance less sensitive to the changes in the carrier energy distributions with temperature, more than the three dimensional structure typically exhibited by bulk-area semiconductor gain media. Additionally, the value of $T_0$ will vary from around 70° Celsius for bulk-area comprised semiconductor laser diodes, and to as high as over 250° Celsius for quantum-well comprised semiconductor laser diodes.

Additionally, the implication from the high slope efficiency that semiconductor laser diodes saturate homogeneously would not be surprising except that spectral data indicate differently. The spectral data for the semiconductor laser diode teaches us that increasing amounts of current injection will result in multimode emission close to threshold. Further, multimode emission results when high rates of semiconductor spontaneous-emission leads to relatively high intensities of "Amplified Spontaneous-Emission" (ASE) modes occurring below the lasing threshold of the laser diode.

While, in contrast, the spectrum for the laser diode becomes single mode at even higher current levels because of mode competition. It is interesting to note that the laser diode's spectrum reverts back to multimode emission output at even higher current levels. This multi-longitudinal mode behavior is called spectral mode hopping by those well versed in the art, and is only possible for an inhomogeneously broadened gain-medium.

Moreover, this type of behavior does not occur for VCSEL diodes. VCSEL diodes, regardless of the fact that they are "High-Q Cavity" (HQC) lasers (i.e., having a short cavity length dimension that typically equals one emission wavelength), just like all other semiconductor based laser diodes they too comprise of an inhomogeneously broadened gain-medium, but since they exhibit single longitudinal laser-emission-output the instability exhibits itself as a different kind of behavior. Moreover, for the VCSEL diode, an inhomogeneously broadened gain results instead, in an unstable state of polarity for it's laser-emission-output.

Furthermore, the polarity switching behavior occurs at different input current levels; whereby, the exhibited state of laser emission polarity undergoes a flip/flop switch like change from one particular state of linear polarity to an opposed one. This makes it practically impossible for the VCSEL diode to be used in polarity sensitive applications like magneto-optic high-density data storage.

Since most types of lasers may be unambiguously classified as being either homogeneously or inhomogeneously broadened, the dual character exhibited by the semiconductor laser diode makes its particular physics interesting and somewhat complicated. Further, in order to know the ultimate linewidth of any semiconductor laser diode we most account for fluctuations made to occur in the laser field by the presence of spontaneous-emission within the laser's resonating cavity.

The addition of a spontaneously emitted photon, which has an arbitrary phase relative to that of the laser-field, results in a random walk-off for the tip of the laser-field vector. The field amplitude remains at essentially the square of the photon number, while the phase fluctuates freely, eventually assuming all values between 0 and $2\pi$. The diffusion of phase leads to a vanishing laser field-vector sum, and the rate of decay of the ensemble average of the field-vector is a measure of the spontaneous-emission linewidth of the laser diode. According to this picture, the laser linewidth is given by the Schawlow-Townes formula, which is given as $$\Delta \upsilon_{S-T} = \frac{A}{n_{SS}} \qquad (2)$$

where A is the spontaneous-emission coefficient into the lasing mode and $n_{SS}$ is the steady-state photon number of the lasing mode.

In Addition, the linewidth of the semiconductor laser diode has a contribution that comes from fluctuations in the refractive index caused by fluctuations in the carrier-density. Further, because of gain-clamping, intensity fluctuations have negligible direct effect on the line-width; however, they do cause fluctuations in the carrier-density. Since the refractive index change due to carrier-density at the gain-peak is large in a semiconductor gain-medium, the density fluctuations cause substantial index fluctuations, which, in turn, lead to fluctuations in phase. Moreover, resulting in the following increase in the fundamental laser linewidth, which is given as $$\Delta v = (1+\alpha^2)\Delta v_{S-T} \qquad (3)$$

where $\alpha$ is the linewidth-enhancement factor, which is a measure of the change in the medium refractive for a corresponding change in the laser diode's gain. Hence, intensity fluctuations contribute indirectly to the linewidth, even though their direct contribution is negligible. Further, in two-level media, the indirect contribution is also negligible, since the change in the index of refraction goes through zero at the gain-maximum. Zero thus multiplies the change in saturation caused by intensity fluctuations, unless the laser diode is forced to operate away from the gain-maximum.

For EEL diodes, the laser field is index guided by the diode's heterostructure in the transverse ($\hat{x}$) direction. Wherein, the optical guide is usually made sufficiently narrow to support only one transverse mode. Since the required guide thickness is approximately 1-$\mu$m, the transverse beam divergence may be as large as 30°. However, one should remember that if the laser field is diffraction limited in this direction, in principle it may be collimated, expanded, focused, etc. to any desired shape with conventional optics. Of course, doing so may be impractical because the needed optical elements are likely to be considerably larger than the laser diode.

In the lateral ($\hat{y}$) direction, the optical-field confinement is often weaker, leading to substantial astigmatism in the laser-emission-output. Single-mode operation is still possible with a narrow gain or index stripe width. However, for high-power operation, the lateral dimension has to be wide in order to prevent material damage due to high optical intensities. The lateral mode profile then depends more on the gain medium than is the case with the transverse mode profile, and that a wide stripe laser diode usually operates multimode. Further, the onset of multimode operation is hastened by self-focusing, which is caused by the saturation of the carrier-induced refractive index change.

Moreover, in order to promote a better understanding of the self-focusing effect, we should first look at the reverse, which is where a low laser intensity profile results instead, in a lack of gain-saturation, which provides for a carrier distribution that is made to follow the injection current distribution. To put it more succinctly, when the carrier-induced refractive index is made to decrease with increasing carrier density, then the resulting refractive index distribution tends to defocus the laser field, i.e. commonly referred to as the anti-guiding effect.

Contrariwise, owing to the more typical occurrence of gain-saturation, a spatial hole is burned into the center of the distribution by the laser field. This, as a direct consequence of gain-saturation, leads to the formation of concentric variations in the refractive index distribution, which, in turn, results in the self-focusing of the laser field. Consequently, the resultant focused laser field burns a deeper hole in the carrier distribution, which, in turn, further leads to even more focusing, i.e. this is commonly referred to as the self-focusing effect. Eventually the self-focusing is balanced by diffraction and gain to provide for a final intensity profile that comprises of several narrow 'bumps' (i.e., commonly referred to as filaments).

Typically, filamentation makes a noise contribution that keeps laser diodes suffering from it from being utilized in current application. However, for a laser diode that has a large area gain-volume, the self-focusing effect causing filamentation, being comprised as having a very high-intensity optical field, would most likely introduce what is commonly called "Catastrophic Optical Damage" (COD) to the laser diode's molecular structure, causing it to fail entirely. Filamentation is just one instability made to occur when spontaneous-emission makes its phase perturbating contribution to resonant laser fields.

Prior art teaches hundreds of semiconductor laser diode resonators that fail to completely neutralize any one particular instability, the reason simply being, because these resonators still harbored within themselves the destabilizing phase perturbating effects contributed by spontaneous-emission. These resonator designs, some of which are described below in much detail, failed because they were designed to treat one, maybe two, particular instabilities rather than the cause of the destabilization.

In a contrariwise fashion, my "Optical Phase Conjugation Laser Diode" (OPCLD) invention, by utilizing 'optical phase conjugation' neutralizes the instability seeded phase perturbations that both spontaneous-emission and acoustic-phonons contribute to stimulated-emission undergoing resonant amplification. Therefore, my OPCLD invention, in stark contrast to prior art, eliminates the cause of destabilization in order to successfully effect a homogenous broadening of the gain for the semiconductor laser diode.

In the following paragraphs there is contained much relevant prior art that teaches several examples of resonator designs that effect some degree of resonance stabilization for current laser diodes. However, because these approaches fail to neutralize the arbitrary phase instability contributed to resonance by the acoustic phonons and the spontaneous-emission that occur within all semiconductor laser diodes, they fail to stabilize the amplified resonance of intracavity stimulated-emission, which is seriously degrading the performance of current laser diodes.

Take for example, the resonator of a typical VCSEL, where its gain-region is reconfigured to be physically longer along its lateral direction, while being made physically shorter along its transverse direction (e.g., forming either a rectangular or elliptical shaped gain-region), which theoretically provides more gain to one opposed polarity orientation over another. For more details, please see—Krassimir Panajotov et al., "Polarization behavior and mode structure of Vertical-Cavity Surface-Emitting Lasers with elliptical surface relief," published in Vertical Cavity Surface-Emitting Lasers VII, Proceedings of SPIE, Vol. 4994, pp. 127-138, (2003).

Unfortunately, even after being redesigned to provide for a laser-emission-output that exhibits a stable polarity, the VCSEL still suffers from the same polarity switching instability problem it did before being redesigned. The real cause behind the VCSEL's failure to stabilize the polarity of its stimulated-emission output lies not within what is probably misconstrued as being an unfortunately redesigned laser diode resonator, but rather, lies within the arbitrary phase contribution of intracavity spontaneous-emission. For more details regarding the polarity-switching problem sometimes experienced by VCSELs. For more details, please see—R. P. van Extor, "Characterizing and understanding VCSEL polarization noise," Proceedings of SPEE, Vol. 3946, pp 58-68, 26-28 Jan., (2000).

Furthermore, now that we have established and identified the root cause of instabilities responsible for lowing the performance of semiconductor laser diodes, lets focus more specifically upon the relevant Prior art. Prior art is filled with examples of Edge-Emitting based Laser diode designs, which are described as having a semiconductor-comprised gain-medium, for example a quantum-well semiconductor gain structure that is formed epitaxially upon an upturned surface of a semiconductor substrate wafer. Whereby, two cavity forming mirrors are created, not epitaxially grown (i.e., internal light reflecting cleaved facets form along crystalligerous striations as the result of an entire wafer being diced into individual EEL devices), when individual EELs are diced for electronic component packaging.

Generally, the two total internal reflection edge facets are positioned on opposite sides of a semiconductor comprised gain-region along angles that are perpendicular to the substrate wafer's outermost surfaces, which altogether forms a resonant cavity. Electrical and/or optical pumping of the gain-medium will generate amplified photonic radiation, which is made to propagate (i.e., intracavity photonic radiation undergoes oscillation made to build into resonantly amplified laser-emission-output) in a direction that runs parallel along the plane of the substrate wafer.

Moreover, edge-emitting laser diodes are among the most common semiconductor laser diode devices currently produced. Available commercially as individual laser diodes, laser diodes combined into a transceiver package (i.e., having a combined photo-detector and internally modulated laser diode transmitter based semiconductor comprised integrated circuit structure), and as linear-bar laser diode arrays. The linear-bar laser diode arrays are used, for example, as an optical pump source for pumping solid-state lasers in order to provide for high-power laser-emission-output levels (e.g., 1 to 100 Watts) greater than a few hundred milliwatts. Many adaptations of the edge-emitting laser will typically operate in high-order spatial modes and at multiple frequencies. This prevents their use in applications, which require high-power laser-emission output into a single transverse spatial cavity mode at a single frequency.

Furthermore, EELs exhibit a significant degree of astigmatism, and a beam aspect ratio that is generally large making it difficult to focus the beam to a small spot size preventing EELs from being used in those applications that require a focused beam output. Further, poor beam quality in EELs also makes frequency doubling of the laser-emission-output, using nonlinear optical materials, difficult and inefficient. Further, EELs, because of their much longer cavity lengths and significantly larger gain-volumes, can only be internally modulated at around 2.3-Gbits/ps before they begin to suffer significantly from dispersive pulse broadening effects, which has prevented them from being used in applications requiring a high-degree of internal modulation for the laser-emission-output transmission of data signals.

VCSELs on the other hand, due to their reduced threshold current, circular output beam, inexpensive high-volume manufacture, and high-rates of internal modulation (typically>5-Gbits per second), VCSELs are today, particularly suitable for the multimode optical fiber that typically comprises today's "Local Area Networks" (LANs). Widely adapted for LANs are the selectively oxidized VCSEL diodes, which use an oxide aperture located within its vertical cavity to produce strong electrical and optical confinement, enabling high electrical-to-optical conversion efficiency, however, a design strategy that only provides minimal modal discrimination—allowing emission into multiple transverse spatial modes.

Because, multimode configured fiber spans, such as the kind utilized in many of today's enterprise-wide LAN and Data-Center topologies, are configured to never exceed a few hundred meters in length, the multi-mode signals they carry do not undergo signal attenuation or data loss. Therefore, the typical multi-mode VCSEL diode has made an ideal coherent light source for these multi mode LAN topologies; moreover, resulting in the VCSEL capturing more than 70% total market share for semiconductor laser diodes used in Datacom applications. However, VCSELs that emit into a single transverse spatial mode are increasingly being sought-out for emerging high-value applications, including:

Data communication using single-mode optical fiber;
Barcode scanning;
Laser printing;
Optical read/write data-heads;
Long-Haul Telecommunications and Datacom transmission;
Modulation Spectroscopy; and
"Fiber to the Home" (FTTH) compliant transmitters.

However, because selectively oxidized based VCSEL diode designs exhibit a high-degree of index confinement, stable single low-order transverse spatial mode operation in selectively oxidized VCSELs is a challenging task at best. VCSELs are typically designed and constructed to have optical cavity lengths approximately one wavelength of a desired laser-emission-output (i.e., making the VCSEL a 'High-Q Cavity' laser diode design). This short cavity length in turn produces widely spaced resonance nodes, causing the VCSEL diode to operate within a much-desired single longitudinal optical-mode (i.e., giving the appearance of having a homogeneously broadened gain for the VCSEL).

However, because their cavity diameter dimensions (i.e., 5-μm to 20-μm) are relatively large compared to their cavity lengths, these laser diodes usually (i.e., typically the diameter size of a VCSEL's resonating optical cavity will not exceed 13-μm, which is about twelve times greater than a single wavelength of the laser-emission-output by the device) operate in multiple transverse spatial modes (i.e., generally called multimode operation); moreover, each additional transverse spatial mode possess an unique wavelength, polarization, and what is commonly called a transverse spatial profile (i.e., sometimes generally called a beam intensity pattern). For applications requiring small spot size and high spectral purity, lasing into a single transverse cavity mode, usually the lowest-order fundamental mode (i.e., $TEM_{00}$), is necessary.

In general, low-order fundamental transverse cavity mode laser-emission output for a selectively oxidized VCSEL is attained by providing optical loss to higher-order transverse cavity modes. By selectively creating optical loss for the higher-order modes, we provide modal discrimination, which consequently leads to a VCSELs operation in a single transverse cavity mode. Strategies for producing VCSELs that operate in a single transverse cavity mode have been developed.

However, because these strategies are based upon either an introduction of loss being made relatively greater for higher-order cavity modes, and thereby, will provide for an increased gain for low-order fundamental transverse cavity modes. In addition, there is an alternative approach to providing loss to higher-order cavity modes, and that is to provide gain directly for the low-order fundamental transverse cavity modes instead.

Furthermore, increased modal loss provided for higher-order cavity modes has been successfully demonstrated using three different design approaches, which first includes a modal discrimination technique that uses an etched-surface relief located on the periphery of the top facet that selectively reduces the reflectivity of the top mirror for higher-order transverse optical modes. The advantage of this technique is that the ring located around the edge of the cavity, etched in the top quarter-wave mirror stack assembly can be produced during the VCSEL's initial fabrication by conventional dry-etching, or it can be post processed on a completed VCSEL die using focused ion-beam etching. A disadvantage, however, is that the etched relief requires careful alignment to the oxide aperture or it could greatly result in an increase of optical scattering loss for the fundamental transverse cavity modes, as manifested by the relatively low (i.e., less than 4-mW) single-mode laser-emission output powers that have been reported.

Consequently, it would be more desirable to introduce mode-selective loss into the VCSEL's structure during its epitaxial deposition to avoid extra fabrication steps and self-alignment problems. Two such techniques use tapered oxide current apertures and extended optical cavities within the VCSEL laser diode respectively. The first approach, pursued extensively at Sandia National Laboratories (i.e., Albuquerque N. Mex.), is predicated on designing the profile of the oxide aperture tip in order to preferentially increase loss to higher-order transverse spatial cavity modes.

Furthermore, the aperture-tip profile is produced by tailoring the composition of the "Aluminum-Gallium-Arsenide" (AlGaAs) layers, which are oxidized during fabrication to create an aperture located within the before mentioned VCSEL. Further, VCSELs containing a tapered oxide whose tip is vertically positioned at a null (i.e., node of standing wave) in the longitudinal optical standing wave will produce greater than 3-mW of single mode output, and greater than 30-dB of side-mode suppression. Creating this structure, however, requires a detailed understanding of the oxidation process, and produces additional loss for the much-desired fundamental trans-verse cavity mode.

Furthermore, one other method used to increase modal discrimination is to extend the optical cavity length of VCSEL itself and thus, increase the diffraction loss for the higher-order trans-verse spatial cavity modes. Researchers at the University of Ulm (i.e., Ulm, Germany) have reported single-mode operation up to 5-mW, using a VCSEL constructed with a 4-μm thick cavity spacer inserted within the VCSEL's optical cavity. However, the problem here is that using even longer cavity spacers can also introduce multiple longitudinal cavity modes (i.e., generally called spatial hole burning) negating the VCSEL's greatest contribution to semiconductor laser diode application, but has resulted in single transverse cavity mode operation up to nearly 7-mW. It is interesting to note that VCSELs comprising multiple wavelength cavities do not appear to suffer any electrical penalty, however, careful cavity design is required to balance the trade-offs between the modal selectivity in the transverse and spectral longitudinal cavity modes.

However, this is all rather academic, because in order to achieve stability for a laser-emission-output into a single fundamental transverse cavity mode of low-order (i.e., preferably TEM$_{00}$), the required amounts of loss needed in order to discriminate the desired mode ultimately introduce so much loss that the laser-emission-output levels never exceed a few milliwatts of power for typical gain-regions 13-µm in diameter, more or less making these devices incapable of any real world application. Further, the 13-µm diameter size used for the VCSEL's gain-region typically cannot be exceeded in an attempt to increase gain because it would introduce the onset of higher-order transverse spatial cavity modes below threshold regardless of any particular loss mechanism utilized to eliminate them.

In addition, prior art also teaches that manipulating the modal gain rather than the modal loss can also produce single-mode VCSELs. One such technique was developed at Sandia National Laboratories to spatially aperture laser gain independently of the oxide aperture. The essential aspect of this VCSEL design approach is its lithographically defined gain-region, which is produced by an intermixing of quantum-well active-regions at the lateral periphery of the VCSEL's laser cavity.

Interestingly, both the modal loss and modal gain design approaches, though they have had some moderate success, do not completely resolve the multi-mode operational issue for the VCSEL because they only treat the symptoms of the instability not the cause. More succinctly, a laser diode that is capable of a high-powered single fundamental transverse cavity mode laser-emission-output, under normal resonator design conditions—like the use of conventional mirrors, is really an oxymoron. However, prior art does teach several examples of stable resonator designs that can effectively achieve a high-power laser-emission-output into a single fundamental transverse cavity mode.

In addition, prior art also teaches the use of ion implants as loss providing structures, which are formed during a VCSEL's fabrication. Wherein, the epitaxial growth of the VCSEL's bottom total-reflection "Distributed Bragg Reflector" (DBR) quarter-wave mirror-stack assembly is epitaxially grown upon a substrate wafer. After which, the VCSEL's active-region is epitaxially grown upon the top outermost surface of the previously deposited bottom total-reflection DBR (i.e., a first quarterwave mirror-stack assembly), and is typically comprised as having a minimum of one "Multiple Quantum-well" (MQW) that is sandwiched between two GRIN comprised spacer layers. After which, the VCSEL's top partial-reflection DBR (i.e., a second DBR quarter-wave mirror-stack assembly) is next epitaxially grown upon the top outermost surface of the VCSEL's MQW comprised active-region.

Moreover, prior art further teaches that upon completion of the epitaxial deposition of the various optical and/or semi-conductor materials that comprise the VCSEL's MQW gain-region, the gain-region is typically homogenized via an ion-implantation process, or alternatively, is homogenized via an ion-implantation process, which is made to occur around the masked regions that were used to create the top partial-reflection DBR mirror-stack assembly. The resultant VCSEL has a central quantum-well comprised active-region structure that preferentially provides gain for a single low-order fundamental transverse spatial cavity mode.

Consequently, only a single-mode output of little more than just a few milliwatts with a side-mode suppression ratio greater than 40-dB is obtained for this approach. This approach also requires greater fabrication complexity, however, it is anticipated that higher performance can be reached with further refinement of process parameters. Further, in order to achieve a stability for a laser-emission-output into a single fundamental transverse cavity-mode of low-order (i.e., preferably TEM$_{00}$), the required amounts of loss needed in order to discriminate the desired cavity mode ultimately introduces so much loss that the laser-emission-output levels never exceed only a few milliwatts of output power for a gain-region 13-µm in diameter, making these devices incapable of any real world application.

Furthermore, because of new and greater demands being made on VCSEL based applications, new types of single-mode VCSELs are currently under development at numerous laboratories around the world. These techniques introduce modal discrimination by increasing optical loss for the higher-order modes, or as an alternative introduce modal discrimination by increasing the relative gain of the fundamental optical transverse mode. A number of additional techniques not described in detail here have also been used for forcing VCSEL devices to operate in single transverse cavity modes.

Moreover, prior art further teaches techniques that include: Spatial Filtering—please see—R. A. Morgan et al., "Transverse Mode Control of Vertical-Cavity Top-Surface-Emitting Lasers," IEEE Photon., Tech. Lett., Vol. 4, pp. 374-376, (1993), Anti-guiding Techniques—please see—Y. A. Wu et al., "Single-Mode Emission from a Passive Anti-guiding Region Vertical Cavity Surface Omitting Laser," Electronics Lett., pp. 1861-1863, (1993), External Cavity Techniques please see—B. Koch et al., "Single-Mode Vertical Cavity Surface Emitting Laser by Graded Index Lens Spatial Filtering," Appl. Phys. Lett., Vol. 70, pp. 2359-2361, (1997), and Altering the Top Mirror Structure—please see—H. Martinson et al., "Transverse Mode Selection in Large Area Oxide Confined Vertical Cavity Surface Emitting Lasers Using Shallow Surface Relief," IEEE Photon. Tech. Lett., Vol. 11, pp. 1536-1538, (1999), and B. Koch et al., "Single Mode VCSEL," Digest of the Conference on Lasers and Electro-Optics—CLEO 2000, San Francisco, Calif., pp. May 1, (2000).

Moreover, prior art further teaches that these techniques have resulted in laser-emission-output levels being limited to less than 5-mW. Apparently, a major drawback with existing VCSEL design is the performance of their laser-emission-output levels for single mode devices, which are typically very small. Further, when designers increased the lateral size (i.e., between 13-µm and 90-µm) of the VCSEL diode's gain-region in an attempt to improve the performance of laser-emission-output levels, the ending result was a multimode transverse behavior exhibited by the resultant laser-emission-output, but with significant increase in power levels.

In addition, prior art also teaches that because VCSEL diodes use epitaxially deposited multilayered quarterwave mirror-stack assemblies (i.e., sometimes-called distributed feedback reflectors) in order to provide optical feedback. These structures being constructed using optical and/or semi-conductor material that are lattice-matched to the material used to construct the VCSEL's active-region.

If the VCSEL's active-region is constructed using a material regime that provides for a non-visible emission spectra (e.g., 1.3-µm to 1.6-µm for long non-visible wavelengths and 500-µm to 300-µm for short non-visible wavelengths) then the only available mirror construction material lattice-matched to a previously deposited gain-region have very low contrasting refractive indices between them, which results in the VCSEL's mirror-stack assemblies constructed using these materials of low-contrast refractive indices having almost no reflectivity. This is why the current market does not see any commercially available Indium-Phosphide based long-wavelength 1.550-μm VCSEL diodes. Further, it is quit clear that the VCSEL diode suffers from several major performance issues yet to be resolved, which limits its application to non-proprietary low-power, multimode, and visible wavelength operation.

In conventional VCSEL diodes, cavity mirrors are positioned on opposite faces of a semiconductor comprised gain-medium. A first mirror is epitaxially grown onto a semiconductor substrate. The semiconductor comprised gain-medium is epitaxially grown onto the first mirror structure. Then a second mirror is epitaxially grown onto the previously grown gain-medium.

Electrical or optical pumping generates a laser beam with laser-emission output emitted in a direction orthogonal to the plane of the substrate. Conventional VCSELs find application in optical Datacom and optical interconnect systems. VCSEL diodes are characterized by generally low-order fundamental transverse cavity mode $TEM_{00}$, where laser-emission output levels above 2-mW cw degenerate into polarity switching multi-mode output emission.

In addition, prior art teaches the construction and use of a BALD based resonator design, which has either a vertically oriented (i.e., laser-emission being perpendicular to grown semiconductor layers and their growth substrate wafers) resonating optical cavity, e.g. like those used in a "Vertical Cavity Surface Emitting Laser" (VCSEL), or has a laterally oriented (i.e., laser-emission being parallel to grown semiconductor layers and their growth substrate wafers) resonating optical cavity, e.g. like those used in a EEL diode.

Furthermore, concerning the later, larger area VCSEL emitters, having large beam diameters equal too or greater than 100-am, have demonstrated laser-emission-output power levels equaling 100-mW cw to >2-W pulsed laser-emission-output. However, operation of any VCSEL diode having such a large gain-region diameter generally carries with it the penalty of a laser-emission output beam exhibiting higher-order transverse cavity modes and related multiple frequencies, and for devices having gain-region diameter sizes that exceed 1 millimeter in size suffer from the filamentation problem that ultimately leads to COD.

Furthermore, prior art also teaches the use of an external cavity VCSEL diode approach, which is commonly referred to by prior art as a "Vertical External Cavity Surface Emitting Laser" (VECSEL), whereby an external reflector serves as the output coupler. External cavity VECSEL devices can provide low-order fundamental transverse cavity mode laser-emission-output at significantly higher power levels than conventional VCSEL diodes. Previous work on external cavity vertically emitting semiconductor lasers typically resulted in low output power.

For example, the work of Sandusky and Brueck produced low laser-emission-output power and used optical pumping to excite a semiconductor gain-medium. For more details, please see J. V. Sandusky, "A cw external cavity surface-emitting laser," Photonics Technology Letters, vol. 8, pp. 313-315, (1996). Additionally, in a study by Hadley et al., where an electrically excited VCSEL, having an external cavity configuration, produced 2.4-mW cw and 100-mW pulsed laser-emission-output into an low-order fundamental transverse cavity mode using an gain-region and emitting area equaling 120-μm. For more details, please see—M. A. Hadley, G. C. Wilson, K. Y. Lau, and J. S. Smith, "High single-traverse mode output from external cavity surface emitting laser diodes," Applied Phys. Letters, vol. 63, pp. 1607-1609, (1993).

In addition, please see—Mooradian et al. for details regarding a VECSEL diode design called the NECSEL, which is a variation of the VECSEL approach, but is capable of producing very high-power laser-emission-output into a single fundamental transverse cavity mode. Further, the NECSEL diode design, by utilizing an extended vertical cavity surface emitting resonator, which is designed to function by striking careful balances between diffraction, the location, the size, the use of thermal lensing (i.e., caused by carrier induced change of refractive index and gain-saturation), a gain-region comprised with a large numbers of quantum-wells (i.e., greatly reduces probability of filamentation and COD), cavity length, radius of curvature for a laser-emission-output coupling mirror, can provide for a high-power laser-emission-output into a single fundamental transverse cavity mode.

For more details, please see—A. V. Shchegrov, A. Mooradian, "488-nm coherent emission by intracavity frequency doubling of extended cavity surface-emitting diode lasers," Proceedings Of SPIE, Vol. 4994, pp. 197-205, 29-30 Jan., (2003), and A. V. Shchegrov, A. Mooradian, "Novel 980-nm and 480-nm light sources using vertical cavity lasers with extended coupled cavities," published in Vertical Cavity Surface-Emitting Lasers VII, Proceedings of SPIE, Vol. 4994, pp. 21-31, 29-30 Jan., (2003).

Furthermore, while the NECSEL design approach is capable of producing high-power laser-emission-output into a single fundamental transverse cavity mode it suffers from two major flaws that limit its use to non-telecom and non-Datacom application (i.e., for use in optical fiber signal regenerative pumping).

Because the NECSEL uses DBR multi-layered mirror structures to provide for optical feedback the device is limited to only near infra-red and visible wavelength application.

Because the NECSEL resonator is configured to utilize internal thermal lensing (i.e., resulting from carrier induced change of refractive index and the gain-saturation that occurs for large semiconductor gain-volume) to provide for a stable resonance capable of lasing into a single fundamental transverse cavity mode at higher laser-emission output power, it cannot provide for internal modulation speeds of around 2.3-Gigabits/ps—soon to exceed the 10-Gigabits/ps that are typically being required for present and near-future low-cost fiber-optic application (e.g., such as Passive Optical Networks, Fiber-To-The-Home, and Fiber-To-The-Premises).

Moreover, to define this problem further, let us take a quick look at ion-implanted VCSELs; they typically suffer from internal modulation delays as large as 1-μsec or more; moreover, the laser turn-on delay for these devices is caused by intracavity thermal lens formation. For more details, please see—K. L. Lear, R. P. Schneider, Jr., K. D. Choquette, and S. P. Kilcoyne, Photon. Tech. Lett. 8, 740 (1996), and N. K. Dutta, L. Tu, G. Hasnain, G. Zydzik, H. Wang, and A. Y. Cho, Electron. Lett. 27, 208, (1990).

In addition, prior art also teaches many examples of narrow-stripe EEL diodes, which emit high-quality laser beams, but have several drawbacks that limit their use in high-value applications. For example, due to the inhomogeneous broadening of their gain, the practical output power for EEL semi-conductor laser diodes is at best around 50-mW to 300-mW. The main reason for this is lateral mode instabilities, which arise because high output power and single mode operation have contradictory design requirements.

Moreover, for high power operation, a large optical mode cross section is needed to circumvent the material damage threshold □10 MW/cm². While, on the other hand, one is not completely free to change the transverse (i.e., perpendicular to the plane of the p-n function) mode dimension because it is determined by the heterostructure, whose primary purpose is carrier confinement.

Furthermore, typical heterostructure only support the lowest transverse cavity modes. This leaves the lateral (i.e., parallel to the plane of the p-n junction) mode dimension as the only transverse degree of freedom. The lateral mode dimension may be increased by having a wide channel with weak lateral waveguiding. The weak optical confinement within these laser diodes, which are called broad area edge-emitting laser diodes, usually leads to multilateral mode operation. We consider multilateral mode operation to be instability because it gives rise to spectral broadening and high spatial frequencies in the lateral field distribution. Many applications are unaffected by this instability because the laser-emission-output can still be coupled to a multimode optical fiber with reasonable efficiency. However, as we expand the range of applications to include, for example, free-space communications, then it is desirable, if not necessary, for a high power semiconductor laser diode to be able to operate in a single cavity mode.

Moreover, there are several factors affecting lateral mode stability. For BALD based devices, the gain-medium plays an important role through filamentation. Filamentation results from the self-focusing due to gain-saturation. More succinctly, filamentation results when the inhomogeneous character of the laser transition and the asymmetrical electron momentum distribution of the population inversion about the peak gain-frequency lead to an appreciable carrier-induced refractive index $\delta n_g$ that decreases with increasing carrier density.

Near threshold, where the carrier density decreases with distance from the center of the laser beam, $\delta n_g$ causes the refractive index in gain-guided laser diodes to increase with distance from the beam center. The resulting refractive index distribution acts as a diverging lens (anti-guiding). While the net consequence of anti-guiding and diffraction is a diverging wavefront, the laser diode still has a finite steady-state beam width because of gain guiding.

Further above threshold, the higher laser peak intensity creates a dip in the carrier density because of the gain-saturation. Further, due to $\delta n_g$, the net refractive index has a bump in the middle. Consequently, a waveguide is created that focuses the laser beam, resulting in a higher peak intensity, which in turn creates a stronger waveguide. Further, for laser diodes, this self-focusing phenomenon is called filamentation. Wherein, a steady-state filament size is reached when the self-focusing is balanced by diffraction and carrier diffusion. Moreover, the filament is considerably narrower than the electrode width, and it has a flat wavefront, which is typical of index-guided modes.

Moreover, filamentation occurs very close to threshold, and at high excitations, the filament width will reach an asymptotic value that is independent of electrode width. The asymptotic filament size is governed by $\delta n_g$, carrier diffusion, and laser-wavelength (i.e., via diffraction). Further, at even higher excitations, more than one filament will appear in the lateral field distribution, which does not settle to a steady-state. The detrimental effects of filamentation are material damage due to increased peak-intensity, and increased loses via spontaneous emission due to a reduced overlap between lasing optical field and the gain-region.

In addition, prior art teaches many laser diode designs that were created to realize a semiconductor laser diode capable of emitting spatially coherent laser light (i.e., single transverse modes), and yet would still have laser-emission-output power equaling several watts to dozens of watts or more. For more details, please see Botez and Schifres, "Diode Laser Arrays," Cambridge Press, (1994), which describes a monolithic laser diode structure that realizes a high-quality laser-emission-output and a process for producing the semiconductor comprised structure.

Furthermore, in order to remedy the drawbacks of conventional current-injection type semiconductor laser diodes, both U.S. Pat. No. 5,461,637 and U.S. Pat. No. 5,627,853 proposes that broad area surface-emitting semiconductor comprised laser diodes be optically excited by a coherent laser light source outside the cavity.

However, since these semiconductor laser diodes utilize thermal lensing to affect an increase in the refractive indices with a change in temperature—then the temperature must be increased. These semiconductor laser diode devices, however, are quit sensitive to temperature distribution, which in turn causes their spatial oscillation modes to become unstable (i.e., the instability sometimes called spatial mode hoping by those well versed in the art).

Moreover, what should be apparent by now to the reader is how difficult it is to achieve both a single low-order fundamental transverse cavity mode oscillation and a high-power laser-emission-output for conventional semiconductor laser diode devices. For example, prior art teaches that the semiconductor laser diode device describe above has a design configuration that finds it difficult to emit laser light with higher output power into a single transverse cavity mode.

For more details, please see—Nakamura et al., "InGaN/GaN/AlGaN—Based Laser Diodes Grown on GaAs substrates with a Fundamental Transverse Mode," Japanese Journal of Applied Physics, Part 2 Letters, vol. 37, pp. L1020, (1998), which discloses an InGaN based short-wavelength semiconductor laser diode device. Additionally, prior art further teaches a quality high-powered laser-emission-output semiconductor laser diode; described in great detail in an abstract written by B. Pezeshki et al., "400-mW Single-Frequency 660-nm Semiconductor Laser," published in IEEE Photonics technology Letters, vol. 11, pp. 791, (1999), which discloses an AlGaInP based (i.e., which comprises of material capable of visible spectra emission wavelengths) semiconductor laser diode design.

In addition, prior art teaches a BALD design approach to solve the previously described problems of unstable low-power multimode laser-emission-output, which includes what is sometimes called a phased array semiconductor laser diode. Further, the BALD design approach comes in two flavors, including:

(i) Edge-Emitting phased array semiconductor laser diodes, and (ii) Surface-Emitting phased array semiconductor laser diodes.

Moreover, an Edge-Emitting Phased Array semiconductor laser diode is configured to have multi-emission or broad area emission capabilities, and in particular to a phased array laser diode or a phased locked array laser diode having preferred fundamental supermode operation with a structural design that utilizes "Impurity Induced Disordering" (IID).

Furthermore, prior art teaches that an Edge-Emitting phased array semiconductor laser diode comprises a plurality of closely coupled or spaced emitters on the same integral structure or substrate. Examples of such phased array laser diodes have been thoroughly described and illustrated in U.S.

Pat. No. 4,255,717, also in Pat. No. Re. 31,806, and also described in an article by William Streifer et al., entitled "Phased Array Diode Lasers," published in the June, (1984), issue of 'Laser Focus World' and 'Electro-Optics' magazines. Wherein, the laser emitters of such laser diodes are represented by a periodically spaced current confinement means (e.g., contact stripes used for current pumping and to establish spaced optical cavities in the active gain-region of these laser diodes).

Moreover, prior art continues by teaching that the current confinement means may be interconnected or closely spaced to a degree that the optical mode established in each of the lasing cavities below a respective current confinement will couple to its neighboring optical mode, i.e. the evanescent waves will overlap into adjacent optical lasing cavities. Further, the array of optical fields produced, become locked in phase, and if the phase difference between the adjacent current confinement equals zero, then the lateral radiation pattern in the far field will comprise a much-desired single lobe.

However, prior art also teaches that a phased array laser diode will not operate in a single mode, but rather operates with two or more lobes in a far field pattern. Consequently, the phase relationship between adjacent optical modes is not under independent control and the phases will adjust themselves in a manner that minimizes laser threshold current.

In most cases, it appears that the lasing mode favored is a supermode, which results as a direct consequence of the optical fields located between adjacent optical emitters pass through zero. This is because in most real world index-guided laser diodes, as well as in many gain-guided laser diodes, pumping is reduced for locations that lay between laser emitters requiring overall reduced current pumping.

Furthermore, the prior art teaches that the foregoing explanation can be exemplified as follows. An array laser diode with $N^{th}$ coupled emitters has $N^{th}$ possible coupled modes, which are referred to as "supermodes." A supermode is a cooperative lasing of the $N^{th}$-optical emitters or filaments of the array laser diode. Since there are $N^{th}$ optical emitters, there are $N^{th}$ possible supermodes, because all these emitters are optically coupled.

Each supermode has the property that the $1^{st}$ and the $N^{th}$ supermode have the same intensity pattern or envelope, the $2^{nd}$ and the $(N-1)^{th}$ have the same intensity envelope, and in general, the $i^{th}$ and $(N-i)^{th}$ have the same intensity envelopes. The $1^{st}$ or fundamental supermode has all emitters lasing in phase with an amplitude distribution representative of half a sinusoidal cycle. This is the only supermode pattern that radiates in a single central lobe in the far field pattern because all emitters are in phase.

Therefore, for a uniformly spaced array of identical emitters, the $1^{st}$ and $N^{th}$ supermode envelopes are half a sinusoidal period, the second and the $(N-1)^{th}$ supermode envelopes are two half-sinusoidal periods, etc. The phase relationship between the individual emitters in $N^{th}$ supermodes differs. More specifically, for the $1^{st}$ supermode, all emitters are in phase, and for the $N^{th}$ supermode, the phases alternate between zero and $\pi$.

Usually the $1^{st}$ and $N^{th}$ supermodes have the lowest current thresholds as compared to all other supermodes because their intensity envelopes do not exhibit nulls near the center of the array where the charge density is greater because of current spreading and charge diffusion in the active region of the laser diode array. However, as previously indicated, the $N^{th}$ supermode, which radiates in two lobes, has a lower current threshold of operation than the $1^{st}$ supermode. Further, phased array laser diodes have a high utility due to their high power output. It is preferred that the power be concentrated into a single lobe, i.e. in the $1^{st}$ supermode. The reason being is that a substantial majority of laser applications require power in a single far field lobe. Further, if lasing is experienced in more than one lobe, measures are taken to diminish or otherwise attempt to eliminate or block off the other operating lobes in the far field pattern.

Moreover, prior art further teaches that there has been much activity relative to phase locked array laser diodes or phased array laser diodes, where efforts have been established to discriminate among the supermodes to provide for fundamental supermode selection. One such suggestion was at the IEEE 9th Conference in Brazil, July 1984, where J. Katz et al. presents a talk on supermode discrimination via a controlled lateral gain distribution along the plane of the lasing structure by incorporating a separate contact to each laser diode array structure, and tailoring the currents through the array laser diode structures themselves. Further, the abstract presented for the talk can be found in the Proceedings of the Conference—pages 94 and 95, in a document entitled "Supermode Discrimination in Phase-Locked Arrays of Semiconductor Laser Arrays."

Furthermore, more recently are the articles of Twu et al. entitled "High Power Coupled Ridge Waveguide Semiconductor Laser Arrays," Applied Physics Letters, Vol. 45(7), pp. 709-711, Oct. 1, (1984), and S. Mukai et al. entitled "Fundamental Mode Oscillation of Buried Ridge Waveguide Laser Array," Applied Physics Letters, Vol. 45(8), pp. 834-835, Oct. 15, (1984). Wherein, these articles suggest discrimination among the supermodes to obtain the single lobe fundamental supermode by employing index guided ridge waveguide structure, where the laser diode structures are uniformly pumped with an optical field mainly confined to the ridge region of the structure, while higher gain is experienced in the valley or coupling regions to induce in-phase operation (0° phase) and promotion of fundamental supermode operation.

In addition, prior art also teaches a similar techniques used to discriminate among supermodes, which is disclosed in U.S. patent application Ser. No. 667,251, which was filed Nov. 1, 1984. Further, prior art also teaches a technique proposed in U.S. Pat. No. 4,624,000, entitled "Phased Array Semiconductor Lasers With Preferred Emission in a Single Lobe.", which relates to the use of structural means associated with the laser diode to enhance the amount of gain experienced in regions between adjacent optical cavities of lasing structures by spatially modulating the optical overlap of the optical field of each of the laser structures across the entire array to thereby favor the fundamental supermode over other potential modes.

In addition, prior art also teaches a phased array semiconductor laser diode design approach that includes a sizable array of VCSELs, which was originally disclosed by Jewell et al. in U.S. Pat. No. 4,949,350. Further, the patent first describes the growth of a vertical-cavity Fabry-Perot resonator structure on a substrate as being laterally undefined. Vertically, it consisted of upper and lower interference mirrors separated by an optical distance equal to the lasing wavelength. The mirrors are further described as sandwiching an active layer comprising of several quantum-well layers, which emitted light at the lasing wavelength when current was passed through them.

All the layers were described as being constructed using III-V based semiconductors that were epitaxially deposited by "Molecular Beam Epitaxy" (MBE) on a doped GaAs substrate wafer. Wherein the layers deposited above the active-region were p-type, while those deposited below were n-type to form a laser diode. A layer of gold was then deposited over the upper mirror as a contact layer.

Moreover, the laser diode array was then laterally defined by a photolithographic definition of a nickel mask above the intended lasers followed by chemically assisted, ion-beam etching. The ion-beam etching was carried through the entire vertical-cavity structure to create an array of pillars having heights of more than 5-µm. Each pillar was a separate laser and was electrically selected by contacting the metal at the top of the respective pillar. The conductive substrate served as a common counter electrode. Light was emitted through the substrate. Jewell et al. demonstrated their invention with lasers having diameters ranging down to 2-µm. Thus, it became possible to fabricate extremely dense arrays of lasers.

Moreover, the pillar lasers of Jewell et al. suffer from several problems, e.g. electrical contacts need to be formed onto the top of the high aspect-ratio pillars, which posses a fabrication problem. Additionally, for small pillar laser diodes, the relatively large sidewalls cause excessive recombination. Consequently, heat cannot be efficiently dissipated from the pillar laser structures, causing degradation in laser-emission-output performance. The sophisticated processing of Jewell et al. raises questions of manufacturability.

For example, Jewell et al. suggests that planarization using polyimide would maintain the index-guide optical waveguiding function and current confining function of the previously defined pillars and yet, would save the contacting problem. Work is progressing on this approach and on regrowth using insulating AlGaAs, which would help solve the recombination and thermal dissipation problems, but currently the results are not very satisfactory.

In addition, prior art further teaches a planarized array of vertical-cavity surface-emitting lasers, which is disclosed by Orenstein et al. in U.S. patent application, Ser. No. 480,117, which was filed on Feb. 14, (1990); Also, disclosed in an abstract entitled "Lateral definition of high performance surface emitting lasers by planarity preserving ion implantation processes," published in Conference Proceedings, CLEO, pages 504-505, May 21-25, (1990); and Also, in an abstract entitled "Vertical-cavity surface-emitting InGaAs/GaAs lasers with planar lateral definition," Applied Physics Letters, volume 56, pages 2384-2386, (1990).

Wherein, Orenstein et al. constructed the same vertical cavity surface-emitting phase locked structure as in the Jewell et al. phased array. However, they performed the lateral definition via an ion implanting of protons in regions surrounding the intended laser pillars, which extended down to just above the active-region layer. The protons reduced the conductivity of the implanted region; thus, current was successfully gain-guided through the laser's gain-region.

However, using the above-mentioned approach Orenstein et al. might have retained the current gain-guiding of Jewell et al., but as a result sacrificed any index guiding advantages, since the protons did not have a significant effect on the refractive index of the implant area. Consequently, the deep ion implantation of their technique places a lower limit on the size of the lasers and the separation between adjacent laser diode pillars.

Although, VCSELs provide the advantage of lasers having very small areas and low threshold current some applications require higher optical power. In principle, a SEL can achieve high-power through a simple increase in the cross-section of the lasing gain-region with a constant current density. Recent experiments, however, has demonstrated that this technique does not work.

For larger sized surface-emitting lasers, the produced laser light is filamented into irregularly and perhaps separated lasing areas. Similar filamentation has also been observed in edge emitting "Broad Area Laser Diodes" (BALD), which, for both SEL diodes and BALD devices, is due to inhomogeneities in the gain and resultant refractive index distributions of their optical waveguides, the reasons being previously explained.

Moreover, for VCSELs, filamentation can additionally arise from spatial variations in mirror reflectivities, which must be necessarily, above 99% because of their short gain lengths and high cavity finesse. The previously mentioned spatial variations are enough to induce lasing preferentially in some regions but not in others. Aside from efficiency and thermal problems, the sparsely connected filaments are not likely to be phase-locked or even to have the same frequency. Therefore, a large area surface-emitting laser tends to lose its laser characteristics. Further, even medium sized lasers (i.e., lasers having gain-regions 5-µm to 40-µm in diameter) are bound to oscillate in a large number of transverse cavity modes, the distribution of which is uncontrollable.

Moreover, prior art further teaches that a Yoo et al. has disclosed an array of small phase-locked lasers in a abstract document entitled "Fabrication of a two-dimensional phased array of vertical-cavity surface-emitting lasers,", which was published in Applied Physics Letters, volume 56, pages 1198-1200, (1990). In this refinement of the Jewell et al. technique, they fabricated a rectangular array to have more than 160 laser diodes configured within a 25-µm$^2$ surface area. Each laser diode structure had a square dimension equaling 1.3-µm$^2$, and is separated from neighboring laser diodes by a space of no less than 0.1-µm. The circular array was planarized with polyimide and a common upper electrode attached to all the LDs located within the array. The angular distribution of the far-field optical intensity showed substantial, though possibly not complete, phase locking between all of the laser diodes.

Moreover, Yoo et al. was able to achieve phase locking between the strongly waveguiding of the Jewell et al. pillars design, but only by a very small separation between the pillars and the small areas of the pillars themselves. The calculations of Yoo et al. in "Array Mode Analysis of Two-Dimensional Phased Arrays of Vertical Cavity Surface Emitting Lasers," IEEE Journal of Quantum Electronics, volume 26, pages 1039-1051, (1990), have shown this requirement of small laser spacing for strongly waveguided structures. However, such a structure and associated processing produce very high surface recombination on the sides of the pillars because of the large surface-to-volume ratio. As a result, their phase-locked array showed poor efficiency and threshold current, and their phase locking was not complete.

Additionally, prior art teaches a approach by Deppe et al. that utilizes a different yet similar phase-locked surface-emitting laser diode array, which is fully disclosed an abstract document entitled "Phase-coupled two-dimensional Al$_x$Ga$_{1-x}$As/GaAs vertical-cavity surface-emitting laser array," Applied Physics Letters, volume 56, pages 2089-2091, (1990). Wherein, they stopped the epitaxial growth of the vertical cavity with the upper spacer layer. After which, they formed a 2-µm wide Mn—Al metallization grid upon the top of the upper spacer layer and an insulating InP direct-bandgap semiconductor stack was deposited upon the top of the grid-covered spacer layer. Lasing, however, was not configured to occur beneath the grid.

Furthermore, phase-locked laser diode arrays, such as the one just described, present several unique applications. If the laser structures are phase locked with non-zero phase differences, the far-field intensity assumes a multi-lobed or at least off-axis pattern with the details of the patterns depending on the number of structures and the relative phase differences between each structure. If, however, the phase differences are controlled, then the intensity pattern can be controlled.

Consequently, the two-dimensional phased arrays of both EEL diode and VCSEL diode based designs have one major still unresolved flaw, due to the phase perturbation contributed by spontaneous emission, the phase difference exhibited by adjacent laser diode regions do not always equal zero, and the laser-emission-output for the majority of laser diodes comprising the array is out of phase (i.e., not phased locked) causing multiple lobes to appear in the far field pattern of a coupled laser-emission-output (i.e., a far field version of a multimode high-order transverse cavity mode intensity pattern). Resulting in a high degree of signal noise, which has keep these semiconductor laser diodes from being used in high-value applications; e.g., applications such as Telecommunications, Datacom, and the convergent "Passive Optical Networks" (PONs).

In addition, prior art also teaches a new kind of laser diode design approach altogether; currently, this laser diode design is called the "Quantum Cascade" (QC) laser diode, and was initially described in U.S. Pat. No. 5,457,709, incorporated herein by reference in its entirety. For more details, please see—U.S. Pat. No. 5,509,025; U.S. Pat. No. 5,901,168; and U.S. Pat. No. 6,055,257, which are altogether incorporated herein by reference in their entireties. Unlike the more conventional semiconductor laser diode, QC semiconductor lasers are unipolar, that is, they are based upon one type of carrier (i.e., typically electrons located in the conduction band), which make inter-subband transitions between energy levels that are created by quantum confinement. Further, in a unipolar semiconductor lasers, electronic transitions between conduction band states arise from size quantization made to occur in the active gain-region of a heterostructure. The inter-subband transitions are located between excited states of coupled quantum-wells for which, resonant tunneling is the pumping mechanism.

Furthermore, a single gain-region unipolar semiconductor laser is possible, but multiple gain-regions may be used as well. QC lasers comprise an active gain-region having a plurality (e.g., typically twenty-five) of essentially identical undoped laser-active semiconductor based layers, sometimes referred to as "Radiative Transition" (RT) regions. Each active (RT) region comprises as a plurality of semiconductor layers, and has quantum-well regions interleaved with barrier regions, to provide two or more coupled quantum-wells.

Moreover, prior art teaches that these coupled quantum-wells provide for at least second and third associated energy states for charged carriers (e.g., electrons). Further, the second energy state comprises of a lower energy than the third energy state, which corresponds to second and third wavefunctions, respectively. The energy difference between the third and the second energy state determines the wavelength of the laser-emission-output. The energy difference between second and third energy states is in turn determined by the arrangement of all the coupled quantum-wells in the active region. The arrangement includes the number of quantum-wells, the thickness of each individual quantum-well, the energy height, and thickness of each energy barrier layer that is located between two neighboring quantum-wells.

Furthermore, a multilayer carrier injector or injection region, sometimes referred to as an "injection/relaxation" (I/R) or "energy relaxation" region, is disposed between any two adjacent active regions. Thus, a given active region is separated from an adjoining one by an I/R region. The I/R region, like the active region, also typically comprises a plurality of semiconductor layers. Each active region-I/R region pair (i.e., each RT-I/R pair) may also be referred to as a 'repeat unit.' At least, some of the layers in each I/R region are doped, and in any case, the I/R regions, as well as the active regions, are unipolar.

The aforementioned U.S. Pat. No. 5,457,709, discloses a technique for designing a QC laser that uses the inter-subband transition located between energy levels of a coupled quantum-well structure and an I/R region with a digitally graded energy gap structure and the nominal structure of a QC laser is described in the aforementioned U.S. Pat. No. 5,509,025. Unlike a diode laser, the layers of a multilayer semiconductor QC laser structure are either undoped, or, if doped they are all of the same type, e.g. comprising an n-type dopant such as Silicon.

Moreover, an operating voltage is provided across the multilayer semiconductor structure of the QC laser. Further, this in turn causes substantial energy relaxation of charge carriers (e.g., electrons) in the I/R regions, some of which are introduced into the I/R region from an adjacent active-region. These injection carriers undergo a radiative transition, leading to lasing.

In addition, prior art further teaches many improvements to the QC semiconductor laser since its initial inception. For more details, please see—U.S. Pat. No. 5,457,709; and by J. Faist et al., "High Power Mid-infrared ($\lambda 0$ about 5-µm) Quantum Cascade Lasers Operating Above Room Temperature," published in Appl. Phys. Lett., vol. 68, pp. 3680-3682, (1996); and also see C. Sirtori et al., Appl. Phys. Lett., vol. 68, p. 1745, (1996). Moreover, for several types of applications, especially in the area of optical sensors configured for atmospheric trace gases, it is advantageous for the lasers to operate in a single transverse mode at a single frequency.

Furthermore, the use of distributed feedback (DFB) QC lasers for this purpose has been extensively explored, as described by J. Faist et al., "Distributed Feedback Quantum Cascade Lasers," published in Appl. Phys. Lett., vol. 70, No. 20, pp. 2670-2672, (1997); by C. Gmachl et al., published in IEEE Photonics Technol. Lett., vol. 9, p. 1090, (1997); and by C. Gmachl et al., published in Appl. Phys. Lett., vol. 72, p. 1430, (1998).

Moreover, unlike other semiconductor lasers, such as laser diodes, the lasing wavelength of a QC semiconductor laser is essentially determined by quantum confinement (i.e., determined by the thickness of an active-region's layers), rather than by the bandgap of the active-region material. The lasing wavelength thus, can be tailored over a wider range than it can for a typical EEL diode using the same semiconductor material. For example, QC semiconductor lasers comprised with InAlAs/InGaAs active-regions have been tailored to operate at various mid-IR wavelengths ranging from 3.5-µm to 13-µm.

In addition, prior art also teaches that the use of diffraction gratings is one way to further control the operation frequency of semiconductor lasers. Further, the QC semiconductor laser can have its feedback provided by a DFB configuration, a DBR configuration, or a "Grating Coupled Surface Emitting Lasers" (GCSEL) configuration. For example, GCSELs are described in detail by A. J. Lowery, "Performance Comparison of Gain-Coupled and Index-Coupled DFB Semiconductor Lasers," published IEEE J. Quantum Electronics, vol. 30, no. 9, pp. 2051-2063, (1994); by A. Kock, "Single-mode and Single-beam Emission from Surface Emitting Laser Diodes Based on Surface-mode Emission," published in Appl. Phys. Lett., vol. 69 (24), pp. 3638-3640, (1996); by A. Rast et al., in "New Complex-Coupled DFB-Laser with a Contacted Surface Grating for $\lambda=1.55$-µm," published in IEEE Proceedings Optoelectronics, vol. 142, no. 3, pp. 162-164, (1995).

Moreover, when using a diffraction grating, both the thickness of the active-region layers and the diffraction-grating determine the lasing wavelength, as follows. In a QC semiconductor laser, the characteristics of the active-region (i.e., the number and layer thicknesses of coupled quantum-wells) can be varied to determine the laser-emission wavelength range. The diffraction grating is used therein to precisely pick out a much narrower wavelength range within the range previously determined by the active-region layer thickness.

More succinctly, the grating controls the lasing wavelength more precisely than the lasing wavelength range determined by the layer thickness alone. However, the lasing wavelength selected by the diffraction grating cannot exceed the available laser wavelength range determined by the layer thickness and the whole laser structure. Thus, a unipolar injection laser, such as a QC laser, offers several advantages over bipolar semiconductor lasers. Compared to bipolar semiconductor lasers, these QC lasers have a frequency response not limited by electron/hole recombination, a narrow emission linewidth because the line-width enhancement factor is theoretically zero, and a weaker temperature dependence of the lasing threshold.

Additionally, as noted above, appropriately designed QC semiconductor lasers can have an emission wavelength in the spectral region from the mid-IR to the submillimeter region, which is entirely determined by quantum confinement. An alternative approach to fabricate a high-power, single-mode laser is to use a so-called 'curved grating'. In such a laser, with a mode made up of counter-propagating diverging beams, the rulings of the diffraction gratings are curved to reflect one traveling wave into the other. See, e.g., Lang, R. J., "Design of Aberration-Corrected Curved Mirror and Curved-Grating Unstable-Resonator Diode Lasers," IEEE J. Quantum Electron., vol. 30, p. 31 (1994). A method for fabricating the grating for a DFB semiconductor laser is disclosed in "Surface-Emitting Distributed Feedback Semiconductor Laser," by S. Macomber et al., published in Appl. Phys. Lett. 51(7), pp. 472-474, (August 1987).

Moreover, this paper as prior art describes a technique in which a gold coating is deposited on a grating etched into the p-side of a semiconductor laser. The gold coating also serves as the p-contact for the laser. However, this approach employs an edge-emitting laser structure and has a large beam divergence angle (i.e., sometimes referred to as the diffraction angle) along the direction that is perpendicular to the laser surface, as well as a much higher optical power density at the laser facet that it is susceptible to catastrophic mirror damage. An edge-emitting semiconductor laser also typically has an elliptical, as opposed to circular, laser beam cross-section. This can require correction and collimating, which can be expensive or otherwise impracticable or undesirable.

In addition, prior art also teaches that due to the nature of the curved grating, the laser-emission-output beam has a spatial phase-difference distribution, which reduces optical beam quality. Many applications also require lasers that can operate in the mid-IR spectral range, (e.g., between 3-µm and 13-µm). Such applications might include:

Remote chemical sensing,
Pollution monitoring,
"Laser Infrared Detection and Ranging" (LIDAR),
Infrared counter-measure, and
Molecular spectroscopy.

Unfortunately, few convenient laser sources operate in the mid-IR spectral region. As noted above, for example, bipolar semiconductor laser diodes, including quantum-well laser diodes, have too large a bandgap, making it difficult, if not impossible, to obtain laser operation at mid-IR wavelengths. Some semiconductor laser diodes can operate in this wavelength range, but they require special cooling to a very low-temperature, which can be costly. QC lasers, however, as noted above, do not suffer these drawbacks, and can be designed to emit radiation at substantially any desired wavelength in a rather wide spectral region, including laser emissions in the mid-IR range.

Therefore, prior art further teaches that QC lasers are desirable for mid-IR range application. For example, QC lasers may be employed advantageously as radiation sources for the absorption spectroscopy of gases and pollutants, because at least some QC lasers can operate in the relevant wavelength region at or near room temperature, and with relatively high output power. For more details, please see—J. Faist et al., Applied Physics Lett., Vol. 68, pp. 3680-3682, (1996); and C. Sirtori et al., "Mid-infrared (8.5-µm) Semiconductor Lasers Operating at Room Temperature," IEEE Photonic Technol. Lett., vol. 9 (3), pp. 294-296, (1997), both incorporated herein by reference in their entirety.

Moreover, prior art further shows that some applications require high-power laser-emission-output into a single fundamental transverse cavity mode. For example, for LIDAR, "Differential Absorption LIDAR" (DIAL), and other remote chemical sensing systems, a spatially coherent, single-mode, high-power laser-emission-output beam having the appropriate wavelength range can greatly increase the sensing range. Single-mode emissions from QC lasers can be achieved by incorporating a "Distributed Feed-Back" (DFB) or "Distributed Bragg Reflection" (DBR) reflection grating to form their respective resonating laser diode cavity structure.

It is difficult, however, to achieve a spatially coherent, single-mode, high-power laser-emission-output using conventional edge-emitting QC laser structures as the source of mid-IR radiation. To obtain high output power with an edge-emitting QC laser, one has to either use a very high injection current density into a narrow stripe laser configuration or use a broad area laser to increase the lasing area. A high injection current density will cause severe device heating, thus significantly limit the maximum laser-emission-output power, and therein, reduce the laser's lifetime.

Moreover, prior art further teaches that for any BALD device, regardless what type of semiconductor gain-region it might use, it is very difficult to maintain single mode operation under high-current injection operation because of the carrier induced refractive index change that causes the filamentation problem, which, as previously stated, hastens the onset of multi-moded lasing. For more details, please see—G. P. Agrawal & N. K. Dutta, "Semiconductor Lasers" (2nd edition; New York: Van Nostrand Reinhold, 1993).

Moreover, the self-induced filamentation effect produces a multi-spatial cavity mode laser-emission-output, which diminishes the laser's power and performance. The multi-mode laser emission is very difficult to focus, which is especially problematic when a long propagation distance or a very small focus beam size is required. Consequently, the multi-mode laser emission is less coherent and therefore, very difficult to use in several high-value applications such as Telecommunications.

In addition, prior art teaches that the output beam of an EEL diode has a very large divergence angle in a direction perpendicular to the laser diode's top surface. Surface emitting QC lasers, by contrast, show great promise for applications requiring stable higher-power laser-emission-output. A surface-emitting DFB based semiconductor laser diode has more potential to produce higher power laser-emission-output than does an EEL diode, because a larger lasing area can be used and the internal losses of the laser structure can be reduced.

Moreover, under current technology, the laser-emission-output from SELs can be spatially coherent if the width or the lateral dimension of the lasing region is limited to about 5-μm. To obtain higher laser-emission-output power, however, it is advantageous to provide a lasing gain-region with a width of 50-μm or more. Unfortunately, increasing the width of the gain-region typically leads to spatially incoherent operation at high current injection levels. Thus, there is a need for techniques for fabricating a surface emitting QC laser with both a wide lasing region and a spatially coherent laser-emission-output beam.

Prior art teaches several of these approaches, which have been proposed as a means to prevent the filamentation problem from occurring in a broad-area QC semiconductor lasers. Further, a typical solution is to create a so-called unstable resonance cavity (i.e., also referred to as an unstable resonant cavity or unstable resonator) within the laser diode device. There are several ways to create this kind of cavity for a high-power laser diode configuration.

Furthermore, a semiconductor laser diode with a continuous unstable resonator has been described by S. Guel-Sandoval et al., in a document entitled "Novel High-Power and Coherent Semiconductor Laser with a Unstable Resonator," published in Appl. Phys. Lett., vol. 66, (1995), pp. 2048-2050, which is incorporated herein by reference in its entirety. Further, this paper fully describes a means for inducing a quadratically varying index of refraction across the lateral dimension of a wide-stripe semiconductor laser diode, in order to introduce some control over beam divergence and the coherent operation of the laser diode device.

In addition, prior art also teaches an approach, which uses the curved grating described in the Lang reference above. Further, a new way to fabricate a grating-coupled surface-emitting laser diodes with an unstable resonance cavity is disclosed in aforementioned U.S. Pat. No. 5,727,016. This patent describes the use of a variable index refraction layer, having an approximately parabolic-trough, therein. The refraction layer is positioned adjacent to the active lasing region. A straight-toothed, second-order diffraction grating contacts the refraction layer to produce a broad, spatially coherent output beam. For more details, please see—A. Kastalsky, "Infrared Intraband Laser Induced in a Multiple-Quantum-Well Interband Laser," IEEE J. Quantum Electronics, vol. 29, no. 4, pp. 1112-1115, (1993).

Therefore, prior art teaches that there is a need for improved surface-emitting QC lasers, which produce high-power, spatially coherent, single-mode output beams, having a small divergence angle. Such devices especially would be useful, for example, for remote chemical sensing and LIDAR applications. A compact, low-cost, and reliable high-power, spatially coherent, single-mode, mid-IR semiconductor laser can greatly reduce the system cost and reliability for these applications.

Moreover, as prior art has proposed, a QC laser that incorporates grating-coupled, surface-emitting, and unstable resonance cavity structures would find application in technologies needing a mid-IR coherent light source. The grating-coupled, surface-emitting structure of the present invention provides the advantage of a narrow spectral width laser output with a small divergence angle, and the unstable resonance cavity structure provides the advantage of preventing the filamentation effect that causes multimode lasing under high injection current. The combination of these two structures allows the laser to maintain narrow spectral, single mode, and small diffraction output at high injection current. This combination in a unipolar QC laser also allows lasing emissions to be achieved over a wide spectral region, including wavelengths in the mid-IR range.

In addition, prior art also teaches that because it is surface emitting, the GCSEL exhibits a circular laser-emission-output beam and a smaller divergence angle, and can therefore, be more attractive than EEL diodes in some applications. A typical QC laser is of unipolar semiconductor laser design having a multilayer stacked structure epitaxially grown upon a semiconductor substrate, typically Indium-Phosphide, which forms an optical waveguide structure therein. The optical waveguide structure includes a core or active-region of relatively large effective refractive index (e.g., an index of 3.3) between cladding-regions of relatively small effective refractive index (e.g., an index of 3.1). Further, a cladding-region will also be referred to herein, as a 'confinement region'.

Moreover, prior art further teaches that the core-region comprises a plurality of repeat units, each unit having essentially an identical active-region (i.e., sometimes called the gain-region or gain-medium), and a carrier injection/relaxation (I/R) region, as described above. The core-region generates lasing when electrical power is applied to the structure through electrodes. The lasing light propagates within the optical waveguide, which includes the core-region, in the longitudinal direction of the cavity, where it is amplified by the lasing action.

Moreover, prior art further teaches that the nominal structure of this aspect of the QC laser is similar to that described by the aforementioned U.S. Pat. No. 5,509,025. As noted above, diffraction gratings may be used to control the operational frequency of semiconductor laser diodes by helping to select a narrower lasing frequency range within the frequency range set by the laser diode structure itself. Grating coupled DFB structures, for example, have been applied to the basic QC laser structure to produce single-mode lasers having a pre-selected wavelength. In addition, a QC laser structure that uses a DFB configuration will only utilize a first order grating.

For example, prior art teaches that a first order grating may be used to couple light in the longitudinal direction of the laser cavity (i.e., edge emitting). Gratings can also be made for the use of higher coupling orders, as will be appreciated by those skilled in the art. To fabricate a SEL QC laser, for example, one would need to incorporate a second order grating into a laser structure to produce a grating coupled SEL. Further, laser diodes with grating coupled surface emitting structures are well known. See, for instance, the aforementioned Kock reference, which discloses a surface-emitting bipolar laser diode with a second-order grating in the top-cladding layer, the grating facilitated coupling of the laser cavity mode into a surface mode. A second order grating causes vertical coupling, instead of in the cavity longitudinal direction.

Regardless, prior art further teaches that the main advantage of a surface coupled laser is that the laser-emission-output beam has a much smaller divergence angle than a conventional EEL diode, and can be circular in cross section rather than elliptical, as is the case for EEL diodes. A laser-emission-output beam having a smaller divergence angle and circular cross section is easier to focus into a smaller spot size or collimate into a laser beam that can maintain a smaller spot size after the beam has traveled a long distance, and easier to couple into a fiber or other light-receiving device.

Moreover, the QC laser of the present invention employs a grating-coupled, surface-emitting structure, to provide a narrow spectral linewidth (e.g., MHz) laser output having a small divergence angle (e.g., 1°). In conclusion, while prior art shows conclusively that QC semiconductor lasers can made somewhat stable, they still suffer from the same phase perturbation problem contributed by spontaneous emission that all other semiconductor lasers suffer from regardless any improvement.

In addition, prior art also teaches how and why conventional resonators control transverse spatial cavity modes, both for macroscopic and microscopic optical systems. Further, at scales associated with microscopic optical systems, which include single mode optical fiber, semiconductor gain-media, and "Micro-Opto-Electro-Mechanical-System" (MOEMS) devices, transverse spatial cavity mode control can dictate many system design variables.

Typically, the low-order fundamental transverse mode operation is desired in laser diode devices, this is due to the optical beam spatial profile requirements for long distance beam propagation, the focusing of laser-emission-output beams into small spots, and laser-emission-output beam coupling into single mode transmission fibers.

In addition, prior art also teaches that the different transverse spatial cavity modes of an optical resonator will typically have different resonant optical frequencies, which is characteristically detrimental for both active and passive cavity applications requiring spectral purity. A typical application requiring spectral purity of resonator operation is the application of spectral monitoring of the optical communications signals being manipulated by "Wavelength-Division-Multiplexed" (WDM) optical transmission equipment, using tunable Fabry-Perot filters.

Moreover, prior art teaches that for active cavity devices, such as EEL semiconductor laser diodes, the transverse spatial cavity mode problem is addressed by the judicious design of the laser waveguide to ensure that it supports only a single fundamental transverse cavity mode.

In addition, prior art teaches that for VCSELs, oxide confining layers, and other aperturing techniques are used to achieve single transverse cavity mode operation in small aperture devices. Problems begin to arise, however, when we try to design high-powered laser-emission-output capable VCSELs; wherein, a contradictory contention arises between the desire to increase modal volume and beam diameter size, and the desire to suppress oscillation of the higher-order transverse cavity modes.

Typically, an oxymoron for designers and engineers alike. Further, prior art teaches that for passive cavity devices, the transverse spatial mode problem is more intractable, since the high-degree of freedom associated with the design of the gain-medium is not present. One solution is to incorporate a single mode optical fiber into the design. The inclusion of optical fiber, however, tends to complicate device integration, creates fiber-coupling requirements, and does not resolve all of the spatial cavity mode problems present.

In addition, prior art also teaches a related solution to controlling the transverse "Side Mode Suppression Ratio" (SMSR), which contemplates the use of intracavity apertures or spatial filters. Further, higher-order spatial cavity modes generally have larger mode field diameters than do the lower-order fundamental transverse modes such as $TEM_{00}$. Wherein, apertures in an optical train can induce loss for the higher-order transverse cavity modes, and may be used to improve the laser diode's side-mode suppression. These spatial filters, however, can also introduce loss for the fundamental transverse spatial modes as well, and therefore require precise alignment.

In addition, prior art teaches another solution concerning cavity design. Whereby, in a confocal Fabry-Perot cavity, where cavity length is equal to the mirror radius of curvature, all trans-verse modes are degenerate, i.e. all the transverse spatial modes coexist on the same frequencies, or wavelengths, as the longitudinal mode frequencies, or the longitudinal mode frequencies shifted by a half spectral period.

Furthermore, MOEMS comprise micro-optical cavities that typically have large free spectral ranges, or spectral periods, corresponding to small cavity lengths of only tens of micrometers. Therefore, as prior art suggests, a confocal MOEMS micro-cavity configuration would require mirrors with correspondingly small radii of curvature (i.e., tens of micrometers), which are difficult to fabricate and have small cavity mode sizes, which are also difficult to align. Further, a more typical, and probably a more feasible configuration used by MOEMS would be a tunable-filter based Fabry-Perot cavity that utilizes a hemispherical cavity configuration.

Moreover, in such cavities, one of two reflectors is near planar and the other reflector is a spherical in shape. The advantage here is reduced alignment criticalities; this is because of the general radial homogeneity contributed by the near planar reflector. Further, in such configurations, spatial mode spectral degeneracy is not present, and any higher-order transverse cavity modes present themselves as only a few spurious peaks, which are observed in the filter transmission spectrum.

Moreover, prior art further teaches that these problems have led to solutions that focus on minimizing the excitation of higher-order modes by precise control of how light is launched into the laser diode's cavity. For example, please see—U.S. patent application Ser. No. 09/666,194, filed on 21 Sep., (2000), by Jeffrey A. Korn, and U.S. patent application Ser. No. 09/747,580, filed 22 Dec., (2000), by Walid A. Atia et al., which are disclosures that concern, in part, an alignment of a tunable filter relative to the surrounding optical train.

For more details, please see—U.S. patent application Ser. No. 09/809,667, filed on the 15 of Mar. (2001), by Jeffrey A. Korn, which discloses, in part, a mode field matching between the launch light mode and the lowest-order spatial transverse cavity mode of the filter. Further, such design approaches minimize excitation of higher-order transverse spatial cavity modes and thus, yield systems with better side-mode suppression ratios.

In conclusion, prior art clearly shows that the SEL based semiconductor laser diodes as described above, as described in the included materials, and mentions, while in some cases might provide for low-order fundamental transverse spatial cavity mode laser-emission-output, they all typically suffer from three major performance issues:

Because they do not neutralize the phase perturbations contributed by spontaneous emission to resonance, the laser-emission-output remains unstable manifesting multiple instabilities (e.g., spatial mode hopping, spectral mode hopping, polarity switching, high threshold currents, filamentation, multi-transverse operation at threshold, multi-longitudinal operation at threshold, spatial hole burning, spectral hole burning, low-power laser-emission-output, overall degradation of laser diode performance, and single low-order fundamental transverse spatial cavity mode being virtually unattainable over a wide range of power levels;

Because the solutions described above and in the included references focus on introducing loss for high-order transverse spatial cavity modes, the overall power performance of the laser diode is seriously degraded to the point where these laser diodes only produce around 2-mW to 3-mW of laser-emission-output power and therefore, not applicable for most current high-valued application; e.g., applications such as optical Telecommunication and Data transmission; and Because these devices (mostly EELs) suffer from intracavity pulse-broadened dispersion (i.e., chirp) they have reached their internal limits for data modulation and therefore, can not transmit data any faster than just a few Gigabits/ps. Consequently, this limits them to low-valued applications; e.g., such as multimode fiber optic LANs, fiber channel interconnects, and other non-proprietary Datacom and Enterprise based application.

Consequently, my OPCLD invention, by using an optical "Phase Conjugation Mirror" (PCM) in place of the more conventional "Cleaved Facet" (CF), "Distributed Bragg Reflection" (DBR), and "Distributed Feed-Back" (DFB) mirror designs typically used by VCSELs, VECSELs, EELs, and BAID devices, it successfully neutralizes phase perturbations that being the root cause of performance degradation and the laser-emission-output instabilities that regularly manifest themselves in all current semiconductor laser diodes as higher threshold currents, low-power laser-emission-output, unstable spatial cavity modes, unstable spectral cavity modes, instability of polarity for laser-emission-output, filamentation, and COD.

OBJECTS AND ADVANTAGES

Accordingly, besides the objects and advantages of the Optical Phase Conjugation Laser Diode as described above, several objects, and advantages of my OPCLD invention are:

To achieve the forgoing objects, and in accordance with one aspect of my OPCLD invention as embodied and broadly described herein, a laser system for generating a laser beam from a semiconductor laser diode is provided, which improves or enhances the overall beam quality of broad-area gain semiconductor laser diodes, more specifically to provide for a system and method for generating high-power laser-emission-output that is free from spatial mode instability, spectral mode instability, filamentation, and COD;

Another object of my OPCLD invention is to provide for a monolithically manufactured semiconductor laser diode system, which decreases the expense and the difficulties associated with the manufacturing and assembly of various conventional external cavity mirrors and lenses used to provide optical feedback for current "Vertical Extended Cavity Surface Emitting Laser" (VECSEL) diodes;

Another object of my OPCLD invention is to provide for an optical phase conjugating resonate cavity, which provides for a high-power laser-emission output into a single fundamental transverse spatial cavity mode;

Another object of my OPCLD invention is to provide for a laser-emission-output mirror having a curved Gaussian profile promoting geometry, such as a confocal, a convex, or a spherical shape, which is monolithically formed at a predetermined distance from the gain-region. Further, because the invention utilizes a PCM as its primary reflector, the curved Gaussian profile promoting output mirror can be monolithically formed into any partial Gaussian, near-Gaussian, or super-Gaussian geometry, designed to select from an infinite number of cavity modes possible, any one particular transverse cavity mode for lasing. Consequently, for PCM based resonators there is no such thing as an unstable cavity mode, regardless the cavity length, the laser-emission-output mirror's radii of curvature, shape, or diameter, a particular transverse cavity mode's phase sufficiently replicates itself at the laser-emission-output mirror's reflective surface each and every round trip through my OPCLD invention's resonator;

Another object of my OPCLD invention is to provide for a confocal Fabry-Perot cavity, where cavity length does not have to equal the mirror radius of curvature for all transverse spatial cavity modes to become degenerate. More succinctly, for the OPCLD, all transverse spatial cavity modes will coexist on the same frequencies, or wavelengths, as the longitudinal spectral cavity mode frequencies, or the longitudinal mode frequencies shifted by a half spectral period, regardless any cavity length chosen for the OPCLD;

Another object of my OPCLD invention is to provide for a Gaussian profile promoting laser-emission output mirror, which is a monolithically integrated into my OPCLD invention as a digital Fresnel mirror and/or Fresnel lens having an etched location adjacent to and centered upon my OPCLD invention's semiconductor gain-region. Wherein, the digital Fresnel mirror and/or Fresnel lens has a Gaussian profile promoting surface-relief area that lays contiguous with the laser diode's gain-region, such that laser-emission-output passing there through has an intensity profile that is substantially Gaussian shaped. Moreover, the Gaussian profile promoting surface-relief area is formed using grey-scale masking and chemical lithography (e.g., two versions of grey-scale mask making and lithographic etching are described in U.S. Pat. No. 5,480,764, and U.S. Pat. No. 6,071,652) to etch out the desired surface relief areas from either and/or an epilayer of deposited material or from the semiconductor material that comprises my OPCLD invention's substrate wafer;

Another object of my OPCLD invention is to provide for an optical phase conjugation laser diode resonating cavity, which is capable of neutralizing the phase perturbating contribution of intracavity spontaneous emission. This optical phase conjugating cavity will include a semiconductor laser diode structure having at least one active gain-region, a total retro-reflecting phase-reversing PCM, a partial reflecting DBR, and a partial transmitting Gaussian profile promoting laser-emission-output mirror. Wherein, a retro-reflected phase conjugate pulse of an incoming fundamental intracavity laser-emission is directed at a laser-emission-output reflector, resulting in a filament free laser-emission-output having a substantially Gaussian shaped low-order fundamental transverse cavity mode (i.e., preferably $TEM_{00}$) intensity profile;

Another object of my OPCLD invention is to provide for a method of intracavity optical phase conjugation that neutralizes the arbitrary intracavity phase perturbations that cause filamentation to form within the laser-emission-output, which in turn provides for a stable high-power laser emission with output levels ranging between 20-mW to 2-W;

Another object of my OPCLD invention is to provide for a method of intracavity optical phase conjugation that neutralizes the arbitrary intracavity phase perturbations that cause COD, which in turn provides for a stable high-power laser-emission-output into a single low-order fundamental transverse cavity mode;

Another object of my OPCLD invention is to provide for a method of intracavity optical phase conjugation that neutralizes the arbitrary intracavity phase perturbations that cause spectral mode instabilities to form within the laser-emission-output, which in turn provides for a homogeneously broadened gain and a very narrow linewidth for the laser-emission-output;

Another object of my OPCLD invention is to provide for a method of intracavity optical phase conjugation that neutralizes the arbitrary intracavity phase perturbations that cause spatial mode instabilities to form within the laser-emission-output, which in turn provides for a stable high-power laser-emission-output into a single fundamental transverse spatial cavity mode;

Another object of my OPCLD invention is to provide for a method of intracavity optical phase conjugation that neutralizes the arbitrary intracavity perturbations that cause instabilities in polarity to form within the laser-emission-output, which in turn provides for a stable linearly polarized high-power laser-emission-output;

Another object of my OPCLD invention is to provide for a method of intracavity optical phase conjugation that reverses the effects that chirp (i.e., sometimes called pulse broadening dispersion) has on resonance, which in turn provides for a chirp reversing resonator design solution capable of at least 20-Gigabits/ps of bandwidth (i.e., double what current VCSELs provide) for internally modulated data transmission over fiber-optic cable;

Another object of my OPCLD invention is to provide for a semiconductor laser diode that eliminates expensive epitaxial deposition associated with the manufacturing of a primary total reflection quarter-wave DBR mirror-stack, which typically comprises of hundreds of alternating quarterwave plates that are constructed from lattice-matched refractive contrasting semiconductor material, and replacing it with a retro-reflecting phase-reversing array of polyhedral shaped prisms, which are simultaneously constructed, using grey-scale lithography, from either a single epilayer of deposited semiconductor material, or constructed from the semiconductor material used to comprise the OPCLD invention's substrate wafer;

Another object of my OPCLD invention is to provide for a semiconductor laser diode that uses gradiently doped spacer-layers to provide for confinement of both injected carriers and excited emission photons to the invention's active-region, which in turn increases laser-emission-output that exhibits a much narrower line-width;

Another object of my OPCLD invention is to provide for a semiconductor laser diode that produces more effective output gain by using two gradiently doped spacer-layers to lower the heat produced by series electrical resistance at the material interface that typically lays between Ohmic contacts, Ohmic contact-layers, and the N or P doped spacer-layers that typically sandwich a gain-region;

Another object of my OPCLD invention is to provide for a semiconductor laser diode that can be configured and utilized as an independently addressable laser device;

Another object of my OPCLD invention is to provide for a semiconductor laser diode that can be configured and utilized in a array of laser diodes, which is comprised as having a multitude of individual laser diodes that are each individually addressable, or altogether, addressable as a group (laser diode array), e.g. such as in an phased locked array of OPCLD devices, which are altogether capable of high-power laser-emission-output into a single fundamental transverse cavity mode;

Another object of my OPCLD invention is to provide for a semiconductor laser diode and/or laser diode array and integrated circuit package, which is manufactured from the same semiconductor material used to construct laser transmission, internal data-modulation, signal processing and amplifying, and photo-detection, data-receiving driver circuitry, all of which would be integrated into single circuit device packages;

Another object of my OPCLD invention is to provide for a semiconductor laser diode that uses an optical material, such as "Lithium-Fluoride" (LiF) to construct a total internal reflection optical-cladding barrier that also gives added support and protection for every individual prism element that comprises my OPCLD invention's retro-reflecting phase-reversing PCM;

Another object of my OPCLD invention is to provide for a semiconductor laser diode that can increase its modal discrimination by extending its optical-cavity length, using a polyhedral shaped prism waveguide array (i.e., the PCM) to transversely redirect intra-cavity produced laser emission into areas of the gain-region previously un-stimulated;

Another object of my OPCLD invention is to provide for a semiconductor laser diode that can increase its modal discrimination, using a process of total internal-reflection to redirect intra-cavity produced light out of its normal longitudinal propagation into a first transverse propagation, then next into a second transverse propagation, then next into a third transverse propagation, and then finally into a longitudinal, but reversed propagation, which will effectively increase diffraction loss for higher-orders of transverse modes light, while sufficiently increasing gain to preferably a single fundamental transverse cavity mode, causing it to undergo amplification as the laser-emission-output;

Another object of my OPCLD invention is to provide for a semiconductor laser diode that can produce filament free high-power laser-emission-output (i.e., determined by gain-region volume size $l \times h \times N_{th}$ of quantum-wells between 20-mW and 2-Watts) into a single low-order fundamental transverse cavity mode;

Another object of my OPCLD invention is to provide for an improved phased array semiconductor laser diode that provides for the desired fundamental supermode operation, while utilizing a more streamline structural configuration that is much simpler to fabricate, using only a three-step grey-scale lithography based monolithic etch;

Another object of my OPCLD invention is to provide for an broad area surface emitting laser diode apparatus that can utilize many different kinds semiconductor laser-active materials in its gain-region to provide for laser-emission wavelengths yet unrealized by the VCSEL diode and other similar laser diodes.

Further objects and advantages will provide for an OPCLD technology, wherein the selection of one semiconductor and/or optical material over another for use in the construction of the OPCLD's gain-region, a retro-reflecting corner-cube prism array based PCM, a multilayered quarter-wave mirror-stack assembly, and a Gaussian mode providing curved shaped laser-emission-output mirror is determined by any particular application's need for a wavelength specific laser-emission-output and is not determined by cavity geometrics or any other structural criteria.

Therefore, the choice to use one semiconductor and/or optical material over another for the construction of my OPCLD invention was presented only as an example. Because, my OPCLD invention has replaced the primary DBR normally used in the VCSEL with an array of retro-reflecting corner-cube prisms comprised as PCM, it can utilize any semiconductor regime of material made available for epilayered deposition.

BRIEF SUMMARY OF THE INVENTION

According to my OPCLD invention, there is provided a semiconductor laser diode apparatus that comprises a PCM based first reflector means formed from an array of retro-reflecting hexagon apertured hexagonal shaped corner-cube prisms, a first hetero-junction configured gain-region means formed from a multitude of quantum-well and barrier layers, a DBR based second reflector means formed from a multitude of quarter-wave mirror-pairs, a Gaussian mode based third reflector means formed from a single layer of semiconductor or optical material into a hemispherical curved shaped laser-emission-output end mirror. My OPCLD invention comprises a PCR that utilizes a PCM to provide for optical phase conjugation, which neutralizes the phase perturbations contributed by spontaneous-emission, acoustic phonons, quantum-noise, gain-saturation, diffraction, and other intracavity aberrations and distortions that altogether destabilize the stimulated-emission that is undergoing amplifying oscillation within the PCR. Resulting in a laser diode apparatus capable of stable high-power laser-emission-output into a single low-order fundamental transverse spatial cavity mode, and reversal of intra-cavity chirp resulting in high-speed internal modulation that produces a data signal of around 20-Gigabits/ps, which is double the bandwidth that current single-mode VCSELs can provide.

BRIEF DESCRIPTION OF THE SEVERAL VIEWS OF THE DRAWINGS

Still further objects and advantages will become more apparent from a consideration of the ensuing Figure descriptions and drawings. In the drawings, closely related Figures have the same number but different alphabetic suffixes:

FIG. 2A is an auxiliary top plan-view illustration of the first design configuration of my OPCLD invention, which is shown as comprising an overall square shaped structure, two metal contact runs plus two metal contact pads, and a corner-cube array based PCM.

FIG. 3A is an auxiliary bottom plan-view illustration of the first design configuration of my OPCLD invention, which is shown as comprising substrate member etched using grey-scale lithography to have a Gaussian mode providing curved shaped laser-emission-output mirror.

FIG. 5A is an auxiliary top plan-view illustration of the second design configuration of my OPCLD invention, which is shown as comprising a round shaped structure, a doughnut shaped metal contact, and a Gaussian mode providing curved shaped laser-emission-output mirror.

FIG. 6A is an auxiliary bottom plan-view illustration of the second design configuration of my OPCLD invention, which is shown as comprising a round shaped structure, a peripheral surrounding metal contact, and a hemispherical shaped corner-cube array based PCM.

FIG. 8 is a top plan-view illustration of the third design configuration of my OPCLD invention, which is shown as comprising two metal contact runs, and an undoped corner-cube array based PCM.

FIG. 8A is an auxiliary top plan-view illustration of the third design configuration of my OPCLD invention, which is shown as comprising an overall square shaped structure, two metal contact runs plus two metal contact pads, and an undoped corner-cube array based PCM.

FIG. 9 is a bottom plan-view illustration of the third design configuration of my OPCLD invention, which is shown as comprising an undoped substrate member, an undoped substrate member, and a Fresnel shaped laser-emission-output mirror.

FIG. 9A is an auxiliary bottom plan-view illustration of the third design configuration of my OPCLD invention, which is shown as comprising an overall square shaped structure, and an undoped substrate member, and a Fresnel shaped laser-emission-output mirror.

FIG. 11A is an auxiliary top plan-view illustration of the fourth design configuration of my OPCLD invention, which is shown as comprising an overall round shaped structure, a trench deposited doughnut shaped metal contact, and an undoped Gaussian mode providing Fresnel based laser-emission-output mirror.

FIG. 12A is an auxiliary bottom plan-view illustration of the fourth design configuration of my OPCLD invention, which is shown as comprising an overall round shaped structure, a doped substrate member, and an undoped corner-cube array based PCM.

FIG. 14A is an auxiliary top plan-view of the fifth design configuration of my OPCLD invention, which is shown as comprising an overall round shaped structure, a doughnut shaped metal contact, a peripheral surrounding metal contact ring, and an undoped corner-cube array based PCM.

FIG. 15A is an auxiliary bottom plan-view illustration of the fifth design configuration of my OPCLD invention, which is shown as comprising an overall round shaped structure, a peripheral surrounding metal contact ring, a doped Gaussian mode providing Fresnel based laser-emission-output mirror and one metal contact.

FIG. 17A is an auxiliary top plan-view illustration of the sixth design configuration of my OPCLD invention, which is shown as comprising a doughnut shaped metal contact, a parameter surrounding metal contact ring, and an undoped Gaussian mode providing convex shaped DBR based laser-emission-output mirror.

FIG. 18A is a bottom plan-view illustration of the sixth design configuration of my OPCLD invention, which is shown as comprising the corner-cube array based PCM, and a parameter surrounding metal contact ring.

FIG. 20A is an auxiliary top plan-view illustration of the seventh and preferred design configuration of my OPCLD invention, which is shown as comprising a overall circular shape, a doughnut shaped metal contact, a peripheral surrounding metal contact ring, and a Gaussian mode providing curved laser-emission output-mirror.

FIG. 21A is a bottom plan-view illustration of the seventh and preferred design configuration of my OPCLD invention, which is shown as comprising a doped substrate member, an undoped corner-cube array based PCM, a doped epilayered gain-region, a first undoped DBR based mirror-stack assembly, a second undoped DBR based mirror-stack assembly configured to have a convex shaped profile, a highly ++doped hemispheric shaped current guiding member, a highly ++ doped current guiding doughnut shaped member, a undoped collimating lens, a trench deposited doughnut shaped metal contact, a peripheral surrounding metal contact ring, and a Gaussian mode providing curved shaped laser-emission-output mirror.

FIG. 23 is a top plan-view illustration of the eighth design configuration of my OPCLD invention, which is shown as comprising a doughnut shaped metal contact, and a Gaussian shaped-mode providing curved laser-emission output-mirror.

FIG. 23A is an auxiliary top plan-view illustration of the eighth design configuration of my OPCLD invention, which is shown as comprising a doughnut shaped metal contact, a peripheral surrounding metal contact ring, and a Gaussian mode providing curved shaped laser-emission-output mirror.

FIG. 24 is a bottom plan-view illustration of the eighth design configuration of my OPCLD invention, which is shown as comprising a corner-cube array based PCM.

FIG. 24A is an auxiliary bottom plan-view illustration of the eighth design configuration of my OPCLD invention, which is shown as comprising a peripheral surrounding metal contact ring, and a corner-cube array based PCM.

FIG. 26 is a Section A-A side-view illustration of a single hexagon shaped corner-cube retro-reflecting prism, which is shown along with the mathematical symbols used to describe its solid geometry.

FIG. 26A is a three dimensional illustration of a single hexagon shaped corner-cube retro-reflecting prism, which is shown along with the relative high and the relative low locations of the vertices that define its angled surface geometry.

FIG. 26B is a plan-view illustration of a single hexagon shaped corner-cube retro-reflecting prism, which is shown along with the relative high and the relative low locations of the vertices that define its angled surface geometry.

FIG. 27 is a plan-view illustration of a corner-cube array shown as comprising seven hexagon shaped corner-cube retro-reflecting prisms.

FIG. 27A is a section side-view illustration of the longitudinal geometry of eight hexagon shaped corner-cube retro-reflecting prisms, which is shown along with a Gaussian shaped envelope of an incoming wavefront.

FIG. 27B is a section side-view illustration of the longitudinal geometry of eight hexagon shaped corner-cube retro-reflecting prisms, which is shown along with a Gaussian shaped envelope of an incoming wavefront and its outgoing phase-reversed pseudo-conjugate.

FIG. 30 is a Section A-A side-view illustration of a single dome shaped retro-reflecting mirror, which is shown along with the mathematical symbols used to describe its solid geometry.

FIG. 30A is a three dimensional illustration of a single dome shaped retro-reflecting structure.

FIG. 30B is a plan-view illustration of a single dome shaped retro-reflecting mirror.

FIG. 31 is a plan-view illustration of an array of dome shaped reflectors shown as comprising seven dome shaped retro-reflecting mirrors.

FIG. 31A is a section side-view illustration of the longitudinal geometry of eight dome shaped retro-reflecting mirrors, which is shown along with a Gaussian shaped envelope of an incoming wavefront.

FIG. 31B is a section side-view illustration of the longitudinal geometry of eight dome shaped retro-reflecting mirrors, which is shown along with a Gaussian shaped envelope of an incoming wavefront and its outgoing phase-reversed pseudo-conjugate.

FIG. 35 is a Section A-A side-view illustration of a single roof shaped retro-reflecting prism, which is shown along with the mathematical symbols used to describe its geometry.

FIG. 35A is a three dimensional illustration of a single roof shaped retro-reflecting prism.

FIG. 35B is a plan-view illustration of a single roof shaped retro-reflecting mirror.

FIG. 36 is a plan-view illustration of a roof shaped retro-reflecting array, which comprises of fifteen roof shaped retro-reflecting prisms.

FIG. 36A is a section side-view used to illustrate the longitudinal geometry of an array of six roof shaped retro-reflecting prisms, which is shown along with a Gaussian shaped envelope of an incoming wavefront.

FIG. 36B is a section side-view used to illustrate the longitudinal geometry of an array of six roof shaped retro-reflecting prisms, which is shown along with a Gaussian shaped envelope of an incoming wavefront and its outgoing phase-reversed pseudo-conjugate.

FIG. 39 is a Section A-A side-view illustration of a single tetragon shaped corner-cube retro-reflecting prism, which is shown along with the mathematical symbols used to describe its solid geometry.

FIG. 39A is a three dimensional illustration of a single tetragon shaped corner-cube retro-reflecting prism.

FIG. 39B is a plan-view illustration of a small array of six tetragon shaped corner-cube retro-reflecting prisms.

FIG. 40 is a plan-view illustration of an array of forty-two tetragon shaped corner-cube retro-reflecting prisms.

FIG. 40A is a section side-view that illustrates the longitudinal geometry of an array of eight tetragon shaped corner-cube retro-reflecting prisms, which is shown along with a Gaussian shaped envelope of an incoming wavefront.

FIG. 40B is a section side-view that illustrates the longitudinal geometry of an array of eight tetragon shaped corner-cube retro-reflecting prisms, which is shown along with a Gaussian shaped envelope of an incoming wavefront and its outgoing phase-reversed pseudo-conjugate.

FIG. 43 is a Section A-A side-view illustration of a single cone shaped retro-reflecting prism, which is shown along with the mathematical symbols used to describe its solid geometry.

FIG. 43A is a three dimensional illustration of a single cone shaped retro-reflecting prism.

FIG. 43B is a plan-view illustration of a single cone shaped retro-reflecting prism.

FIG. 44 is a plan-view illustration of an array of seven cone shaped retro-reflecting prisms.

FIG. 44A is a section side-view that illustrates the longitudinal geometry of an array of eight cone shaped retro-reflecting prisms, which is shown along with a Gaussian shaped envelope of an incoming wavefront.

FIG. 44B is a section side-view that illustrates the longitudinal geometry of an array of eight cone shaped retro-reflecting prisms, which is shown along with a Gaussian shaped envelope of an incoming wavefront and its outgoing phase-reversed pseudo-conjugate.

FIG. 47 is a Section A-A side-view illustration of a single tetragon shaped corner-cube retro-reflecting prism, which is shown along with the mathematical symbols used to describe its solid geometry.

FIG. 47A is a three dimensional illustration of a single tetragon shaped corner-cube retro-reflecting prism.

FIG. 48 is a Section B-B side-view illustration of a single hexagon shaped corner-cube retro-reflecting prism, which is shown along with mathematical symbols used to describe its solid geometry.

FIG. 48A is a three dimensional illustration of a single hexagon shaped corner-cube retro-reflecting prism.

FIG. 49 is a plan-view illustration of a combined array of twelve tetragon shaped and seven hexagon shaped corner-cube retro-reflecting prisms.

FIG. 49A is a plan-view illustration of a single hexagon shaped corner-cube and six tetragon shaped corner-cube retro-reflecting prisms.

FIG. 49B is a sectional side-view illustration of ten tetragon corner-cube retro-reflecting prisms.

FIG. 50 is a plan-view illustration of a combined array of tetragon shaped corner-cube and hexagon shaped corner-cube retro-reflecting prisms, which are altogether used to comprise a phase-locking alternate version of the OPCLD's PCM, which is shown along with an on-axis laser-beam intensity waistband distribution profile and location.

FIG. 51 is a Section A-A side-view illustration of a single tetragon shaped corner-cube retro-reflecting prism, which is shown along with the mathematical symbols used to describe its solid geometry.

FIG. 51A is a three dimensional illustration of a single tetragon shaped corner-cube retro-reflecting prism.

FIG. 52 is a Section B-B side-view illustration of a single hexagon shaped corner-cube retro-reflecting prism, which is shown along with the mathematical symbols used to describe its solid geometry.

FIG. 52A is a three dimensional illustration of a single hexagon shaped corner-cube retro-reflecting prism.

FIG. 53 is a plan-view illustration of a combined array of thirty-six tetragon shaped corner-cube and one hexagon shaped corner-cube retro-reflecting prisms.

FIG. 53A is a plan-view illustration of eighteen tetragon shaped corner-cube retro-reflecting prisms, which are shown as surrounding one hexagon shaped corner-cube retro-reflecting prism.

FIG. 53B is a sectional side-view illustration of sixteen tetragon shaped corner-cube retro-reflecting prisms.

FIG. 55 is a Section A-A side-view illustration of a single hexagon apertured pyramid shaped retro-reflecting prism, which is shown along with the mathematical symbols used to describe its solid geometry.

FIG. 55A is a three dimensional illustration of a single hexagon apertured pyramid shaped retro-reflecting prism.

FIG. 56 is a Section B-B side-view illustration of a single hexagon shaped corner-cube retro-reflecting prism, which is shown along with the mathematical symbols used to describe its solid geometry.

FIG. 56A is a three dimensional illustration of a single hexagon shaped corner-cube retro-reflecting prism.

FIG. 57 is a plan-view illustration of a combined array of four hexagon shaped corner-cube retro-reflecting prisms, and three-hexagon apertured pyramid shaped retro-reflecting prisms.

FIG. 57A is a plan-view illustration of one hexagon shaped corner-cube retro-reflecting prism and two-hexagon apertured pyramid shaped retro-reflecting prisms.

FIG. 57B is a sectional side-view illustration of ten hexagon shaped corner-cube retro-reflecting prisms.

FIG. 59 is a Section A-A side-view illustration of a single tetragon shaped corner-cube retro-reflecting prism, which is shown along with the mathematical symbols used to describe its solid geometry.

FIG. 59A is a three dimensional illustration of a single tetragon shaped corner-cube retro-reflecting prism.

FIG. 60 is a Section B-B side-view illustration of a single hexagon shaped corner-cube retro-reflecting prism, which is shown along with the mathematical symbols used to describe its solid geometry.

FIG. 60A is a three dimensional illustration of a single hexagon shaped corner-cube retro-reflecting prism.

FIG. 61 is a plan-view illustration of a combined array of three hexagon shaped corner-cube retro-reflecting prisms and twenty-four tetragon shaped corner-cube retro-reflecting prisms.

FIG. 61A is a plan-view illustration of a hexagon shaped corner-cube retro-reflecting prism and twelve tetragon shaped corner-cube retro-reflecting prisms.

FIG. 61B is a sectional side-view illustration of ten hexagon shaped corner-cube retro-reflecting prisms.

FIG. 63 is a Section A-A side-view illustration of a single hexagon apertured pyramid shaped retro-reflecting prism, which is shown along with the mathematical symbols used to describe its solid geometry.

FIG. 63A is a three dimensional illustration of a single hexagon apertured pyramid shaped retro-reflecting prism.

FIG. 64 is a Section B-B side-view illustration of a single tetragon shaped corner-cube retro-reflecting prism, which is shown along with the mathematical symbols used to describe its solid geometry.

FIG. 64A is a three dimensional illustration of a single tetragon shaped corner-cube retro-reflecting prism.

FIG. 65 is a plan-view illustration of a combined array of three hexagon apertured pyramid shaped retro-reflecting prisms and twenty-four tetragon shaped corner-cube retro-reflecting prisms.

FIG. 65A is a plan-view illustration of a single hexagon apertured pyramid shaped retro-reflecting prism and twelve tetragon shaped corner-cube retro-reflecting prisms.

FIG. 65B is a sectional side-view illustration of ten tetragon shaped corner-cube retro-reflecting prisms.

FIG. 66 is a plan-view illustration of a combined very-large array of tetragon shaped corner-cube retro-reflecting prisms and hexagon aperturing pyramid shaped retro-reflecting six sided prisms, which are altogether used to comprise a phase-locking alternate version of the OPCLD's PCM.

FIG. 66A is a plan-view illustration of patterned phase-grating or diffraction-grating.

FIG. 66B is a combined illustration of a block diagram and mathematical formula for a Fresnel waveguide source.

FIG. 66C is a side-view illustration of a patterned phase grating or diffraction grating.

FIG. 67 is a block diagram that illustrates a first step used to create both the OPCLD's PCM and Gaussian mode providing curved shaped laser-emission-output mirror using grey-scale masking and photo-lithographically to chemically etch both the OPCLD's PCM and laser-emission-output mirror.

FIG. 68 is a block diagram that illustrates a second step used to create both the OPCLD's PCM and Gaussian mode providing curved shaped laser-emission-output mirror; moreover, this second step involves the use of an "Ultra Violet" (UV) light source, which is used to expose the unmasked areas of photo-resist material present on the surface of an OPCLD's substrate wafer.

Figure 69:
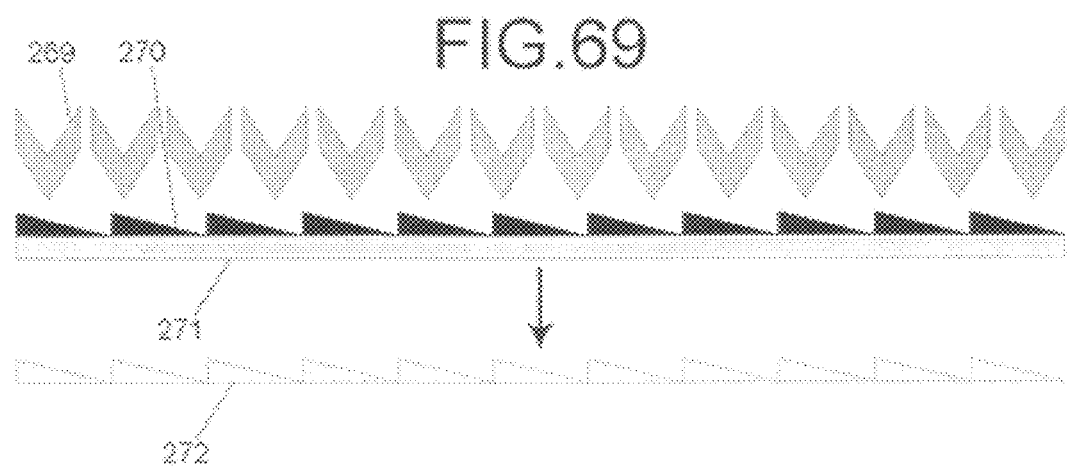

FIG. 69 is a block diagram that illustrates a third step used to create both the OPCLD's PCM and Gaussian mode providing curved shaped laser-emission-output mirror; moreover, this third step involves the use of chemical etching, which is used to form the complex three dimensional corner-cube and curved shaped geometries that comprise the OPCLD's PCM and Gaussian providing laser-emission-output mirror.

Figure 70:
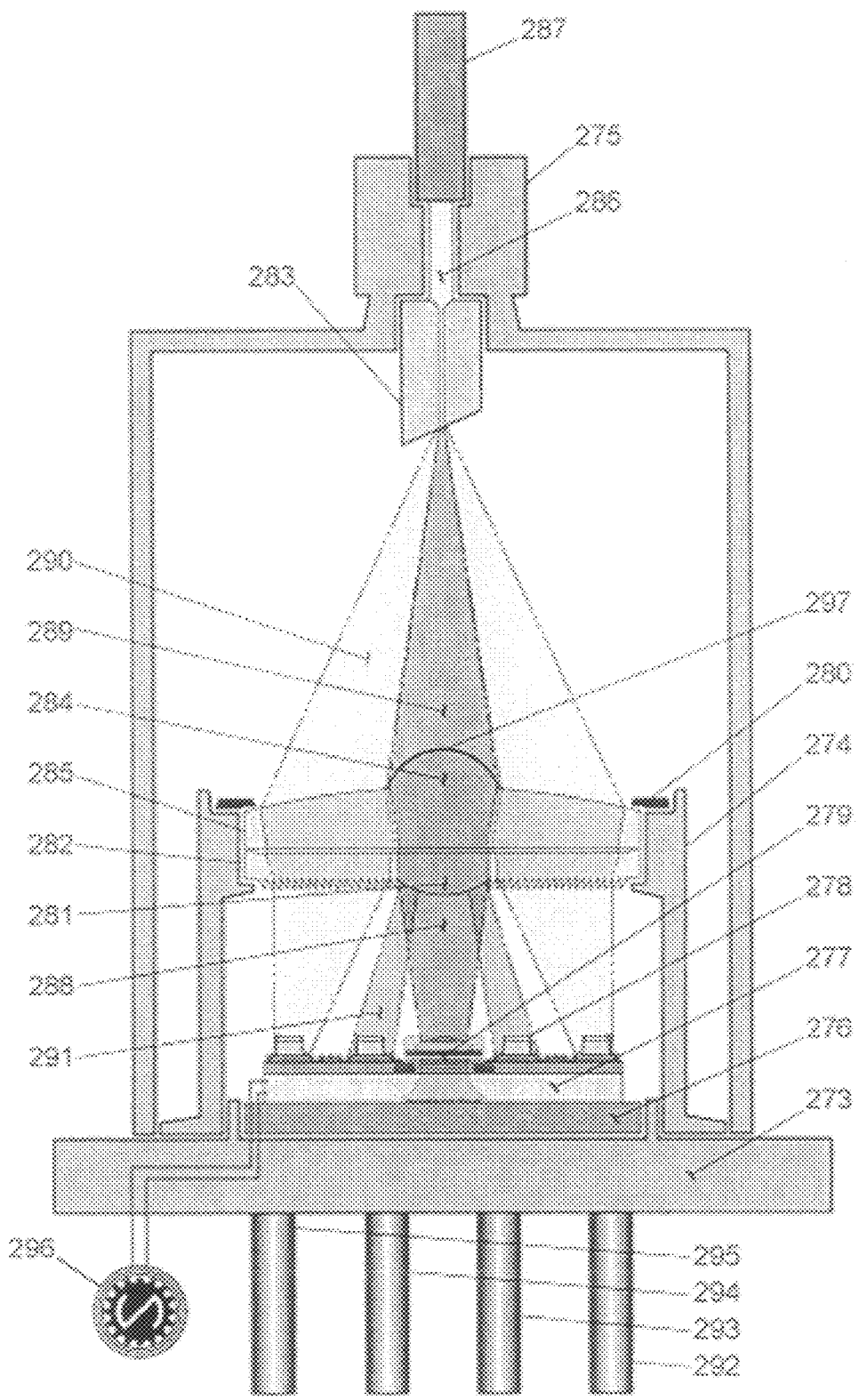

FIG. 70 is a sectional side-view illustration of a combination "Photo Diode" (PD) and "Optical Phase Conjugation Laser Diode" (OPCLD) transceiver package, which comprises an outer housing, a inner housing for suspending and positioning optics, transceiver module, collimating lens, coupling light to fiber lens, coupling light photo-detector lens, diffraction lens, circuit posts, and connected fiber pigtail.

FIG. 71 is a sectional side-view illustration of a combination PIN Photo Detector and OPCLD transceiver module that is altogether monolithically constructed from the same epitaxially deposited material.

FIG. 72 is a sectional side-view illustration of a combination Field Effect Transistor and OPCLD transceiver module that is altogether monolithically constructed from the same epitaxially deposited material.

Figure 73:
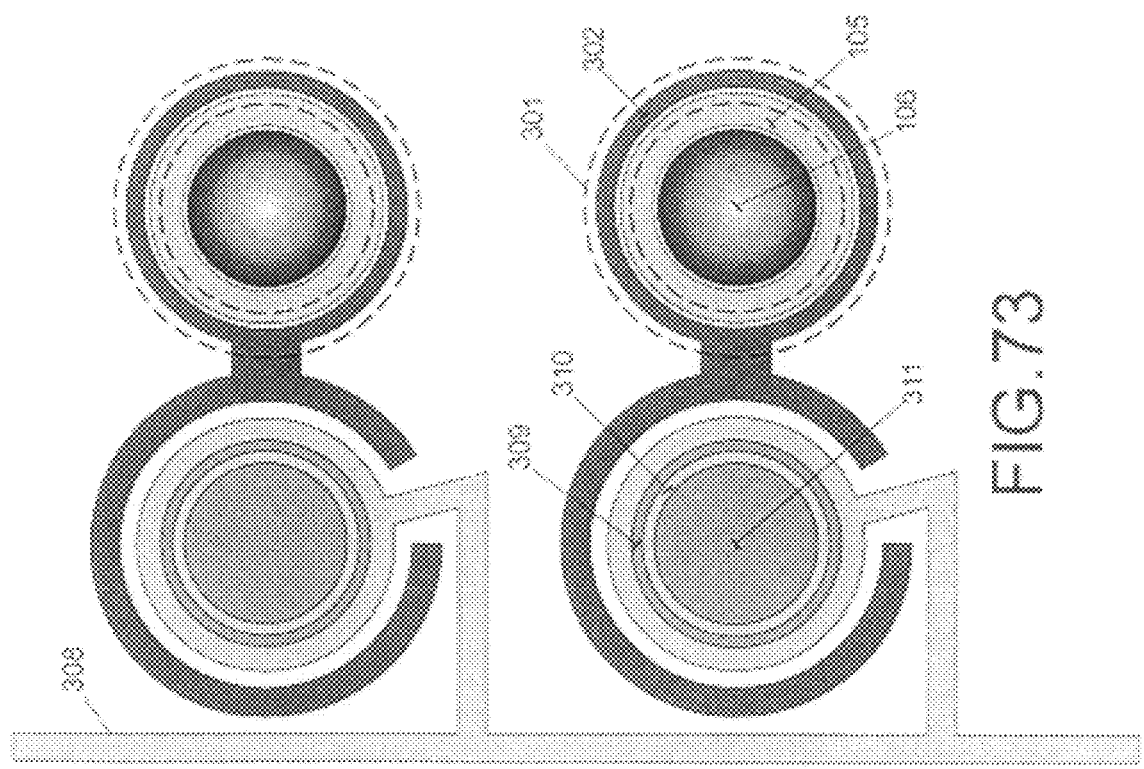

FIG. 73 is a top plan-view illustration of a combination PIN Photo Detector and OPCLD transceiver module that is altogether monolithically constructed from the same epitaxially deposited material.

Figure 74:
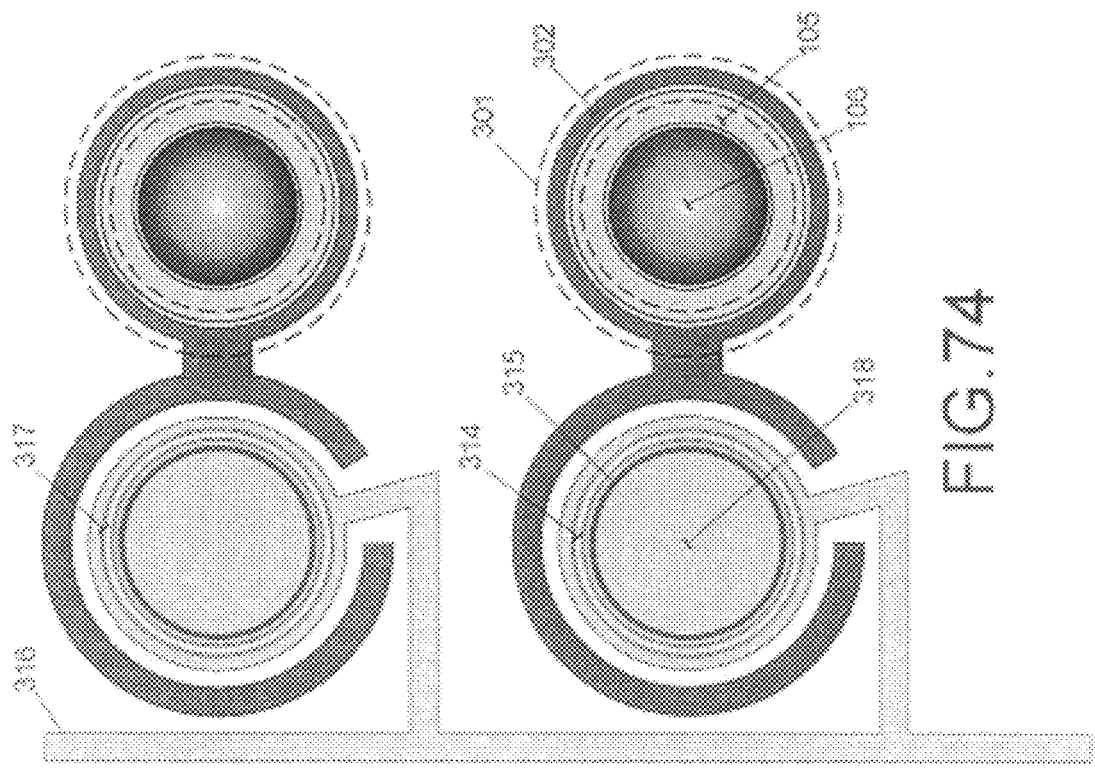

FIG. 74 is a top plan-view illustration of a combination Field Effect Transistor and OPCLD transceiver module; altogether monolithically constructed from the same epitaxially deposited material.

Figure 75:
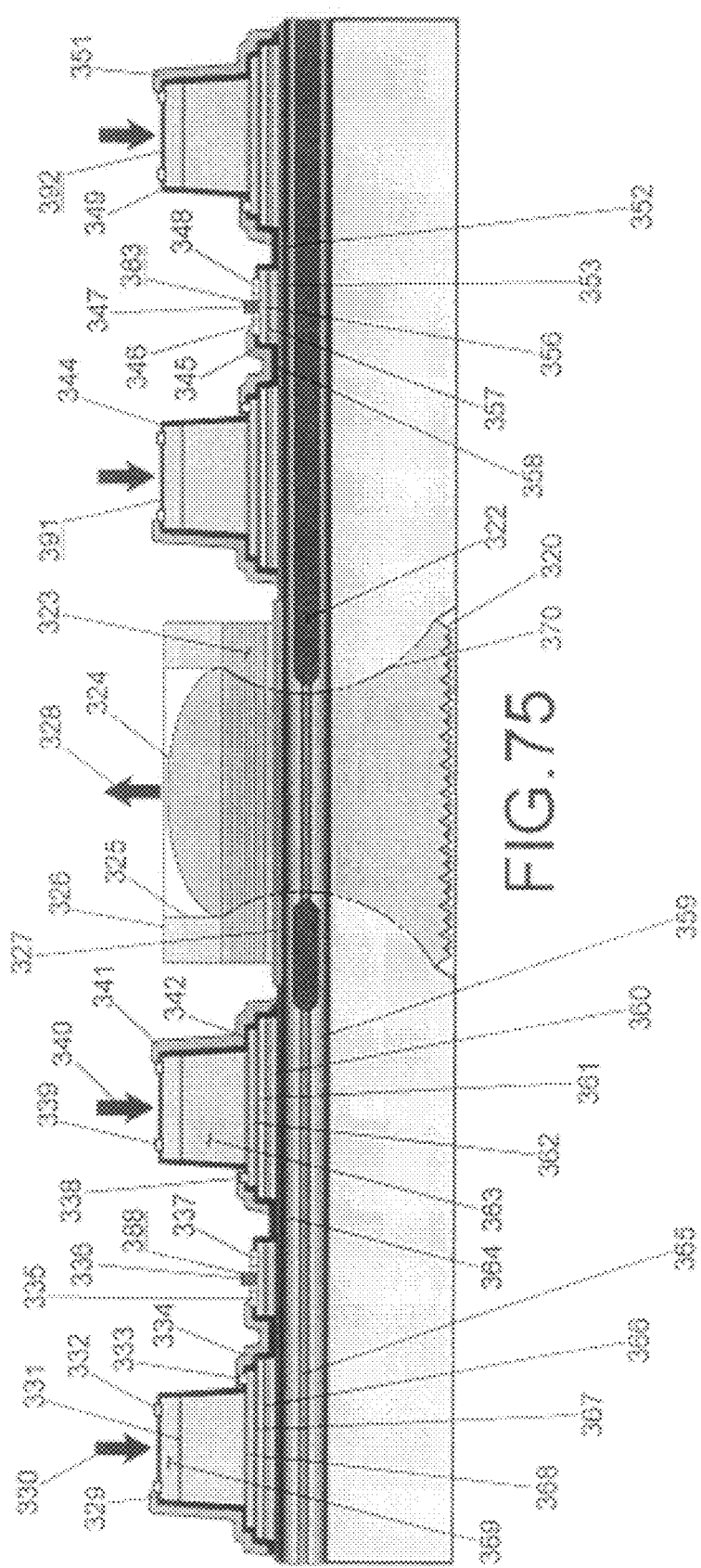
Figure 76:
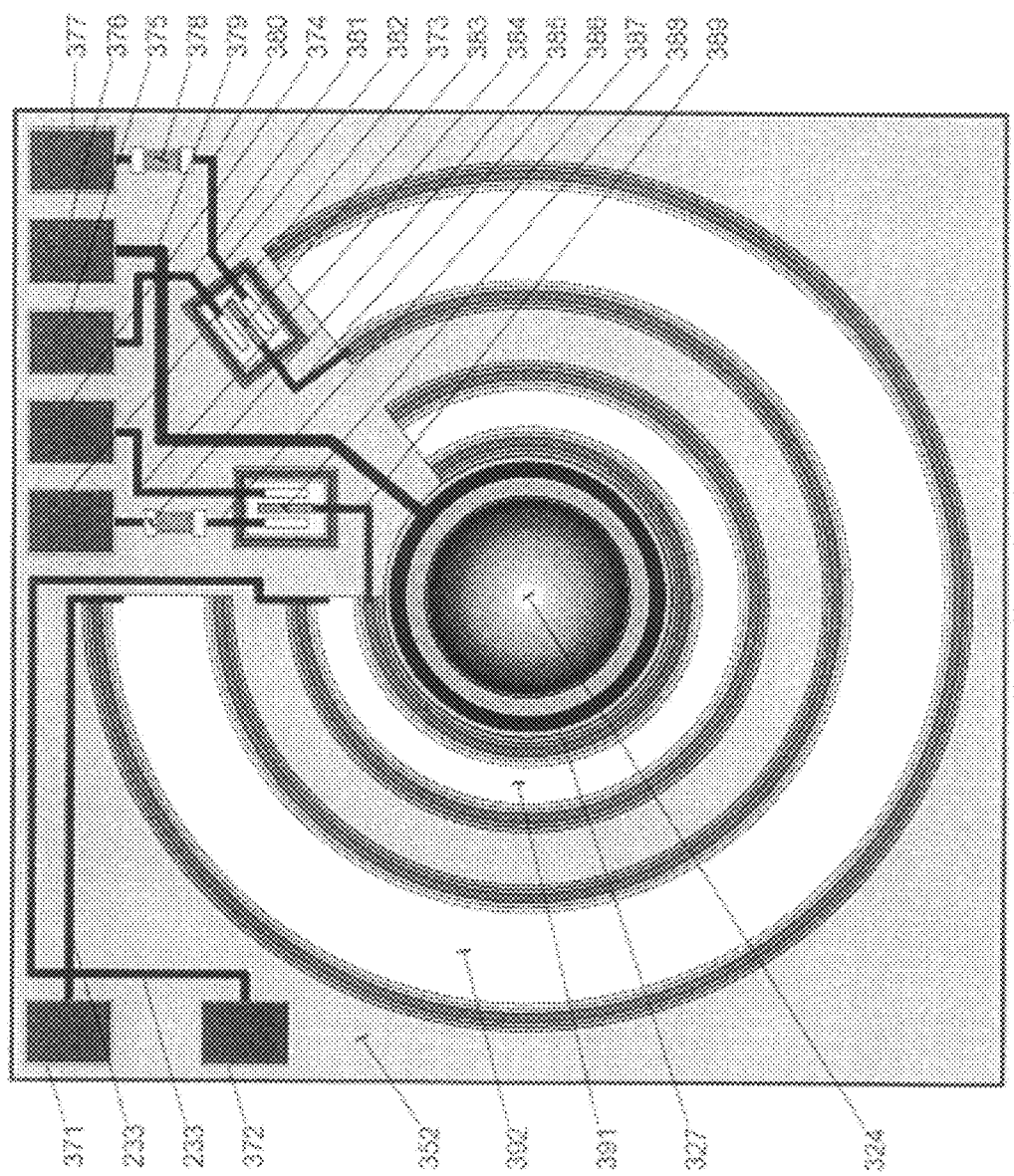

FIG. 75 is a sectional side-view illustration of a combination PIN Photo Detector, "High Electron Mobile Transistor" (HEMT), and OPCLD transceiver module; altogether monolithically constructed from the same epitaxially deposited material and lithographically etched to form a final integrated circuit package for use in the package illustrated in FIG. 70.

DETAILED DESCRIPTION OF THE INVENTION

Preferred Embodiments

FIGS. 19, 20, & 21

The "Optical Phase Conjugating Laser Diode" (OPCLD), as illustrated in FIGS. 19, 20, 20A, 21, and 21A, represents the preferred embodiment of my invention. The OPCLD begins its construction as a commercially obtained semiconductor substrate wafer, which is utilized as a growth medium during the epitaxial growth of the OPCLD's multilayered structure. For the preferred version of my OPCLD invention grey-scale masking and lithography is utilized to prepare the wafer for the epitaxial deposition of the various layers that will comprise the OPCLD. Depending upon the material regime chosen as the material used to construct the OPCLD's gain-region, the method used to grow the OPCLD will more likely be one of two well known epitaxial growth methods, e.g. "Molecular Beam Epitaxy" (MBE) is typically used to grow GaN based epi-structures upon commercially obtained Silicon-Carbide or $Al_2O_3$ substrate wafers, while "Metal-Organic Chemical Vapor Deposition" (MOCVD) is typically used to grow InP based epi-structures upon commercially obtained Indium-Phosphide or Gallium-Phosphide substrate wafers.

Figure 19:
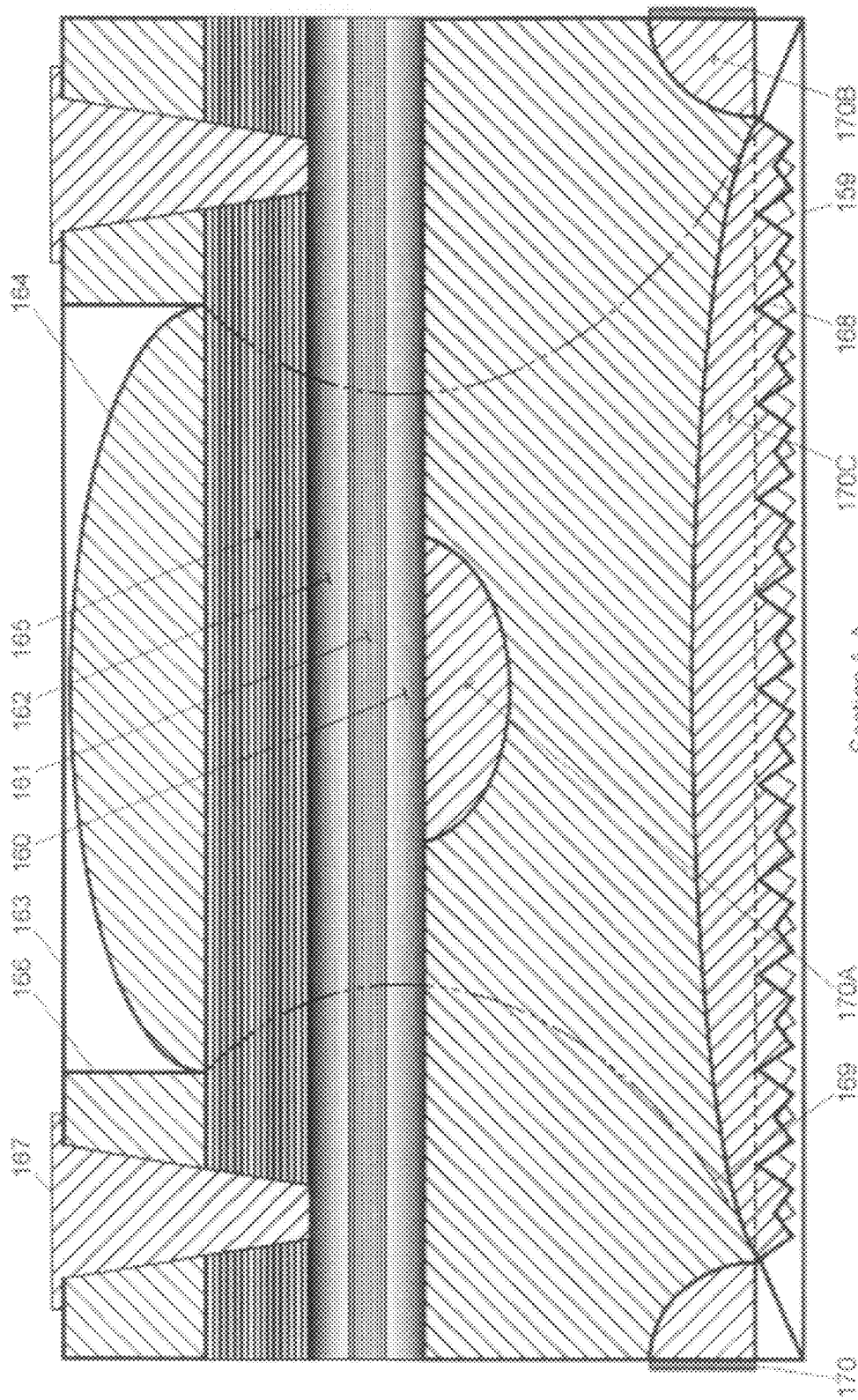
FIG. 19 is a Section A-A side-view illustration of a seventh and preferred design configuration of my OPCLD invention, which is shown as comprising a doped substrate member, an undoped corner-cube array based PCM, a doped epilayered gain-region, an undoped epilayered partial-reflection quarter-wave based DBR mirror-stack assembly, a highly ++ doped hemispheric shaped current guiding member, a highly ++ doped current guiding doughnut shaped member, a undoped collimating lens, a trench deposited doughnut shaped metal contact, a peripheral surrounding metal contact ring, and a Gaussian mode providing curved shaped laser-emission-output mirror.

Please note that spacer-layers 160 and 162 (FIG. 19) are gradiently filled as a means to illustrate how they are gradiently doped. For these spacer-layers, doping is heaviest in the dark colored areas, while doping is lightest in the light colored areas. FIG. 19 is a Section A-A side-view illustration of a single OPCLD, which is described below as universally comprised as having multiple epilayered structures that are deposited and shaped in the following order, including:

A choice of either commercially obtaining a p-doped or an n-doped semiconductor substrate-layer 159 (FIG. 19).

The wafer needs to be etched first using grey-scale masking and lithography to form an Nth number of hemispherical recessions 170A (FIGS. 19, 20, and 21) in the up-turned surface of the wafer. While a second group of half-doughnut shaped recessions 170B (FIGS. 19, 20A, and 21A) need to be formed using grey-scale masking and lithography into the down-turned surface of the wafer.

Next, both previously etched recessions 170A, 170B are to be filled using MOCVD with the same semiconductor material used to comprise the wafer itself except it most be highly ++doped.

After which, any bulges, bumps, or other irregularities can be smoothed down flat using either etching and/or polishing.

Next, is an epitaxial deposition of a few highly doped surface-smoothing buffer-layers (not illustrated) upon the up-turned second face surface of the previously processed substrate wafer. After deposition, the buffer-layers, will altogether have a total thickness equaling one-hundred Angstroms.

Next, a epitaxial deposition of a first spacer-layer 160 (FIG. 19), which is made to occur upon the upturned surface of the previously deposited buffer-layers and will be comprised as having either a gradiently or non-gradiently doped deposited structure, using either a P or N dopant material, e.g. for an N spacer-layer use an electron donating material like Silicon or Carbon, while for an P spacer-layer use an electron accepting material like Boron or Zinc.

Upon the up-turned second face of the previously formed spacer-layer 160 is epitaxially deposited a gain-region 161 (FIG. 19), which is comprised as having either a single layered lattice-matched P-doped, N-doped, or un-doped bulk semiconductor layer based gain-region 161, a single or multilayered strained or unstrained quantum-dot based gain-region 161, a single or multilayered strained or unstrained quantum super-lattice based gain-region 161, a single or multilayered strained or unstrained quantum-cascade based gain-region 161, a single or multilayered "Organic-Light-Emitting-Diode" (OLED) based gain-region 161, being comprised, for example, from the deposition of a 30-nm layer of TAD (TAD is conventional for triphenyl/diamine), a 15-nm layer of NAPOXA (NAPOXA is conventional for 2-naphtyl-4,5-bis(4-methoxyphenyl)-1,3-oxazole), a 15-nm layer of Alq (Alq is conventional for 8-hydroxyquinolinato aluminum), for synthesis information, please see, U.S. patent application Ser. No. 08/673,864, filed Sep. 13, (1995), by A. Dodabalapur et al., or a single or multilayered strained or unstrained quantum-well based gain-region 161.

Upon an up-turned second face of the previously formed gain-region 161 is epitaxially deposited a second lattice-matched semiconductor spacer-layer 162 (FIG. 19), which is comprised as having either a gradiently or a non-gradiently doped structure using either P or N dopant material.

Upon an up-turned second face of the previously formed second spacer-layer 162 is an epitaxially deposited second reflector 165 (FIGS. 19 and 20), which is comprised as having an undoped multilayered DBR based mirror-stack assembly that provides for a partial reflection.

Upon an up-turned second face of the previously deposited DBR based mirror-stack assembly 165 is an epitaxially deposited emitter layer 163 (FIGS. 19, 20, and 20A), which is later lithographically (i.e., using grey-scale masking and lithography) formed 166 into a hemispherical shaped 164 (FIGS. 19, 20, and 20A) Gaussian mode providing third reflector 164.

Using a first face of the commercially provided substrate 159, a first reflector 168 (FIGS. 19, 21, and 21A) is formed (i.e., using grey-scale masking and lithography) into an array of retro-reflecting polyhedral prisms (FIGS. 19, 21, and 21A) 168, which provides for the OPCLD's optical phase-conjugation capable PCM.

A first N or P Ohmic contact 167 (FIGS. 19, 20, and 20A) is formed, when the appropriate metal alloy is deposited into a circular shaped trench that was previously etched all the way through both reflector three's construction layer 164 and the DBR based second reflector layer 165, where it will make electrical contact with the top outer-most p++ doped surface of the OPCLD's second spacer-layer 162. While a second N or P Ohmic contact 170 (FIGS. 19, 20, 20A, 21, and 21A) is formed, when the appropriate metal alloy is deposited around the entire periphery of the bottom outer-most n++ doped surface edge of the OPCLD's doped substrate 159.

Wherein, the third reflector's Gaussian mode 164 providing shape 166 (FIGS. 19 and 20), and the first reflector's optical phase-conjugation providing PCM 168 (FIG. 21A) define a hemispherical laser cavity that provides for a low-order fundamental transverse cavity mode 169 (FIG. 19) (i.e., preferably the transverse mode $TEM_{00}$) having a high-power laser-emission-output (i.e., $\geq$100-mW of cw output for a gain-region having a diameter$\geq$60-µm) for my OPCLD invention.

In addition, it is important to remember that the choice of material constituents used to construct my OPCLD invention is not determined by the inventions mirror structures or any other structure, but is instead determined by any particular wavelength specific to application. Below, I have listed in an ascending order of epitaxial deposition all of the specific layers and the structure forming processes that are necessary for creating a long-wavelength version of my OPCLD invention, using an InGaAsP/InP regime of material specifically tailored to provide for 1.310-µm, 1.490-µm, and 1.550-µm laser-emission-output.

Moreover, structure formation, being almost entirely independent of material deposition, can sometimes exhibit a varied non-sequential order of process. Regardless, I have listed below the structure-forming processes that are required for constructing the OPCLD using an order of process that best describes the creation of the preferred embodiment of the invention. The steps used to construct a Long-Wavelength version of my OPCLD invention are specific, and will require the use of MOCVD to epitaxially deposit a multitude of layers using InGaAsP, InP, GaP as construction material, and additionally, will require the use of grey-scale photo-masking and lithography to etch the previously deposited InGaAsP, InP, GaP layers into a laser producing "Phase Conjugation Resonator" based cavity structure. These steps are listed below to include:

A commercially obtained doped InP substrate-wafer 159 (FIG. 19); providing for a binary semiconductor composition equaling InP, a large lattice-matched surface growth area that promotes the epitaxial growth of the various layers when combined form my OPCLD invention, a surface-area that exhibits a crystallographic orientation of <100>, an approximate wafer-diameter equaling either 3.0-in, 5.0-in, or 8.0-in, an approximate wafer-thickness equaling 625-µm, an energy band-gap equaling 1.35 eV at 300K, an emission $\lambda=ch/E_g=0.92$-µm, a vacuum wavelength of 1.550-µm, and a high-refractive index equaling 3.17.

If we want to provide the OPCLD invention with an injected carrier induced thermal lens, then we will need to perform three etchings on the N doped InP substrate-wafer 159 (FIG. 19). Further, using grey-scale masking and lithography, a first etch is performed on the up-turned surface of the N doped InP substrate-wafer 159 (FIG. 19) to provide for a first hemispherical shaped lens profile 170A (FIG. 19), a second etch is performed on the down-turned surface of the N doped InP substrate-wafer 159 (FIG. 19) to provide for a second hemispherical shaped lens profile 170C (FIG. 19), and a third etch is again performed on the down-turned surface of the N doped InP substrate-wafer 159 (FIG. 19) to provide for a doughnut shaped lens profile 170B (FIG. 19).

If we want to provide the OPCLD with an injected carrier induced thermal lens, we will need to epitaxially deposit a highly n++ doped InP comprised material into the first hemispherical shaped lens profile 170A (FIG. 19), and into the doughnut shaped lens profile 170B (FIG. 19), until both previously etched profiles are entirely filled with the highly n++doped InP material. Additionally, we will also need to epitaxially deposit an undoped InP material into the previously etched second hemispherical shaped lens profile 170C (FIG. 19), while, for all three profiles, removal of any deposited material excess, can either be etched away or polished away to form planar flat surfaces using methods know by those well versed in the art.

Figure 22:
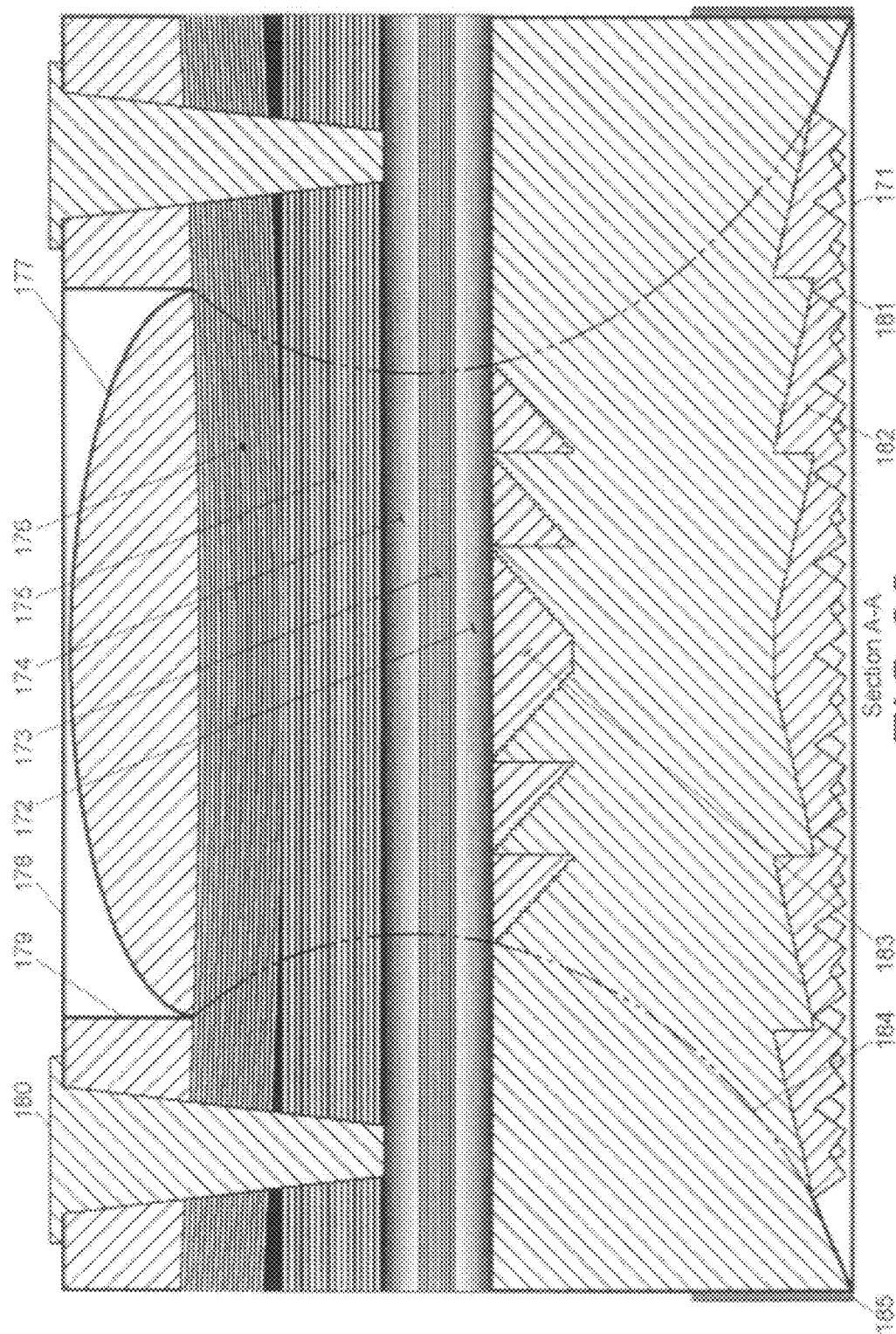
FIG. 22 is a Section A-A side-view illustration of an eighth design configuration of my OPCLD invention, which is shown as comprising a doped substrate member, an undoped corner-cube array based PCM, a doped epilayered gain-region, an undoped epilayered planar shaped DBR mirror-stack assembly, a Fresnel shaped light diverging concave lens member, a Fresnel shaped light collimating convex lens member, a trench deposited doughnut shaped metal contact, a peripheral surrounding metal contact ring, and a Gaussian mode providing curved shaped laser-emission-output mirror.

However, if we want to provide the OPCLD invention with a non-thermal lens solution, then we will need to perform two etchings on the N doped InP substrate-wafer 171 (FIG. 22). Further, using grey-scale masking and lithography, a first etch is performed on the up-turned surface of the N doped InP substrate-wafer 171 (FIG. 22) to provide for a first Fresnel shaped lens profile 183 (FIG. 22), while a second etch is performed on the down-turned surface of the N doped InP substrate-wafer 171 (FIG. 22) to provide for a second Fresnel shaped lens profile 182 (FIG. 22).

However, if we want to continue providing the OPCLD with an non-thermal lens solution, then we need to next epitaxially deposit N doped InP material into the first previously etched Fresnel shaped lens profile 183 (FIG. 22), and into the second previously etched Fresnel shaped lens profile 182 (FIG. 22), until both profiles are entirely filled-up with the N doped InP material, while, for both profiles, removal of any deposited material excess, can either be etched away or polished away to form planar flat surfaces using methods know by those well versed in the art.

The epitaxial deposition of several N doped InP bufferlayers (not shown), which will altogether comprise of a single layer 100 Angstroms thick.

The epitaxial deposition of an first N doped InP spacerlayer 160 (FIG. 19); providing for a binary semiconductor composition equaling InP, a deposition thickness equaling 300-nm, a Silicon dopant-linearly graded from (n+) 1-3E18 to (N) 1-3E16, an energy band-gap equaling 1.35 eV at 300K, an emission $\lambda=ch/E_g=0.92$-μm, a vacuum wavelength of 1.550-μm, and a high refractive index equaling 3.17.

The epitaxial deposition of a first un-doped InGaP barrierlayer; providing for a MQW comprised gain-region 161 (FIG. 19), a tensile strained ternary semiconductor composition equaling $In_{0.9}Ga_{0.1}P$, and a deposition thickness equaling 7-nm.

The epitaxial deposition of an undoped $In_rGa_{1-r}As_{1-s}P$ quantum-well-layer; providing for a first epilayer deposited in a MQW comprised gain-region 161 (FIG. 19), a quaternary semiconductor composition equaling $In_{0.76}Ga_{0.24}As_{0.82}P_{0.18}$, a deposition thickness equaling 7-nm, a 1% compressive strain; an energy band-gap equaling 1.1 eV at 300K, an emission $\lambda=ch/E_g=1.548$-μm, a vacuum wavelength of 1.550-μm, and a refractive index equaling 3.23.

The epitaxial deposition of an undoped $In_rGa_{1-r}As_{1-s}P$ barrier-layer; providing for a second epilayer deposited in a MQW comprised gain-region 161 (FIG. 19), an unstrained quaternary semiconductor composition equaling $In_{0.80}Ga_{0.20}As_{0.43}P_{0.57}$, a deposition thickness equaling 7-nm, an energy band-gap equaling 1.1 eV at 300K, an emission $\lambda=ch/E_g=1.180$-μm, a vacuum wavelength of 1.550-μm, and a refractive index equaling 3.23.

The epitaxial deposition of an undoped $In_rGa_{1-r}As_{1-s}P$ quantum-well-layer; providing for a third epilayer deposited in a MQW comprised gain-region 161 (FIG. 19), a quaternary semiconductor composition equaling $In_{0.76}Ga_{0.24}As_{0.82}P_{0.18}$, a deposition thickness equaling 7-nm, a 1% compressive strain; an energy band-gap equaling 1.1 eV at 300K, an emission $\lambda=ch/E_g=1.548$-μm, a vacuum wavelength of 1.550-μm, and a refractive index equaling 3.23.

The epitaxial deposition of an undoped $In_rGa_{1-r}As_{1-s}P$ barrier-layer; providing for a fourth epilayer deposited in a MQW comprised gain-region 161 (FIG. 19), an unstrained quaternary semiconductor composition equaling $In_{0.80}Ga_{0.20}As_{0.43}P_{0.57}$, a deposition thickness equaling 7-nm, an energy band-gap equaling 1.1 eV at 300K, an emission $A=ch/E_g=1.180$-μm, a vacuum wavelength of 1.550-μm, and a refractive index equaling 3.23.

The epitaxial deposition of an undoped $In_rGa_{1-r}As_{1-s}P$ quantum-well-layer; providing for a fifth epilayer deposited in a MQW comprised gain-region 161 (FIG. 19), a quaternary semiconductor composition equaling $In_{0.76}Ga_{0.24}As_{0.82}P_{0.18}$, a deposition thickness equaling 7-nm, a 1% compressive strain, an energy band-gap equaling 1.1 eV at 300K, an emission $A=ch/E_g=1.548$-μm, and a vacuum wavelength of 1.550-μm, and a refractive index equaling 3.23.

The epitaxial deposition of an undoped $In_rGa_{1-r}As_rP$ barrier-layer; providing for a sixth epilayer deposited in a MQW comprised gain-region 161 (FIG. 19), an unstrained quaternary semiconductor composition equaling $In_{0.80}Ga_{0.20}As_{0.43}P_{0.57}$ a deposition thickness equaling 7-nm, an energy band-gap equaling 1.1 eV at 300K, an emission $\lambda=ch/E_g=1.180$-μm, a vacuum wavelength of 1.550-μm, and a refractive index equaling 3.23.

The epitaxial deposition of an undoped $In_rGa_{1-r}As_{1-s}P$ quantum-well-layer; providing for a seventh epilayer deposited in a MQW comprised gain-region 161 (FIG. 19), a quaternary semiconductor composition equaling $In_{0.76}Ga_{0.24}As_{0.82}P_{0.18}$, a deposition thickness equaling 7-nm, a 1% compressive strain, an energy band-gap equaling 1.1 eV at 300K, an emission $\lambda=ch/E_g=1.548$-μm, a vacuum wavelength of 1.550-μm, and a refractive index equaling 3.23.

The epitaxial deposition of an undoped $In_rGa_{1-r}As_{1-s}P$ barrier-layer; providing for a eighth epilayer deposited in a MQW comprised gain-region 161 (FIG. 19), an unstrained quaternary semiconductor composition equaling $In_{0.80}Ga_{0.20}As_{0.43}P_{0.57}$, a deposition thickness equaling 7-nm, an energy band-gap equaling 1.1 eV at 300K, an emission $\lambda=ch/E_g=1.180$-μm, and a refractive index equaling 3.23.

The epitaxial deposition of an undoped $In_rGa_{1-r}As_{1-s}P$ quantum-well-layer; providing for a ninth epilayer deposited in a MQW comprised gain-region 161 (FIG. 19), a quaternary semiconductor composition equaling $In_{0.76}Ga_{0.24}As_{0.82}P_{0.18}$, a deposition thickness equaling 7-nm, a 1% compressive strain, an energy band-gap equaling 1.1 eV at 300K, an emission $\lambda=ch/E_g=1.548$-m, a vacuum wavelength of 1.550-μm, and a refractive index equaling 3.23.

The epitaxial deposition of an undoped $In_rGa_{1-r}As_{1-s}P$ barrier-layer; providing for a tenth epilayer deposited in a MQW comprised gain-region 161 (FIG. 19), an unstrained quaternary semiconductor composition equaling $In_{0.80}Ga_{0.20}As_{0.43}P_{0.57}$, a deposition thickness equaling 7-nm, an energy band-gap equaling 1.1 eV at 300K, an emission $\lambda=ch/E_g=1.180$-μm, a vacuum wavelength of 1.550-μm, and a refractive index equaling 3.23.

The epitaxial deposition of an undoped $In_rGa_{1-r}As_{1-s}P$ quantum-well-layer; providing for an eleventh epilayer deposited in a MQW comprised gain-region 161 (FIG. 19), a quaternary semiconductor composition equaling $In_{0.76}Ga_{0.24}As_{0.82}P_{0.18}$, a deposition thickness equaling 7-nm, a 1% compressive strain, an energy band-gap equaling 1.1 eV at 300K, an emission $\lambda=ch/E_g=1.548$-μm, a vacuum wavelength of 1.550-μm, and a refractive index equaling 3.23.

The epitaxial deposition of an undoped $In_rGa_{1-r}As_{1-s}P$ barrier-layer; providing for a twelfth epilayer deposited in a MQW comprised gain-region 161 (FIG. 19), an unstrained quaternary semiconductor composition equaling $In_{0.80}Ga_{0.20}As_{0.43}P_{0.57}$, a deposition thickness equaling 7-nm, an energy band-gap equaling 1.1 eV at 300K, an emission $\lambda=ch/E_g=1.180$-μm, a vacuum wavelength of 1.550-μm, and a refractive index equaling 3.23.

The epitaxial deposition of an undoped $In_rGa_{1-r}As_{1-s}P$ quantum-well-layer; providing for a thirteenth epilayer deposited in a MQW comprised gain-region 161 (FIG. 19), a quaternary semiconductor composition equaling $In_{0.76}Ga_{0.24}As_{0.82}P_{0.18}$, a deposition thickness equaling 7-nm, a 1% compressive strain, an energy band-gap equaling 1.1 eV at 300K, an emission $\lambda=ch/E_g=1.548$-μm, a vacuum wavelength of 1.550-μm, and a refractive index equaling 3.23.

The epitaxial deposition of a second un-doped InGaP barrier-layer; providing for a MQW comprised gain-region 161 (FIG. 19), a tensile strained ternary semiconductor composition equaling $In_{0.9}Ga_{0.01}P$, and a deposition thickness equaling 7-nm.

The epitaxial deposition of a second doped InP spacer-layer 162 (FIG. 19); providing for a binary semiconductor composition equaling InP, a deposition thickness equaling 300-nm, a Carbon dopant-linearly graded from (P) 2-4E16 to (p+) 2-4E20, an energy band-gap equaling 1.35 eV at 300K, an emission $\lambda=ch/E_g=0.92$-μm, a vacuum wavelength of 1.550-μm, and a high refractive index equaling 3.17.

The epitaxial deposition of an undoped $Al_xGa_yIn_zAs$ mirror-stack-layer 165 (FIG. 19); providing for a ternary semiconductor composition equaling $Al_{0.05}Ga_{0.42}In_{0.53}As$, a first epilayer deposited in a DBR comprised second reflector, a deposition thickness equaling $\lambda(4n)_S=102$-nm, an energy band-gap equaling 1.35 eV at 300K, an emission $\lambda=ch/E_g=0.92$-μm, a vacuum wavelength of 1.550-μm, and a low-refractive index equaling 1.68.

The epitaxial deposition of an undoped InP mirror-stack-layer 165 (FIG. 19); providing for a second epilayer deposited in a DBR comprised second reflector, a deposition thickness equaling $\lambda(4n)_S=122$-nm, an energy band-gap equaling 1.35 eV at 300K, an emissions=$ch/E_g=0.92$-μm, a vacuum wavelength of 1.550-μm, and a high-refractive index equaling 3.17.

The epitaxial deposition of an undoped $Al_xGa_yIn_zAs$ mirror-stack-layer 165 (FIG. 19); providing for a ternary semiconductor composition equaling $Al_{0.05}Ga_{0.42}In_{0.53}As$, a third epilayer deposited in a DBR comprised second reflector, a deposition thickness equaling $\lambda(4n)_S=102$-nm, an energy band-gap equaling 1.35 eV at 300K, an emission $\lambda=ch/E_g=0.92$-μm, a vacuum wavelength of 1.550-μm, and a low-refractive index equaling 1.68.

The epitaxial deposition of an undoped InP mirror-stack-layer 165 (FIG. 19); providing for a fourth epilayer deposited in a DBR comprised second reflector, a deposition thickness equaling $\lambda/(4n)_S=122$-nm, an energy band-gap equaling 1.35 eV at 300K, an emission $\lambda=ch/E_g=0.92$-1m, a vacuum wavelength of 1.550-μm, and a high-refractive index equaling 3.17.

The epitaxial deposition of an undoped $Al_xGa_yIn_zAs$ mirror-stack-layer 165 (FIG. 19); providing for a ternary semiconductor composition equaling $Al_{0.05}Ga_{0.42}In_{0.53}As$, a fifth epilayer deposited in a DBR comprised second reflector, a deposition thickness equaling $\lambda(4n)_S=102$-nm, an energy band-gap equaling 1.35 eV at 300K, an emission $\lambda=ch/E_g=0.92$-μm, a vacuum wavelength of 1.550-μm, and a low-refractive index equaling 1.68.

The epitaxial deposition of an undoped InP mirror-stack-layer 165 (FIG. 19); providing for a sixth epilayer deposited in a DBR comprised second reflector, a deposition thickness equaling $\lambda(4n)_S=122$-nm, an energy band-gap equaling 1.35 eV at 300K, an emission $\lambda=ch/E_g=0.92$-μm, a vacuum wavelength of 1.550-μm, and a high-refractive index equaling 3.17.

The epitaxial deposition of an undoped $Al_xGa_yIn_zAs$ mirror-stack-layer 163 (FIG. 19); providing for a ternary semiconductor composition equaling $Al_{0.05}Ga_{0.42}In_{0.53}As$, a seventh epilayer deposited in a DBR comprised second reflector, a deposition thickness equaling $\lambda(4n)_S=102$-nm, an energy band-gap equaling 1.35 eV at 300K, an emission $\lambda=ch/E_g=0.92$-μm, a vacuum wavelength of 1.550-μm, and a low-refractive index equaling 1.68.

The epitaxial deposition of an undoped InP mirror-stack-layer 163 (FIG. 19); providing for an eighth epilayer deposited in a DBR comprised second reflector, a deposition thickness equaling $\lambda(4n)$ s=122-nm, an energy band-gap equaling 1.35 eV at 300K, an emission $\lambda=ch/E_g=0.92$-μm, a vacuum wavelength of 1.550-μm, and a high-refractive index equaling 3.17.

The epitaxial deposition of an undoped $Al_xGa_yIn_zAs$ mirror-stack-layer 165 (FIG. 19); providing for a ternary semiconductor composition equaling $Al_{0.05}Ga_{0.42}In_{0.53}As$, a ninth epilayer deposited in a DBR comprised second reflector, a deposition thickness equaling $\lambda(4n)_S=102$-nm, an energy band-gap equaling 1.35 eV at 300K, an emission $\lambda=ch/E_g=0.92$-μm, a vacuum wavelength of 1.550-μm, and a low-refractive index equaling 1.68.

The epitaxial deposition of an undoped InP mirror-stack-layer 165 (FIG. 19); providing for a tenth epilayer deposited in a DBR comprised second reflector, a deposition thickness equaling $\lambda/(4n)_S=122$-nm, an energy band-gap equaling 1.35 eV at 300K, an emission $\lambda=ch/E_g=0.92$-μm, a vacuum wavelength of 1.550-μm, and a high-refractive index equaling 3.17.

The epitaxial deposition of an undoped $Al_xGa_yIn_zAs$ mirror-stack-layer 165 (FIG. 19); providing for a ternary semiconductor composition equaling $Al_{0.05}Ga_{0.42}In_{0.53}As$, an eleventh epilayer deposited in a DBR comprised second reflector, a deposition thickness equaling $\lambda(4n)_S=102$-nm, an energy band-gap equaling 1.35 eV at 300K, an emission $\lambda=ch/E_g=0.92$-μm, a vacuum wavelength of 1.550-μm, and a low-refractive index equaling 1.68.

The epitaxial deposition of an undoped InP mirror-stack-layer 165 (FIG. 19); providing for a twelfth epilayer deposited in a DBR comprised second reflector, a deposition thickness equaling $\lambda(4n)_S$=122-nm, an energy band-gap equaling 1.35 eV at 300K, an emission $\lambda$=ch/$E_g$=0.92-µm, a vacuum wavelength of 1.550-µm, and a high-refractive index equaling 3.17.

The epitaxial deposition of an undoped $Al_xGa_yIn_zAs$ mirror-stack-layer 165 (FIG. 19); providing for a ternary semiconductor composition equaling $Al_{0.05}Ga_{0.42}In_{0.53}As$, a thirteenth epilayer deposited in a DBR comprised second reflector, a deposition thickness equaling $\lambda(4n)_S$=102-nm, an energy band-gap equaling 1.35 eV at 300K, an emission $\lambda$=ch/$E_g$=0.92-µm, a vacuum wavelength of 1.550-µm, and a low-refractive index equaling 1.68.

The epitaxial deposition of an undoped InP mirror-stack-layer 165 (FIG. 19); providing for a fourteenth epilayer deposited in a DBR comprised second reflector, a deposition thickness equaling $\lambda(4n)_S$=122-nm, an energy band-gap equaling 1.35 eV at 300K, an emission $\lambda$=ch/$E_g$=0.92-µm, a vacuum wavelength of 1.550-µm, and a high-refractive index equaling 3.17.

The epitaxial deposition of an undoped $Al_xGa_yIn_zAs$ mirror-stack-layer 165 (FIG. 19); providing for a ternary semiconductor composition equaling $Al_{0.05}Ga_{0.42}In_{0.53}As$, a fifteenth epilayer deposited in a DBR comprised second reflector, a deposition thickness equaling $\lambda(4n)_S$=102-nm, an energy band-gap equaling 1.35 eV at 300K, an emission $\lambda$=ch/$E_g$=0.92-µm, a vacuum wavelength of 1.550-µm, and a low-refractive index equaling 1.68.

The epitaxial deposition of an undoped InP mirror-stack-layer 165 (FIG. 19); providing for a sixteenth epilayer deposited in a DBR comprised second reflector, a deposition thickness equaling $\lambda(4n)_S$=122-nm, an energy band-gap equaling 1.35 eV at 300K, an emission $\lambda$=ch/$E_g$=0.92-µm, a vacuum wavelength of 1.550-µm, and a high-refractive index equaling 3.17.

The epitaxial deposition of an undoped $Al_xGa_yIn_zAs$ mirror-stack-layer 163 (FIG. 19); providing for a ternary semiconductor composition equaling $Al_{0.05}Ga_{0.42}In_{0.53}As$, a seventeenth epilayer deposited in a DBR comprised second reflector, a deposition thickness equaling $\lambda(4n)_S$=102-nm, an energy band-gap equaling 1.35 eV at 300K, an emission s=ch/$E_g$=0.92-µm, a vacuum wavelength of 1.550-µm, and a low-refractive index equaling 1.68.

The epitaxial deposition of an undoped $Al_xGa_yIn_zAs$ emission-mirror-layer 165 (FIG. 19); providing for a ternary semiconductor composition equaling $Al_{0.05}Ga_{0.42}In_{0.53}As$, an epilayer deposited for use as a Gaussian mode emission providing third reflector, a deposition thickness equaling $\lambda(4n)_S$=300-nm, an energy band-gap equaling 1.35 eV at 300K, an emission $\lambda$=ch/$E_g$ 0.92-µm, a vacuum wavelength of 1.550-µm, and a low-refractive index equaling 1.68.

Using grey-scale masking and lithography, we next form a coherent array of hexagon apertured corner-cube shaped retro-reflecting prism elements (e.g., preferably each prism element has an aperture diameter dimension equal-to or slightly-less-than a wavelength of desired laser emission minus the refractive index of the material used to construct each element), which is preferably called a "Phase Conjugation Mirror" (PCM) 168 (FIGS. 19, 21, and 21A) and will comprise several hundreds of individual corner-cube prism elements 198 (FIGS. 26, 26A, 26B, and 27).

Figure 20:
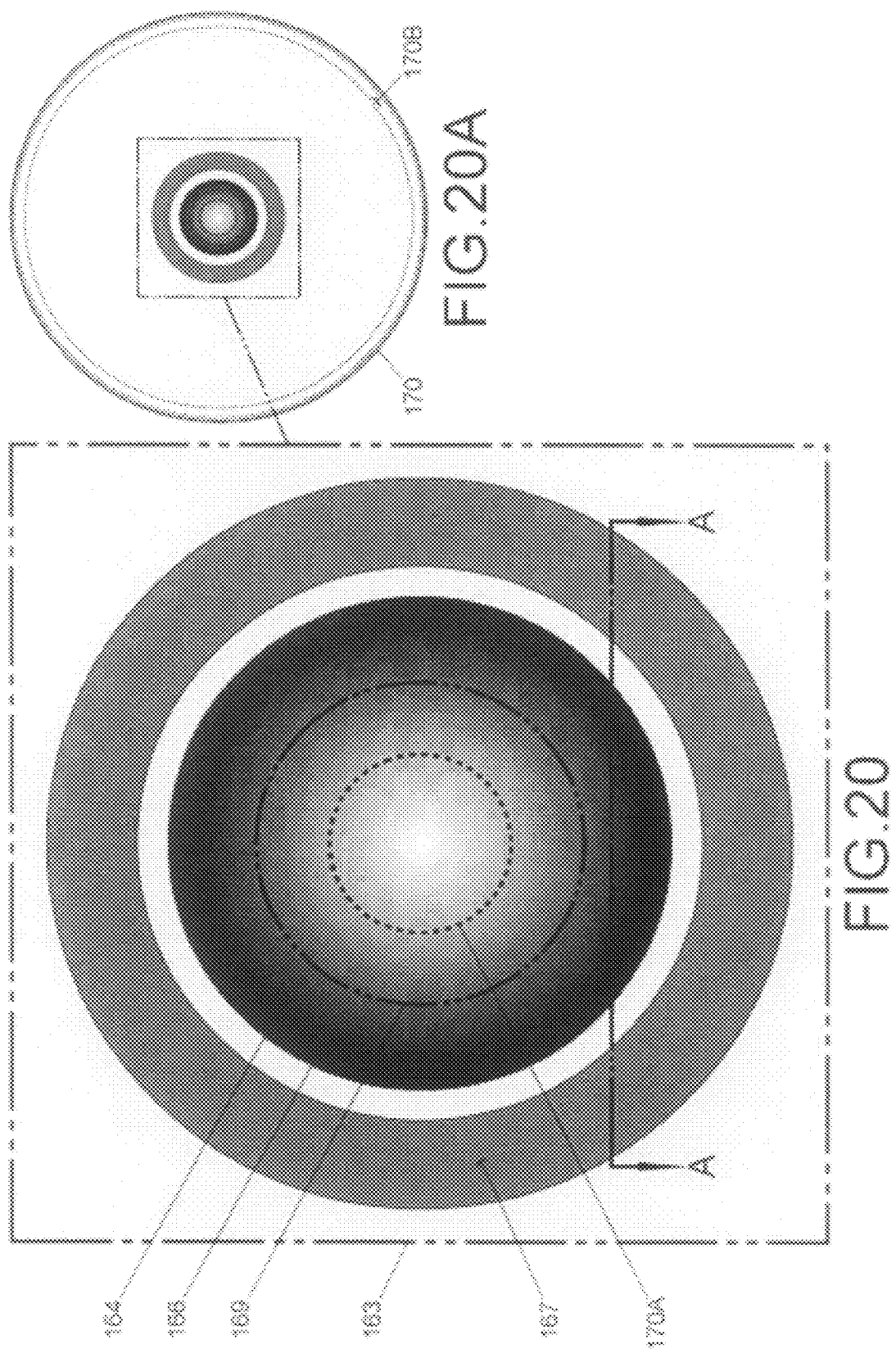
FIG. 20 is a top plan-view illustration of the seventh and preferred design configuration of my OPCLD invention, which is shown as comprising a doughnut shaped metal contact, and a Gaussian mode providing curved laser-emission-output mirror.

Using grey-scale masking and lithography, we will next form an undoped $Al_xGa_yIn_zAs$ laser-emission-output mirror-layer 163 (FIGS. 19, 20, and 20A), which will be used to provide for a hemispherical shaped Gaussian mode providing laser-emission-output mirror 164 and 166 (FIGS. 19, 20, and 20A).

The E-Beam evaporated deposition of either Al/Pt/Ag/Au onto the top outmost surface of the OPCLD's hemispherical shaped Gaussian mode providing laser-emission-output mirror 164 and 166 (FIGS. 19, 20, and 20A), which will form a partially reflective thin metal layer 164 (FIGS. 19, 20, and 20A) that provides for both a partial reflection and a partial transmission of a low-order fundamental transverse spatial cavity mode (i.e., $TEM_{00}$) high-power laser-emission output.

The E-Beam evaporated deposition of a Ti/Ni/Au electrode-layer 167 and 170 (FIGS. 19, 20, 20A, 21, and 21A); providing for a deposition thickness equaling 150-Å, a N Ohmic contact layer 170 to be deposited around the entire bottom peripheral surface area of the OPCLD's substrate layer 159 (FIG. 19), 171 (FIG. 22), and a P Ohmic contact layer 167 to be deposited into a circular trench that was previously etched into and through both the OPCLD's second and third mirror structures in order to expose the top outermost surface of the P doped second spacer-layer 162 (FIG. 19) of the OPCLD; wherein, both the N and P Ohmic contact layers 170, 167 will provide for the electrical pumping of the OPCLD's gain-region 160, 161, 162 (FIG. 19), 172, 173, 174 (FIG. 22).

DETAILED OPERATION OF THE INVENTION

Preferred Embodiments

FIGS. 19, 20, 20A, 21, and 21A

The preferred embodiments described below generally include a PCR based broad area semiconductor laser diode, which comprises a PCM 168 (FIGS. 19, 21, and 21A) used for compensating or correcting phase perturbations and wavefront distortion. Moreover, a preferably reflective, and alternatively transmissive, optical element 163 (FIGS. 19, 20, and 20A) of the PCR has a non-planar surface contour that is preferably configured to provide for a Gaussian mode for the incident beam. In the case of a tunable version of my OPCLD invention, such element may be for adjusted in order to reconfigure the bandwidth, for more details, please see the 'Additional Embodiments' section located below.

Further, the preferred embodiment describes the use of a retro-reflecting coherent array of corner-cube elements, preferably having a hexagon shaped apertures, the centers of which are approximately separated by a dimensional distance that is equal-to or slightly less than one wavelength of desired laser emission minus the refractive index of the material used to construct each element. Preferably, each corner-cube retro-reflecting prism element has a hexagon aperture diameter dimension that is equal-to or slightly less than one wavelength of desired laser emission minus the refractive index of the material used to construct each corner-cube element.

Figure 6:
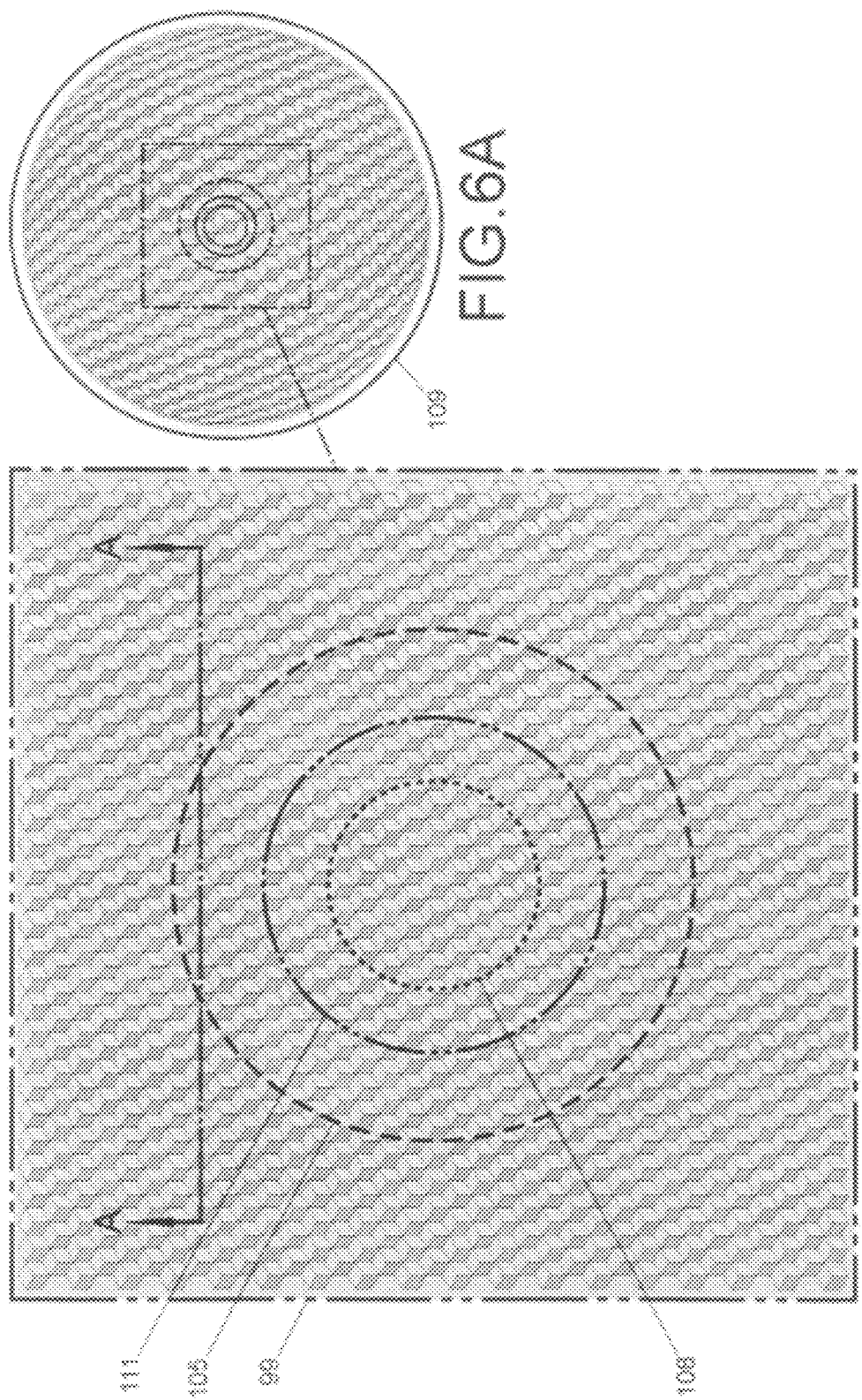
FIG. 6 is a bottom plan-view illustration of the second design configuration of my OPCLD invention, which is shown as comprising a corner-cube array based PCM.

Moreover, the retro-reflecting corner-cube array may have a uniform curvature 110, 110A (FIGS. 4 and 6A), or more preferably may have an otherwise planar shape 168 (FIG. 19). In this case, a beam expander 170A (FIG. 19), 183 (FIG. 22) is preferably used to reduce the wavefront curvature before the retroreflecting corner-cube array 168. Further, the retroreflecting corner-cube array may be used in connection with an adaptable MOEMS based Gaussian mode providing laser-emission-output mirror 164 (FIG. 19) to correct transient wavefront distortions. Wherein, a feedback loop including a processor and a detector, and preferably a spectrometer, are used for controlling the wavefront distortion correction of the adaptable optical element 164 (FIG. 19), such as by controlling the surface contour or curvature of the element 164 using a MEMS or MOEMS technique.

Furthermore, it is noted here that although these preferred embodiments are contemplated for advantageous use with semiconductor broad area vertical cavity surface emitting laser diodes, other semiconductor laser diode adapters may benefit by using any of these preferred embodiments. Moreover, there are three general ways for providing wavefront corrections according to preferred embodiments herein, and these are illustrated by the three reflective components shown at FIGS. 19, 20, 20A, 21, and 21B. They are: (a) using an adaptive optical element such as a MOEMS enabled deformable mirror 164 (i.e., used in concert with either (b) or (c) of the two remaining reflector configurations), 166.

In addition, a MOEMS enabled deformable mirror 164 is fabricated by shaping the ends of a solid material with the desired mirror curvatures and then HR coating the ends. In such case, the net mirror curvature can be distributed between both mirrors. The optical distance between the ends is adjusted mechanically or thermally, for example. Further, the flat first mirror structure and/or the inflection mirror structure 164 is deflectable or movable in a Z-axis direction using MOEMS technology, for example, to thereby provide for a tunable filter with a tunable pass band.

Generally, the mode field diameter for the lowest order mode as defined by the intensity $1/e_2$ diameter of the mode, generally fits within the central portion of the mirror. Typically, the ratio of the mode field $1/e_2$ diameter to the diameter w of the mirror FWHM is slightly greater than about 0.5, usually greater than 0.7. Further, for single mode resonators, the ratio is typically greater than about 0.9 to greater than 1.2, or more.

In contrast, the mode field diameter of a higher order mode, when stable, extends into the negative curvature portion, and possibly the flat portions surrounding the regions with the optical curvature. This eventually makes the cavity unstable for that mode. In this way, the invention utilizes phase profiling or a phase aperture. Further, a variation in phase is introduced across transverse plane to preferentially preserve the lowest order mode while making the higher order modes unstable.

Generally, in the FP filter, a spacer device would separate the mirror device from the membrane device; thus, to thereby define the Fabry-Perot (FP) filtered optical cavity. Further, the optical membrane device would comprise a handle material that functions as a support. Further, an optical membrane or device layer would need to be added to the previously mentioned support material. While, the previously mentioned membrane structure would need to be formed within the previously mentioned optical membrane layer. Moreover, an insulating layer would need to separate the optical membrane layer from the support material.

Moreover, during manufacture, the previously mentioned insulating layer would also function as a sacrificial/release layer, which is partially removed to release the previously mentioned membrane structure from the previously mentioned support material. Further, the insulating layer would define the electrostatic cavity between the previously mentioned membrane structure and the handle wafer. Moreover, when an electrical field is established across this cavity it will provide for the force necessary to deflect the light reflecting membrane out-of-plane and therefore, tune the (FP) filter via a modulation of the size of the optical cavity.

Moreover, as illustrated in FIGS. 19, 20, and 20A, a retro-reflector configuration (b) uses a planar fixed retro-reflecting corner-cube array based PCM 168, 181 such as those illustrated in FIGS. 19, 21, 21A, 22, 24 and 24A. While, retro-reflector configuration (c) uses a curved non-planar fixed retro-reflecting corner-cube array based PCM 110, 110A such as the one illustrated in FIG. 22.

Figure 21:
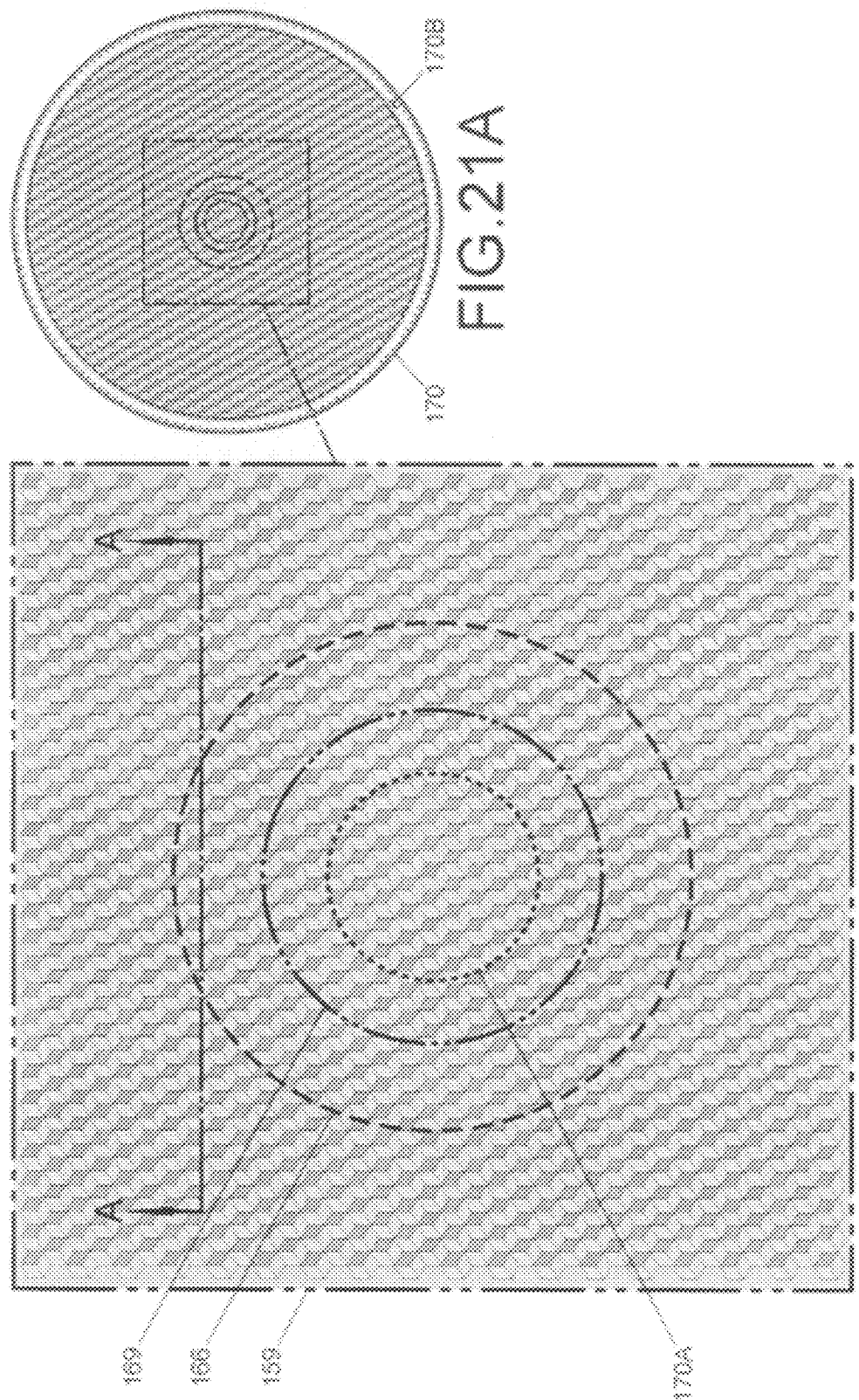
FIG. 21 is a bottom plan-view illustration of the seventh and preferred design configuration of my OPCLD invention, which is shown as comprising a corner-cube array based PCM.

In addition, the effects that reflection has on incident wavefronts when reflected by either a conventional mirror, a phase-conjugate mirror, or a pseudo phase-conjugate retro-reflecting array based PCM, is described in detail by H. H. Barrett and S. F. Jacobs, Opt. Lett. 4, (1979), 190. Further, if a retro-reflecting array is used, then it may have a uniform curvature 110, 110A (FIG. 4), or it may have an otherwise planar shape 168 (FIGS. 19, 21, and 21A). In this case, a beam expander 170A (FIG. 19), 183 (FIG. 22) is preferably used to reduce the incident wavefront curvature before the retro-reflecting array, as the retro-reflecting array is to be used to correct transient wavefront distortions. Further, a feedback loop, including a processor and a detector, can be used for controlling the wavefront distortion correction of the adaptable optical element 163, 164 (FIG. 19), such as by controlling the surface contour or curvature of the element 164.

Furthermore, as illustrated in FIGS. 27A and 27B, for the pseudo phase-conjugate retro-reflecting array based PCM, the base of the wavefront leads the crest of the wavefront in the reflected wavefront by a same phase as the crest was leading the base in the incident wavefront 202, i.e., prior to reflection from the pseudo phase-conjugate mirror 200. Further, FIG. 27B further describes a wavefront incident 202 at a retro-reflective array 200 (indicated by arrow 201 pointing towards the retro-reflective array 200), and the wavefront after reflection 205 from the retro-reflective array 200 (indicated by arrow 206 point away from the retro-reflective array 200).

Moreover, as illustrated in FIG. 27A, segments 204 of the wavefront are phase-conjugated due to a triple-reflection that occurs from corresponding hexagon apertured corner-cubes 198 (FIGS. 26, 26A, and 26B) of the retro-reflecting array 200, while the segments 204 of the reflected wavefront themselves generally relationally conform to the shape of the wavefront if reflected from a conventional mirror, as illustrated by the curve 205, which shown connecting the wavefront segments 204. Further, as such, the base of the wavefront leads the crest of the wavefront in the reflected wavefront 205 by an approximately same phase the wavefront base was leading the wavefront crest in the incident wavefront 207, i.e., prior to reflection from the retro-reflective array 200.

More specifically, for a pseudo phase-conjugate retro-reflecting corner-cube array, each adjacent 208 (FIG. 27B) corner-cube segment 168 (FIG. 19), 181 (FIG. 22) is arranged along a substantially planar substrate 159 (FIG. 19), 171 (FIG. 22). Wherein, FIGS. 27A and 27B, both illustrate an incident wavefront 202, 207 (indicated by the arrow 201 pointing to the right toward the mirror 200) and a reflected wavefront 205 (indicated by the arrow 206 pointing to the left away from the mirror 200), respectively. Further, as illustrated in FIG. 27B, the relative phases 204 of points 208 (i.e., the relative optical boundary 208 of each finite corner-cube prism 203) along the incident 207 and reflected 205 wavefronts are not disturbed equally by reflection from the PCM 200. Moreover, to explain further lets first examine true optical phase conjugation, which can be described simply as $k_{out} = -k_{in}$, which is demonstrated when the crest of an incident wavefront 202 leads the base of an incident wavefront 202, while the base of a reflected wavefront 207 leads the crest of a reflected wavefront 207 upon reflection from a true phase-conjugate mirror. While wavefront reflection from a conventional mirror can be described as $k_{in} + k_x\hat{x} + k_y\hat{y} + k_z\hat{z}$ and $k_{out} = k_x\hat{x} + k_y\hat{y} - k_z\hat{z}$.

Alternatively, the contour of the non-planar mirror 164 (FIG. 19) may be adjustable using MEMS and/or MOEMS, wherein the selected contour of the non-planar mirror 164 is based upon optical detection and feedback control techniques such as those described by Tyson, Principles of Adaptive Optics, cited and incorporated herein by reference. Further, a wavefront made incident at a non-planar retro-reflective array 110A (FIG. 4) and the wavefront after reflection from the non-planar retro-reflective array 110 is phase-conjugated due to three totally internal reflections happening for each corresponding corner-cube 198 (FIGS. 26, 26A, and 26B) of the non-planar retro-reflective array 110, while the segments 204 of the reflected wavefront themselves relationally conform to the shape of the wavefront reflected from the PCM 110. As such, the base of a wavefront leads the crest in the reflected wavefront by a far smaller phase as compared with the phase difference between the base of a wavefront and the crest of an incident wavefront.

Figure 4:
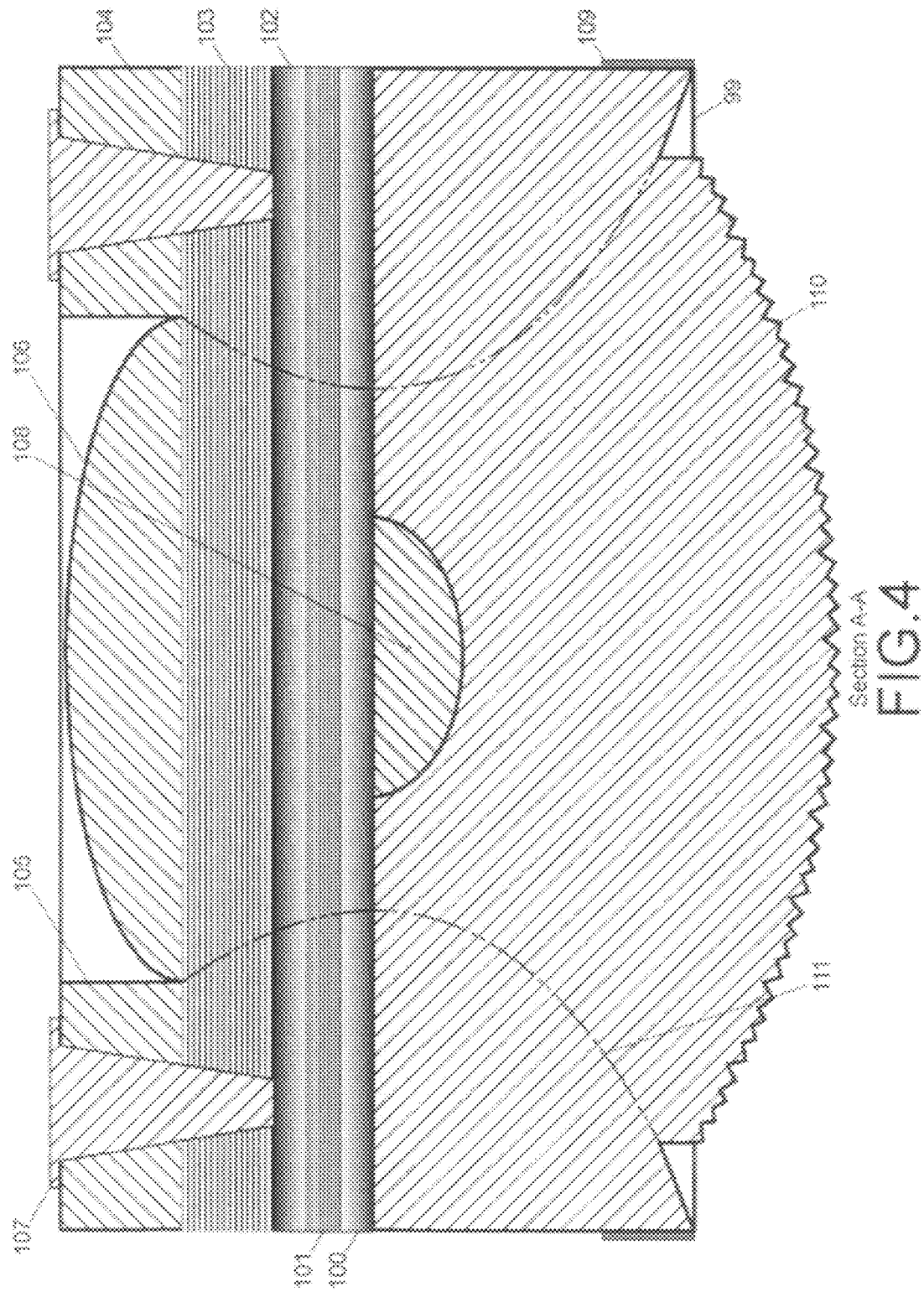
FIG. 4 is a Section A-A side-view illustration of the second design configuration of my OPCLD invention, which is shown as comprising a doped hemispherical shaped substrate member that has a corner-cube array based PCM etched, using grey-scale lithography, right out of the member's bottom surface, an epilayered gain-region, an epilayered partial reflection quarter-wave based DBR mirror-stack assembly, an highly doped current guiding member, a doughnut shaped trenched metal contact, a peripheral surrounding metal contact ring, and a Gaussian mode providing curved shaped laser-emission-output mirror.

In addition, as illustrated in FIGS. 4, 6, 6A, 19, 21, and 21A, the use of approximate phase-conjugation via a retro-reflecting corner-cube array 200. Such approximate phase-conjugation is described by H. H. Barrett and S. F. Jacobs, Opt. Lett. 4, (1979), 190, which is cited and incorporated herein by reference. Further, the preferred retro-reflecting corner-cube array 200 includes many hundreds of adjacently formed hexagon apertured hexagonal shaped corner-cubes, as illustrated in FIGS. 4, 6, 6A, 19, 21, 21A, and 28. Additionally, the hemispherical shaped retro-reflecting corner-cube array 110, 110A is illustrated in FIG. 4 as being first formed (i.e., using grey-scale masking and lithography) into a hemispherical shaped curvature; wherein, the retro-reflecting corner-cube array 110, 110A cuts the wavefront in many segments 203 (FIG. 27B); wherein, each segment 204 fits the original wavefront in a good approximation, parallel to the original phase front piecewise.

According to Barrett et al., previously cited above, a wavefront retro-reflected from a corner-cube array 200 and a wavefront retro-reflected from a 'true' active PCM (e.g., such as a PCM formed during the process of DFWM) will be equal if the incident wavefront 202 can be approximated by a plane wave that is distributed over the entire corner-cube array's normal plane entrance. Further, by using the retro-reflecting corner-cube array, as illustrated at FIGS. 19, 21, and 21A, has some advantages over a non-planar hemispherical mirror and a non-planar active phase-conjugate mirror. Further, the retro-reflecting hexagon apertured hexagonal shaped corner-cube array based PCM may be effectively used as a passive optical element to correct wavefront distortion without any time delay, such as would occur when a detection and a control system were used to adjust the contour of any of the reflectors, this would of course limit my OPCLD invention to only low-bandwidth internal modulation applications.

Moreover, as previously mentioned, for a plane incident wave, the retro-reflected wavefront from a corner-cube array is exactly phase-conjugated. This means that the wavefront curvature of the incident wave determines the quality of the 'approximate' phase-conjugation. It is therefore much desired to minimize the phase deviation $\Delta\phi$ of the retro-reflected wavefront relative to an exact phase-conjugated phase-front. Further, the main contribution to this deviation is given by the second order term in the Taylor expansion (see Barrett et al., above, which neglects to include this term). Where, for a spherical incident wavefront with a radius of curvature R this phase deviation can be estimated as $$\Delta\phi \approx (1/2)(2\pi/\lambda)(d^2/R) \qquad (4)$$

where d is the 'diameter' dimension 199 (FIG. 27) of each corner-cube element present within the array 168 (FIG. 19). Further, the phase-deviation is zero for a plane wave (R→∞), which is in agreement with the above. Therefore, if we set $\Delta\phi \square 2\pi$, then $$(1/2)(d^2/R\lambda) \square 1; \ (1/2)(d^2/R\lambda) = 0.01 (1\% \text{ deviation}) \qquad (5)$$

In order to increase the radius of curvature to achieve the desired value, the beam may be advantageously expanded according to the preferred embodiment herein using, e.g. one or more beam expanding thermal or Fresnel lens being disposed before the retro-reflecting corner-cube array 168 (FIG. 19) to expand the beam by a factor of about M=12 or more. Further, to obtain a good approximation of the retro-reflected wavefront to the phase-conjugated wavefront over a dimension represented herein by D, where an $n^{th}$ number of individual retro-reflecting corner-cube elements of the array are altogether illuminated 198 (FIGS. 26, 26A, 26B, and 27); whereby, the equation may be modified as follows $$(1/2)(D^2/R\lambda) \square 1 \text{ with } D = nd \qquad (6)$$

To achieve a system in conformance with equation (4) and (R→∞), a laser diode system according to the preferred embodiment may be modified according to one or more of the following:

Reduction of d, wherein for high-quality corner-cube arrays, d should be generally $\leq \lambda/n_2$ of the material used to construct the array, Increase the magnification M, wherein an upper limit would be determined by the overall dimension of the corner-cube array itself, e.g. Barrett et al. predicts 150-μm to 1-mm in diameter, but the preferred embodiment predicts 2-μm to 80-μm in diameter, and Approximately fitting the surface of the corner-cube array to the incident wavefront by first spreading the incident wavefront using either an injected carrier induced thermal lens structure (i.e., a thermal lens would comprise a highly n++ or p++ doped hemispherical shaped structure 170A used to provide for a concave wavefront spreading thermal lens, and a highly n++ or p++ doped doughnut shaped structure 170B used in concert with an un-doped convex shaped structure 170C altogether used to provide for a collimating wavefront flattening thermal lens).

As illustrated in FIG. 22, an alternative to the injected carrier induced thermal lens, is to provide a purely optical solution, wherein a first Fresnel lens profile 183 is formed along the second face of the substrate by etching out, then filling in, a Fresnel profile 183 with the appropriate lattice-matched semiconductor material to provide for a wavefront spreading Fresnel lens 183, while a second Fresnel lens profile 182 is formed along the first face of the substrate by etching out, then filling in, a Fresnel profile with the appropriate lattice-matched semiconductor material to provide for a wavefront collimating Fresnel lens, which are altogether used to provide for a lens system in conformance with equation (4) that is capable of providing for an incident wave front's planar flat distribution across the entire normal-entrance of the entire corner-cube array, which will typically comprise of several hundred corner-cube elements 200 (FIG. 28), as illustrated in FIGS. 19, 21, and 21A.

In accordance with the preferred embodiment, as illustrated in FIGS. 19, 21, 21A, 22, 24, and 24A, the following procedure is for providing wavefront correction using a retro-reflecting corner-cube array, which may be advantageously followed by expanding the incident wavefront by a factor M to increase the radius of curvature by including a beam expander 170A, 170B, and 170C (FIG. 19) before the retroreflecting corner-cube array 168 (FIG. 19), 184 (FIG. 22). Further, additional time dependent wavefront distortions (deviations from the averaged wavefront) can be corrected using approximate phase conjugation.

As illustrated in FIGS. 19, 20, 20A, 21, 21A, 22, 23, 23A, 24, and 24A, a PCR based broad area laser diode could preferably contain an adaptive optical reflector 168 and a retro-reflecting corner-cube array based PCM 168 for making wavefront corrections according to a preferred embodiment. Further, the laser diode resonator illustrated in FIGS. 19 and 22, which includes a wavefront correcting optic such as a retro-reflecting corner-cube array based PCM 168, 181, a non-planar fixed or deformable mirror 164, 166, 177, 179, and a beam expander 170A, 183 for expanding the incident wavefront, and a beam collimator 170B, 170C, 182 for flattening the incident wavefront planar flat across the entire normal entrance of the retro-reflecting corner-cube array 168, 181.

Moreover, as illustrated in FIGS. 19, 20, 20A, 22, 23, and 23A, a laser-emission-output coupling mirror 163, 164, 166 is shown for out-coupling a laser-emission-output beam. The use of a non-planar mirror having either a fixed contour or an adjustable contour (i.e., the mirror's contour may be adjusted via a feedback loop that includes a detector and a processor to provide the appropriate detection and control system). The use of a retro-reflecting corner-cube array 168, 181 requires the use of an appropriate beam expander 170A, 170B, 170C, 183, and 182 to provide for a reduction of the wavefront curvature for light waves made incident across the retro-reflecting corner-cube array 168, 181 (FIGS. 19 and 22).

Furthermore, the elements comprising the appropriate beam expander 170A, 170B, 170C, 183, and 182 are created using epitaxial deposition, grey-scale masking and lithography, and wafer polishing, and therefore are monolithically formed into locations specifically fixed to fit the averaged wavefront of the incident laser beam. Wherein, the retro-reflecting corner-cube array based PCM 168, 181 (FIGS. 19 and 22) is used to correct transient wavefront distortions, such as those produced by a laser diode operating in burst mode and/or having long and/or short burst pauses occurring between bursts (i.e., PONs is a Telecomm application that uses time domain multiplexing to send and receive data across a shared optical fiber on a time shared bases, and uses a burst-mode laser diode driver circuit to internally modulate either a Fabry-Perot or a DFB based EEL diode in order to transmit data across an optical fiber at a maximum of 2.3-Gigabit/ps).

Moreover, the use of a retroreflecting corner-cube array (i.e., pseudo phase-conjugator) in order to gain some of same advantages exhibited by a true phase-conjugator (e.g., such as a degenerate four wave mixing optical phase conjugation mirror) in their ability to remove perturbations that occur in macro based optical systems was originated by Jacobs and O'Meara. However, the prior art does not teach, discuss, speculate, or disclose any information regarding the use of retro-reflecting corner-cube arrays as PCMs for use in PCR configured laser apparatus or systems. Further, retro-reflecting corner-cube arrays, as passive pseudo phase-conjugators, are efficient for wavefront correction in various applications.

Moreover, Section II of T. R. O'Meara's document entitled "Wavefront Compensation with Pseudoconjugation," Opt. Eng. 21, 271, (1982), makes a general introduction to retro-reflecting corner-cube arrays and pseudo phase-conjugation. Moreover, the behavior exhibited by an ideal retro-reflecting corner-cube array is compared to the behavior exhibited by a conventional mirror, and to the behavior exhibited by an ideal active phase-conjugator, for more details, please see Sec. III of T. R. O'Meara's abstract document entitled "Wavefront Compensation with Pseudoconjugation," Opt. Eng. 21, 271, (1982).

Wherein, it is described how by inserting a convex shaped collimating lens in front of a retro-reflecting pseudo phase-conjugating system the quality of an image is significantly improved. While, section IV of this same document describes the characteristics of corner-cube arrays employed in various experimental work. Further, a series of pseudo phase-conjugation imaging experiments is also described in Sec. V of the same document. Wherein, the experiments, as described by T. R. O'Meara in his "Wavefront Compensation with Pseudoconjugation," Opt. Eng. 21, 271, (1982), also confirm the theoretical predictions, and demonstrate ways of obtaining wavefront correction in double-pass transmission through distorting media.

As illustrated in FIGS. 39, 39A, 39B, 40, T. R. O'Meara generally describes in his paper that each retro-reflecting corner-cube element 223 used in a retro-reflection corner-cube array based PCM have a tetragon apertured tetrahedral shaped geometry 233, which comprises of at least three photon reflecting surfaces that are assembled at adjacent right-angle locations relative to each other. Further, the tetragon apertured tetrahedral shaped corner-cube elements 233 (FIGS. 39, 39A, 39B, and 40) may be hollow external reflectors with at least three external photon-reflecting surfaces, or the tetragon apertured tetrahedral shaped corner-cube elements 233 (FIGS. 39, 39A, 39B, and 40) may be instead solid internal reflectors with at least three internal photon reflection surfaces.

Figure 28:
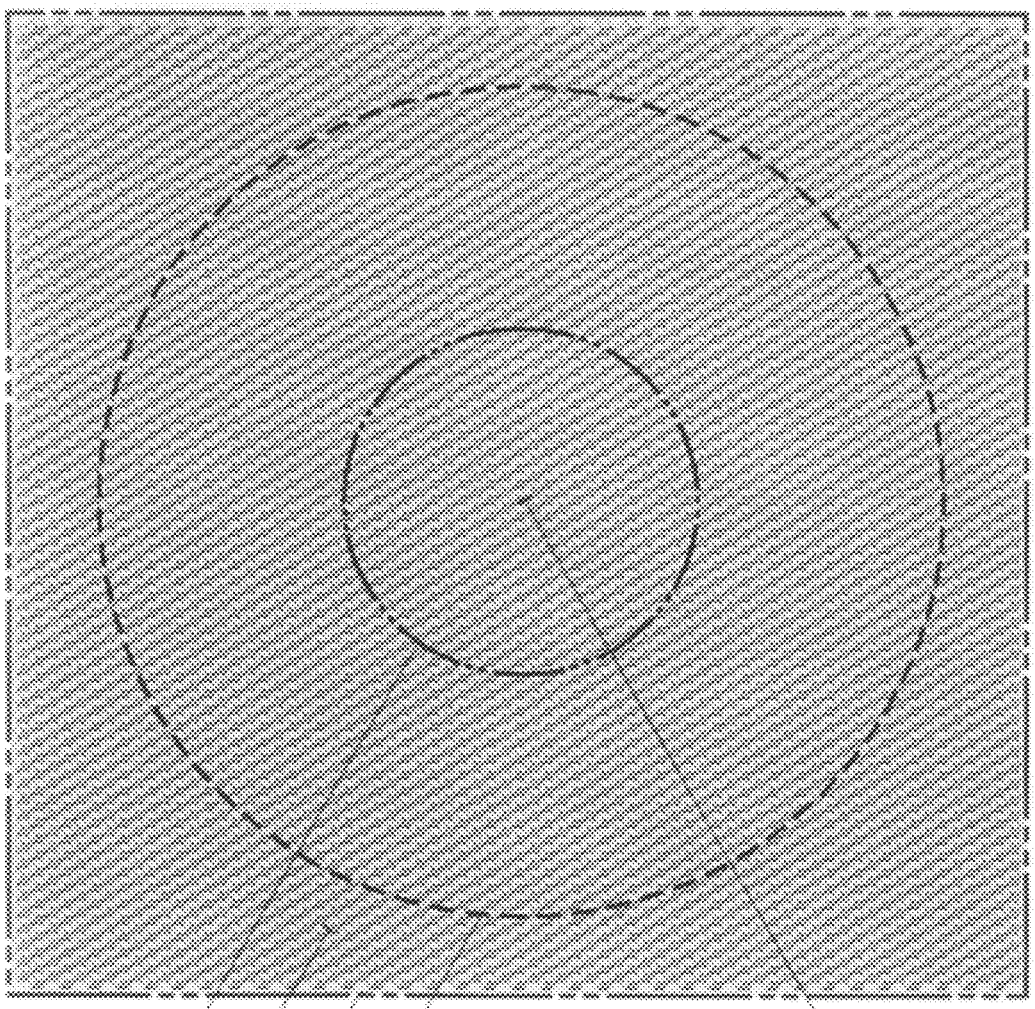
FIG. 28 is a plan-view illustration of a high-density array of hexagon shaped corner-cube retro-reflecting prisms altogether used to comprise the OPCLD's PCM, which is shown along with an on-axis laser-beam intensity waistband distribution profile and location.
Figure 41:
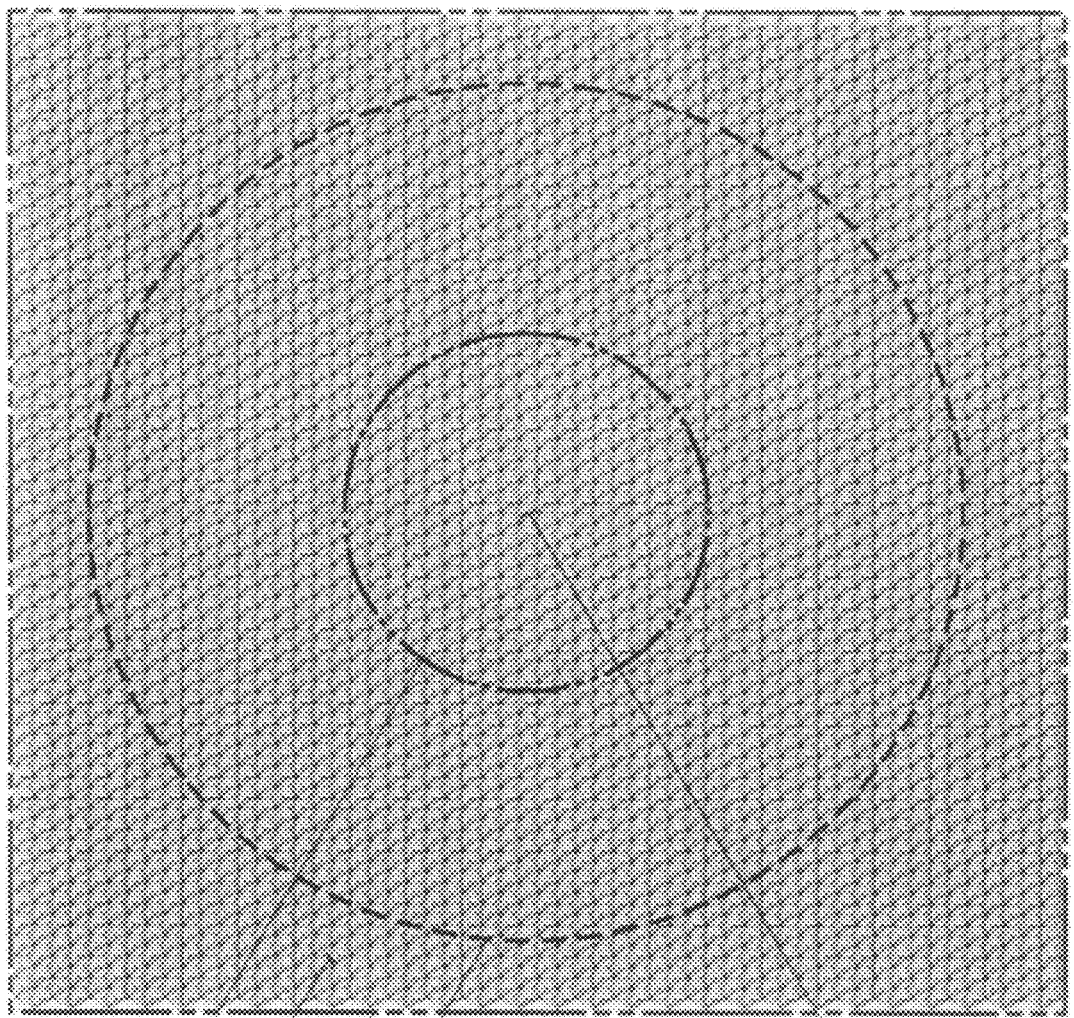
FIG. 41 is a plan-view illustration of a high-density array of tetragon shaped corner-cube retro-reflecting prisms used to comprise an alternate version of the OPCLD's PCM, which is shown along with an on-axis laser-beam intensity waistband distribution profile and location.

Furthermore, when the relative index of refraction $n_2/n_1 = n$ is greater than unity the reflection is described as being external. Contrariwise, when the relative index of refraction $n_2/n_1 = n$ is less than unity the reflection is described as being internal. Moreover, for external reflection the incident light wave approaches the boundary from the side of the transmitting media having the smaller index of refraction, whereas in internal reflection the incident light wave approaches the boundary from the side of the transmitting media having the larger index of refraction. Further, light waves made incident upon the non-reflecting front-face surface normal of a solid corner-cube is subject to a process commonly referred to as "Total Internal Reflection" (TIR), wherein light waves are made to undergo three total internal reflections before exiting back out of the front-face surface normal. Using Snell's Law, shown below as $$\sin\theta_i = \frac{1}{n}\sin\theta_i \quad (7)$$

we can formulate equations in order to solve the amplitudes of both the reflected and the refracted light waves that occur within any particular optical system. Moreover, the experiments used to determine the optical properties exhibited by individual retro-reflection corner-cube structures and the optical properties exhibited by the multitude of retro-reflection corner-cube structures 226 (FIG. 41) used to comprise a retro-reflecting corner-cube array based PCM were thoroughly performed and the results widely published.

Where upon with further analysis, data resulting from these experiments are in agreement with presented theory. However, the researchers mentioned two other critical areas, which they could only speculate upon having no tangible recorded data to support their assumptions, the two critical areas mentioned by the researchers, include:

Diffraction loss—more specifically, the amount of diffraction loss that might be introduced into the PCR if the individual corner-cube elements were made to small in an attempt to increase the perturbation capturing resolution of the PCM. Wherein, the degree of which, as speculated by the researches, would be too high, and consequently would disallow any lasing for the resonator. However, as evidenced by the research, development, production, and use of 'Blazed Diffraction Grating' mirrors in External Vertical Cavity Surface Emitting Laser, such as the ones described in a paper written by A. Lohmann and R. R. A. Syns, *Member, IEEE*, the amount of diffraction loss, and how it would contribute to non-lasing, was overstated by T. R. O'Meara's, "Wavefront Compensation with Pseudoconjugation," Opt. Eng. 21, 271, (1982), and in fact is quit probably irrelevant. Irrelevant, simply because the conjugate reflection provided for by the PCM reverses all diffraction loss suffered by incoming incident wavefronts, and Very small element size—more specifically, T. R. O'Meara et al. states in his paper entitled "Wavefront Compensation with Pseudoconjugation," Opt. Eng. 21, 271, (1982), that it would be to problematic to produce coherent retro-reflecting corner-cube arrays 226 (FIG. 41) if the desired aperture size for each corner-cube element 223 (FIGS. 39, 39A, 39B, and 40) comprising the array 226 (FIG. 41) were made one millimeter in diameter aperture size. However, using grey-scale masking, lithography, and etching, outsourced manufacturers I hired to provide for prototypes can effectively reproduced coherent hexagon apertured hexahedral shaped corner-cube 198 (FIGS. 26, 26A, 26B and 27) arrays 200 (FIG. 28), which are comprised as having a multitude of individual corner-cube elements 200 (FIGS. 27 and 28) comprised as having an aperture diameter dimension size 199 equaling 2.0-μm, but more preferably $\leq \lambda/n_2$ of the material used to construct the array 200 (FIG. 28).

Furthermore, the experiments sited in the paper written by T. R. O'Meara's, "Wavefront Compensation with Pseudoconjugation," Opt. Eng. 21, 271, (1982), were performed using both hollow and solid tetragon apertured tetrahedral shaped corner-cube elements 233 (FIGS. 39, 39A, 39B, and 40). All the corner-cube structures used in the experiments were tetragon apertured tetrahedral shaped corner-cube elements 233 (FIGS. 39, 39A, 39B, and 40) having three adjacently connected triangular shaped front faces 223. Wherein, the front face of all the corner-cubes used in all the arrays were in alignment—parallel along a single plane. Further, if the corner-cubes 225, 226 being used in the array 226 (FIGS. 40 and 41) tetragon apertured tetrahedral shaped corner-cube geometry, not all the light made to enter the front face 226 of these tetragon shaped corner-cubes 225 will become part of the retro-reflected beam.

Depending on where the light enters the corner-cube 223, some of the light makes only one or two reflections and exits the front face before completing the third reflection, and it does not become part of the retroreflected beam. The spatial extent of the retroreflected beam as it exits the front face is smaller than the front face. The reason for this is that the tetragon apertured tetrahedral shaped corner-cube structure used in the sited experiments has an aperture size that equals only about 30% of the tetrahedral shaped corner-cube's entire surface normal area.

While, the preferred embodiment of my OPCLD invention departs from what is described by T. R. O'Meara's, "Wavefront Compensation with Pseudoconjugation," Opt. Eng. 21, 271, (1982), with the preferred use of hexagon apertured hexahedral shaped corner-cube prism elements 198 (FIGS. 26, 26A, 26B and 27) to comprise the inventions PCM 168 (FIG. 19). The reason for the change is quit simply, because hexagon apertured hexahedral shaped corner-cube prism elements 198 (FIGS. 26, 26A, 26B and 27) provide for an aperturing size that equals more than 99% of the hexahedral shaped corner-cube's entire normal surface area, which in turn results in the capture and retro-reflection of 70% more light than what can be captured and retro-reflected by the tetragon apertured tetrahedral shaped corner-cube structure 223, 225 (FIGS. 39, 39A, and 39B) sited in T. R. O'Meara's experiments. This greatly improves the overall gain of my OPCLD invention, but also greatly improves the performance of the pseudo phase-conjugated reflection exhibited by the invention's PCM 200 (FIG. 28).

In addition, the spatial extent exhibited by the retroreflected beam may be considered as the exit pupil of the corner-cube 198 (FIGS. 26, 26A, and 26B) and can be described by an aperture function $a_{CC}(x, y)$, which defines the transmitted amplitude of the light in the retro-reflected beam 205 (FIG. 27B). The ideal aperture function, however, is a one-zero function, assuming that the values of one are within the exit pupil and the values of zero is outside the exit pupil. In practice, the value of $a_{CC}(x, y)$ within the exit pupil is less than one due to reflection losses and is complex-valued due to wavefront aberrations.

In addition, polarization effects, due to reflection or total internal reflection, may couple a significant fraction of the incident light into the orthogonal polarization state. These polarization effects affect the operation of corner-cubes 200 (FIG. 27) in imaging and interferometric applications. Further, a more precise mathematical characterization of the corner-cube itself would address these polarization effects. Consequently, this can be accomplished by generalizing the scalar amplitude transmission $a_{CC}(x, y)$ to a spatially varying Jones polarization matrix (i.e., a polarization aberration function) $J_{CC}(x, y)$ to include the polarization coupling.

Moreover, for light near normal incidence onto the array 200 (FIG. 28), the shape of the exit pupil for each corner-cube structure [the nonzero portion of $a_{CC}(x, y)$] is an irregular hexagon shaped with parallel opposite sides. The shape of the exit pupil depends on the detailed shape of the corner-cube and the direction of the incident light. For more details, please see—1 Aug. 1988/Vol. 27, No. 15/APPLIED OPTICS 3203. Further, the polarization effects as described above is negligible, and therefore, consequently does not affect the operation of the hexagon apertured hexahedral shaped corner-cube prism elements 198 (FIGS. 26, 26A, 26B and 27) or the retro-reflecting corner-cube array based PCM 200 (FIG. 28) for that matter.

In addition, if the tetragon apertured tetrahedral shaped corner-cube structure 223, 225 (FIGS. 39, 39A, and 39B) is used, then, consequently for any incoming light waves exhibiting large angles of incidence, the shape of the exit pupil becomes a parallelogram or a triangle. Therefore, the area of the exit pupil relative to the area of the triangular front face comprises a geometrical efficiency factor, which places an upper limit on the fraction of incident energy returned in the retro-reflected beam.

Furthermore, so if a triangular front face, such as one inherent in the tetragon apertured tetrahedral shaped corner-cube structure 223, 225 (FIGS. 39, 39A, and 39B), is used, then the geometrical efficiency is always going to less than two thirds. The spatial transformation performed by a single corner-cube reflector upon an incident wavefront is an inversion about the center of the exit pupil. Therefore, let us next consider a wavefront made incident upon the corner-cube CC array, where $$E_i(x,y,z) = f_i(x,y)\exp(-ikz) \quad (8)$$

while the retro-reflected field will have the form $$E_{CC}(x,y,z) = f_i(-x,-y)\exp(+ikz)a_{CC}(x,y) \quad (9)$$

For comparison, a wavefront reflected at normal incidence in a conventional plane mirror m has the form $$E_m(x,y,z) = f_i(x,y)\exp(+ikz)a_m(x,y) \quad (10)$$

where $a_m(x,y)$ is an aperture function that defines the spatial extent of the mirror. Further, the complex amplitude of the incident light $f_i(x,y)$ will be decomposed into its amplitude and phase, $$f_i(x,y) = A(x,y)\exp[i\phi(x,y)] \quad (11)$$

to express the effects of a phase-conjugate mirror pc in generating a retro-reflected beam. The phase-conjugated reflection field becomes $$E_{pc}(x,y,z) = A(x,y)\exp[-i\phi(x,y)]\exp(+ikz)a_{pc}(x,y) \quad (12)$$

where $a_{pc}(x, y)$ is an aperture function that describes the area, the efficiency, and the wavefront aberrations for this system. Further, these three retroreflected beams $E_{CC}(x, y, z)$ $E_m(x, y, z)$, and $E_{pc}(x, y, z)$ are in general completely different from each other. For more details, please see—T. R. O'Meara, "Wavefront Compensation with Pseudoconjugation," Opt. Eng. 21, 271, (1982). Further, as illustrated in FIGS. 27A and 27B, for a propagating wavefront of light (i.e., shown as a two dimensional Gaussian shaped dotted line type) 202 when following retro-reflection from a corner-cube array 200, each section 203 of its wavefront 204 will approximate the wavefront sections of a phase-conjugated counterpart 207.

Moreover, as illustrated in FIG. 27B, a wavefront 205 (i.e., shown as a two dimensional Gaussian shaped single-dash double-dotted line type) being retro-reflected from a corner-cube array 200 is shown as having been cut into segments 208 and shifted along the direction of propagation 206, similar to wavefront sectioning in Fresnel lenses or Diffraction gratings. Further, as illustrated in FIG. 27B, the wavefront 205 retro-reflected from a corner-cube array 200 and from a phase-conjugate mirror will be equal if each section 204 of the wavefront 205 has uniform amplitude and an odd phase function.

Furthermore, the only practical case where a retro-reflected wavefront propagating from a corner-cube array 207, while neglecting gaps in the wavefront due to areas where, $a_{CC}(x, y)=0$ will have the same shape 207 (FIG. 27B) as a wavefront 207 propagating from a true phase-conjugate mirror, is when the propagating wavefront 201, 202 being made incident 202 upon the normal of the corner-cube array 200 has an plane-wave distribution and shape. Further, a retro-reflecting corner-cube array 200 based PCM functions as a good pseudo phase-conjugator if the incident wavefronts 202 are made planar-flat across each retro-reflecting corner-cube element used in comprising the array 200 (FIG. 28).

Typically, a retro-reflecting corner-cube array 200 (FIG. 28) acts as a pseudo phase-conjugator by reversing the paths of all the segments of an incident wavefront, where each light-ray is directed backwards toward its point of origin. Pseudo phase-conjugators differ from true phase-conjugators in that the optical path lengths from different corner-cube structures are not equal and therefore, exhibit large differences from structure to structure. Consider the optical path length difference $\Delta$ for two light rays originating from the same object point to different structures in the corner-cube array 200 (FIG. 28).

Consequently, the path length difference for the complete retroreflected path, starting from the point object to the retro-reflection corner-cube array 200 (FIG. 28), then back to the vicinity of the point object will be $2\Delta$. In contradiction to a pseudo phase-conjugator, the path length difference $\Delta$ for true phase conjugation is effectively zero. In pseudo phase-conjugation, the light is returned to the correct image location but exhibits significant phase differences for the wavefront segments. The purpose of the collimating lens used in the experiments conducted by T. R. O'Meara was to minimize the path length differences $\Delta$ from the object to the retro-reflecting corner-cube array, thus minimizing the phase errors at the image.

Moreover, consider a wavefront made incident 201, 202 (FIG. 27A) on a corner-cube array 200 (FIG. 28) with a radius of curvature R. For any illuminating incident wavelength $\lambda$, the quadratic phase-shift $\delta$ across any corner-cube structure having a diameter h is resolved using $$\delta = \frac{2\pi h^2}{2R\lambda} \quad (13)$$

in the paraxial approximation. Further, for the corner-cube structures 226 (FIG. 40) used in this study, the value h is of the order of 300$\lambda$, $\delta \square 2\pi$.

Consequently, very little unevenness was introduced to the phase of any incident wavefront 202 (i.e., the discontinuities between wavefront segments 203) (FIG. 27B) by the individual corner-cubes 198 (FIGS. 26, 26A, 26B, and 27) phase-conjugation criterion was met. Any small phase discontinuity occurring between wavefront segments 203 will guarantee non-cooperative reflection from the entire array 200. Further, final image resolution depends upon what the total optical path length variation is across the entire corner-cube array 200 used to comprise the invention's PCM 200, but is an quantity that lies somewhere between the point spread function of a single corner-cube 198 and the point spread function of a coherent (phased) group of corner-cubes 200 (FIG. 27) used to form the invention's PCM 200 (FIG. 28).

Moreover, to obtain cooperative (coherent) imaging from all the corner-cube structures present in the PCM 200 will require that only very small phase shifts occur between the wavefronts 204 being reflected by all corner-cube structures 200. For a linear array of N structures illuminated by a spherical wavefront with radius R, the relation $$\Delta = \frac{2\pi(Nh)^2}{2R\lambda} \square 2\pi \quad (14)$$

should be satisfied for cooperative diffraction image formation near the diffraction limit. One way to satisfy this relation is to transform the wavefront 201, 202 (FIG. 27A) into a plane-wave at the entrance to the array with a collimating lens 170B, 170C (FIG. 19), 183, 182 (FIG. 22). However, any quadratic phase variation across the wavefront originating from a single object point accumulated during free-space propagation may not satisfy the condition of Equation (14) and hence, may have a wavefront disrupting effect following retroreflection 205. The performance of a pseudo phase-conjugating system may be improved by correcting for any deterministic (quadratic) phase, which can be predetermined. Further, this is done by inserting a collimating lens 170B, 170C (FIG. 19), 183, 182 (FIG. 22) chosen to collimate the wavefront onto the array 200, which is explained in detail in a latter section below.

Moreover, suffice it to say, the purpose of a concave lens 170A (FIG. 19), i.e. a wavefront spreading thermal lens; and 183 (FIG. 22), i.e. a wavefront spreading Fresnel lens, are used to spread incoming wavefronts 202, both transversely and laterally, until they are made sufficiently enlarged as to be made incident upon the entire normal surface area of the OPCLD's PCM 168, 181. While the purpose of a convex lens 170B, 170C (FIG. 19), i.e. wavefront collimating thermal lens; and 182 (FIG. 22), i.e. wavefront collimating Fresnel lens, are to collimate incoming wavefronts 202, both transversely, and laterally until they are made sufficiently planar-flat across the normal dimension of the OPCLD's PCM 200. Wherein, both lens are used in combination to affect a zero length path difference $\Delta=0$ from the object to the corner-cube array 200, thus eliminating the phase errors at the image.

Moreover, it appears that the pseudo phase-conjugation characteristics of the retro-reflecting corner-cube arrays 200 (FIG. 28) improved with the reduction of corner-cube size. The smaller the structures, the more closely the retroreflected rays will retrace their original paths. Dividing the wavefront into smaller segments also reduces the wavefront discontinuities at the edges of the wavefront patches. Different size corner-cubes are optimum for different applications. For example, the wavefront transmitted through a phase distorting medium will be substantially restored as long as the inner scale of the distortions is much larger than the aperture size of each retroreflecting structure. If this condition is satisfied, however, there may be no reason for decreasing the structure size further.

For my OPCLD invention, being a semiconductor broad area laser diode the phase perturbations caused by spontaneous emissions are small, therefore, the hexagon aperture size for each hexagonal shaped corner-cube element needs to be small as well (e.g., the aperture preferably having a diameter size $\leq \lambda/n_2$ of the material used to construct the corner-cube array) a criteria necessary in order to keep my OPCLD invention from forming multiple filaments during electrical pumping.

In addition, some variation of fringe visibility across the pupil of individual structures due to polarization coupling. Polarization coupling effects were measured for the corner-cube arrays by illuminating them with linearly polarized light and observing the array through a crossed polarizer. Each of the six sub-apertures of a cube has different angles of incidence and orientations of the plane of incidence. The polarization state of the light in the exit-pupil has six different states in each of the six sub-apertures, and these states depend strongly on the incident polarization state.

Moreover, for future applications, thin film sputtered coatings (e.g., LiF) can be used to reduce the polarization coupling effects. Optimizing the cube design (i.e., utilization of Hexagon shaped corner-cubes in place of Tetragon shaped corner-cubes) has reduced the relatively large fraction of energy, which does not become part of the retroreflected beam. The main contribution to this lost energy arises from the area of the entrance pupil, which only covers about two-thirds of the total area of the triangular front face of each corner-cube structure. However, this all seems rather academic, because the polarization of returned conjugate beams is reciprocal.

In addition, regarding the basic properties of transverse eigenmodes, where the modal properties of an optical resonator, whether conventional or phase conjugate, can almost always be separated into transverse eigenmodes, which describes the amplitude and phase variations of the field across planes perpendicular to the resonator axis, and axial or longitudinal eigenmodes and resonant frequencies, which describes the essentially independent variation of the field amplitude and phase along the resonator axis. This separation applies in the present discussion, with unique properties appearing in both the transverse and the longitudinal behavior of phase-conjugator based resonators.

Moreover, the transverse eigenmodes of an optical resonator are conventionally defined as those transverse field patterns (i.e., transverse amplitude and phase distributions) that exactly reproduce themselves in transverse form after one round trip around the resonator, including aperturing and diffraction effects. The overall wave amplitude after one round-trip around the resonator is usually multiplied, however, by a complex eigenvalue with magnitude less than unity that represents the round-trip phase shift and diffraction losses. We wish to find both the eigenmodes and the eigenvalue for PCM resonators.

Mirror reflection coefficients are usually assumed to have unity magnitude in transverse-mode analyses. Phase-conjugate reflectors produced by four-wave mixing with sufficiently intense pump fields may, of course, have a reflection coefficient greater than unity. However, for simplicity, we will treat both the conventional and phase-conjugate mirrors in the invention's resonator as having unity magnitude for their reflection coefficients, while neglecting any gain or loss mechanisms that may be present inside the cavity so long as these are transversely uniform and thus do not change the mode shape.

Furthermore, just as in conventional laser resonators, the net round-trip amplitude gain or loss produced by the combination of lossy or finite-reflectivity optical elements, diffraction losses, laser gain-media, ad the amplitude reflectivity of the phase-conjugate mirror will determine the oscillation threshold level, or the net growth or decay with time of the resonate fields in the cavity. However, only the diffraction losses associated with hard or soft apertures located inside the cavity need to be included in the loss calculations for the transverse eigenmodes.

In addition, regarding reflection properties of a general phase-conjugate mirror that will provide for retro-reflection of incident light. We should first establish some useful results for the reflection from an ideal phase-conjugate reflector when it is viewed through various combinations of apertures, arbitrary wave front perturbing screens, and general paraxial optical systems. Suppose for example, an arbitrary field distribution $\in_1(x)_1$ traveling to the right at a reference plane, which could be second face of the substrate layer 159 (FIG. 19), and passes first through a general phase- or amplitude-perturbing screen with a complex amplitude transmission $\hat{\rho}(x)$, and then through an arbitrary series of cascaded paraxial optical elements (e.g., lenses, interfaces, ducts, ect.), before reaching the Ideal phase-conjugator and being reflected back through the same system.

Furthermore, simple formulas for the overall propagation through this series of optical components. The set of cascaded conventional paraxial optical elements can be described by an overall ray matrix or ABCD matrix. The elements of this matrix may in general be complex if Gaussian transverse gain or loss variations are present, but will otherwise be real. Huygens' integral for the propagation of a wave front through such a paraxial system by itself can then be written within the Fresnel or paraxial approximation in the general form (Collins, 1970).

$$\mathcal{E}(x) = e^{-jkL}\sqrt{\frac{jk}{2\pi B}} \int_{-w_0}^{w_o} \mathcal{E}_0(x_0)\exp\left[-\frac{jk}{2B}(Ax_0^2 - 2xx_0 + Dx^2)\right]dx_0 \quad (15)$$

Wherein, $2w_0$ is the width of the aperture (if any) at the input plane, and $\in_0(x_0)$ is the input wave. We assume the form $\exp[j(\omega t - kz)]$ for the underlying variation of all fields in this section. In most practical optical resonators, field variations in the x and y transverse coordinates can be separated, assuming that the optical system may have astigmatism but not image rotation. Further, for the sake of simplicity, I have written Equation (15) in one transverse dimension only; and because we are primarily interested in the transverse wavefront variations only, we will also ignore the on-axis or plane-wave phase-shift term $\exp(-jkL)$ from now on. However, we should now consider the overall reflection from $\in_1$ to $\in_2$.

In addition, regarding the general case, typically, most PCM devices are based upon and utilize an active non-linear wave-scattering or wave-mixing process; wherein, a non-linear process such as 'Brillion Scattering' or 'Four Wave Mixing' is used in conjunction with material that exhibit a non-linear third-order susceptibility to produce back-scattering conjugate providing gratings when the material is optically pumped. The present OPCLD invention utilizes a passive broadband PCM, and therefore does not require the use of external laser sources to provide for pump beams.

However, I will on occasion present general explanation using the active PCM as the model, as long as the model is degenerate, it should work fine for degenerate passive devices as well. For example, an active degenerate PCR would typically provide for a phase-conjugator (using a non-linear four wave mixing technique) optically pumped at a degenerate frequency $\omega_0$, while an incident field $\in_1(x_1)$ (i.e., sometimes called the probe beam) would exhibit a frequency of $\omega_1 = \omega_0 + \Delta\omega$, and a reflected signal (i.e., sometimes called the conjugate or returned beam) from the phase-conjugate mirror that exhibited a frequency of $\omega_2\omega_0 - \Delta\omega$.

Furthermore, let $A_1$, $B_1$, $C_1$, $D_1$ be the paraxial ABCD matrix elements for a signal at frequency $\omega_1$ traveling to the right from just beyond the perturbing screen to the PCM. We will use capital letters to refer to conventional paraxial ABCD matrices, real or complex, for a wave traveling to the right through a conventional optical system, with the subscript indicating the frequency at which the matrix elements are evaluated; moreover, the symbol $\tilde{A}\tilde{B}\tilde{C}\tilde{D}$ will be used later to refer to a special kind of ABCD matrix arising in phase-conjugate systems.

Moreover, the paraxial matrix for a wave traveling from the PCM back to the reference plane, which could be the second face surface of the substrate layer 159 (FIG. 19), through the same elements at frequency $\omega_2$ will then become $D_2$, $C_2$, $B_2$, $A_2$. Further, any small differences between $A_1, B_1, C_1, D_1$ and $D_2, C_2, B_2, A_2$ will consequently arise only from the small frequency difference between $\omega_1$ and $\omega_2$. In particular, the two matrices become identical for the degenerate case $\omega_1 = \omega_2$. Additionally, the reflected field $\in_2(x_2)$ coming out of the reference plane after traveling through the perturbing screen and into the PCM, reflecting off the PCM, and traveling back out through the screen again will be given by the double integral $$\mathcal{E}_2(x_2) = \quad (16)$$

$$\hat{p}(x_2)\sqrt{\frac{k_1 k_1}{4\pi^2 B_1^* B_2}} \int_{-w_{pcm}}^{w_{pcm}} dx_{pc} \int_{-w_{cm}}^{w_{cm}} dx_1 \hat{p}^*(x_1)\mathcal{E}_1(x_1) \times$$

-continued $$\exp\left[\frac{jk_1}{2B_1^*}(A_1^* x_1^* - 2x_{pc} x_1 + D_1^* x_{pc}^2) - \right.$$

$$\left.\frac{jk_2}{2B_2}(D_2 x_{pc}^2 - 2x_2 x_{pc} + A_2 x_2^2)\right]$$

where, $2w_{cm}$ is the width of any aperture at the conventional mirror or reference plane, $2w_{pcm}$ is the width of any aperture at the phase-conjugate mirror end, and the wavefront $\in_2(x_2)$ is now at frequency $\omega_2$. The aperture at the conventional mirror end can of course be absorbed into the screen function $\hat{\rho}(x)$ by setting $\hat{\rho}(x)=0$ for $|x|>w_{cm}$, after which the corresponding limits of integration can be extended to infinity.

In addition, with regards to an unbounded phase-conjugate mirror, the ideal case being, an unbounded "Phase-Conjugating Mirror" (PCM), wherein ($w_{pcm} \to \infty$). Additionally, by reversing the order of integration and evaluating the integral over $dx_{pc}$, we can reduce Equation (16) to get $$\mathcal{E}_2(x_2) = \hat{p}(x_2)\sqrt{\frac{jk_2}{2\pi\tilde{B}}} \quad (17)$$

$$\int_{-\infty}^{\infty} dx_1 \hat{p}^*(x_1)\mathcal{E}_1(x_1) \times \exp\left[-\frac{jk_2}{2\pi\tilde{B}}\tilde{A}x_1^2 - 2x_1 x_2 + \tilde{D}x_2^2\right]$$

Furthermore, the complex quantities $\tilde{A}\tilde{B}\tilde{C}\tilde{D}$ appearing in this integral are the elements of an "equivalent phase-conjugate ray matrix," or an equivalent ABCD matrix for the double-passed system, given by $$\begin{bmatrix} \tilde{\mathcal{A}} & \tilde{\mathcal{B}} \\ \tilde{\mathcal{C}} & \tilde{\mathcal{D}} \end{bmatrix} = \begin{bmatrix} D_2 B_2 \\ C_2 A_2 \end{bmatrix}\begin{bmatrix} A_1^* - (k2/k1)B_1^* \\ -(k_1/k_2)C_1^* D_1^* \end{bmatrix} \quad (18)$$

$$= \begin{bmatrix} A_1^* D_2 - (k_1/k_2)B_2 C_1^* B_2 D_1^* - (k_2/k_1)B_1^* D_2 \\ A_1^* C_2 - (k_1/k_2)A_2 C_1^* A_2 D_1^* - (k_2/k_1)B_1^* C_2 \end{bmatrix}$$

Please note for the degenerate case where, $k_1 = k_2$ the off-diagonal elements $\tilde{B}$ and $\tilde{C}$ of this matrix becomes purely imaginary and $\tilde{D} = \tilde{A}$. Further, the two-way trip into the PCM and back out is evidently equivalent to taking the complex conjugate of the input field $\in_1(x_1)$, and then propagating this conjugated field at frequency $\omega_2$ by applying the usual Huygens integral of Equation (15), but using the phase-conjugate equivalent $\tilde{A}\tilde{B}\tilde{C}\tilde{D}$ matrix given by Equation (18).

In addition, lets suppose the paraxial optical elements remain degenerate ($\omega_1 = \omega_2 = \omega_0$) and also purely real (i.e., no transverse loss or gain variations), but the phase-conjugator has only a finite width extending from $-\omega_{pcm}$ to $\omega_{pcm}$. Then the finite integral of Equation (16) over $dx_{pc}$ can still be carried out, leading to the equation originally given by Lam and Brown et al. (1980), $$\mathcal{E}_2(x_2) = \hat{p}(x_2)\int_{-\infty}^{\infty} \hat{p}^*(x_1)\mathcal{E}_1(x_1) \quad (19)$$

$$\exp\left[-\frac{jkA}{2B}(x_2^2 - x_1^2)\right] \times \frac{\sin[(kw_{pcm}/B)(x_2 - x_1)]}{\pi(x_2 - x_1)} dx_1$$

Moreover, the kernel of the above equation differs in an interesting way from the usual Huygens kernel. The equation says in effect that the diffraction effects of a sharp aperture immediately in front of a phase conjugator appear as a kind of filtering of the usual Huygens kernel with a filter of the form sin c[($kw_{pcm}/B$)($x_2-x_1$)], where sin c x≡(sin x)/x.

In addition, for an unbounded phase-conjugate mirror that is experiencing phase perturbations only the width of the phase conjugator becomes very large and $w_{pcm}$→∞ the sin c function becomes effectively a Dirac δ function, and Equation (19) will as a result, reduce to being $$\in_2(x)=|\hat{\rho}(x)|^2 \in_1(x). \tag{20}$$

Furthermore, suppose the perturbing screen contains only phase and not amplitude perturbations, so that $|\hat{\rho}(x)|^3 \equiv 1$. Consequently, then this result becomes simply $\in_2(x) = \in_2(x)$. Moreover, this verifies mathematically the semi obvious conclusion that an ideal phase-conjugate mirror seen through any optical system containing only arbitrary phase perturbations is still an ideal phase-conjugate mirror. Further, any transverse amplitude variations, however, whether they occur in the ABCD elements or in the perturbing screen $\hat{\rho}(x)$, will reduce or destroy the ideal phase conjugation.

In addition, regarding unbounded phase-conjugate resonators, suppose for the moment that an unbounded 100% reflecting conventional mirror with an arbitrary surface contour is set up facing an unbounded phase-conjugate system as just described. The arbitrary distorted end mirror can be replaced with an ideal plane mirror plus a suitable phase-perturbing screen with a phase perturbation proportional to the surface deviation of the conventional mirror. The field variation $\in(x)$ across the plane mirror will then correspond to the field profile on the surface of the distorted end mirror. Any phase distortion in the end mirror can thus be absorbed into the total perturbing element $\hat{\rho}(x)$.

However, for the limiting case of degenerate signals, real optical elements, and pure phase perturbations only, the resonator eigenvalue equation then becomes simply $$\in_2(x) = \in_1(x) = \gamma \in_1(x). \tag{21}$$

where γ is the resonator eigenvalue and $\in_1(x)$ is the field on the surface of the conventional end mirror. Further, Equation (20) is evidently satisfied by any field distribution that has constant phase, but arbitrary amplitude variations; i.e., $\in_1(x) = |\in_1(x)| \exp(j\theta_1)$ with $\theta_1$=cont. Additionally, the associated eigenvalue is $\gamma = \exp(-2j\theta_1)$ so that $|\gamma|=1$.

Therefore, we can conclude that for an ideal degenerate phase-conjugate resonator (i.e., one with an unbounded phase-conjugator, arbitrary phase perturbations, but no transverse amplitude variations) any wave front with a phase surface matching the conventional mirror surface, but with any arbitrary amplitude profile, is self-reproducing after one round trip through the resonator. Further, such an ideal PCM resonator thus has, depending on one's particular $\in_2(x) = \in^*_1(x) = \gamma \in_1(x)$ viewpoint, either an infinite variety of transverse modes or no unique eigenmodes at all.

Additionally, a second conclusion that can be drawn is that the distinction between geometrically stable and unstable periodic focusing systems, so fundamental to conventional optical resonators, completely disappears in phase-conjugate resonators. For example, a phase-conjugate mirror can reflect the diverging beam from a divergent conventional mirror back to the same mirror surface again, with no net magnification per round trip. If both the conventional mirror and the PCM are unbounded transversely, then any field distribution whose phase front matches the conventional mirror surface, with any arbitrary transverse amplitude variation, will be self-reproducing after a single round trip through the resonator.

Therefore, if a lasing cavity comprises a phase-conjugate resonator, even if it uses a strongly divergent conventional end mirror, the diverging wave front of a resonant mode will simply be focused back onto the mirror, rather than being diverged and magnified on successive round trips as would be the case in a conventional unstable resonator. Consequently, there is essentially no such thing as an "unstable" phase-conjugate resonator. This property is how my OPCLD invention can obtain a large-mode-volume for high-power fundamental transverse spatial cavity mode laser-emission-output, but still maintains simply monolithic construction, while providing for a mode stable 'High-Q Cavity' monochromic laser diode that is also free of filamentation.

In addition, a third conclusion can be derived at by cascading Equation (20) through two complete round trips to obtain $\in_3(x) = |\hat{\rho}(x)|^4 \in_1(x)$, wherein $\in_3$ is the output after two round trips. Further, if $\hat{\rho}$ has only phase variations, we can say that in an ideal phase-conjugate resonator (i.e., having no apertures present) any amplitude and phase pattern, whether phase fronts match the laser-emission-output mirror 164 (FIG. 19) surface or not, is self-reproducing after two complete round trips. This behavior maybe likened to resonator that comprises a folded cavity configuration, wherein the second round trip could be described as being folded over onto an opposite side of the conjugate mirror. Please, make note that this result does not mean that the double-passed wave front is therefore a transverse spatial mode. Rather, this situation should be viewed as a mixture of transverse modes beating with each other on alternate round trips through the resonator.

Furthermore, the general properties and behaviors of ideal phase-conjugate resonators have the following implications for active PCM based resonators, whether they employ intracavity laser gain or a phase-conjugate mirror with net gain, i.e., having a reflection coefficient greater than unity. Most optical resonators suffer from some optical phase aberration or another, either in the intracavity elements or in the conventional laser-emission-output end mirror. If the intra-cavity distortions are purely phase distortions, no matter how "thick" these distortions may be, and then an ideal phase-conjugate mirror will produce a uniphase wave front on the conventional laser-emission-output mirror's surface.

Moreover, this means an essentially diffraction-limited laser-emission-output beam emerging from the left-hand or conventional mirror end of this resonator (given that the diffraction spreading of a laser beam is much more sensitive to its phase profile than its amplitude profile). Consequently, severe phase distortions in the optical elements can be effectively canceled. The cavity will not experience either the severe reduction in the laser-emission-output beam quality or the severe power losses that intracavity phase perturbations commonly produce (Siegman, 1977).

Furthermore, if the conventional laser-emission-output mirror 164 (FIG. 19) itself has a badly wrinkled surface, the resonator will still oscillate with low losses; but the output beam through the conventional laser-emission-output mirror will reproduce the mirror's wrinkles exactly, and thus have poor beam quality. Moreover, it should be clear at this point why and how a PCM based broad area laser diode is provided with a great deal of flexibility regarding the choice over one transverse spatial cavity mode vs. another for lasing. This kind of flexibility over transverse laser emission is unprecedented and does not currently exist for any known conventional (i.e., conventional semiconductor laser diodes without a PCM) semiconductor laser diode.

In addition, regarding phase-conjugate resonators with finite apertures, the infinite variety of transverse amplitude patterns possible in an unbounded phase-conjugate resonator is destroyed as soon as any finite aperture, or any other transverse gain or loss variation, is added to the resonator. Transverse gain variations or apertures produce diffraction effects for the optical waves oscillating inside the phase-conjugate resonator. These diffraction effects cannot be fully canceled by the phase-conjugate mirror, because the conjugator cannot in general intercept all the light. Further, sharp-edged apertures in particular will introduce losses and edge diffraction effects that cannot be compensated for by the PCM.

However, we cannot say that adding either soft (i.e., Gaussian) or hard apertures to the phase conjugate resonator converts to continuous distribution of possible transverse amplitude patterns into a discrete set of lowest-order and higher-order transverse eigenmodes. These modes generally continue to have phase fronts that match closely, but no longer exactly, the surface of the conventional laser-emission-output end mirror. They also have amplitude patterns that generally minimize the diffraction losses produced by the aperture on the transverse eigenmodes. Optical resonators in general have a marvelous ability to adapt their mode patterns to minimize their diffraction losses, while remaining within the constraints of the wave equation. Phase-conjugate resonators with finite apertures largely take advantage of the properties of phase-conjugation to do an even more effective job of this.

In addition, the Hermite-Gaussian transverse eigenmodes of a conventional optical resonator or lens waveguide can be closely approximated by Hermite-Gaussian functions so long as:

(i) The resonator is geometrically stable, and (ii) No optical elements with transverse gain or phase-shift variations of order higher than quadratic are present (Kogelnik and Li, 1966; Siegman, 1971).

Furthermore, the transverse eigenmodes for phase-conjugate resonators will similarly turn out to be of Hermite-Gaussian form if:

(i) Hard-edged diffraction effects are small, and (ii) The resonator contains only conventional (though possibly complex) quadratic paraxial elements in addition to the phase-conjugate mirror.

Geometrically stability, in the conventional resonator sense, is not, however required, or even meaningful in the PCM case. Further, the Hermite-Gaussian solutions do not tell us about the behavior of PCM based resonators in the presence of aberrations, but they will give us the fundamental mode shapes in simple paraxial PCM resonators.

In addition, regarding Hermite-Gaussian mode propagation, we will first examine the propagation properties of the most general complex Hermite-Gaussian modes. Further, using a reference plane located directly on the surface of the conventional laser-emission-output mirror, as done by Au Yeung et al., (1979), a general Hermite-Gaussian transverse mode at frequency $\omega$ with complex radius of curvature $\hat{q}$ and with a "complex spot size" $\hat{u}$, may be written as $$\mathcal{E}(x) = \alpha_m \hat{v}^m H_m\left(\frac{\sqrt{2x}}{\hat{v}}\right) \exp\left(-j\frac{kx^2}{2\hat{q}}\right) \tag{22}$$

where $\alpha_m$ is a complex amplitude coefficient and $H_m$ the Hermite polynomial of order m. The complex radius of curvature $\hat{q}$ is defined as used by $$\frac{1}{\hat{q}} \cdot \frac{1}{R} - j\frac{\lambda}{\pi w^2} \tag{23}$$

with R being the real radius of curvature and w the real Gaussian spot size, so the fields have a transverse amplitude variation like $\exp(-x^2/w^2)$. The parameter $\hat{v}$, which appears only in the highest-order Hermite functions, is a complex generalization of the end spot size w. This parameter is normally real and equal to w in elementary Gaussian beam theory. However, it can become an independent complex quantity in general, and especially so when complex ABCD matrices are involved.

Moreover, let a Hermite-Gaussian mode in the general form of Equation (22) with parameters $\alpha_{m1}, \hat{v}_1, k_1$, and $\hat{q}_1$ be substituted into the round-trip propagation integral of Equation (17). In other words, this mode will be the input wave propagating to the right, just inside the planar mirror surface. The reflected field at this same plane at frequency $\omega_2$ after one round trip will then be another Hermite-Gaussian function of the same order and the same form as Equation (22), but with transformed values $\alpha_{m2}, \hat{v}_2$, and $\hat{q}_2$ that are given in terms of the phase-conjugate $\tilde{A}\tilde{B}\tilde{C}\tilde{D}$ matrix elements of Equation (18) by $$\alpha_{m2} = \frac{\alpha_{m1}^*}{\left[\tilde{A} - (k1/k2)\tilde{B}/q_2\right]^{m+1/2}} \tag{24}$$

$$v_2^2 = \left[\tilde{A} - (k_1/k_2)\tilde{B}/\hat{q}_{11}^*\right]^2 v_1^{*2} + \frac{4j\tilde{B}}{k_2}\left[\tilde{A} - (k1/k2)\tilde{B}/\hat{q}_1^*\right]$$

$$\frac{1}{\hat{q}^2} = \frac{\tilde{D}/q_1^* - (k2/k1)\tilde{C}}{\tilde{B}/q_1^* - (k2/k1)\tilde{A}}$$

The formulas presented above summarize what happens to a Hermite-Gaussian beam in one round trip through a PCR. Further, the transformation rule for $\alpha_m$ ignores the round-trip axial phase-shift due to reflection at the PCM. Coincidentally, Equations (24) are very similar to the propagation rules stated for Gaussian beams in conventional optical systems, but, however, differ in the minus signs, in the complex conjugation of $\hat{q}$, and in the special phase-conjugate $\tilde{A}\tilde{B}\tilde{C}\tilde{D}$ matrix.

In addition, with regards to Hermit-Gaussian resonator eigenmodes, the self-consistent Hermite-Gaussian eigenmodes for a PCR are those values of $\hat{q}_1 = \hat{q}_2 = \hat{q}_{cm}$ and $\hat{u}_1 = \hat{u}_2 = \hat{u}_{cm}$ at the conventional mirror, which obey Equations (24), and which are self-reproducing after one round trip for the degenerate case $\omega_1 = \omega_2$, or after two round trips for the non-degenerate case. Further, we will examine these Hermite-Gaussian eigenmodes for typical PCM based resonators shortly. Wherein, the resulting self-consistent $\hat{q}$ values can be conveniently represented as points or loci in a complex $1/\hat{q}$ plane (actually the $1/\hat{q}^*$ plane) with x and y axes defined by $$\frac{1}{\hat{q}} \cdot x - jy = \frac{1}{R} - j\frac{\lambda}{\pi w^2}. \tag{25}$$

Moreover, the points in the upper half plane (y>0) then correspond to confined Hermite-Gaussian modes, i.e. modes for which the transverse field variation $\exp(-x^2/w^2)$ decays rather than grows at infinite radius. To be physically significant, Hermite-Gaussian resonator eigenmodes most be not only confined ($w_{cm}^2 > 0$) but also perturbation stable (Casperson et al., 1974). Perturbation stability requires that small perturbations $\in \hat{q}$ or $\delta \hat{v}$ about the self-consistent eigenmodes $\hat{q}_{cm}$ and $\hat{v}_{cm}$ should decay rather than grow exponentially on successive round trips. Further, for complex ABCD matrices, not all confined eigensolutions are necessarily perturbation stable, and vice versa.

In addition, the Hermite-Gaussian eigensolutions for real paraxial elements present within a PCM based resonator, specifically for the degenerate case $\omega_1 = \omega_2 = \omega_0$, are found as follows. The $\tilde{A}\tilde{B}\tilde{C}\tilde{D}$ matrix elements for the PCM cavity as given in Equation (18) may be written in general in the convenient forms $$\tilde{A} = A_m e^{-j\theta_m} - A_1 - jA_2,$$

$$\tilde{B} = jB_m,$$

$$\tilde{C} = jC_m,$$

$$D = A^* \tag{26}$$

Where $A_m^2 - B_m C_m = 1$. Further, I will use $A_m$, ect, for the magnitudes of these complex matrix elements, and $A_1$ and $A_2$ for the real and imaginary parts of $\tilde{A}$. Consequently, the trans-formation of the $1/\hat{q}$ value in one round trip is then given by $$\frac{1}{\hat{q}_2} = \frac{\mathcal{A}_m e^{j\theta_m} / \hat{q}_1^* + jC_m}{jB_m / \hat{q}_2^* - \mathcal{A}_m e^{-j\theta_m}} \tag{27}$$

where $\hat{q}_1$ is the value before and $\hat{q}_2$ the value after one round trip. With purely real ABCD elements, which means $A_m = 1$ and $\theta_m = B_m + C_m + 0$, this becomes $1/\hat{q}_2 = -1/q^*_1$ which has the self-consistent eigensolutions $$\text{Re}\frac{1}{\hat{q}_{cm}} \equiv \frac{1}{R_{cm}} = 0 \tag{28}$$

$$\text{Im}\frac{1}{\hat{q}_{cm}} \equiv \frac{-j\lambda}{\pi w_{cm}^2} \text{arbitary}$$

Moreover, this family of solutions for real ABCD elements maps into a locus of self-reproducing solutions located anywhere on the y axis in the complex $1/\hat{q}$ plane. These solutions correspond physically to a uniphase wave front on the end mirror (i.e., $R_{cm} = \infty$) and an arbitrary Gaussian spot size $w_{cm}$. This simply reiterates our earlier conclusion that in an ideal PCM resonator any field pattern with phase front matching the laser-emission-output end mirror profile and with any amplitude profile will be self-reproducing.

Equation (27) also tells us that a Gaussian beam launched from any initial point $1/\hat{q}_1$ in such a system, with finite initial curvature $R_1$ and any spot size $w_1$, is simply reflected in the imaginary axis in the $1/\hat{q}$ plane after each round trip. The beam returns to the mirror after one round trip with the same spot size $w_1$ and reversed curvature $R_2 = -R_1$.

Therefore, I conclude that a Gaussian beam in a real-matrix PCM resonator is perturbation stable, and movement is automatically self-consistent after two round-trips. The self-consistent locus for $1/\hat{q}_{cm}$ as measured at the conventional laser-emission-output end mirror of the resonator can be transformed to any other plane within the PCR by using the appropriate ABCD matrix and the rules for Gaussian beam propagation. For example, an equivalent locus location at the phase-conjugate mirror end is given by $$\hat{q}_{pcm} = (A\hat{q}_{cm} + B)/(C\hat{q}_{cm} + D) \tag{29}$$

Moreover, this represents a conformal transformation in the $1/\hat{q}$ plane. For purely real ABCD elements, Equation (29) transforms the straight-line y-axis locus at the conventional laser-emission-output end mirror into a circle at the PCM end, please see (Belanger et al.) for more details on this subject. Even for complex paraxial systems with transversely varying losses, the imaginary parts of the ABCD elements are usually small, and the same interpretation remains approximately correct.

In addition, regarding complex-valued ABCD paraxial elements (i.e., systems with transversely varying loss or gain) the self-consistent solutions to Equation (27) are given by the roots of $$\frac{1}{\hat{q}\hat{q}^*} + \frac{j}{\mathcal{B}_m}\left(\frac{\tilde{\mathcal{A}}}{\hat{q}} + \frac{\tilde{\mathcal{A}}}{\hat{q}}\right) - \frac{C_m}{\mathcal{B}_m} = 0 \tag{30}$$

Moreover, this equation may be separated into two parts $$\left|\frac{1}{\hat{q}}\right|^2 = \frac{C_m}{\mathcal{B}_m} \text{ and } \text{Re}\left(\frac{\tilde{\mathcal{A}}}{\hat{q}}\right) = 0 \tag{31}$$

Provided that $C_m$ and $B_m$ have the same sign, there are then two unique self-consistent points in the $1/\hat{q}$ plane given by $$x_{cm} \equiv \frac{1}{R_{cm}} = \pm\sqrt{\frac{C_m}{\mathcal{B}_m}\frac{\mathcal{A}_2}{\mathcal{D}_m}} = \pm\sqrt{\frac{C_m}{\mathcal{B}_m}}\sin\theta_m, \tag{32}$$

$$y_{cm} \equiv \frac{\gamma}{\pi w_{cm}^2} = \pm\sqrt{\frac{C_m}{\mathcal{B}_m}\frac{\mathcal{A}_1}{\mathcal{A}_m}} = \pm\sqrt{\frac{C_m}{\mathcal{B}_m}}\cos\theta_m,$$

or, in condensed form, $$\frac{1}{\hat{q}_{cm}} = \frac{1}{R_{cm}} - j\frac{\lambda}{\pi w_{cm}^2} = \pm j\sqrt{C_m/\mathcal{B}_m}\exp(j\theta_m). \tag{33}$$

Moreover, of these two roots, of course, only the confined solution with $y_{cm} > 0$, and hence with $w_{cm}^2 > 0$, can be physically meaningful.

In addition, for purely real paraxial systems, the angle $\theta_m$ will become vanishingly small, and the magnitude ratio $C_m/B_m$ will become indeterminate. Within this limit, Equations (32) convert to the continuous y-axis locus of Equation (28). Further, for complex systems with a transmission maximum on axis, and with not too rapid transverse variation, which is the usual situation, the angle $\theta_m$ will normally be too small. The two discrete eigensolutions given by Equations (32) or (33) will then lie close to the y-axis at equal distances above and below the x-axis, as I will describe shortly. The point below the x-axis, of course represents a nonphysical solution whose fields increase rather than decrease with distance away from the resonator axis.

In addition, regarding transverse mode stability, suppose for a moment that a Gaussian beam is in some fashion launched into a phase-conjugate resonator just inside the conventional laser-emission-output mirror end with an initial Gaussian beam parameter that differs from the exact self-consistent value $1/\hat{q}_{cm} \equiv \hat{z}_{cm}$ by a small perturbation $\delta\hat{z} \equiv \delta(1/\hat{q}) \ll 1/\hat{q}$ .... Further, we can then write the Gaussian curvature parameter for this beam one round trip later, which we will call $\hat{z}' \equiv 1/\hat{q}'$, in the following form $$\hat{z}' \equiv \hat{z}_{cm}\delta\hat{z}' = \frac{\tilde{D}(\hat{z}_{cm} + \delta\hat{z})^* - \tilde{C}}{\tilde{B}}(\hat{z}_{cm} + \delta\hat{z})^* - \tilde{A}^*. \tag{34}$$

Expanding this to first order in the small perturbation $\delta\hat{z}$ and making use of $\tilde{A}\tilde{D} - \tilde{B}\tilde{C} = 1$ gives us the growth ratio for the perturbation after one round trip through the resonator described as being $$\left|\frac{\delta\hat{z}'^*}{\delta\hat{z}^*}\right| = \frac{1}{\mathcal{A}_m \pm \mathcal{B}_m\sqrt{C_m/\mathcal{B}_m)^2}}. \tag{35}$$

where $\hat{q}$ is one or the other of the self-consistent solutions from Equations (32).

Furthermore, each of these self-consistent solutions will or will not be perturbation stable depending on whether the small perturbation $\delta\hat{z} \equiv \delta(1/\hat{q})$ decays or enlarges on successive round trips. We must ask, therefore, whether $\delta\hat{z}' \equiv \delta\hat{z}^*$ has magnitude greater or less than unity. Putting the degenerate self-consistent results from Equations (33) into Equation (35), while keeping proper track of the plus and minus signs yields $$\left|\frac{\delta\hat{z}'^*}{\delta\hat{z}^*}\right| = \frac{1}{\mathcal{A}_m \pm \mathcal{B}_m(\mathcal{A}_m - \sqrt{C_m/\mathcal{B}_m})^2}. \tag{36}$$

Further, noting that $A_m^2 - B_m C_m \equiv (A_m + \sqrt{B_m/C_m})(A_m - \sqrt{B_m/C_m})$ leads us to define a magnification M given and described as being $$M \equiv A_m + \sqrt{B_m/C_m} \tag{37}$$

Moreover, this parameter is vaguely similar to the magnification M commonly defined for conventional unstable resonators. Evidently, M is greater than unity, at least for the case when $B_m$ and $C_m$ have the same sign, and as they must if any self-consistent solutions are to exist at all. Further, the growth ratio for the perturbations next becomes one or the other of $$\left|\frac{\delta\hat{z}'^*}{\delta\hat{z}^*}\right| = \frac{1}{M^2} \quad \text{or} \quad \left|\frac{\delta\hat{z}'^*}{\delta\hat{z}^*}\right| = M^2. \tag{38}$$

The first case applies if $B_m > 0$ and the upper sign in Equations (32) and (33) is chosen, or if both of these conditions are reversed.

Otherwise, the second case applies, in which case the perturbations grow on successive round trips through the resonator. However, to be physically useful, transverse eigenmodes most be both confined (y>0) and perturbation-stable ($|\delta\hat{z}'/\delta\hat{z}^*|=1/M^2$). Further, this eventually can occur if either $A_1$ and $B_m$ [in the notation of Equation (26)] are both >0, in which case the upper sign in Equations (32) and (33) must be chosen, or if $A_1$ and $B_m$ are both <0, in which case the lower sign must be chosen.

Moreover, a condensed version of expressing this is given below and requires that $$Im(\tilde{A}/\tilde{B}) < 0. \tag{39}$$

This happens to be formally the same as what was done in an earlier analysis (Belanger et al., 1980a), but the definitions of $\tilde{A}_1$ and $\tilde{B}_m$ as presented here are quite different. Further, for all cases where this is not satisfied, the confined Gaussian solution will be perturbation unstable, and the perturbation stable solution will diverge radially and henceforth be unphysical.

In addition, regarding resonator eigenvalue mode losses, wherein the complex amplitude coefficient for a degenerate Hermite-Gaussian wave of order m and complex curvature $\hat{q}_1$ decreases after each round trip by the ratio $$\frac{\alpha_{m2}}{\alpha_{m1}^*} = \left(\frac{1}{\mathcal{A} - \tilde{\mathcal{B}}/q_1^*}\right)^{m+1/2} \tag{40}$$

Further, if $\hat{q}_1$ corresponds to the confined and perturbation-stable eigensolution of Equations (32) and (33), this ratio becomes $$\frac{\alpha_{m2}}{\alpha_{m1}^*} = \frac{1}{M^{m+1/2}} e^{j(m+1/2)\theta_m} \tag{41}$$

Moreover, the parameter M thus defines not only the perturbation stability, but also the mode losses per-pass experienced by the Hermite-Gaussian modes. These losses are of course produced by the presence of the quadratic transverse loss variations or "soft apertures" in a complex paraxial phase-conjugate resonator.

Furthermore, an interesting observation is that the mode discrimination between lowest-order and highest-order transverse modes, for a PCR configured resonator, depends only on the magnification M, and hence only on the loss-value of the lowest-order mode, but is otherwise entirely independent of the resonator parameters and of the mode diameter of the transverse eigenmodes. This property is also true for conventional complex paraxial resonators (For more details, please see—Casperson and Lunnam, 1975; Ganiel and Hardy, 1976).

In addition, regarding the complex $\hat{v}$ parameter of higher-order transverse cavity modes, where the complex spot size $\hat{v}$ in a degenerate phase-conjugate resonator transforms after one complete round trip through the resonator, and is given and described as being $$\hat{v}_2^2 = (\mathcal{A} - \tilde{\mathcal{B}}/q_1^*)^2 \hat{v}_2^{*2} + j\frac{2\tilde{\mathcal{B}}\lambda}{\pi}(\mathcal{A} - \tilde{B}/\hat{q}_1^*). \tag{42}$$

Further, if we let $\hat{q} = \hat{q}_{cm}$ become the confined perturbation-stable eigensolution at the conventional laser-emission-output mirror end, as a consequence $\tilde{A} - \tilde{B}/q^*_{cm} = Me^{-j\theta_m}$ and Equation (48) are henceforth transformed to become $$v_{cm}^2 e^{j\theta_m} = M^2 v_1^{*2} e^{-j\theta_m} - \frac{2M\mathcal{B}_m\lambda}{\pi}. \tag{43}$$

The self-reproducing value $\hat{v}_1 = \hat{v}_2 = \hat{v}_{cm}$ for the complex spot size at the conventional laser-emission-output mirror end is herein given as being $$\hat{v}_{cm}^2 = \frac{2M}{M^2 - 1} \frac{\mathcal{B}_m \lambda}{\pi} e^{-j\theta_m}. \tag{44}$$

In addition, for complex paraxial systems the $\hat{v}$ parameter will evidently exhibit a complex value at the conventional laser-emission-output mirror end. Further, this indicates a complex argument in the Hermite polynomials. Moreover, and among other things, this will produce slightly nonspherical phase fronts at the conventional laser-emission-output mirror end for all the Hermite-Gaussian modes of order m≧2.

Consequently, by using the relation $M = A_m + \sqrt{B_m C_m}$, Equation (44) can also be converted into $$\frac{1}{\hat{v}_{cm}^2} = \frac{1}{w_{cm}^2} + j\frac{\pi}{\lambda R_{cm}} \tag{45}$$

wherein, $w_{cm}$ and $R_{cm}$ are the Gaussian eigensolutions given earlier. Further, the complex spot size $\hat{v}_{cm}$ at the conventional laser-emission-output mirror end will consequently differ from the real spot size $w_{cm}$ at the same mirror end; essentially to the same (small) extent that $1/R_{cm}$ will consequently differ from zero, or to the same extent that the phase-front curvature at the conventional laser-emission-output end mirror differs from an exact coincidence with the mirror end itself.

Furthermore, it is also possible to show that the complex spot size $\hat{v}_{cm}$, when transformed to the phase-conjugate mirror end of the resonator, becomes real and identically equal to the real spot size $w_{pcm}$ at that same mirror end; i.e., $\hat{v}_{pcm} = w_{pcm}$. Moreover, this agrees with an earlier analysis of the v parameter carried out at the PCM end of a PCR configured resonator by Belanger et al., 1980b.

In addition, regarding a PCR configured with a total internal reflecting phase-conjugate mirror and a partial-reflecting conventional laser-emission-output Gaussian mode providing curved shaped end mirror; wherein, the conventional laser-emission-output end mirror with an arbitrary radius of curvature $R_0$ being spaced a distance L from a phase-conjugate mirror (comprised as a very large array of corner-cube prism elements) having a "Gaussian aperture" (GA) located just in front of the PCM; i.e., a spreading concave shaped lens and a collimating convex shaped lens. Please note that for any case the actual location of the PCM will be effectively transformed forward to take up position immediately behind the Gaussian aperture (i.e., a soft aperturing lens system).

Moreover, in practical cases this Gaussian aperture may be an inherent characteristic of the phase conjugator itself; for example produced by a finite-width corner-cube array process of passive broadband optical phase-conjugation or by the two finite-width Gaussian pump-beams used in the well-known nonlinear four-wave mixing process of active optical phase-conjugation (Trebino and Siegman, 1980).

In addition, a second example has its curved end mirror with radius of curvature $R_0$, replaced with a plane mirror plus a thin lens with focal length $f = 1/R_0$ for reflection from a curved mirror. Note that we use sign conventions in which R>0 referring to a wave indicates a diverging spherical wave front, whereas R>0 referring to a mirror indicates a concave or converging type mirror. Further, the single-pass voltage transmission of the Gaussian aperture may be written as $$r(x) \equiv \mathcal{E}(x)/\mathcal{E}_0 = \exp(-x^2/w_\alpha^2) \tag{46}$$

so that $w_\alpha$ is the 1/e radius for the amplitude transmission through the aperture. It is then convenient to define a Fresnel number using $$N_\alpha = w_\alpha^2 / 2L\lambda, \tag{47}$$

which characterizes the Gaussian aperture size relative to the length of the PCM cavity. It is also convenient to define a g parameter $$g = 1 - L/R_0, \tag{48}$$

which is the same as the usual g parameter used for conventional optical resonators. Further, the conventional one-way ABCD elements for this cavity are then given by and describe as being $$\begin{bmatrix} A & B \\ C & D \end{bmatrix} = \begin{bmatrix} 1 & 0 \\ -j\alpha & 1 \end{bmatrix} \begin{bmatrix} 1 & L \\ 0 & 1 \end{bmatrix} \begin{bmatrix} 1 & 0 \\ -1/R_0 & 1 \end{bmatrix}, \tag{49}$$

which, results in $\alpha \equiv 1/2\pi N_\alpha L$. Additionally, please note that the individual matrices are cascaded in reverse order so they are encountered by the beam, whereby the Gaussian aperture is represented by a matrix with a complex C element.

Moreover, the phase-conjugate $\tilde{A}, \tilde{B}, \tilde{C}, \tilde{D}$ matrix defined by Equation (18) then has the elements $$\tilde{A} = 1 - 2j\alpha L(1 - L/R_0) = 1 - 2jg\alpha L^2, \tilde{B} = 2J\alpha L^2,$$

$$\tilde{C} = -2j\alpha(1 - L/R_0)^2 = -2jg^2\alpha, \tilde{D} = \tilde{A}^* \tag{50}$$

The self-consistent solutions for the $\hat{q}$ parameter on the conventional laser-emission-output mirror surface are given and described as being $$\frac{1}{\hat{q}_m} = \mp j\frac{|g|}{L}\exp(j\theta_m) \tag{51}$$

$$\frac{1}{\hat{q}_{cm}} = mj\frac{|g|}{L}\exp(j\theta_m),$$

where $$\theta_m = \tan^{-1}(g/\pi N_\alpha) \tag{52}$$

Moreover, perhaps we should emphasize once again that this is the Gaussian $\hat{q}$ parameter for the wave-fronts converging upon the conventional laser-emission-output mirror surface, traveling inward toward the right. Further, please note that only the upper sign in Equation (51) corresponds to a physically meaningful confined and perturbation-stable solution.

Meanwhile, the self-consistent radius and spot size on the mirror end surface at the conventional laser-emission-output mirror end are given and described as being $$R_{cm} = \frac{L}{|g|\sin\theta_m} \approx \frac{\pi N_\alpha L}{g|g|} \tag{53}$$

and $$w_{cm}^2 = \frac{L\lambda}{\pi} \frac{1}{|g|\cos\theta_m} \approx \frac{L\lambda}{\pi} \frac{1}{|g|} \tag{54}$$

whereby, the approximations are valid for $N_\alpha \gg |1-L/R_0|$. Consequently, this approximation basically means that the Gaussian aperture is large compared with the spot size of the cavity mode at the aperture. Further, the Gaussian mode-loss factor—that is, the reduction in cavity mode amplitude after one round trip through the PCR—contains essentially the same ratio, and are given and described as being $$\frac{\alpha_2}{\alpha_1} = \frac{1}{1+|g/\pi N_a|} \tag{55}$$

whereby, $\alpha_1$ and $\alpha_2$ are the mode amplification before and after one round trip through the PCR. Further, please note that the wave-front radius $R_{cm}$ at the conventional laser-emission-output mirror end surface is nearly always ?L; wherein, the wave front very nearly matches the mirror end surface, except for cases where very highly divergent or convergent end mirrors are used, which would comprise a $|R_0| \rightarrow 0$ value.

Furthermore, for a typical pair of values of g and $N_\alpha$, a Gaussian beam launched with an arbitrary initial $\hat{q}_0$ value will converge toward the appropriate self-consistent locus point location upon subsequent round trips through the PCR. Further, for a finite-width soft aperture that exhibits a $1/\hat{q}$ value will no longer oscillate back and forth between two points on opposite sides of a continuous locus, but instead will converge slowly into a final discrete eigensolution.

In addition, concerning cavity mode spot size sensitivity, where one fundamental property of phase-conjugate resonators all have in common is their greatly reduced sensitivity of the mode parameters to perturbations in the cavity design parameters. To explain further, the spot size w of the lowest-order Gaussian mode at any reference plane in a conventional round-trip ABCD matrix of the same resonator, in the form $$w^2 = \frac{B\lambda}{\pi} \frac{1}{\sqrt{1-[(A+D)/2]^2}} = \frac{w_0^2}{(1-g^2)^{\frac{1}{2}}} \tag{56}$$

wherein, $g \equiv (A+D)/2$, $w_0^2 \equiv B\lambda/\pi$, and ABCD elements are the conventional elements for one complete round-trip starting from the same reference plane. Further, the parameter B for a conventional resonator is often comparable with the physical length of the laser cavity. Further, the "confocal spot size" $w_0 = \sqrt{B\lambda/\pi}$ is then usually much smaller than is desirable to obtain efficient energy extraction from a large-diameter laser medium.

Moreover, obtaining a large spot size w and hence a large mode volume in a laser cavity thus, usually requires a cavity design that operates close to (or beyond) the geometrical stability boundary $g^2 \rightarrow 1$. Within this confinement, the sensitivity of the cavity mode spot-size to small fluctuation $\delta g$ in the resonator geometrical parameters becomes very large. Moreover, we can write this sensitivity for a conventional stable resonator, for example, by differentiating Equation (60), in the form $$\frac{\delta w}{w} = \frac{g}{2}\left(\frac{w}{w_0}\right)\delta g \approx \frac{1}{2}\left(\frac{w}{w_0}\right)\frac{\delta g}{g}, w\bigg)\bigg)w_0 \tag{57}$$

The fluctuations in g are eventually multiplied by the very large ratio $(w/w_0)^4$. Conventional stable resonators with large mode diameters are thus inordinately sensitive to very small perturbations in their physical dimensions. Further, the results obtained from Equations (54) and (57) show that in phase-conjugate resonators we have instead $$\frac{\delta w}{w} \approx \frac{1}{2}\frac{\delta g}{g} \tag{58}$$

Moreover, the spot sizes in PCM based resonators are much less sensitive to small changes in the resonator parameters. Further, larger mode volumes can be achieved without operating on the boundary between geometrically stable and unstable systems, while good transverse cavity mode discrimination can still be obtained, for example, by using an appropriate diverging end mirror, plus a weak Gaussian aperture located in the PCM cavity.

In addition, regarding Gaussian apertured phase-conjugate mirror based resonator configurations, one such configuration comprises a Gaussian-apertured phase-conjugate mirror plus a Gaussian apertured planar mirror spaced by distance L. Further, this PCR example is similar in concept to the PCR described above, except that the conventional laser-emission-output mirror now has a variable "imaginary curvature" rather than a variable "real curvature." We shall let the strengths of the two Gaussian apertures be denoted by $\alpha L = \frac{1}{2}\pi N_\alpha$ and $\beta L \equiv \frac{1}{2}\pi N_\alpha$. The matrix elements for Equation (18) are therefore given by $$\tilde{A} = A_1 - jA_2 = 1 + 2\alpha\beta L^2,$$

$$\tilde{B} = jB_1 = j\alpha L^2$$

$$\tilde{C} = jCm = 12j[\alpha + \beta + \alpha(\beta L)^2] \tag{59}$$

Moreover, if we allow the possibility that either $\alpha$ or $\beta$ may become negative, meaning that one or the other of the Gaussian apertures may have a transmission that increases with radius, the cavity mode properties of this resonator become fairly complicated. It is particularly useful to analysis the negative aperture case because, clearly no real aperture can have a transmission function that increases indefinitely with increasing radius.

There can be laser gain media, however, in which the gain does increase with radial distance from the axis, at least for some finite distance about the axis. One can also synthesize Gaussian variable reflectivity mirrors with an inverted inflection function versus radius, at least over the finite diameter of the mirror. An understanding of idealized negative Gaussian apertures allows us to assess the possible behavior of such systems, at least up to the point where the Gaussian mode itself spreads beyond the finite edges of such a system.

Moreover, I will only summarize briefly here the rather complex results for this resonator example. Further, as described by Equations (32) or (33), physically meaningful and self-consistent solutions can exist only for $C_m/B_m > 0$, located between the $\alpha=0$ axis and the curve $\alpha=-\beta/[1+(\beta L)^2]$. Additionally, the quantity $A_m = A_m \cos\theta_m$, which compels the choice of upper or lower signs in Equations (32), (33), and (36), changes from positive to negative on the boundary curves defined by $\alpha L = -\frac{1}{2}\beta L$. Please note also that the sign of $B_m$, which combines with $A_1$ to determine perturbation stability, is the same as the sign of $\alpha$.

In addition, various combinations and results for the above example can be graphically and/or mathematically indicated using $\alpha$ and $\beta$ configured matrix (not necessary to show diagram of $\alpha$ and $\beta$ configured matrix here being that it use is well known by those versed in the art). For example, take the confined and perturbation-stable solutions at the conventional laser-emission-output mirror end, which can exist according to the analytical criteria everywhere in the first quadrant ($\alpha>0$, $\beta>0$) of the $\alpha$ and $\beta$ configured matrix.

While another example of confined and perturbation-stable solutions, at the conventional laser-emission-output mirror end, can also exist, according to the analytical criteria, in a limited portion of the lower-right quadrant ($\alpha>0$, $\beta<0$) of the $\alpha$ and $\beta$ configured matrix. Further, another example of confined and perturbation-stable solutions, at the conventional laser-emission-output mirror end, apparently can also exist, according to the analytical criteria, in an outer portion of the upper-left quadrant ($\alpha<0$, $\beta<0$) of the $\alpha$ and $\beta$ configured matrix. Further, in the nominally allowed regions of the upper-left quadrant, and also in the portion of the allowed region in the lower-right quadrant, the solutions for $\hat{q}$ are indeed perturbation-stable and confined at the conventional laser-emission-output mirror end.

In addition, the behavior of the transverse cavity modes and how they will occur for a PCR comprised with hard-edged mode-controlling apertures is considered next. Wherein, phase-conjugate resonators configured with hard-edged apertures will exhibit Fresnal diffraction effects, which is caused by the intra-cavity presence of apertures that comprise hard light diffracting surface edges, in as much as would a conventional optical resonator. These effects, in PCM as in conventional resonators, will be generally complicated and analytically intractable. As a result, exact mode properties using hard-edged apertures can generally be determined only by numerical calculation methods, such as the well-known Fox, Li, and Prony methods (Fox and Li, 1961; Siegman and Miller, 1970).

Furthermore, concerning the previously mentioned numerical mode calculations, the integral equation appropriate for round trip propagation in a simple PCM based resonator is given and described by Equation (19), assuming separable rectangular transverse coordinates and a finite aperture-width of $2w_{pcm}$ at the PCM end. While, a similar aperture of finite-width $2w_{cm}$ at the conventional laser-emission-output mirror end can be incorporated into the perturbation function $\hat{\rho}(x)$, or can be accounted for by truncating the integration at $\pm w_{pcm}$. Extension of this integral equation to accommodate apertures elsewhere in the cavity, or to express it in cylindrical coordinates, is a straightforward exercise.

Furthermore, eigensolutions of this type of integral equation are routinely calculated in conventional resonator theory, most effectively by the use of fast Fourier or fast Hankel transform methods (Sziklas and Siegman, 1974, 1975; Siegman, 1977b; Sheng and Siegman, 1980). Further, these methods can be coupled with Prony methods if higher-order eigenmodes are to be extracted (Siegman and Miller, 1970; Murphy and Bernabe, 1978). Please note that the kernel in Equation (19) differs in an interesting way from the more usual kernel used for conventional resonators. However, the integral still retains the form of a convolution integral, namely, $\in_2(x_2) \sim \int \in^*_1(x_1) K(x_2-x_1) dx_1$, so that fast transform methods can still be employed.

Furthermore, for a simply case of a finite-width mirror plus a finite-width PCM, the significant parameters are the Fresnel numbers, which can be defined as being $$N_{cm} = w_{cm}^2/B\lambda \text{ and } N_{pcm} = w_{pcm}^2/B\lambda. \quad (60)$$

Whereby, the parameter B is simply the cavity length L if no lenses or other elements intervene between the mirror surface and the PCM. Further, if both of these Fresnel numbers are ?1, Hermite-Gaussian analysis of the previous section can be expected to apply. If one or both Fresnel numbers becomes small enough that the aperture impinges on the Hermite-Gaussian solution, significant diffraction effects can be expected to occur. Generally, the transverse modes in resonators with hard apertures will display considerable ingenuity in distorting their amplitude patterns and phase profiles to minimize their diffraction losses at the apertures, while continuing to obey the optical wave equation.

Furthermore, numerical calculations of transverse modes in a phase-conjugate resonator having a finite-width aperture has already been carried out by Lam and Brown (1980), (1980b); wherein, they considered only one transverse coordinate (using a stripe configuration for their resonator) using fast Fourier transform as their analytical method. Further, their results have come to show mode patterns at the conventional mirror end for two elementary phase-conjugate resonator configurations ($g=0$ and $g=2$) that exhibit moderately strong aperturing ($N_{cm}=1$). The resultant mode patterns indicate the expected Fresnel ripples and diffractive perturbations to the underlying Gaussian approximations.

Moreover, for the hemispherical case of $R_0=L$ or $g=0$ the mode will be apertured most heavily at the conventional laser-emission-output mirror end, and the PCM appears to do a good job of removing most of the diffraction ripples at the conventional mirror. However, for the divergently unstable case of $R_0=-L$ or $g=2$ the mode will be most sharply apertured at the PCM end, and this will show up as strong diffraction ripples at the conventional mirror end. Additionally, for the divergently unstable case the phase distribution profile results in being located on a transverse plane perpendicular to the resonator axis, not on the conventional mirror surface as might be expected. This profile will exhibit a roughly quadratic shape of superimposed ripples, which corresponds to a phase front converging back down onto the conventional end mirror's surface.

Consequently, the effects of end mirror distortion on a hemispherical based PCM resonator is described as being a phase distortion pattern distributed across the conventional mirror surface. Further, this phase profile corresponds to Fresnel numbers $N_{cm}=N_{pcm}=2/\pi$ and $15/\pi$, respectively. For the lower Fresnel number the wave front at the conventional mirror surface remains significantly distorted by the previously described mirror distortion.

However, for the larger Fresnel number the phase-conjugator mirror can resolve and almost totally correct for the phase aberrations. Additionally, numerical calculations on more complex PCM resonators have been carried out by Hardy (1981). Further, optical phase-conjugator is obviously able to greatly reduce resonator losses by canceling nearly all diffraction effects from a midplane aperture.

Moreover, for the PCM cases with $N_\alpha=1.875$ the calculated mode patterns agree very closely with the Gaussian profiles predicted by the Hermite-Gaussian analysis. Even for the case $N_\alpha=0.3$, where the analytically predicted Hermite-Gaussian mode is heavily clipped by the midplane aperture, the mode between the aperture and the conventional mirror remains very close to Gaussian with a few minor side lobes. The phase-conjugate reflector captures, and largely cancels the diffraction scattering from the midplane aperture. While, by contrast, the conventional end mirror results show the usual diffractive ripples, as well as much larger mode losses.

Furthermore, the effects that intracavity phase perturbation has on the next type of resonator described has been explored by Hardy, 1981. Whereby, the lowest-order mode was calculated for a resonator having a phase grating inserted at the resonator midplane (i.e., in the aperture plane of the phase-conjugate mirror) so that the circulating wave passes through the grating going in both directions. Further, the grating has a phase deviation of $\Delta\phi(x)=\Delta\phi_d \cos(2\pi x/T)$ across the aperture.

Experimental results shows us that for the above resonator configuration, both the diffraction loss and the beam quality are much less affected by an intracavity phase grating in the PCM case than the conventional mirror case (i.e., for more details see Hardy, 1981).

In addition, let us consider transverse-mode orthogonality properties of a PCM based resonator. Take for example a phase-conjugate resonator that has a hard-edged aperture, or one that departs in some other way from the Hermite-Gaussian approximations, will almost certainly, possess higher-order transverse modes also. None of these higher-order mode patterns appears to have been published yet for other than the Hermite-Gaussian case, although such calculations are under way (Hardy, personal communication).

Furthermore, the orthogonality properties of these higher-order transverse modes can, however, be established in a general fashion, similar to the orthogonality properties of the transverse modes in conventional optical resonators (Siegman, 1979). Only the final result will be stated here, with the proof left to a separate publication (Hardy et al., 1982). Next, let us consider a general phase-conjugate resonator configuration in which the reflection from the phase conjugator may have an arbitrary transverse variation in magnitude but not in phase, i.e.

$$\in_{refl}(x) = |\hat{\rho}_{pcm}(x)| e^{j\psi} \in_{inc}(x). \tag{61}$$

Herein, $\in_{inc}(x)$ is the incident field striking the PCM, while $\in_{refl}(x)$ describes the phase-conjugate reflection field, and $\psi$ is not a function of the transverse coordinates (i.e., the conjugator may be apertured but is otherwise ideal). Further, the conventional optics located in the remainder of the PCM based resonator may be quit arbitrary, including paraxial elements, perturbing screens, and/or finite apertures of some kind or another. Let an additional index m or n be used to label the different order transverse eigenmodes in the PCM resonator. Now we can show that under very general conditions (with proper normalization) that $$\int_{-\infty}^{\infty} |\hat{\rho}_{pcm}(x)| \varepsilon_{inc,m}(x) \bar{\varepsilon}_{inc,n}(x) dx = \int_{-\infty}^{\infty} \varepsilon_{inc,m}(x) \varepsilon_{refl,n}(x) dx = \delta_{nm} \tag{62}$$

Moreover, this calculation is made initially at the input plane to the phase conjugator. However, it can also be shown under very general conditions (Arnaud, 1976) that the second integral will continue to hold at any other plane within the resonator, if we write it in the form $$\int_{-\infty}^{\infty} E_{for,m}(x) E_{back,n}(x) dx = \delta_{nm}, \tag{63}$$

Where $\in_{for}$ represents the forward-traveling and $\in_{back}$ the backward-traveling wave at the plane. Under the most general conditions in the PCM resonator, as in conventional optical resonators, neither the transverse eigenmodes going in the forward direction, $\in_{for,m}(x)$, nor the same modes going in the backward direction at the same plane, $\in_{back,n}(x)$, form a separately orthogonal set, with or without complex conjugation (unless the PCM is ideal, with no transverse variation). Rather, each transverse eigenmode going in one direction at a given transverse plane is or thogonal without complex conjugation to all the eigenmodes in the family going in the opposite direction at the same plane.

Furthermore, this is essentially the same as the orthogonality relation for conventional optical resonators (Siegman, 1979). It represents again the fact that Huygens integral written in a phasor formulation has a complex symmetric but not Hermitian kernel. Alternately, it can be viewed as arising from the fact that the optical resonator problem obeys a fundamentally Hermitian operator (the wave equation), but in general does not have adjoint boundary conditions whenever diffraction losses are present.

In addition, the Gaussian beam parameters at the conventional laser-emission-output mirror end can be transformed to the phase-conjugate mirror end, just inside the Gaussian aperture, by using the conventional matrix parameters $A=1-L/R_0$, $B=L$, $C=-1/R_0$, and $D=1$. Further, the beam parameters just before hitting the Gaussian aperture at the PCM end are then $$R_{pcm} = 2gL/(2g-1) \tag{64}$$

and $$w_{pcm}^2 = \frac{2L\lambda}{\pi} \frac{|g| + g\sin\theta_m}{\cos\theta_m} \approx \frac{2|g|\lambda L}{\pi}. \tag{65}$$

Furthermore, please note that the universal rule states $w_{cm} \cdot w_{pcm} = \sqrt{2L\lambda/\pi}$. In addition, the Gaussian mode for this type of PCM resonator will also have associated with it a beam waist location that is in most cases very close to the center of curvature of the conventional end mirror. In fact the location of $z_0$ for this waist, with $z_0$ being measured positive to the right of the end mirror, is herein given and described as $$\frac{z_0 - R_0}{R_0} \approx \frac{g^2}{g^2 + (1-g)^2} \tag{66}$$

and where the spot size of the mode waist will be $$w_0^2 \approx \frac{L\lambda}{\pi} \frac{|g|}{g^2 + (1-g)^2}. \tag{67}$$

In addition, regarding the elementary properties of an PCM resonator, wherein a conventional resonator having a planar flat conventional mirror in place of the PCM, would have confined Gaussian modes only over the stable region 0<g<1, with unstable modes outside. The Gaussian mode behavior of the PCM resonator differs significantly from that behavior exhibited by a conventional resonator. Further, by adding an arbitrary weak Gaussian-aperturing effect to an unbounded PCM (i.e., $N\alpha \to \infty$) leads to discrete, confined, perturbation stable Gaussian eigenmodes for all values of g. These spot sizes and mode profiles are moreover, essentially independent of the aperture strength, so long as $N_\alpha \gg 1$.

ADVANTAGES OF THE INVENTION

Preferred Operational Embodiments

From the description above, the PCM resonator mode behavior then includes the following significant a number of advantages, which become evident for my OPCLD invention, and are listed below as:

(a) Another object of my OPCLD invention is to provide for a "divergent" regime g>1, or $R_0$<0 (the positive-branch unstable regime in a conventional resonator), where the PCM resonator exhibits behavior of a diverging spot size at the PCM end and a small spot size at the CM end. Further, this behavior will eventually be limited at large g, when the PCM spot size expands to where it belongs to be influenced by a weak Gaussian aperture.

(b) Another object of my OPCLD invention is to provide for a planar point g=1 or $R_0 \to \infty$, where the PCM mode is half confocal in form, with a waist spot size of at the planar mirror end, and a spot size that is X larger at the PCM end.

(c) Another object of my OPCLD invention is to provide for a region between g=1 and g=0 at the point g=1/$\sqrt{2}$ or $R_0$=(2+$\sqrt{2}$)L, which is a "symmetric point 1," where $w_{cm}=w_{pcm}$ will provide for a shallow waist spot size at the exact center of the resonating cavity.

(d) Another object of my OPCLD invention is to provide for an increased mirror curvature that makes the resonator approach the hemispherical point g=0 or $R_0$=L. Further, in turn the spot size at the conventional laser-emission-output end mirror surface will expand until it encounters a finite aperture, while the PCM spot size goes toward a value of zero.

(e) Another object of my OPCLD invention is to provide for a value for g that is between 0 and −1; moreover, causing the resonator to become "overconvergent" and nominally unstable (i.e., in the negative-branch sense) to higher transverse modes. Further, the mode behavior here will be a mirror image of the region between g=0 and g=+1, except that it exhibits a deeper waist spot size inside the PCR. In particular, the mode behavior will come to a symmetric point 2, which is located at $$g = -1/\sqrt{2} \text{ or } R_0 = [\sqrt{2}/(1+\sqrt{2})]L. \quad (68)$$

Whereby, the cavity mode will again exhibit a value of $w_{cm}=w_{pcm}$, as it did at symmetric point 1, but with a considerably deeper waist spot size being located at the center of the resonator.

(f) Another object of my OPCLD invention is to provide for g<−1 or $R_0$<L/2, where the overconvergent cavity mode becomes much like the divergent cavity mode for g>+1, but with a large spot size at the PCM end, except that in this case there is a very tight internal focus just in front of the conventional laser-emission-output end mirror surface (rather than just behind it, as occurs for g→+∞).

(g) Another object of my OPCLD invention is to provide for a resonator that always selects the waist location (i.e., from among an infinite number available to it) that minimizes the Gaussian spot size at the Gaussian aperture, while keeping the mode curvature matched to the mirror surface at the CM end.

(h) Another object of my OPCLD invention is to provide for a resonator where moving the Gaussian aperture to any other planar location in the resonator will consequently change the cavity mode to minimize the spot size at the new aperture location.

Further objects and advantages will provide for an OPCLD technology, wherein, for a broadband conjugator (i.e., my OPCLD's corner-cube array based PCM is broadband), the implications for chirp reversal are quit clear. Further, if h(z,−iΩ) is taken to be constant in equation (68), which is utilized to numerically compute the conjugate waveforms, and is given the form $$\mathcal{E}_c(z, t) = \frac{1}{\sqrt{2\pi}} \int_{-\infty}^{\infty} h\left(z, \frac{1}{2}\alpha\nu - i\Omega\right)[\tilde{\mathcal{E}}_p(-\Omega)]^* e^{-i\Omega t} d\Omega; \quad (69)$$

wherein, the chirp (i.e., the rate of change of instantaneous frequency with time) of the conjugate pulse is precisely opposite to that of the input pulse. Further, this was first pointed out by Marburger in 1978. Additionally, Yariv et al., (1979) showed that a pulse that had undergone dispersive spreading could be conjugated in a suitably broadband conjugator so that the chirp reversal would cause subsequent dispersive narrowing upon retraversal of the dispersive element.

Moreover, the conjugate reflectivity for a DFWM configured Germanium based PCM, which on resonance is set to equal unity, and the physical thickness of the Germanium used to construct the PCM is varied (e.g., 0.1-, 1.0-, or 2.0-cm). Wherein, a Gaussian shaped probe laser pulse is used, but this time a positive linear chirp is impressed upon it, so that the bandwidth is twice that of a non-modulated probe pulse. At the peak of the input pulse, the instantaneous frequency is that of the pump waves. Further, the instantaneous frequency shift is plotted as a function of time for both the input and the phase-conjugate pulses. Three different cases were considered, with the conjugator thicknesses 0.1-cm, 1.0-cm, and 2.0-cm.

Wherein, t=0 is the time at which the peak of the probe pulse strikes the input face of the conjugator. While, for the thinnest conjugator (L=0.1-cm), the bandwidth of the device is adequate to produce nearly perfect chirp reversal, but for greater thicknesses the chirp reversal is clearly incomplete. Further, for all three cases the chirp showed a rather distinct disappearance at the temporal peak of the conjugate pulse (as evidenced by a flattening of the frequency-versus-time curves). Thus, a chirped pulse is conjugated as a relatively chirp-free pulse in this narrow-bandwidth limit.

In a similarly related calculation, $_\kappa$L was set equal to π/4, and the conjugator thickness was set to equal 2-cm. Increasing the chirp on the input pulse resulted in decreasing the duration of the conjugate pulse. This can be easily understood by considering that as the chirp becomes more severe, the pulse sweeps more quickly through the high-reflectivity center frequency of the conjugator.

Moreover, decreasing $_\kappa$ at the fixed length L does not, however, produce perfect chirp-reversal. Further, the reason being that as one decreases $_\kappa$L, the δ-function response becomes a flat-topped function for the round-trip duration of the conjugator. The duration of the function depends only upon L, as physically thick conjugator to reverse the input pulse chirp can be easily understood in terms of the impressed gratings; the number of lines in the grating determines the resolution. Therefore, weak coupling alone ($_\kappa$L<<π/2) is insufficient to guarantee faithful chirp reversal; moreover, the transfer function must be sufficiently broad.

Furthermore, Pepper and Yariv, (1980), have shown that, in the steady state, a conjugator with a reflectivity of unity will compensate for the interposition of a weakly nonlinear aberration as long as catastrophic self-focusing does not occur therein. Clearly, when considering the above, steps would be taken to restrict the transit time of the conjugator to far less than the duration of the input pulse; otherwise, the time-varying divergence (the chirp) would not be faithfully reversed.

Furthermore, being informed herein on how chirp reversal is accomplished in a DFWM PCM system, concerning my OPCLD invention, the issue as to whether or not its PCM is sufficiently broadband or not is rather self-explanatory. My OPCLD invention by replacing the more conventional DFWM based PCM with a PCM configured with a very large array of corner-cube shaped reflecting elements (this corner-cube configured PCM provides for the phase-shifting, via total internal reflection, of incident laser-light to further provide for $k_{out}=-k_{in}$ of said laser-light therein) it accomplishes a L=0 level of broadband phase-conjugate reflection.

Remember, as stated above," t=0 is the time at which the peak of the probe pulse strikes the input face of the conjugator.

While, for the thinnest conjugator (L=0.1-cm), the bandwidth of the device is adequate to produce nearly perfect chirp reversal, but for greater thicknesses the chirp reversal is clearly incomplete." For the corner-cube array based PCM, because the TIR interface that lies between the TIR corner-cube array itself and surrounding air (the air having a lower-refractive index than the material used to construct the corner-cubes) $L \leq \lambda$ of OPCLD's emission wavelength, and is therefore sufficiently thin to flawlessly satisfy the above described criteria for L=0.

DESCRIPTION OF THE INVENTION

Additional Embodiments

FIG. 70, and FIGS. 71-75, 32

As illustrated in FIG. 70, a first additional embodiment of my OPCLD invention includes a multi-channel light source, which is used in a wavelength division multiplexed optical communication system. Further, is disclosed an OPCLD, hermetically sealed circuit package, and optical fiber pigtail configured to provide for remote provisioning of the wavelength based channels used in DWDM systems. Wherein, a wavelength tunable laser diode would significantly reduced the number of laser diodes currently being used in conventional DWDM based communication systems, and is preferably configured as a single laser diode light source, which is used for emitting laser light at the multiple frequencies useful in WDM applications.

Advantageously, such a laser diode device could be electronically (i.e., remotely) provisioned to provide for a remote switching of any number of wavelength channels that might be unused and therefore available for use. Further, such a laser diode light source would include a PCR configured laser diode cavity that would comprise multiple longitudinal modes of laser-emission-output and an optical cavity whose length is preferably adjusted to provide for a predetermined number of frequency spacings that are made to occur between the longitudinal modes that form therein.

Moreover, as illustrated in FIGS. 19 and 70, the system preferably includes an approximately 50-GHz mode-locker, an electrical or an optical pump source, and a OPCLD 279 with an adjustable 274 cavity 284, 297 provided preferably by removing a reflecting surface layer of the OPCLD 163, 164, 166 and replacing it with an external cavity reflector 284, 297. The external cavity reflector 284, 297 preferably includes a concave reflecting surface 297 spaced substantially further from the remaining reflecting surface of the layered structure 165 (FIG. 19) than where the removed reflecting surface layer was located 164 (FIG. 19). The multiple frequency output 289 (FIG. 70) of the cavity 288 is then coupled 285, 286 to an erbium-doped fiber amplifier (EDFA) through a pulse spreading fiber 287 for DWDM application.

In addition, a means for preferably fixing relative amplitudes of laser-emission-output into a substantial fraction of the longitudinal modes, and a means for preferably maximizing the spectral bandwidth over which the longitudinal modes maintain fixed relative amplitude, by designing the laser cavity 288 to have minimal variation of refractive index with frequency over the emission frequency range of interest. Additionally, the laser light source 279, as depicted in FIG. 70, comprises a laser cavity 288 for the device, an electrically and/or optically driven gain-region 161 (FIG. 19), and an external resonant lasing optical cavity 288 being formed, for example, using a gradient index lens 284 with a mirrored surface 297.

Furthermore, the OPCLD's gain-region can be stimulated into laser-emission using an external laser diode(s) (not shown) to optically pump the OPCLD's gain-region. Alternatively, the OPCLD's lasing cavity may be electrically pumped as well (typical for current laser diodes). Many alternative methods of photo-pumping and electrical pumping of gain-media are well known in the art; e.g., please see—Wilmsen, Temkin, and Coldren, "Vertical Cavity Surface Emitting lasers," 2nd edition (Cambridge Press), which is hereby incorporated by reference in its entirety.

Moreover, as illustrated in FIG. 70, structure 296 represents an electrically oscillating signal that is applied to the gain-medium structure of the OPCLD or an electrically oscillating signal can be applied to an additionally inserted loss providing light absorbing structure (a passive mode locking technique) in order to provide for active mode locking. Further, the additional loss structure may be an additional electro-absorption modulator layer of the OPCLD device. As mentioned above, an electrical pumping of the OPCLD may be used, and when used, it is preferably supplied at the same port as the mode locking input, and used as the alternative to an external pump laser diode (not shown).

Moreover, the input electrical pumping can itself be preferably modulated 296 and therefore can serve as the mode-locker (an active mode locking technique). Consequently, passive mode locking provides for a fixed amplitude relationship of the modes with a temporal stability that increases the number of modes. Further discussion regarding internal modulation is set forth below with respect to FIGS. 19 and 70. The signal used to internally modulate the OPCLD is around 50-mW 296 and may be obtained from the Microwave Development Company as a 50-GHz Gunn oscillator 296 (FIG. 70).

Alternatively, an OPCLD apparatus could include a passive mode locking mechanism, rather than an active-mode-locking mechanism. For passive mode locking, a saturable absorber may be used in that it is similar to the electro-absorption modulator described herein, except that high-frequency modulation is not applied to the saturable absorber when the device is operating in a passive mode-locking manner; e.g., when a D.C. bias signal input is applied to the saturable absorber to modify the strength of its intra-cavity absorption.

Moreover, the OPCLD apparatus may not include active mode locking, although use of active mode locking is preferred. Further, with no active mode locking, the longitudinal modes will still be present in the OPCLD's resonating cavity. However, the amplitudes of the modes will be under reduced control, resulting in greater noise between the modes as energies 'slosh' back and forth between said modes. Thus, without active mode locking, the amplitudes of the modes will have less relative stabilization than if the preferred active mode locking were used. Active mode locking uses a low frequency modulation to homogenize the modes, which in turn stabilizes their relative amplitudes when no mode locking is used. With or without such low frequency modulation for stabilizing the relative amplitudes of the modes, an embodiment may be realized without mode locking according to an alternative embodiment.

In addition, a pulse spreading fiber, which may be used to decrease the peak amplitude of the pulses that are emitted by the OPCLD device under mode-locked operation. Wherein, the pulse spreading fiber 287 transmits the multiple channel signals from the cavity of the OPCLD transmitter, as illustrated in FIG. 70. Due to the dispersion properties that are associated with most types of optical fiber, the pulse spreading fiber 287 can include an appropriate length of virtually any optical fiber. Consequently, the higher the dispersion in the fiber, the shorter the length that should be preferably used.

Moreover, for the transceiver device illustrated in FIG. 70, the laser-emission-output 288, 289 of the OPCLD is preferably between 4 and 128 separate wavelength channels (and could be more), and exhibit about 100-mW per channel. As discussed below with reference to FIG. 70, the envelope of the amplitude versus frequency will exhibit a more Gaussian shape when AM mode-locking is used, while alternatively exhibiting a more flattened shape if FM mode-locking is used, rendering the FM mode-locking as being the more preferred, provided frequency chirp is acceptable (the OPCLD has a resonating cavity structure that reverses for each round trip intra-cavity chirp), although either form of mode locking may be used advantageously, the choice of which, should be determined by the particular setup and application specifications. Moreover, as illustrated in FIG. 70, structures such as a photo-pumping source such pump laser, an electrical oscillating signal generator, and a pulse spreading fiber, respectively, all of which are conventional items, such as are readily known and understood by those well skilled in the art.

Figure 32:
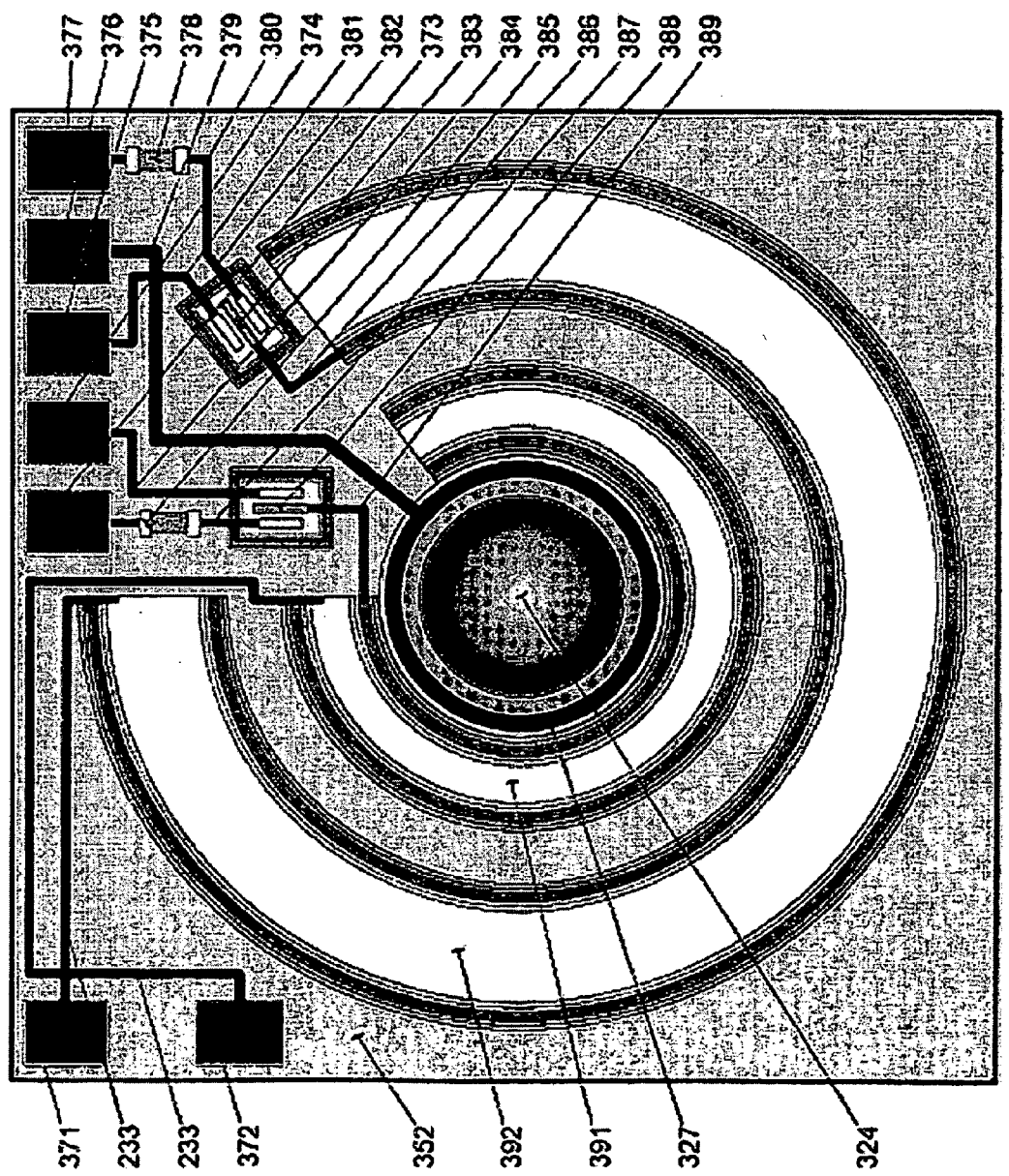
FIG. 32 is a top plan-view illustration of a combination PIN Photo Detector, HEMT, and OPCLD transceiver module; altogether monolithically constructed from the same epitaxially deposited material and lithographically etched to form a final integrated circuit package for use in the package illustrated in FIG. 70.

Furthermore, as illustrated in FIGS. 70, 75, and 32, this additional embodiment of the OPCLD invention comprises an external cavity 279, 284, 297, an integrated OPCLD, respectively, according to a preferred embodiment, where several alternative designs and variations will be discussed below with reference to FIGS. 70, 75, and 32. In general, the cavity length of the system, including structures 279, 284, 297, is greatly extended compared to a conventional VCSEL diode device.

Preferably, as illustrated in FIG. 70, the width of the invention's optical PCR configured cavity should be around 2-mm to 3-mm in physical length for a mode spacing of 50-GHz. For example, at 50-GHz and for a refractive index n≅1 (i.e., the refractive index of an air or inert gas filled cavity) 288, the invention's physical cavity length would need to be 3-mm, which provides for an optical path length that corresponds to the desired 50-GHz. Moreover, for a cavity material such as glass (e.g., having a refractive index n=1.5) 281, 284, then the cavity's physical length would need to be around 2-mm to provide for an optical path length of 2-mm×1.5=3-mm, which again corresponds to a desired 50-GHz mode spacing.

In addition, the invention's optical cavity length may be increased to reduce the mode spacing made available. For example, by doubling the invention's cavity length, e.g. from 4-mm to 6-mm, the mode spacing would correspondingly be reduced to 25-GHz, or by again doubling the invention's cavity length, e.g. from 8-mm to 12-mm, the mode spacing would correspondingly be reduced to 12.5-Hz. Further, the mode spacing may be increased, if desired, by alternatively reducing the cavity length, e.g. by reducing the invention's cavity to half its original length, e.g. from 3-mm to 1.5-mm to increase the mode spacing to 100-GHz. Generally, the mode spacing may be advantageously selected by adjusting the invention's laser-emission-output mirror 284, 297 to a corresponding cavity length.

Furthermore, the additional embodiment of the OPCLD invention, as illustrated in FIGS. 70 and 75, provides for an second mirrored reflector surface 297 of a OPCLD, which for the mode locking version of the OPCLD invention, is not monolithically formed upon the OPCLD's partial reflection DBR mirror-stack assembly 165 (FIG. 19) during the invention's manufacturing, with the specific intent that the mode locking version of the OPCLD invention be configured with an external cavity of the preferred embodiment herein.

Moreover, as illustrated in FIG. 70, the laser-emission-output mirror's metalized outer surface 297 must instead be formed such that it has a sufficiently low-reflectivity that the external cavity of structure 284, 297 of FIG. 70 is included in the resonance cavity of the OPCLD. Moreover, the extension of the OPCLD's optical cavity from 1.5-mm to 15-mm permits a 10-GHz to 100-GHz mode spacing. Wherein, the invention's cavity will support a number of modes having a spacing that depends upon the inverse of the cavity length (i.e., c/2nL, where n is the refractive index of the cavity material and L is the cavity length). Further, the OPCLD's mode locking with external cavity can be configured to provide for multiple channel signal output according to the preferred additional embodiment herein, and therefore can be selectively configured for use in the telecom band around 1,550-nm, and alternatively with the telecom short distance band of around 1,300-nm, or the very short range 850-nm band as well.

For a wavelength of 1.550-μm, the 100-GHz, the 50-GHz, and the 12.5-GHz cavities are of particular interest as they correspond to standard DWDM channel spacings. The OPCLD invention itself is around 650-μm high, and preferably comprises a MQW gain-region of InGaAsP or InGaAs, a corner-cube based PCM, an InGaAlAs or InGaAsP or AlGaAs comprised DBR mirror (or mirrors formed of other materials according to desired wavelengths as taught, e.g., in Wilmsen, Temkin and Coldren, et al., "Vertical Cavity Surface Emitting Lasers", 2nd edition, Chapter 8), or according to the mode locking OPCLD, a single InGaAlAs partially reflecting out-coupler mirror 284, 297, which couples with the pulse spreading fiber of structure 287 to output the signal to the EDFA. In summation, the mode-locking version of the OPCLD can be advantageously varied to meet any particular wavelength specification, and its external cavity advantageously varied for adjusting the mode spacing of the device as well.

In addition, as illustrated in FIG. 70, the mode locking version of the OPCLD invention is further embodied as having a triplex transceiver package configuration that comprises an integrated OPCLD and HEMT photodiode and pre-amp circuit 277, 278, 279, a circuit mount base assembly 273, a tri-plexing multilens and external cavity laser-emission-output mirror assembly 274, 280, 281, 282, 284, 285, 297, a bronze metal comprised heat-sink sub-assembly 276, a hermetically sealing outer shell 275 and fiber pigtail fixture assembly 285, 286, 287, a Fresnel lens fixture 282 that provides for the demuxing of the 1,310-nm upstream, the 1,490-nm and 1,550-nm downstream telecom signals that are currently being utilized in PON, EPON, FTTP, and FTTH based networking, and a four prong connector 292, 293, 294, 295, providing for the transceiver's connectivity.

Moreover, as illustrated in FIG. 70, the laser-emission-output mirror has a Gaussian mode providing convex shaped lens assembly with one or more reflective metal coatings on its remote surface 297 such that it efficiently reflects incident light emitted from the OPCLD as a resonator reflector, preferably around 1,550-nm for the Telecom band, as mentioned earlier. Further, the partial-reflection DBR based mirror-stack assembly 279 is preferably formed from alternating high and low refractive index semiconductor material latticed matched to the device's gain-region. However, in order to build up a higher amount of available reflectivity the use of alternating quarter-wavelength layers constructed from $TiO_2/SiO_2$ or other such material that exhibit highly contrasting refractive indices, all of which are well known to those skilled in the art.

As illustrated in FIG. 70, for each of the just mentioned reasons or functions of the coated and curved surface 297 on the lens 284, the radius of curvature of the lens 284 having the coating 297 is around the length of the mode locking OPCLD's external cavity. Laser emission that comes from the mode locking OPCLD will diverge outward from the gain-region of the OPCLD and substantially be reflected directly 288 back to the gain-region when the radius of curvature is approximately the device's cavity length, or around 2-mm to 3-mm for a 50-GHz mode-spacing. Additionally, the lens 284 forming the cavity is segmented into a lens component 274 plus an intra-cavity modulation structure or cavity phase modulator 279, which is used to modulate the length of the cavity or the loss in the cavity. For modulating the length of the cavity, the preferably 50-GHz signal 296 is applied to the region 279, while the region 279 preferably includes a strongly electro-optic material, and the optical path length varies as the refractive index of the modulator section varies with the oscillating electrical field 296.

Furthermore, a modulation of the length of the cavity results in what is called FM mode locking, while a modulation of the loss in the cavity results in what is called AM mode locking. Both AM and FM forms of mode locking exhibits its own distinct and potentially useful set of properties. Moreover, both forms of mode locking are compatible with optical phase conjugation and may be used to mode lock the OPCLD's PCR. Additionally, the laser-emission-output mirror 297 and convex shaped lens 284 and the collimating convex lens 281 are formed from a material that exhibits no dispersion or at least very little dispersion. This is so that the mode spacing does not change substantially with frequency. Dispersion, for the OPCLD, is negligible, due to the presence of its broadband corner-cube based PCM, and all dispersion that occurs within the cavity of the OPCLD is completely undone for each round trip through the resonator.

In addition, as illustrated in FIG. 19, the mode locking trimuxed transceiver comprises a OPCLD that has a total reflection phase-conjugating corner-cube array configured PCM 168, a partial reflection DBR configured mirror-stack 165, and a partial reflection Gaussian mode providing curved shaped and metalized laser-emission-output mirror 163, 164, 166 all of which rely upon the effective epitaxial deposition and fabrication of lattice-matched InP based material. Wherein, an un-doped mirror-stack 165 is lower in reflectivity, but has its reflectivity supplemented by the reflectivity of an external cavity laser-emission-output mirror 163, 164, and 166 (FIG. 19). In this sense, there may be no mirror or layer having little or no reflectivity over the OPCLD's gain-region 160, 161, 162.

Furthermore, the mirror-stack 165 is preferably made of InGaAsP or InGaAlAs material. While, the gain-region 160, 161, 162 is shown between the phase-conjugate mirror 168 and conventional mirrors 165 and 163, 164, 166 (FIG. 19) is preferably formed of semiconductor material taken from periodic table of elements—columns III-V or II-VI—all being light emitting semiconductor materials, which efficiently emit and amplify light at a predetermined wavelength.

Moreover, as illustrated in the preferred embodiment of FIG. 19, the PCM 168 is formed (using grey-lithography masking and etching as method of construction) out of the first or under-side surface of the InP substrate layer 159. While, the gain-region 160, 161, 162 is epitaxially deposited upon the second or upper-side surface of same substrate layer 159 (FIG. 19), and the mirror-stack assembly 165 is in succession epitaxially deposited upon the second or upper-side surface of the OPCLD's previously deposited gain-region 160, 161, 162 (FIG. 19), and the laser-emission-output mirror 163, 164, 166 (FIG. 19) is firstly epitaxially deposited upon the second or upper-side surface of the conventional partial reflection mirror-stack 165 (FIG. 19), secondly etched into shape using grey-lithography masking and etching as method of its construction, and thirdly metalized using gold, silver, or aluminum or some other appropriately reflective metal. Wherein, the mode locker structure and/or mechanism is contacted across an OPCLD structure that includes mirrors 168, 165 and the gain-region 160, 161, 162, providing for a laser-emission output whose wavelength is electronically tunable which can be done from a remote site.

Furthermore, a structure in which an additional electro-absorption modulator (not shown) is preferably included in the epitaxial structure of the mode locking OPCLD. Wherein, a p-type doped layer is epitaxially deposited upon the previously deposited DBR mirror-stack assembly 165 (for the mode locking loss modulator configuration of the OPCLD the DBR mirror-stack assembly 165 will need to p-type doped, making it electrically conductive therein). Further, the electro-absorption modulator is next epitaxially deposited upon the second or up-turned surface of the previously deposited p-type layer, and a n-type doped layer is epitaxially deposited upon the second or up-turned surface of the previously deposited the modulator layer.

Moreover, the electro-absorption modulator is herein used to introduce loss modulation independently of the OPCLD's gain provided for by the OPCLD's gain-region 160, 161, 162. Further, the electro-absorption modulator is preferably designed to have low capacitance and good high-frequency response. In the case where no high-frequency electrical source is applied to an electro-absorption modulator present within the OPCLD's resonating optical cavity mode locking can still occur because of the so-called passive mode locking, wherein the electro-absorber saturates at high optical field strengths, and the laser naturally oscillates in a pulsed mode or a mode-locked manner.

In addition, as illustrated in FIGS. 19, 70, 75, and 32, an external cavity mode locking OPCLD device could for example, have a triplexer configuration that would be comprised to include:

An external cavity configuration that provides for a combination "Planar-Lightwave Circuit" (PLC) 282 and Gaussian mode providing laser-emission-output mirror 284, 285, and 297. Further, the PLC 282 comprises a concentrically circular Fresnal shaped light redirecting structure 281 and 282. While the Gaussian mode providing laser-emission-output mirror 284, 285, and 297 comprises a metalized hemispherical shaped 284 laser-emission-output mirror 297, respectively. Wherein 281 and 282 provide for a splitting and redirecting of an incoming serialized 1.490-µm single-mode optical transmission that comprises a "Voice over Internet Protocol" (VoIP) voice-communication signal, and a "Transmission Control Protocol/Internet Protocol" (TCP/IP) data-communication signal, and an incoming serialized 1.550-µm single-mode analog and/or digital-video signal. While, optical components 284 and 297 provide for both partial-reflectance and partial-transmittance of resonate stimulated-emission and for the Gaussian mode profiling of the OPCLD's spectrally and spatially perturbation free high-power single transverse cavity mode laser-emission-output 289 (FIG. 70), A InP substrate layer 276 (FIG. 70) and PCM, which is comprised from an array of retro-reflecting phase-conjugate elements 168 (FIG. 19), An undoped or highly doped InP comprised light-spreading concave shaped soft-apertured lens 170A (FIG. 19), An undoped or highly doped InP comprised light-collimating convex shaped soft-apertured lens 170, 170B, and 170C (FIG. 19), An appropriately doped multilayered double hetero-junction semiconductor comprised light-emitting and light-amplifying gain-region 160, 161, and 162 (FIG. 19), An undoped or doped DBR configured mirror-stack assembly, which basically has a planar shaped quarterwave mirror-stack configuration that provides for both a partial transmission and a partial reflection of intracavity produced stimulated emission 165 (FIG. 19) 279 (FIG. 70), An evaporated deposition of the metal used to form into a peripheral surrounding doughnut shaped Ohmic contact 170 (FIGS. 19, 20, 20A, and 21A), which provides for an injection of negatively charged carriers (electrons) into the anode side of the OPCLD, An evaporated deposition of the metal used to form a doughnut shaped Ohmic contact 167 (FIGS. 19, 20, 20A, and 21A), which provides for an injection of positively charged carriers (holes) into the cathode side of the OPCLD, A "Burst Laser Driver" (BLD) circuit, and an "Automatic Power Control-Circuit" (APC), which altogether define the InP comprised and HEMT configured circuitry that provides for an electronic conditioning of an outgoing serialized electronic signal, wherein an BLD (not shown) comprises a multiple HEMT circuit configuration that provides for both an electronically controlled mode locked selection of the OPCLD's laser-emission wavelength 289 and an electronically controlled internal modulation of the OPCLD's 279 stimulated-emission 288, which in turn additionally provides for a serialization of the OPCLD'S laser-emission-output 289, while an APC (not shown) comprises a multiple HEMT circuit configuration that provides for a feedback controlled automation of the OPCLD's laser-emission-output power level 288, A Phototransistor circuit, a "Low-Pass Filter" (LPF) circuit, and a "Limiting Amplifier" (LA), which altogether define the InP comprised "High-Electron Mobility Transistor" (HEMT) configured electronic circuitry that provides for high-speed detection of a time-division multiplexed serialized optical signal having a wavelength of 1.490-µm, and a high-speed conversion (i.e., from serialized optic to serialized electronic) of the time-division multiplexed serialized optical signal into an electronically conditioned and amplified serial data signal output, using the LPF and the LA as the signal conditioning and amplifying means, A Phototransistor circuit, and a "Video Receiver" (VR) circuit, which altogether define the InP comprised HEMT configured electronic circuitry that provides for high-speed detection of a time-division multiplexed serialized optical signal having a wavelength of 1.550-µm, and provides for high-speed conversion of the detected time-division multiplexed serialized optical signal into an electronically conditioned and amplified "Radio Frequency" (RF) configured video signal output, using the VR as the signal conditioning and amplifying means.

A bronze alloy heat-sinking structure 276,

An outer cover 275, and fiber pigtail connection 285,

An base structure for securing the OPCLD 277, the PLC 282, and the external cavity forming Gaussian mode providing metalized hemispherical shaped laser-emission-output mirror assembly 163, 164, and 166 (FIG. 19), A PLC positioning frame assembly 274, 280 (FIG. 70), Mode locking signal generator 296, Male pin connectors 295, 294, 293, 292, which provide for common line power, data, control, and signal connectivity.

Moreover, a tunable multi-channel light source for wavelength division multiplexed systems is realized for the OPCLD according to the additional embodiments set forth above, and the object of the invention is met. A mode locking OPCLD, being a tunable multi-channel transmitter, provides the substantial advantage of providing many discrete and precisely controlled wavelengths, and can make these wavelengths available for independent high-speed internally modulated (made to occur from within the OPCLD's resonating cavity) data transmission, due to the fact that the OPCLD's mode locking is accomplished via an electrically controlled electro-absorption modulator which can be provisioned electronically from a remote location to provide for any wavelength and/or rate of data modulation requested by the customer; e.g. such as a "Central Office" (CO).

In summation, a tunable light source that provides for frequency selection will preferably comprise a single "Optical Phase Conjugated Laser Diode" (OPCLD), which is configured to have a phase-conjugating dispersion free external-cavity of adjustable length. Further, this will greatly reduce the number of parts required for provisioning DWDM and/or WDM networks, the volume, the weight, and the cost of a DWDM system, and will consequently also reduce the dependence of DWDM and PON optical networking systems on the production of very complicated EEL diode designs such as "Fabry-Perot" (FP) and "Distributed Feed-Back" (DFB) laser diodes, which typically exhibit low wafer yield and much higher manufacturing costs than surface emitting laser diode designs such as the OPCLD.

In addition, as illustrated in FIGS. 71, 72, 73, 74, 75, and 32, an additional embodiment of the OPCLD invention is disclosed next. Wherein, for conventional EEL diodes, laser radiation is emitted into a plane that is a continuation of the plane of the p-n junction that forms the diode. Different types of these laser diode devices are widely used to provide for laser radiation in the infrared and visible wavelength regions. While these laser diodes have enjoyed considerable commercial success, they are relatively large and consequently as a result are difficult to integrate with other devices. Before going any further—please see Olbright et al., "Cascadable Laser Logic Devices Discrete Integration of Phototransistors with Surface Emitting Laser Diodes," Electronic Letters, vol. 27, No. 3, Jan. 31, 1991, pp. 216-217, which is incorporated herein for reference purposes only.

Moreover, during the nineteen eighties a new class of semiconductor laser diode was conceived, created, developed, and later commercialized, this laser diode is generally called the "Vertical Cavity Surface Emitting Laser" (VCSEL). Unlike the edge-emitting laser diode, these VCSEL diodes emit laser radiation in the direction perpendicular to the plane of the p-n junction formed in the laser diode. Considerable information concerning the structure and formation of such laser diodes is set forth, for example, in U.S. Pat. No. 4,949,350, in J. Jewell et al., "Microlasers," Scientific American. Vol. 265, No. 5, pp. 86-94 Nov. 1991); in J. Jewell et al., "Vertical-Cavity Surface-Emitting Lasers: Design, Growth, Fabrication, Characterization," IEEE Journal of Quantum Electronics, Vol. 27, No. 6, pp. 1332-1346 (June 1991); in G. R. Olbright et al., "Cascadable Laser Logic Devices: Discrete Integration of Phototransistors with Surface-Emitting Laser Diodes," Electronics Letters, Vol. 27, No. 3, pp. 216-217 (Jan. 31, 1991; in J. Jewell et al., "Low-threshold Electrically-Pumped Vertical Cavity Surface Emitting Lasers", Electronics, Lett., Vol. 25, p. 1123 (1989); and in J. Jewell et al., "Vertical Cavity Lasers for Optical Interconnects", SPIE Vol. 1389 International Conference on Advances in Interconnection and Packaging, pp. 401-407 (1990), all of which are incorporated herein by reference.

Furthermore, as set forth in certain of the above-referenced publications, VCSEL diodes have numerous advantages over EEL diodes, some of the most important of which are that they can be fabricated in extremely small sizes (e.g., on the order of 1-μm to 13-μm in diameter—providing for higher wafer yields) and can be easily integrated with other devices, such as transistors. An additional embodiment of the present invention is directed to such integration of vertical-cavity lasers. Further, we have invented a OPCLD that can be integrally formed with electronic semiconductor based switches, such as three-terminal transistors.

As illustrated in FIGS. 71, 72, 73, 74, 75, and 32, one additional embodiment of the present OPCLD invention comprises a laser diode cavity that is sandwiched between a partial reflection metalized Gaussian mode providing laser-emission-output mirror 105, 106 (FIGS. 71, 72, 73, and 74) 324, 325, 326 (FIGS. 75 and 32), a partial reflection DBR mirror 103 (FIGS. 71, 72, 73, and 74) 323 (FIGS. 75 and 32), and a corner-cube array based total internal reflection PCM 110 (FIGS. 71 and 72) 320 (FIG. 75). While, the laser cavity itself comprises a pair of spacer layers 100, 102 (FIGS. 71, 72, 73, and 74) surrounding one or more laser active quantum-well layers 101 that serve as the active laser emitting material of the device 101 (FIGS. 71, 72, 73, 74, and 75) 365 (FIG. 75). The thickness of the laser cavity is $m\lambda/2n_{eff}$, where m is an integer, $\lambda$ is the wavelength of the laser radiation, and $n_{eff}$ is the effective index of refraction of the cavity.

Moreover, electrical pumping of the laser diode is achieved by heavily doping the PCM comprising substrate layer 99 (FIGS. 71 and 72) and regions of the OPCLD's first spacer-layer 100 (FIGS. 71, 72, 73, and 74) to one conductivity-type, and by heavily doping regions of the OPCLD's upper spacer-layer 102 (FIGS. 71, 72, 73, and 74) with the opposite conductivity type; forming a light emitting diode structure therein, and by applying a suitable voltage to the LED structure 100, 101, 102 (FIGS. 71, 72, 73, and 74) to provide for electrically pumped stimulated emission.

Furthermore, the switch may take any number of forms and can be located in various positions relative to my OPCLD. The switch may be an electronic switch such as a bipolar transistor or a field effect transistor. In the case of the bipolar transistor, the transistor can be located underneath, on top of, or alongside the OPCLD, just like in the phototransistor case. In the case of a field effect transistor, the transistor is located alongside the OPCLD, FIG. 72. Alternatively, the switch may also be an optical switch such as a phototransistor located alongside the OPCLD portion of the circuit, as illustrated in FIG. 72.

Moreover, several different combinations of optically controlled and electrically controlled switches may also be implemented in accordance with the OPCLD invention. Integrated switching of the present OPCLD invention provides a convenient means for controlling the output of laser radiation from the OPCLD with either optical or electrical signals. Boolean logic functions can readily be implemented by the switches; whereby, signal amplification and conversion from electrical to optical and/or optical to electrical is easily achieved therein.

As illustrated in FIGS. 71 and 72, a confinement region 300 is defined in the periphery of quantum-well layer 101 by proton implantation to confine current flow in the laser to a narrow region around the central vertical axis 298 of the laser. After the epitaxial deposition of several layers are defined by optical lithography and etching to form a plurality of columns, including a metalized partial reflection Gaussian mode providing laser-emission-output mirror 105, 106 (FIGS. 71, 72, 73, and 74) 324, 325, 326 (FIGS. 75 and 32), a partial reflection DBR mirror-stack assembly 103 (FIGS. 71, 72, 73, and 74) 323 (FIGS. 75 and 32). Electrical contacts 302, 316 (FIGS. 71, 72, 73, and 74) 329, 341, 351 (FIGS. 75 and 32) are formed when an appropriate metal is deposited upon the second spacer layer 102 (FIGS. 71, 72, 73, and 74) 364 (FIGS. 75 and 32), and upon the doped substrate layer 99 (FIGS. 71, 72, 73, and 74) 352 (FIG. 32) of my OPCLD invention and later etched into predetermined shapes.

Wherein, as illustrated in FIG. 22, each column comprises a separate laser diode and can be made to lase by applying a suitable voltage between contact 183 and contact 181 of that column to drive sufficient current through the column. Illustratively, a substrate layer 171 is comprised of n+ doped GaAs, having a diameter of 3 or 4 inches (7.5-cm or 10-cm). Further, during the photolithography process each of the OPCLD's laser-emission-output mirrors is etched to be about 120-μm in diameter and about 1.5-μm high above the surface of the second spacer layer 174. While, the whole wafer is ordinarily diced into several OPCLD units for later use in an electronic transceiver package.

As illustrated in FIGS. 22, 71, 72, 73, 74, 75, and 32, in the case of a red-light emitting OPCLD, the second mirror layer 175 (FIG. 22) 103 (FIGS. 71, 72, 73, and 74) 323 (FIGS. 75 and 32) comprises of alternating layers of un-doped AlAs and AlGaAs, wherein each layer has a thickness equaling one quarter-wavelength of the radiation being emitted by the OPCLD divided by the refractive index of un-doped AlAs and AlGaAs used to construct each alternating layer. Further, as will be recognized by those skilled in the art, the construction of the second mirror layer 175 (FIG. 22) 103 (FIGS. 71, 72, 73, and 74) 323 (FIGS. 75 and 32) is that of a distributed Bragg reflector in which, the AlAs is the layer having the lower index of refraction, and AlGaAs is the layer having the higher index of refraction. The second mirror layer 175 (FIG. 22) 103 (FIGS. 71, 72, 73, and 74) 323 (FIGS. 75 and 32) 175 is designed so that it is partially reflective and partially transmissive.

Moreover, the first spacer layer 172 (FIG. 22) 100 (FIGS. 71, 72, 73, and 74) 359 (FIGS. 75 and 32) comprises a layer of AlGaInP that is gradiently configured so that the amount of Gallium is increased toward the quantum-well layer. For this mid-range wavelength version of the OPCLD, all semiconductor material used to comprise its multi-layered structure is lattice matched to the GaAs. The second spacer layer 174 (FIG. 22) 102 (FIGS. 71, 72, 73, and 74) 364 (FIGS. 75 and 32) is similar in its construction, wherein the AlGaInP used in its construction is gradiently configured so that the amount of Gallium is increased toward the quantum-well layer.

In addition, a quantum-well layer 173 (FIG. 22) 101 (FIGS. 71, 72, 73, and 74) 365 (FIGS. 75 and 32) comprising three approximately 50-Å thick well layers of GaInP separated by two approximately 454-Å thick barrier-layers of AlGaInP. A first gradient spacer-layer 172 (FIG. 22) 100 (FIGS. 71, 72, 73, and 74) 359 (FIGS. 75 and 32), MQW 173 (FIG. 22) 101 (FIGS. 71, 72, 73, and 74) 365 (FIGS. 75 and 32), and a second gradient spacer-layer 174 (FIG. 22) 102 (FIGS. 71, 72, 73, and 74) 364 (FIGS. 75 and 32) altogether constitute the laser cavity.

Further, typically the general length of the OPCLD's laser cavity (i.e., which is the thickness of layers 172, 173, and 174) is $m\lambda/2n_{eff}$, where $\lambda$ is the free space wavelength of laser radiation emitted, m is an integer, and $n_{eff}$ is the effective refractive index of the cavity. Further, a first mirror structure 184 (FIG. 22) 110 (FIGS. 71, 72, 73, and 74) 320 (FIGS. 75 and 32) comprises a very large array of corner-cube retro-reflecting reflectors (i.e. the PCM). The first mirror structure 184 (FIG. 22) 110 (FIGS. 71, 72, 73, and 74) 320 (FIGS. 75 and 32) is a totally internal retro-reflecting PCM, and will provide for optical phase conjugation of the emission produced by the OPCLD's gain-region.

Moreover, in accordance with an additional embodiment of the OPCLD invention, optoelectronic integrated circuit devices are formed by combining OPCLDs with three-terminal transistors. Additionally, integrated circuits are also disclosed in which, OPCLDs are combined with heterojunction phototransistors in novel combinations as well. As illustrated in FIGS. 71, 72, 73, 74, 75, and 32, an OPCLD may be combined with either a "Heterojunction Bipolar Transistor" (HBT) or a "High-Electron Mobility Transistor" (HEMT) in order to form an integrated optoelectronic circuit.

For example, as shown in FIGS. 72 and 74, an optoelectronic integrated circuit is created when an HBT is formed upon the upper surface of a substrate wafer 99 and an OPCLD is formed therein, when the first surface of the substrate layer 99 is used to construct a PCM 110, and the upper surface of the substrate layer 99 is used to construct the gain-region 100, 101, 102, DBR based mirror 103 and the Gaussian shape providing laser-emission-output mirror 104, 105, 106, and the p-n-p structure of the HBT transistor.

Furthermore, as illustrated in FIGS. 72 and 74, an integrated optoelectronic circuit is formed on a substrate wafer 99, first by forming an OPCLD out of the first surface of the substrate layer 99, while a multitude of additional layers are epitaxially deposited upon the second surface of the same substrate wafer 99, and second by epitaxially depositing and then etching a multitude of additional layers that are altogether used to form the HBT upon the second surface of the second gradient spacer-layer 102 of the previously formed OPCLD.

Moreover, as illustrated in FIGS. 72 and 74, a Heterojunction Bipolar Transistor has an n-p-n transistor configuration that comprises an n-type collector layer 318, a p-type base layer 317, and an n-type emitter layer 316. Circuit further comprises an annular metal contact 302 to the upper surface of the second spacer-layer 102, while an annular metal contact 314 is deposited upon the base layer 317, and an n-type Ohmic contact is deposited upon the n++ doped substrate layer 99. Further, the entire optoelectronic circuit is altogether formed by epitaxially depositing a multitude of layers one on top of the other beginning with layer 100, on top of substrate 99. Additional layers of structures 101, 102 are formed upon the substrate layer 99 by using epitaxial growth techniques well known to those skilled in the art, and described, for example, in U.S. Pat. No. 4,949,350.

Moreover, the layers used to comprise the DBR mirror 103 are also epitaxially grown. However, one advantage of the structure of FIGS. 72 and 74 is that the DBR mirror 103 is not part of the electric circuit that biases the OPCLD. As a result, the DBR mirror 103 can be made of a much wider variety of materials and, in particular, can be made of dielectric materials as well. Illustratively, the substrate layer 99 is made of n++ doped GaAs, and the HBT transistor is a GaAs transistor comprising of an emitter layer 316 of n-type AlGaAs approximately 0.2-µm thick, a base layer 317 of p-type GaAs approximately 0.25-µm thick, and a collector layer 315 of n-type InGaAs/GaAs approximately 0.5-µm thick.

Following the deposition of the various layers that comprise the optoelectronic device, individual integrated circuits are defined by photolithographic and etching techniques. First, the upper mirrors of the circuits are defined by removing unwanted portions of the mirror layers down to the upper surface of the second spacer-layer 102. Next, the metal contact material 302 is deposited and the metal contact is defined by removing unwanted portions of the deposited metal material. Individual OPCLDs can be further defined by removing unwanted portions of both spacer-layers 100, 102, the quantum-wells 101, the DBR based mirror stack 103, and the collector 318, the emitter 316, and the base layers 317. The metal material used to form contact 314 is then deposited onto the exposed surface of base layer 317. Finally, contact 314 is further defined by removing unwanted portions of the deposited metal material.

Moreover, when a suitable voltage $V_o$ is applied between contact layer 302 and the substrate 99, a circuit is formed that will operate as an electrically switched laser. As shown, the electroptic circuit comprises a HBT, an OPCLD, and a resistor $R_n$ that is the electrical resistance of the substrate layer 99. When sufficient electrical current (e.g., tens of micro-Amps) is supplied to the base layer 317 of the HBT, the transistor becomes electron conducting, which results in a substantial current flow (i.e., several milli-Amps) through the OPCLD. This causes the OPCLD to lase, emitting laser radiation (i.e., equaling about 1-mW) through partially transmissive DBR mirror 305 and the Gaussian mode providing curved shaped laser-emission-output mirror 104, 105, and 106.

Advantageously, contact 302 extends around the periphery of the base 316 of the OPCLD invention. Wherein, contact 302 is annular in shape and surrounds partially transmissive DBR mirror 305 and the Gaussian mode providing curved shaped laser-emission-output mirror 104, 105, and 106. Various arrangements may be made to establish electrical connection, for example, contact 316 is connected to a common bus to which a biasing voltage $V_o$ is applied to bias all the OPCLDs in the array. Additionally, each contact 302 could easily be connected via an individual lead to a separate bonding pad (not shown), so that individual control signals can be applied to each OPCLD.

Finally, as illustrated in FIGS. 72 and 74, the contact-layers 302, 314, 315 are deposited and defined, while the partially transmissive DBR mirror 305 and the Gaussian mode providing curved shaped laser-emission-output 298 mirror 104, 105, and 106, which also includes an insulating layer 299 as well as the layers of semiconducting material that are deposited to form the emitter 316, the base 317, and the collector 318 portions of the HBT circuit. This is feasible as long as the material at layer locations 299, 303, 304, and 305 do not absorb significant amounts of laser radiation from the OPCLD. This condition is met if the semiconductive material used to construct these layers exhibit higher bandgap energy than the laser emission frequency.

Alternatively, the materials of layers 299, 303, 304, and 305 can be completely removed from the surface area where the partially transmissive DBR mirror 305 and the Gaussian mode providing curved shaped laser-emission-output mirror 104, 105, and 106 is to be formed, and afterwards the appropriate construction material can be epitaxially deposited and used to form the partially transmissive DBR mirror 305 and the Gaussian mode providing curved shaped laser-emission-output mirror 104, 105, and 106.

Moreover, as illustrated in FIGS. 71 and 73, another example of an optoelectronic circuit would comprise a partially transmissive DBR mirror 305 and the Gaussian mode providing curved shaped laser-emission-output mirror 104, 105, and 106, a gradiently doped p-type spacer-layer 102, a multiple quantum-well region 101, a gradiently doped n-type spacer-layer 100, a corner-cube array based PCM 110, a "Hetero-junction Photo-Transistor" (HPT) with a n-p-n transistor configuration comprising an n-type collector-layer 310, a p-type base-layer 309, and an n-type emitter-layer 308. The integrated optoelectrical circuit further comprises a transparent contact-layer 311 providing electrical conductivity to collector-layer 310 and an annular contact-layer 302 providing electrical conductivity to emitter-layer 308.

Furthermore, the HPT portion of the optoelectrical circuit is epitaxially deposited and later lithographically etched at a location above epilayers 100, 101, 102 of the OPCLD; moreover, being formed alongside the partially transmissive DBR mirror-stack assembly 305 and the metalized Gaussian mode providing curved shaped laser-emission-output mirror 104, 105, and 106. Further, the HPT is electrically isolated from the OPCLD's gain-region (i.e., gain-region comprised as layers 104, 105, and 106) via an insulating layer 313 and ion-implanted guard rings 300, 301, 306, and 312, and is electrically connected via a mutual contact 302 for the gain-region 101 of the OPCLD, where lasing takes place.

As further illustrated in FIGS. 71 and 73, contact-layer 302 comprises of two interconnected annular contacts, the first of which circumscribes the emitter-layer 308 of the HPT circuit assembly, while the other circumscribes the partially transmissive DBR mirror-stack assembly 305 and the metalized Gaussian mode providing curved shaped laser-emission-output mirror 104, 105, and 106. Fabrication of the HPT optoelectrical circuit is similar to the fabrication of the previously described HBT optoelectrical circuit.

For example, the layers used to construct the PCM 110, the first spacer-layer 100, the MQW gain-region 101, the second spacer-layer 102, and the HPT configured transistor(s) are altogether epitaxially deposited in succession one layer upon another starting with the substrate wafer layer 99 as a growth medium. While, the partially transmissive DBR mirror-stack assembly 305 and the metalized Gaussian mode providing curved shaped laser-emission-output mirror 104, 105, and 106 are altogether epitaxially deposited upon the OPCLD's second spacer-layer 102, where their final structure will be defined when photolithographic etching is utilized to remove the unwanted portions of these layers.

As illustrated in FIG. 73, which is a top plan view of a two-dimensional array of integrated HPT and OPCLD devices, the transparent contact-layer 311 is shown as not being connected to a common bus line, but is instead made available for independent signal busing. While the emitter-layer 308 of the HPT assembly is configured and etched into a shape that provides for a common bus circuit run 308, which connects to the other HPTs present within the array. The HPT might be configured to conduct electricity, when light 307 of sufficient intensity is made incident upon the HPT portion of the optoelectrical circuit, therein causing the OPCLD to lase. Alternatively, the integrated optoelectrical HPT based circuit could also be configured in such a way that the HPT and the OPCLD portions of the integrated optoelectrical circuit would operate independently from one another.

In addition, Boolean logic functions can also be implemented within the integrated opto-electrical circuit, either by adjusting the threshold at which the HPT becomes electron conducting, or by simply adjusting the intensity of the radiation made incident 307 upon the HPT, which in turn would trigger the HPT portion of the device to produce an output logic signal. For example, an OR logic gate could be implemented by making the conducting threshold low enough so that any beam of incident radiation 307 constitutes an input, and the OR logic gate would consequently be triggered by providing for electrical conduction within the HPT portion of the circuit. Another example would be to implement an AND logic gate by setting the threshold for input intensities such that every beam of radiation 307 that constitutes an input signal to the AND logic gate must be made incident upon the HPT in order to trigger an electrical conduction.

As illustrated in FIGS. 75 and 32, a slightly different version of an additional embodiment of the OPCLD invention, would comprise an InP configured OPCLD, two high-speed InP configured phototransistors, and two high-speed InP configured HEMT pre-amps. Further, the HEMT portion of the optoelectronic circuit is constructed using a 650-μm thick InP substrate wafer layer 99 as growth medium for epitaxially growing a multitude of lattice-matched layers that will comprise the HEMT configured optoelectronic integrated circuit. The lattice-matched layers used to form the HEMTs are epitaxially grown after the formation of the OPCLD portion of the circuit is completed.

Moreover, growth of which begins with an insulating un-doped buffer-layer of InP material 352, which is epitaxially deposited upon the second top most surface of the OPCLD's second spacer-layer 364, using an organic metal vapor growth method such as MOCVD to perform the material deposition. Further, epilayers 352, 361, 362, 366, 367, and 368 are particularly necessary because they are later used to form the HEMT based pre-amp circuits 353, 357, 356, 346, 347, and 348. While epilayers 352, 361, 362, 366, 367, and 368 are particularly necessary because they are used to form the two InP configured photodiode structures 391 and 392.

Moreover, as illustrated in FIGS. 75 and 32, the epilayer 352 functions as an insulation layer that protects the HEMT based circuitry from current used to electrically pump the OPCLD's gain-region 365, while the epilayer 353 functions as a buffer-layer that prevents any impurities present in the InP substrate wafer layer 99 from diffusing into any epitaxial layer formed there above.

Furthermore, an i-GaInAs configured epilayer 366 functions as an electron conductive layer within the HEMT 383 (or 388) circuit. While, epilayer 361 functions by injecting electrons into the i-GaInAs configured active epilayer 366. Moreover, the direct bandgap semiconductor material used to construct epilayer 361 is smaller in its electron affinity than that of the electron conductive epilayer 366, and the HEMT's PIN structure is formed from these epitaxially deposited semiconductor layers.

In addition, regarding the photodiode portion of the HEMT configured optoelectrical integrated circuit, epilayer 362, which is an n-GaInAs configured epilayer, forms the N-layer portion of a photodiode PIN structure, while epilayer 363, which is an i-GaInAs configured layer, forms the I-layer portion of a photodiode PIN structure, and epilayer 369, which is an P-GaInAs configured layer, forms the P-layer portion of a photodiode PIN structure. Moreover, after epilayers 102 to 109 have been deposited, any unnecessary areas of the epilayers 102 to 109 are removed using conventional photolithography and chemical etching.

Moreover, leaving only those portions that are required to provide for two light receiving photodiodes 391 and 392, two HEMT based pre-amp circuits 383 and 388, and two impedance matching resistors 378 and 385, all of which are illustrated in FIG. 32. Further, the physical dimensions of the photodiodes 391 and 392 may be slightly different from each other, as required. Wherein, anode electrodes 332 and 339 have a light receiving opening at a center thereof 330, 340, which are etched out of the P-GaInAs configured epilayer 369 portion of the photodiodes.

Moreover, as illustrated in FIGS. 75 and 32, the HEMT pre-amp circuits 388 and 383 will comprise source electrodes 335 and 346, drain electrodes 337 and 348, and gate electrodes 336 and 347, respectively. While, two impedance matching resistors 378 and 375 are formed by $n^{-layers}$ having Si ion-implanted in the InP substrate wafer layer 99. While, an insulative layer 342, 344, 349, and 358 is formed across the entire optoelectrical integrated circuit's surface area excluding the electrodes 332, 333, 335, 336, 337, 338, 339, 346, 347, and 348, while the circuit run and circuit pad forming metals are evaporated deposited and altogether are formed into their desired patterns 334, 339, 341, 345, 351, 373, 374, 375, 376, 377, 379, 380, 381, 382, 384, 386, 387, 388, 389, as illustrated in FIG. 32.

DESCRIPTION OF THE INVENTION

Alternative Embodiments

FIGS. 22-24, FIG. 70, and FIGS. 71-75, 32

Disclosed below and illustrated in FIGS. 1, 2, 2A, 3, 3A, 4, 5, 5A, 6, 6A, 7, 8, 8A, 9, 9A, 10, 11, 11A, 12, 12A, 13, 14, 14A, 15, 15A, 16, 17, 17A, 18, 18A, 22, 23, 23A, 24, 24A, 25, 25A, 25B, 30, 30A, 30B, 31, 31A, 31B, 33, 34, 35, 35A, 35B, 36, 36A, 36B, 37, 38, 39, 39A, 39B, 40, 40A, 40B, 41, 42, 43, 43A, 43B, 44, 44A, 44B, there are several alternate variations of the OPCLD invention, and consequently it should noted that regardless of the fact the OPCLD invention can be made subject to numerous adaptations and modifications those modifications and adaptations do not depart from the scope and spirit of the invention.

Therefore, it is to be understood that, within the scope and spirit of the invention, the invention may be practiced other than as specifically described above or below. In particular, the invention is to be interpreted in accordance with the appended claims, and equivalents thereof, without limitations being read from the specification described in the above or below paragraphs.

In addition, the doping of an OPCLD's multi-layered structures is accomplished during epitaxial deposition by the addition of various dopant materials (e.g., N type electron donating dopant material like Phosphorus and P type electron accepting dopant material like Boron) to various construction material being utilized during the MBE or MOCVD epitaxial deposition of the layers that will constitute the OPCLD. Further, the OPCLD invention is a new kind of resonator design that has never been used before in a semiconductor laser diode device and can use many different construction materials and dopant concentrations of specific dopant materials within the several different semiconductor layers that might comprise the OPCLD's various multi-layered structure.

The "Optical Phase Conjugating Laser Diode" (OPCLD), as illustrated in FIGS. 1, 2, 2A, 3, 3A, represents an alternative embodiment to the OPCLD invention illustrated in FIG. 19. Wherein, the alternative OPCLD begins its construction as a commercially obtained semiconductor substrate wafer, which is utilized as a growth medium during the epitaxial growth of the OPCLD's multilayered structure. For the this alternative version of my OPCLD invention and depending upon the material regime chosen as the material used to construct the OPCLD's gain-region, the method used to grow the OPCLD will more likely be one of two well known epitaxial methods of material growth; e.g., "Molecular Beam Epitaxy" (MBE), which is typically used to grow GaN based epi-structures upon commercially obtained Silicon-Carbide or $Al_2O_3$ substrate wafers, while "Metal-Organic Chemical Vapor Deposition" (MOCVD) is typically used to grow InP based epi-structures upon commercially obtained Indium-Phosphide or Gallium-Phosphide substrate wafers. Please note that the OPCLD's spacer-layers are illustrated using a color of grey that gradiently changes from dark to light or from light to dark as a means to illustrate how these layers are gradiently doped.

Please note, that for the OPCLD's spacer-layers, doping is heaviest in the dark colored areas of the spacer-layer, while doping is lightest in the light colored areas of the spacer-layer.

Figure 1:
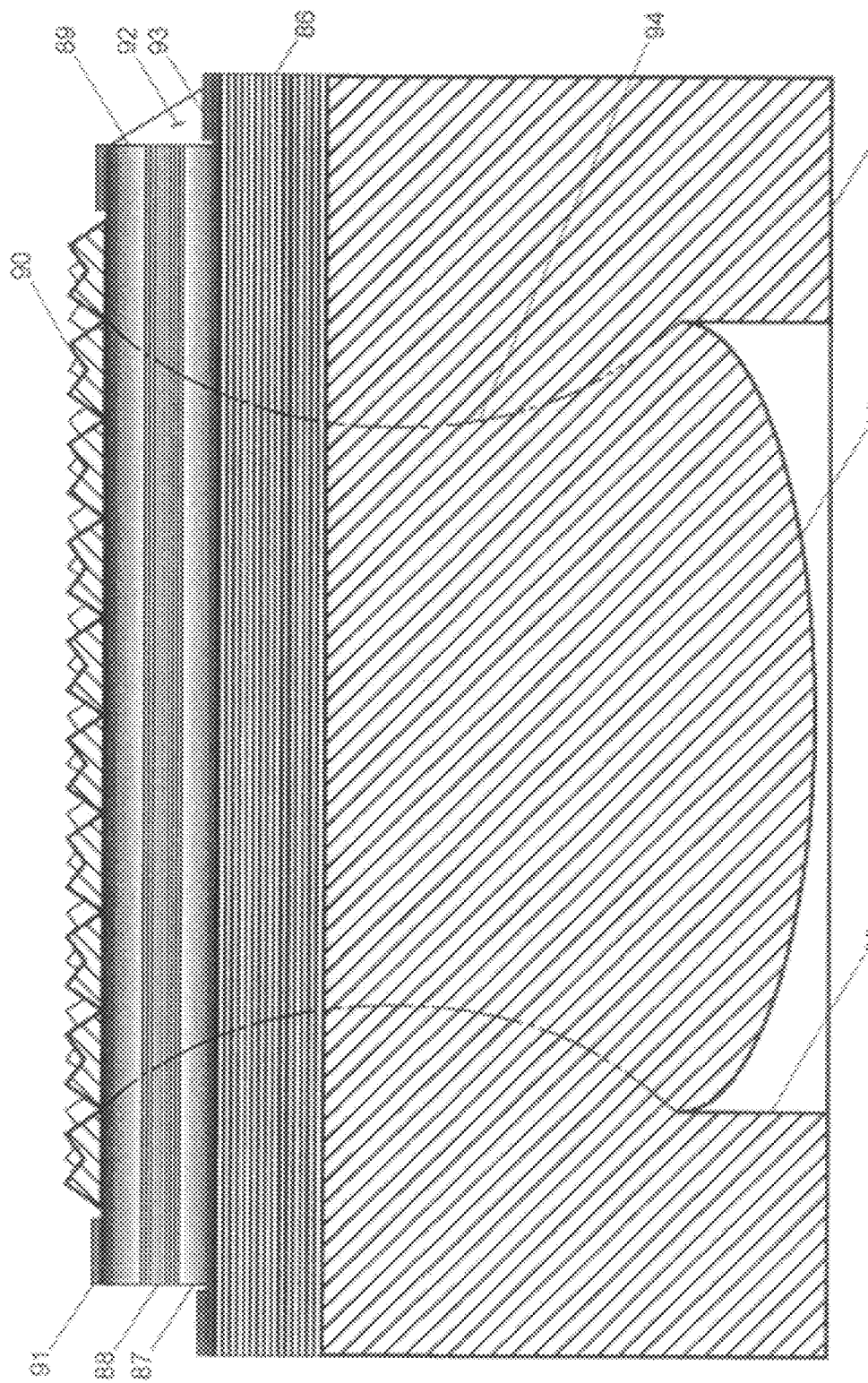
FIG. 1 is a Section A-A side-view illustration of the first design configuration of my OPCLD invention, which is shown as comprising an undoped substrate member, a Gaussian mode providing curved shaped laser-emission-output mirror, an undoped epilayered quarter-wave based DBR mirror-stack assembly, a doped epilayered gain-region, a first doughnut shaped metal contact, a second doughnut shaped metal contact, and a corner-cube array based PCM.

Additionally, FIG. 1 is a Section A-A side-view illustration of a single OPCLD, which is described below as comprising a multiple epilayered structure that is deposited and shaped in the following order, which includes:

A choice of either commercially obtaining a p-doped or an n-doped semiconductor substrate wafer 85 (FIG. 1).

Next, using MBE or MOCVD, is the deposition of a few un-doped surface-smoothing buffer-layers (not illustrated) upon the up-turned second face surface of the substrate wafer 85. Further, after deposition these buffer-layers will typically have a total thickness equaling 100-Å.

Upon an up-turned second face of the previously formed buffer-layers is an epitaxially deposited second reflector 86 (FIG. 1), which is comprised as having a gradiently doped DBR configured mirror-stack assembly that provides for a partial reflection/partial transmission of intra-cavity stimulated emission.

Next, is the epitaxial deposition of a first spacer-layer 87 (FIG. 1), which is made to occur upon the upturned surface of the previously deposited DBR 86 and will be comprised as having either a gradiently or non-gradiently doped structure, using either a P or N dopant material, e.g. for an N-type spacer-layer use an electron donating material like Silicon or Carbon, while for an P-type spacer-layer use an electron accepting material like Boron or Zinc.

Upon the up-turned second face of the previously formed spacer-layer 87 is an epitaxially deposited gain-region 88 (FIG. 19), which is comprised as having either a single layered lattice-matched P-doped, N-doped, or un-doped bulk semiconductor layer based gain-region, a single or multilayered strained or unstrained quantum-dot based gain-region, a single or multilayered strained or unstrained quantum superlattice based gain-region 88, a single or multilayered strained or unstrained quantum-cascade based gain-region 88, a single or multilayered "Organic-Light-Emitting-Diode" (OLED) based gain-region, being comprised, for example, from the deposition of a 30-nm layer of TAD (TAD is conventional for triphenyl/diamine), a 15-nm layer of NAPOXA (NAPOXA is conventional for 2-naphtyl-4,5-bis(4-methoxyphenyl)-1,3-oxazole), a 15-nm layer of Alq (Alq is conventional for 8-hydroxyquinolinato aluminum), for synthesis information, please see, U.S. patent application Ser. No. 08/673,864, filed Sep. 13, (1995), by A. Dodabalapur et al., or a single or multilayered strained or unstrained quantum-well based gain-region 88 (FIG. 1).

Upon an up-turned second face of the previously formed gain-region 88 is an epitaxially deposited second lattice-matched semiconductor spacer-layer 89 (FIG. 1), which is comprised as having either a gradiently or a non-gradiently doped structure using either P-type or N-type dopant material.

Figure 2:
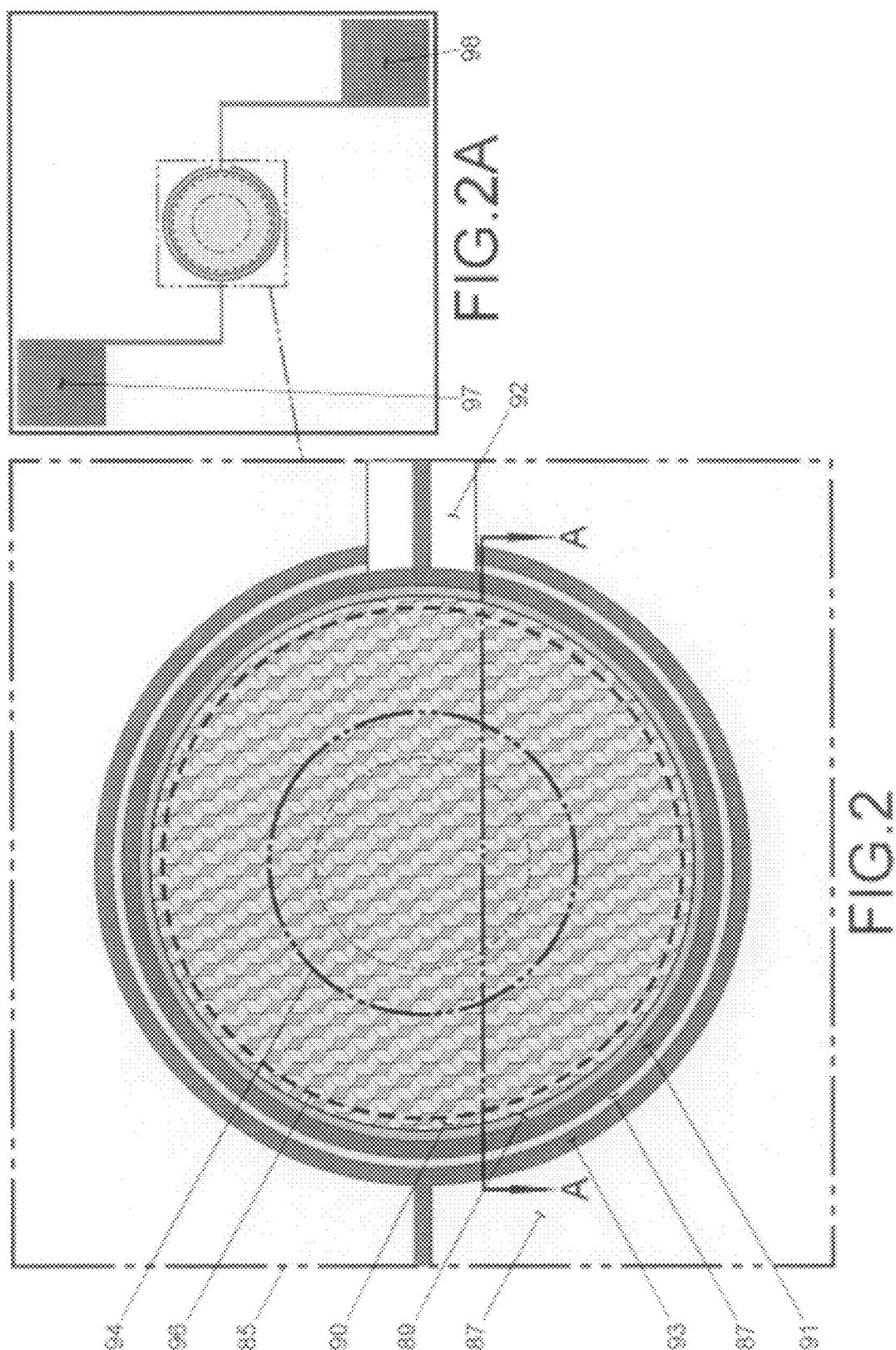
FIG. 2 is a top plan-view illustration of the first design configuration of my OPCLD invention, which is shown as comprising two metal contact runs, and a corner-cube array based PCM.
Figure 3:
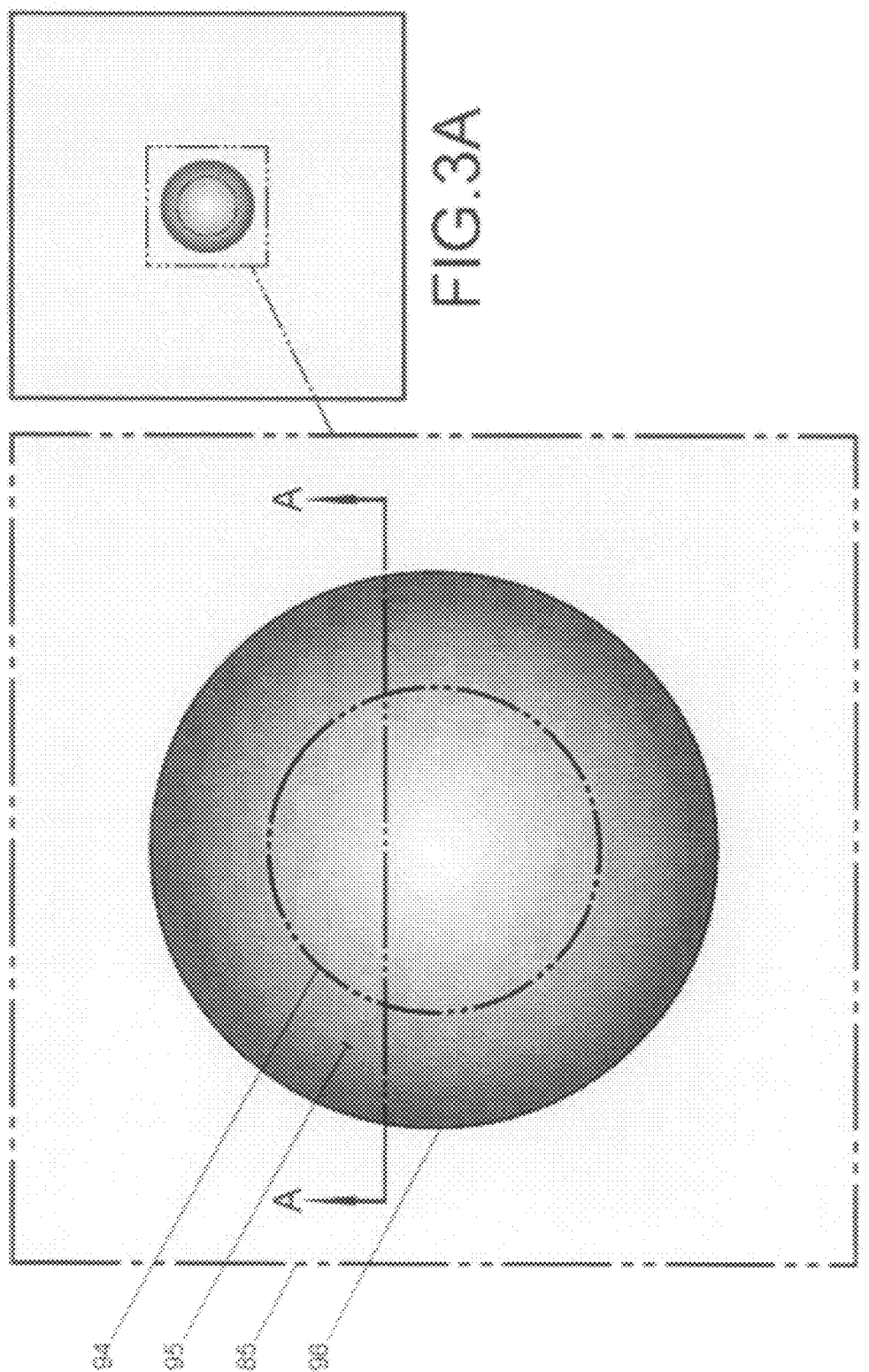
FIG. 3 is a bottom plan-view illustration of the first design configuration of my OPCLD invention, which is shown as comprising a substrate member, and a Gaussian mode providing curved shaped laser-emission-output mirror.

Upon an up-turned second face of the previously deposited spacer-layer 89 is an epitaxially deposited PCM layer 90 (FIGS. 1, 2, and 2A), which is lithographically (i.e., using grey-scale masking and lithography) formed into a very large array of corner-cubes retro-reflecting elements 90 (FIGS. 1, 2, and 2A).

Using a first face of the commercially provided substrate wafer 85, a first reflector 95 (FIGS. 1, 3, and 3A) is formed (i.e., using grey-scale masking and lithography) into a laser-emission-output mirror 95, which provides for a Gaussian shaped laser-emission-output into a single fundamental transverse spatial cavity mode.

A first N-type or P-type Ohmic contact 93 (FIGS. 1, 2, and 2A) is formed when the appropriate metal alloy is deposited upon the outermost up-turned n++ or p++ surface of a previously etched out area of the OPCLD's first spacer-layer 87, and later formed into doughnut shaped contact ring 93, a contact circuit trace and a contact circuit pad 97. While a second N-type or P-type Ohmic contact 91 (FIGS. 1, 2, and 2A) is formed when the appropriate metal alloy is deposited upon the second n++ orp++ doped surface of the OPCLD's second spacer-layer 89, and later formed into doughnut shaped contact ring 91, a contact circuit trace and a contact circuit pad 98.

Wherein, the third reflector's Gaussian mode providing shape 95, 96 (FIGS. 1, 3, and 3A) and the first reflector's optical phase-conjugation providing PCM 90 (FIGS. 1, 2, and 2A) altogether define a hemispherically confined optical field 96 with a waist-band location that is symmetrically centered within in the OPCLD's laser cavity 94, and further provides for a high-power laser-emission-output (i.e., $\geq$100-mW of cw output for a gain-region having a diameter $\geq$60-µm) into a low-order fundamental transverse spatial cavity mode (i.e., preferably the transverse cavity mode $TEM_{oo}$).

Please note that spacer-layers 87 and 89 (FIG. 1) are drawn as gradiently filled rectangles as a means to illustrate how and to what extent they have their alloys gradiently configured. For the OPCLD's spacer-layers dark colored areas graphically represent where the semiconductor alloy exhibits a lower bandgap, while a higher bandgap exists is graphically illustrated by the light colored areas.

In addition, please note that for the second alternative OPCLD embodiment, particularly regarding its spacer-layers, doping is heaviest in the dark colored areas of the spacer-layer, while doping is lightest in the light colored areas of the spacer-layer. Further, as illustrated in FIGS. 4, 5, 5A, 6, and 6A, the second alternative version of the OPCLD is comprised as having a multiple epilayered structure that is deposited and shaped accordingly and in the following order, which includes:

A commercially obtaining p-doped or n-doped semiconductor substrate wafer 99 (FIG. 4).

The substrate wafer 99 needs to be first etched using grey-scale masking and lithography to form an Nth number of hemispheric shaped recessions 108 (FIG. 4) in the up-turned surface of the substrate wafer 99. While a second group of hemispheric shaped expressions 110A (FIG. 4) are formed, using grey-scale masking and lithography, out of the down-turned surface of the substrate wafer 99.

Next, recession 108 is filled using MOCVD with the same semiconductor material used to comprise the substrate wafer 99 except the construction material used to fill the recession will be highly n++ or p++ doped, choice of dopant polarity being dependant upon desired type and direction of connectivity.

After which, any bulges, bumps, or other irregularities can be smoothed down flat using chemical etching and/or polishing agents or mechanical polishing.

Next, is an epitaxial deposition of a few highly doped surface-smoothing buffer-layers (not illustrated) upon the up-turned second face surface of the previously processed substrate wafer 99. After deposition, the buffer-layers will altogether have a total thickness equaling 100-Å.

Next, is a epitaxial deposition of a first spacer-layer 100 (FIG. 4), which is made to occur upon the upturned outmost surface of the previously deposited buffer-layers and will be comprised as having either a gradiently or non-gradiently doped structure using either a P-type or N-type dopant material; e.g., for an N-type spacer-layer use an electron donating material like Silicon or Carbon, while for an P-type spacer-layer use an electron accepting material like Boron or Zinc.

Upon the up-turned second face surface of the previously formed spacer-layer 100 is an epitaxially deposited a gain-region 101 (FIG. 4), which is comprised as having either a single layered lattice-matched P-doped, N-doped, or un-doped bulk semiconductor layer based gain-region, a single or multilayered strained or unstrained quantum-dot based gain-region, a single or multilayered strained or unstrained quantum super-lattice based gain-region 101, a single or multilayered strained or unstrained quantum-cascade based gain-region 101, a single or multilayered "Organic-Light-Emitting-Diode" (OLED) based gain-region 101, being comprised, for example, from the deposition of a 30-nm layer of TAD (TAD is conventional for triphenyl/diamine), a 15-nm layer of NAPOXA (NAPOXA is conventional for 2-naphtyl-4,5-bis(4-methoxyphenyl)-1,3-oxazole), a 15-nm layer of Alq (Alq is conventional for 8-hydroxyquinolinato aluminum), for synthesis information, please see, U.S. patent application Ser. No. 08/673,864, filed Sep. 13, (1995), by A. Dodabalapur et al., or a single or multilayered strained or unstrained quantum-well based gain-region 101.

Upon an up-turned second face surface of the previously formed gain-region 101 is an epitaxially deposited a second lattice-matched semiconductor spacer-layer 102 (FIG. 4), which is comprised as having either a gradiently or a non-gradiently doped structure using either P-type or N-type dopant material.

Upon an up-turned second face of the previously formed second spacer-layer 102 (FIG. 4) is an epitaxially deposited second reflector 103 (FIG. 4), which is comprised as having an undoped DBR configured mirror-stack assembly 103 that provides for a partial reflection/partial transmission of intra-cavity stimulated emission.

Upon an up-turned second face of the previously deposited DBR configured mirror-stack assembly 103 is an epitaxially deposited laser-emission-output layer 104 (FIGS. 4, 5, and 5A), which is lithographically (i.e., using grey-scale masking and lithography) formed into a hemispherical shaped 105, 106 (FIGS. 4, 5, and 5A) Gaussian mode and partial reflection providing metalized third reflector.

Using the outmost surface of the previously etched hemispheric shaped expressions 110A (FIG. 4), which were formed, using grey-scale masking and lithography, out of the down-turned surface of the substrate wafer 99, a first reflecting body 110 (FIGS. 4, 6, and 6A) is peripherally formed (i.e., using grey-scale masking and lithography) into an array of retro-reflecting polyhedral shaped prisms 198 (FIGS. 26, 26A, and 26B), which will provide for the OPCLD's optical phase-conjugating PCM 110.

Figure 5:
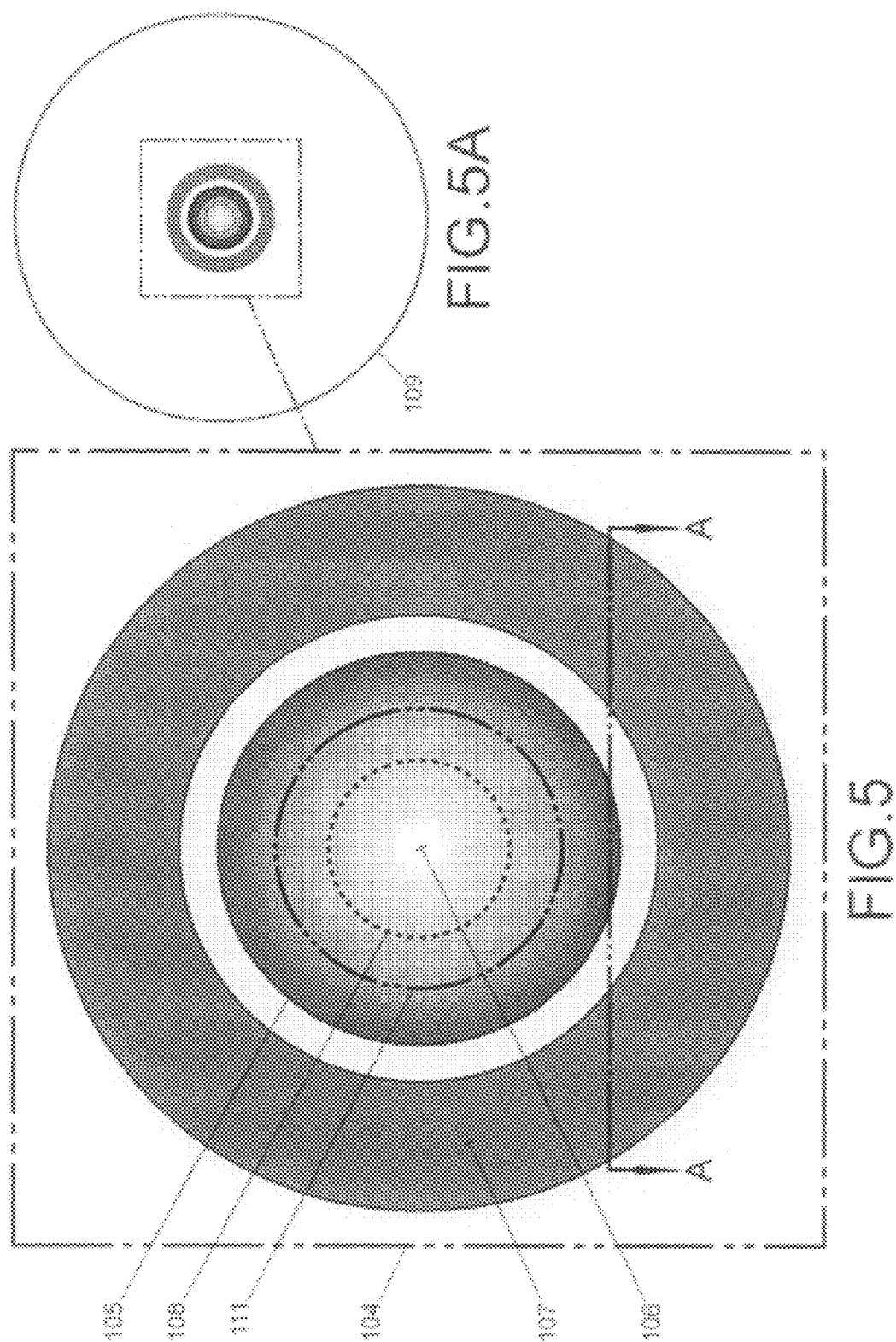
FIG. 5 is a top plan-view illustration of the second design configuration of my OPCLD invention, which is shown as comprising one doughnut shaped metal contact, and a Gaussian mode providing curved shaped laser-emission-output mirror.

A first N-type or P-type Ohmic contact 107 (FIGS. 4, 5, and 5A) is formed when the appropriate metal alloy is deposited into a circular shaped trench that was previously etched all the way through both reflector number three's deposited construction layer 104 and the previously deposited DBR configured mirror-stack assembly 103, where it will be lithographically formed into a doughnut shaped contact layer that provides for electrical connectivity with the top outer-most n++ or p++ doped surface of the OPCLD's second spacer-layer 102. While a second N-type or P-type Ohmic contact 109 (FIGS. 4, 5A, and 6A) is formed when the appropriate metal alloy is deposited upon and around the entire periphery of the bottom outer-most n++ or p++ doped surface edge of the OPCLD's substrate wafer 99, where it will be lithographically formed into a rectangular shaped contact layer 109 (FIGS. 4, 5A, and 6A).

Wherein, the third reflector's Gaussian mode providing hemispherical shaped structure 105, 106 (FIGS. 4, 6, and 6A) and the first reflector's optical phase-conjugating hemispherical shaped PCM 110 (FIGS. 4, 6, and 6A) will altogether define a confocally confined optical field 111 with a waist-band location 108 that is symmetrically centered within in the OPCLD's laser cavity 108, and altogether further provides for a high-power laser-emission-output (i.e., ≧100-mW of cw output for a gain-region having a diameter≧60-μm) into a low-order fundamental transverse spatial cavity mode (i.e., preferably the transverse cavity mode $TEM_{oo}$).

Please note that spacer-layers 100 and 102 (FIG. 4) are drawn as gradiently filled rectangles as a means to illustrate how and to what extent they have their alloys gradiently configured. For the OPCLD's spacer-layers dark colored areas graphically represent where the semiconductor alloy exhibits a lower bandgap, while a higher bandgap exists is graphically illustrated by the light colored areas.

Figure 7:
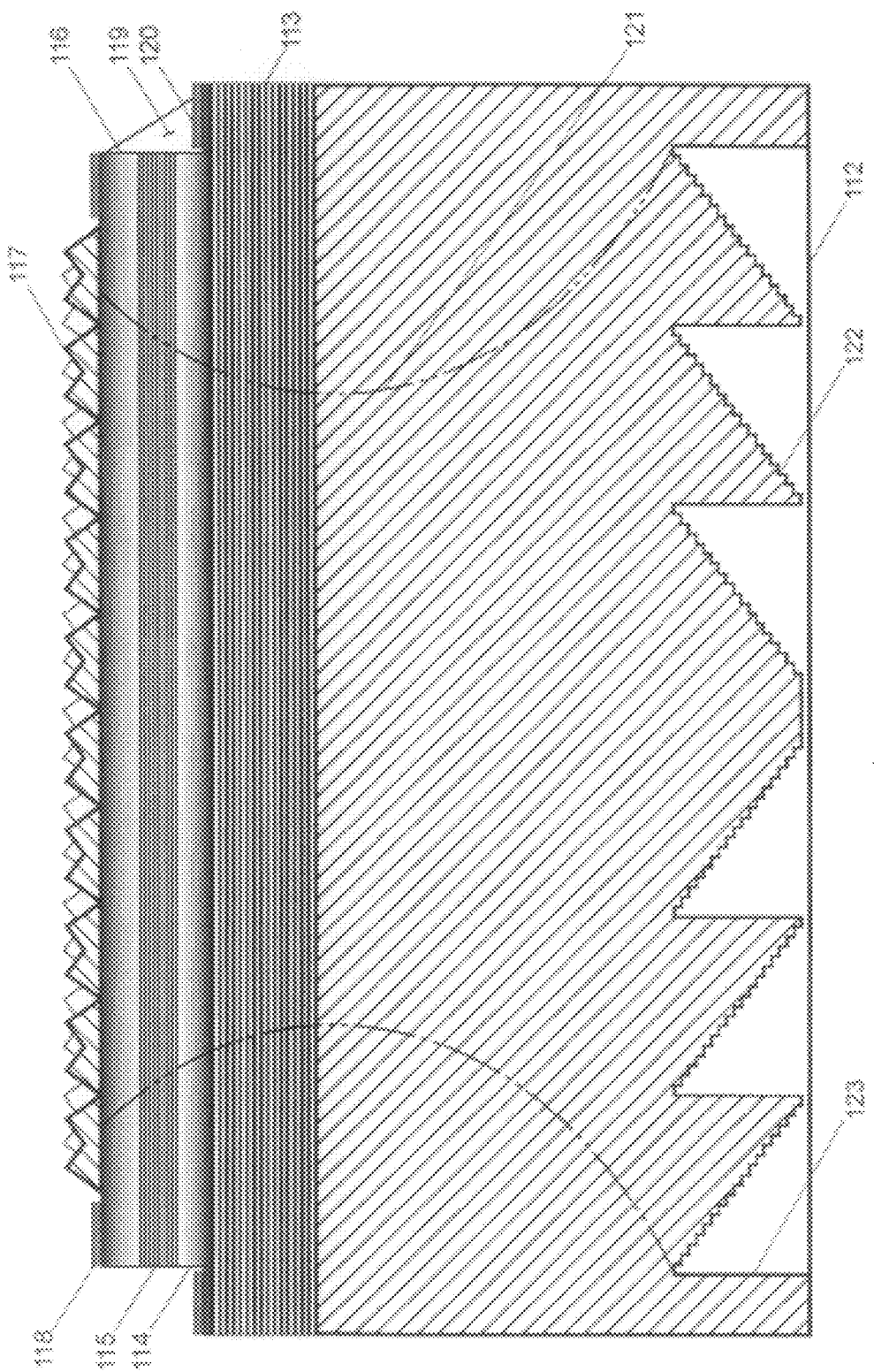
FIG. 7 is a Section A-A side-view illustration of the third design configuration of my OPCLD invention, which is shown as comprising an undoped substrate member, an undoped Fresnel shaped laser-emission-output mirror, an undoped epilayered quarter-wave based DBR mirror-stack assembly, a doped epilayered gain-region, a first doughnut shaped metal contact, a second doughnut shaped metal contact, and an undoped corner-cube array based PCM.

In addition, please note that for the third alternative OPCLD embodiment, particularly regarding its spacer-layers, doping is heaviest in the dark colored areas of the spacer-layer, while doping is lightest in the light colored areas of the spacer-layer. Further, as illustrated in FIGS. 7, 8, 8A, 9, and 9A, the third alternative version of the OPCLD is comprised as having a multiple epilayered structure that is deposited and shaped accordingly and in the following order, which includes:

A choice of either commercially obtaining a p-doped or an n-doped semiconductor substrate wafer 112 (FIG. 7).

Next, using MBE or MOCVD, is the deposition of a few un-doped surface-smoothing buffer-layers (not illustrated) upon the up-turned second face surface of the substrate wafer 112. Further, after deposition, these buffer-layers will typically have a total thickness equaling about 100-Å.

Upon an up-turned second face surface of the previously formed buffer-layers is an epitaxially deposited second reflector 113 (FIG. 7), which is comprised as having a gradiently n-doped or p-doped DBR configured mirror-stack assembly that provides for a partial reflection/partial transmission of intracavity stimulated emission.

Next, is the epitaxial deposition of a first spacer-layer 114 (FIG. 7), which is made to occur upon the upturned surface of the previously deposited DBR 113 and will be comprised as having either a gradiently or non-gradiently doped structure, using either a P-type or N-type dopant material, e.g. for an N-type spacer-layer use an electron donating material like Silicon or Carbon, while for an P-type spacer-layer use an electron accepting material like Boron or Zinc.

Upon the up-turned second face of the previously deposited spacer-layer 114 (FIG. 7) is an epitaxially deposited gain-region 115 (FIG. 7), which is comprised as having either a single layered lattice-matched P-doped, N-doped, or un-doped bulk semiconductor layer based gain-region, a single or multilayered strained or unstrained quantum-dot based gain-region, a single or multilayered strained or unstrained quantum super-lattice based gain-region 115, a single or multilayered strained or unstrained quantum-cascade based gain-region 115, a single or multilayered "Organic-Light-Emitting-Diode" (OLED) based gain-region, being comprised, for example, from the deposition of a 30-nm layer of TAD (TAD is conventional for triphenyl/diamine), a 15-nm layer of NAPOXA (NAPOXA is conventional for 2-naphtyl-4,5-bis (4-methoxyphenyl)-1,3-oxazole), a 15-nm layer of Alq (Alq is conventional for 8-hydroxyquinolinato aluminum), for synthesis information, please see, U.S. patent application Ser. No. 08/673,864, filed Sep. 13, (1995), by A. Dodabalapur et al., or a single or multilayered strained or unstrained quantum-well based gain-region 115 (FIG. 7).

Upon an up-turned second face of the previously deposited gain-region 115 is an epitaxially deposited second lattice-matched semiconductor spacer-layer 116 (FIG. 7), which is comprised as having either a gradiently or a non-gradiently doped structure using either P-type or N-type dopant material.

Upon an up-turned second face of the previously deposited spacer-layer 116 is an epitaxially deposited PCM layer 117 (FIGS. 7, 8, and 8A), which is lithographically (i.e., using grey-scale masking and lithography) formed into a very large array of corner-cube shaped retro-reflecting elements 117 (FIGS. 7, 8, and 8A).

Using a first face of the commercially provided substrate wafer 112, a first reflector 122, 123 (FIGS. 7, 9, and 9A) is formed (i.e., using grey-scale masking and lithography) into a laser-emission-output Fresnel shaped digital mirror 122, which provides for a Gaussian shaped high-power laser-emission-output into a single fundamental transverse spatial cavity mode.

A first N-type or P-type Ohmic contact 120 (FIGS. 7, 8, and 8A) is formed when the appropriate metal alloy is deposited upon the outermost up-turned n++ or p++ surface of a previously etched out area of the OPCLD's first spacer-layer 114, and later formed into doughnut shaped contact ring 97, a contact circuit trace and a contact circuit pad 97. While a second N-type or P-type Ohmic contact 91 (FIGS. 1, 2, and 2A) is formed when the appropriate metal alloy is deposited upon the second n++ or p++ doped surface of the OPCLD's second spacer-layer 116 and contact isolation ramp 119, and is later formed into a doughnut shaped contact ring 118, a contact circuit trace and a contact circuit pad 98.

Wherein, the first reflector's Gaussian mode providing Fresnel shaped digital mirror 122, 123 (FIGS. 7, 9, and 9A) and the third reflector's optical phase-conjugation providing PCM 117 (FIGS. 7, 8, and 8A) altogether define a hemispherically confined optical field 123 with a waist-band location that is symmetrically centered within in the OPCLD's laser cavity 121, and further provides for a high-power laser-emission-output (i.e., >100-mW of cw output for a gain-region having a diameter≧60-μm) into a low-order fundamental transverse spatial cavity mode (i.e., preferably the transverse cavity mode $TEM_{oo}$).

Please note that spacer-layers 114 and 116 (FIG. 7) are drawn as gradiently filled rectangles as a means to illustrate how and to what extent they have their alloys gradiently configured. For the OPCLD's spacer-layers dark colored areas graphically represent where the semiconductor alloy exhibits a lower bandgap, while a higher bandgap exists is graphically illustrated by the light colored areas.

Figure 10:
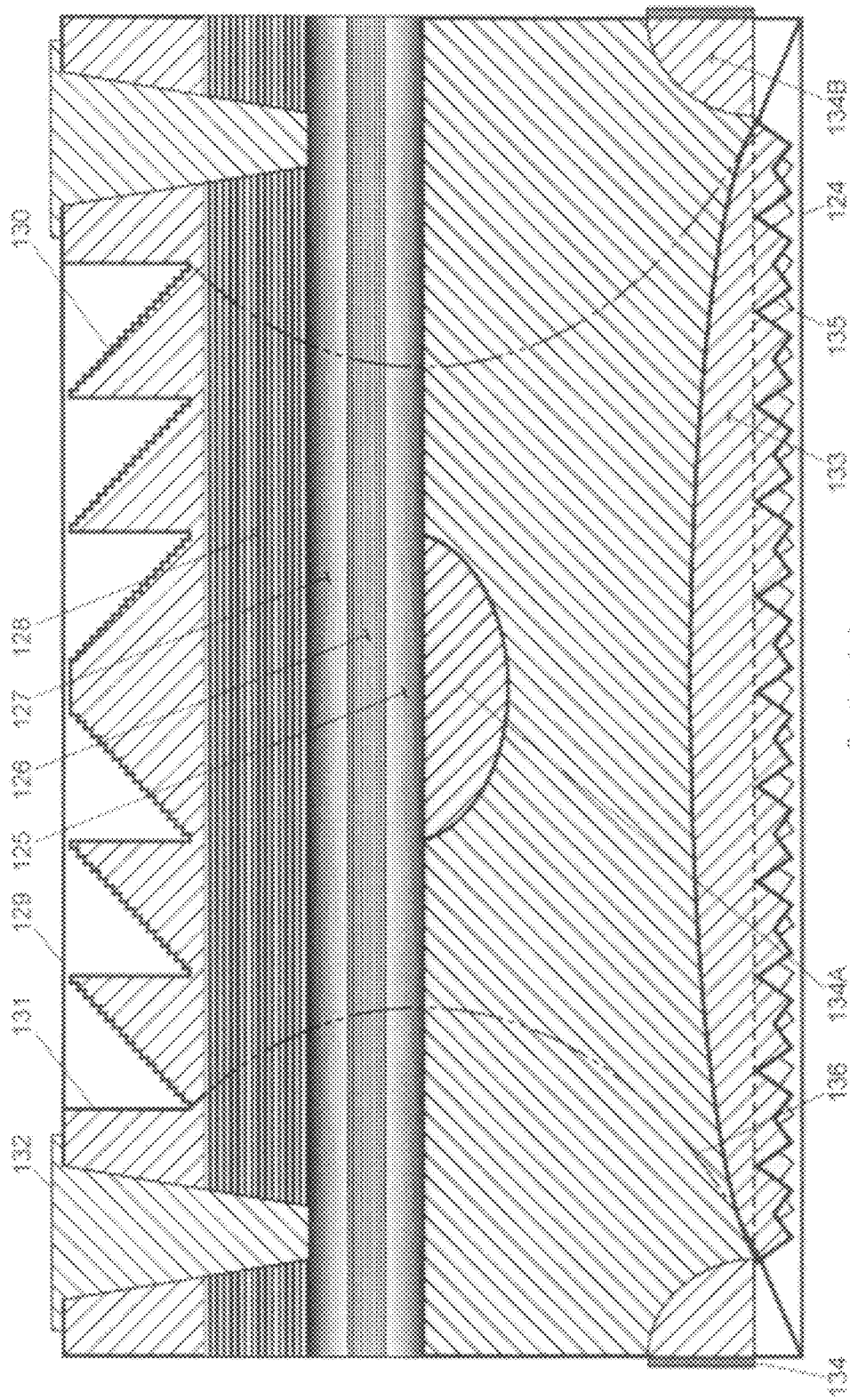
FIG. 10 is a Section A-A side-view illustration of a fourth design configuration of my OPCLD invention, which is shown as comprising a doped substrate member, an undoped corner-cube array based PCM, a doped epilayered gain-region, an undoped epilayered partial-reflection quarter-wave based DBR mirror-stack assembly, a highly ++ doped current guiding member, a highly ++ doped current guiding doughnut member, a collimating lens, a trench deposited doughnut shaped metal contact, a peripheral surrounding metal ring contact, and a Fresnel shaped laser-emission-output mirror.

In addition, please note that for the fourth alternative OPCLD embodiment, particularly regarding its spacer-layers, doping is heaviest in the dark colored areas of the spacer-layer, while doping is lightest in the light colored areas of the spacer-layer. Further, as illustrated in FIGS. 10, 11, 11A, 12, and 12A, the second alternative version of the OPCLD is comprised as having a multiple epilayered structure that is deposited and shaped accordingly and in the following order, which includes:

A commercially obtaining p-doped or n-doped semiconductor substrate wafer 124 (FIG. 10).

The substrate wafer 124 needs to be first etched using grey-scale masking and lithography to form an $N^{th}$ number of hemispheric shaped recessions 134A (FIG. 10) in the up-turned surface of the substrate wafer 124. While a second group of hemispheric shaped recessions 133 (FIG. 10) are formed, using grey-scale masking and lithography, out of the down-turned surface of the substrate wafer 124. With a group of doughnut shaped recessions 134B (FIG. 10) being formed, using grey-scale masking and lithography, out of the down-turned surface of the substrate wafer 124.

Next, recession 134A is filled using MOCVD with the same semiconductor material used to comprise the substrate wafer 124 except the construction material used to fill the recession will be highly n++ or p++ doped, choice of dopant polarity being dependant upon desired type and direction of device's connectivity.

Next, recession 134B is filled using MOCVD with the same semiconductor material used to comprise the substrate wafer 124 except the construction material used to fill the recession will be highly n++ or p++ doped, choice of dopant polarity being dependant upon desired type and direction of device's connectivity.

Next, recession 133 is filled using MOCVD with a lattice-matched semiconductor material, but a semiconductor that has lower-refractive index than the material used to construct the substrate wafer 124, forming therein a soft-apertured lens.

After which, any bulges, bumps, or other irregularities exhibited by the just filled internal lens 133, 134, 134A can be smoothed down flat at the substrate's two material boundary interface surfaces, using chemical etching and/or polishing agents or mechanical polishing.

Next, is an epitaxial deposition of a few highly doped surface-smoothing buffer-layers (not illustrated) upon the up-turned second face surface of the previously processed substrate wafer 124. After deposition, the buffer-layers will altogether have a total thickness equaling 100-Å.

Next, is a epitaxial deposition of a first spacer-layer 125 (FIG. 10), which is made to occur upon the upturned outmost surface of the previously deposited buffer-layers and will be comprised as having either a gradiently or non-gradiently doped structure using either a P-type or N-type dopant material; e.g., for an N-type spacer-layer use an electron donating material like Silicon or Carbon, while for an P-type spacer-layer use an electron accepting material like Boron or Zinc.

Upon the up-turned second face surface of the previously formed spacer-layer 125 is an epitaxially deposited a gain-region 126 (FIG. 10), which is comprised as having either a single layered lattice-matched P-doped, N-doped, or un-doped bulk semiconductor layer based gain-region, a single or multilayered strained or unstrained quantum-dot based gain-region, a single or multilayered strained or unstrained quantum super-lattice based gain-region 126, a single or multilayered strained or unstrained quantum-cascade based gain-region 126, a single or multilayered "Organic-Light-Emitting-Diode" (OLED) based gain-region 126, altogether being comprised, for example, from the sputtered deposition of several light-emitting polymers such as a 30-nm layer of TAD (TAD is conventional for triphenyl/diamine), a 15-nm layer of NAPOXA (NAPOXA is conventional for 2-naphtyl-4,5-bis(4-methoxyphenyl)-1,3-oxazole), a 15-nm layer of Alq (Alq is conventional for 8-hydroxyquinolinato aluminum), for synthesis information, please see, U.S. patent application Ser. No. 08/673,864, filed Sep. 3, (1995), by A. Dodabalapur et al., or a single or multilayered strained or unstrained quantum-well based gain-region 126.

Upon an up-turned second face surface of the previously formed gain-region 126 (FIG. 10) is an epitaxially deposited second lattice-matched semiconductor spacer-layer 127 (FIG. 10), which is comprised as having either a gradiently or a non-gradiently doped structure using either P-type or N-type dopant material.

Upon an up-turned second face surface of the previously deposited second spacer-layer 127 (FIG. 10) is an epitaxially deposited second reflector 128 (FIG. 10), which is comprised as having an undoped DBR configured mirror-stack assembly 128 that provides for a partial reflection/partial transmission of intra-cavity stimulated emission.

Upon an up-turned second face surface of the previously deposited DBR configured mirror-stack assembly 128 is an epitaxially deposited laser-emission-output layer 129 (FIGS. 10, 11, and 11A), which is lithographically (i.e., using grey-scale masking and lithography) formed into a Fresnel shaped 130, 131 (FIGS. 10, 11, and 11A) Gaussian mode and partial-reflection/partial transmission providing digital mirror and the device's third reflector.

Using the outmost surface of the previously deposited undoped lower-refractive index material layer to form, using grey-scale masking and lithography, out of the down-turned surface an array of polyhedral shaped retro-reflecting prisms 198 (FIGS. 26, 26A, and 26B) altogether used to comprise the device's PCM and first reflector 135, which will provide for the OPCLD's optical phase-conjugating PCM 135.

Figure 11:
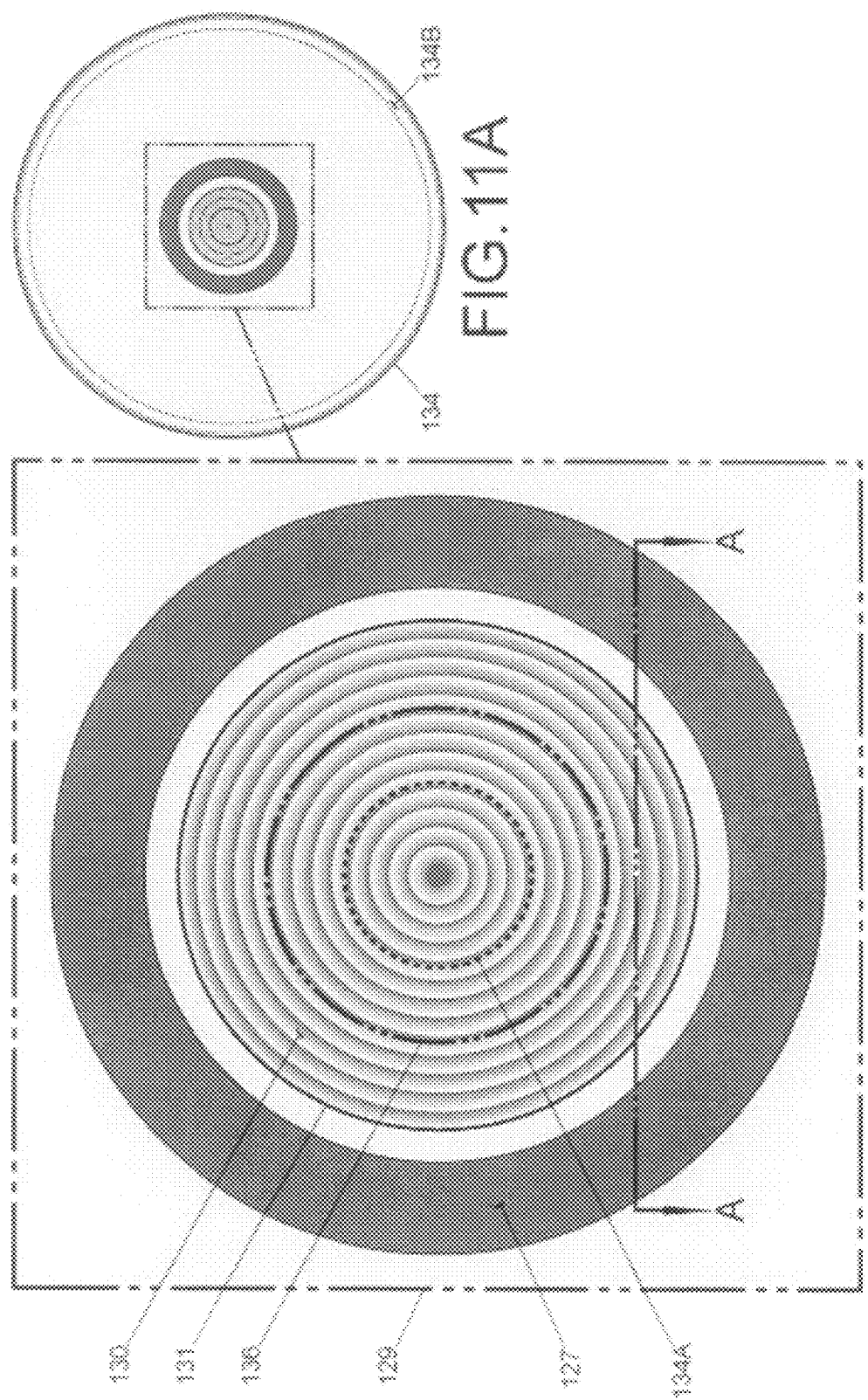
FIG. 11 is a top plan-view illustration of the fourth design configuration of my OPCLD invention, which is shown as comprising a doughnut shaped metal contact, and a Gaussian mode providing Fresnel based laser-emission-output mirror.
Figure 12:
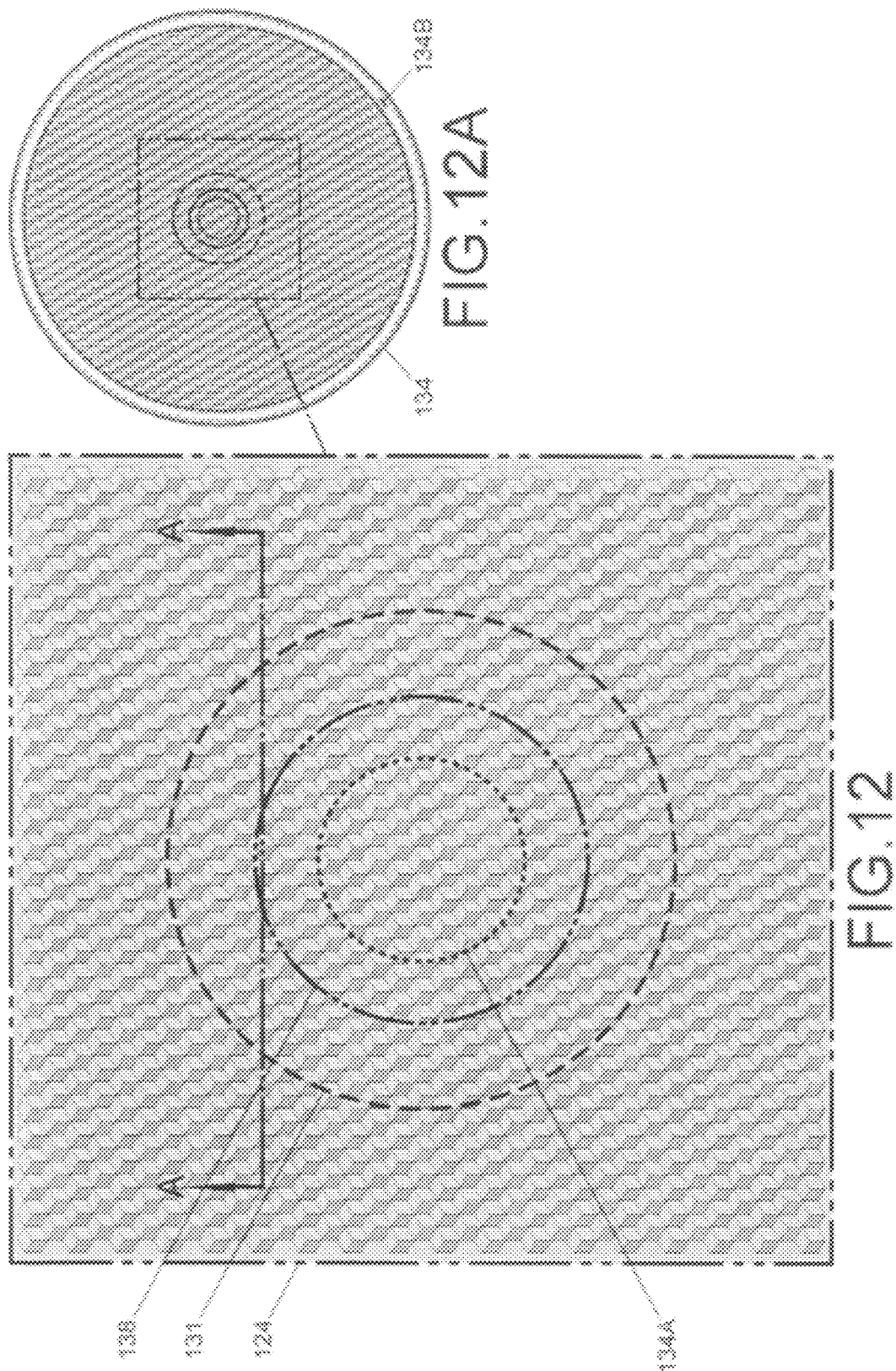
FIG. 12 is a bottom plan-view illustration of the fourth design configuration of my OPCLD invention, which is shown as comprising a peripheral surrounding metal ring contact, and an undoped corner-cube array based PCM.

A first N-type or P-type Ohmic contact 132 (FIGS. 10, 11, and 11A) is formed when the appropriate metal alloy is deposited into a circular shaped trench that was previously etched all the way through both reflector number three's deposited construction layer 129 and the previously deposited DBR configured mirror-stack assembly 128, where it will be lithographically formed into a doughnut shaped contact layer 132 that provides for electrical connectivity to the top outer-most n++ or p++ doped surface of the OPCLD's second spacer-layer 127. While a second N-type or P-type Ohmic contact 134 (FIGS. 10, 11A, and 12A) is formed when the appropriate metal alloy is deposited upon and around the entire periphery of the bottom outer-most n++ or p++ doped surface edge of the OPCLD's substrate wafer 124, where it will be lithographically formed into short cylinder shaped contact layer 134 (FIGS. 10, 11A, and 12A).

Wherein, the third reflector's Gaussian mode providing Fresnel shaped mirror structure 130, 131 (FIGS. 10, 11, and 11A) and the first reflector's optical phase-conjugating PCM 135 (FIGS. 10, 12, and 12A) will altogether define a hemi-spherically confined optical field with a waist-band location 138 that is symmetrically centered within in the OPCLD's laser cavity, and altogether further provides for a high-power laser-emission-output (i.e., $\geq$100-mW of cw output for a gain-region having a diameter$\geq$60-µm) into a low-order fundamental transverse spatial cavity mode (i.e., preferably the transverse cavity mode $TEM_{00}$).

Please note that spacer-layers 125 and 127 (FIG. 10) are drawn as gradiently filled rectangles as a means to illustrate how and to what extent they have their alloys gradiently configured. For the OPCLD's spacer-layers dark colored areas graphically represent where the semiconductor alloy exhibits a lower bandgap, while a higher bandgap exists is graphically illustrated by the light colored areas.

Figure 13:
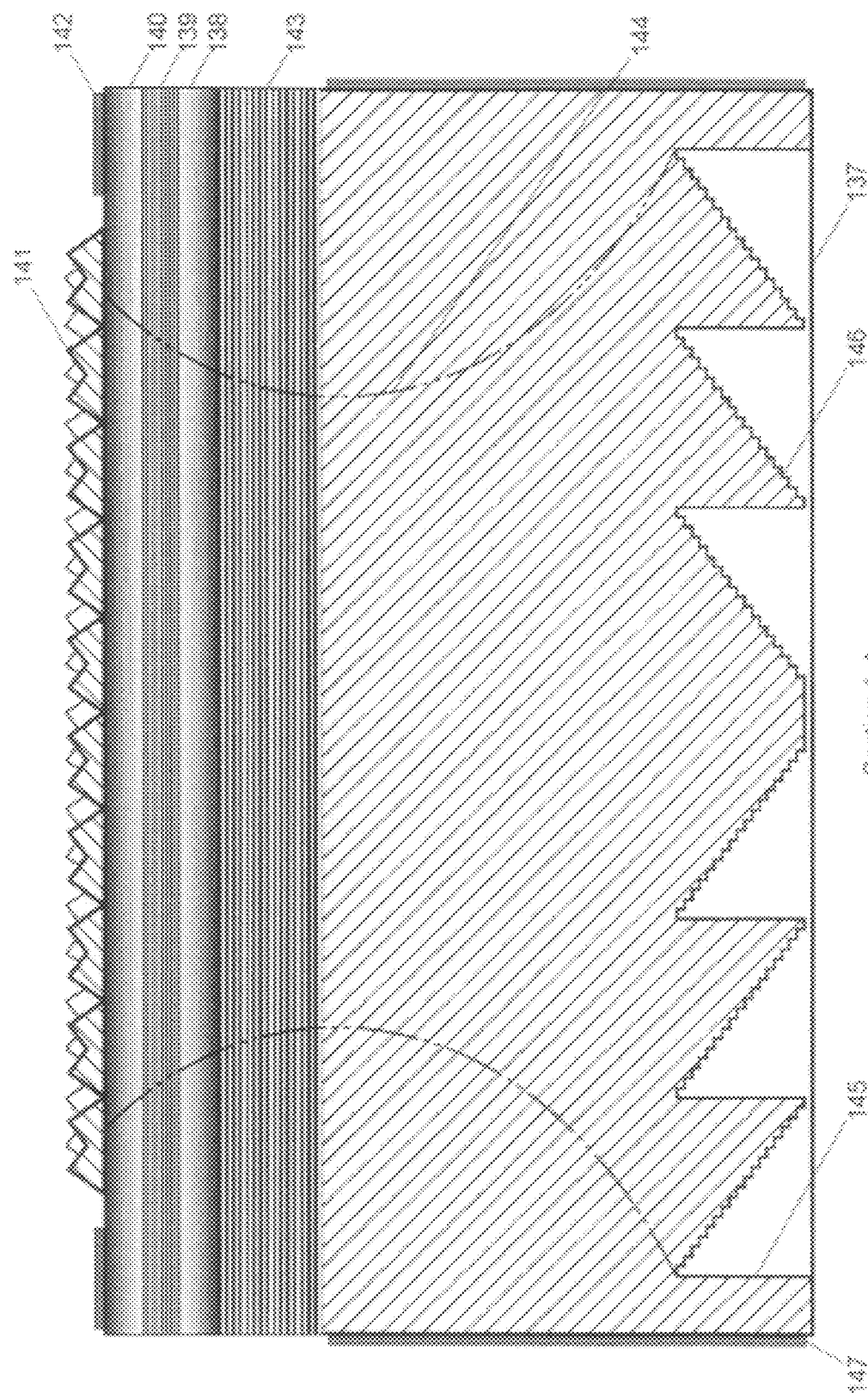
FIG. 13 is a Section A-A a side-view illustration of a fifth design configuration of my OPCLD invention, which is shown as comprising a doped substrate member, a doped Gaussian mode providing Fresnel based laser-emission output mirror, a doped epilayered active-region, a doped epilayered quarter-wave based DBR mirror-stack assembly, a doughnut shaped metal contact, a peripheral surrounding metal contact ring, and an undoped corner-cube array based PCM.

In addition, please note that for the fifth alternative OPCLD embodiment, particularly regarding its spacer-layers, doping is heaviest in the dark colored areas of the spacer-layer, while doping is lightest in the light colored areas of the spacer-layer. Further, as illustrated in FIGS. 13, 14, 14A, 15, and 15A, the fifth alternative version of the OPCLD is comprised as having a multiple epilayered structure that is deposited and shaped accordingly and in the following order, which includes:

A choice of either commercially obtaining a p-doped or an n-doped semiconductor substrate wafer 137 (FIG. 13).

Next, using MBE or MOCVD, is the deposition of a few un-doped surface-smoothing buffer-layers (not illustrated) upon the up-turned second face surface of the substrate wafer 137. Further, after deposition, these buffer-layers will typically have a total thickness equaling about 100-Å.

Upon an up-turned second face surface of the previously formed buffer-layers is an epitaxially deposited second reflector 143 (FIG. 13), which is comprised as having a gradiently n-doped or p-doped DBR configured mirror-stack assembly that provides for a partial reflection/partial transmission of intracavity stimulated emission.

Next, is the epitaxial deposition of a first spacer-layer 138 (FIG. 13), which is made to occur upon the upturned surface of the previously deposited DBR 143 and will be comprised as having either a gradiently or non-gradiently doped structure, using either a P-type or N-type dopant material, e.g. for an N-type spacer-layer use an electron donating material like Silicon or Carbon, while for an P-type spacer-layer use an electron accepting material like Boron or Zinc.

Upon the up-turned second face of the previously deposited spacer-layer 138 (FIG. 13) is an epitaxially deposited gain-region 139 (FIG. 13), which is comprised as having either a single layered lattice-matched P-doped, N-doped, or un-doped bulk semiconductor layer based gain-region, a single or multilayered strained or unstrained quantum-dot based gain-region, a single or multilayered strained or unstrained quantum super-lattice based gain-region 139, a single or multilayered strained or unstrained quantum-cascade based gain-region 139, a single or multilayered "Organic-Light-Emitting-Diode" (OLED) based gain-region, being comprised, for example, from the deposition of a 30-nm layer of TAD (TAD is conventional for triphenyl/diamine), a 15-nm layer of NAPOXA (NAPOXA is conventional for 2-naphtyl-4,5-bis(4-methoxyphenyl)-1,3-oxazole), a 15-nm layer of Alq (Alq is conventional for 8-hydroxyquinolinato aluminum), for synthesis information, please see, U.S. patent application Ser. No. 08/673,864, filed Sep. 13, (1995), by A. Dodabalapur et al., or a single or multilayered strained or unstrained quantum-well based gain-region 139 (FIG. 13).

Upon an up-turned second face of the previously deposited gain-region 139 is an epitaxially deposited second lattice-matched semiconductor spacer-layer 140 (FIG. 13), which is comprised as having either a gradiently or a non-gradiently doped structure using either P-type or N-type dopant material.

Figure 14:
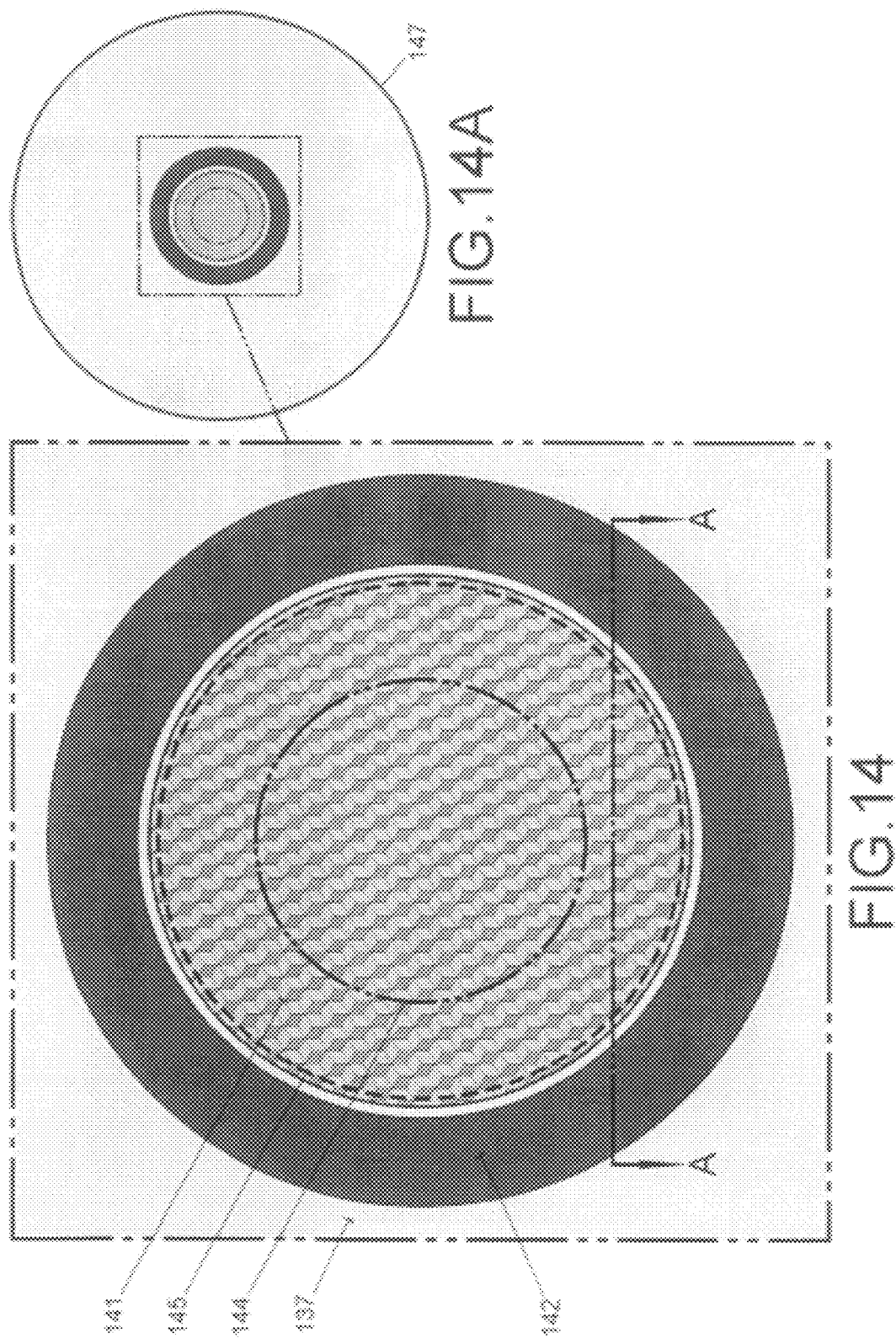
FIG. 14 is a top plan-view illustration of the fifth design configuration of my OPCLD invention, which is shown as comprising a doughnut shaped metal contact, and an undoped corner-cube array based PCM.
Figure 15:
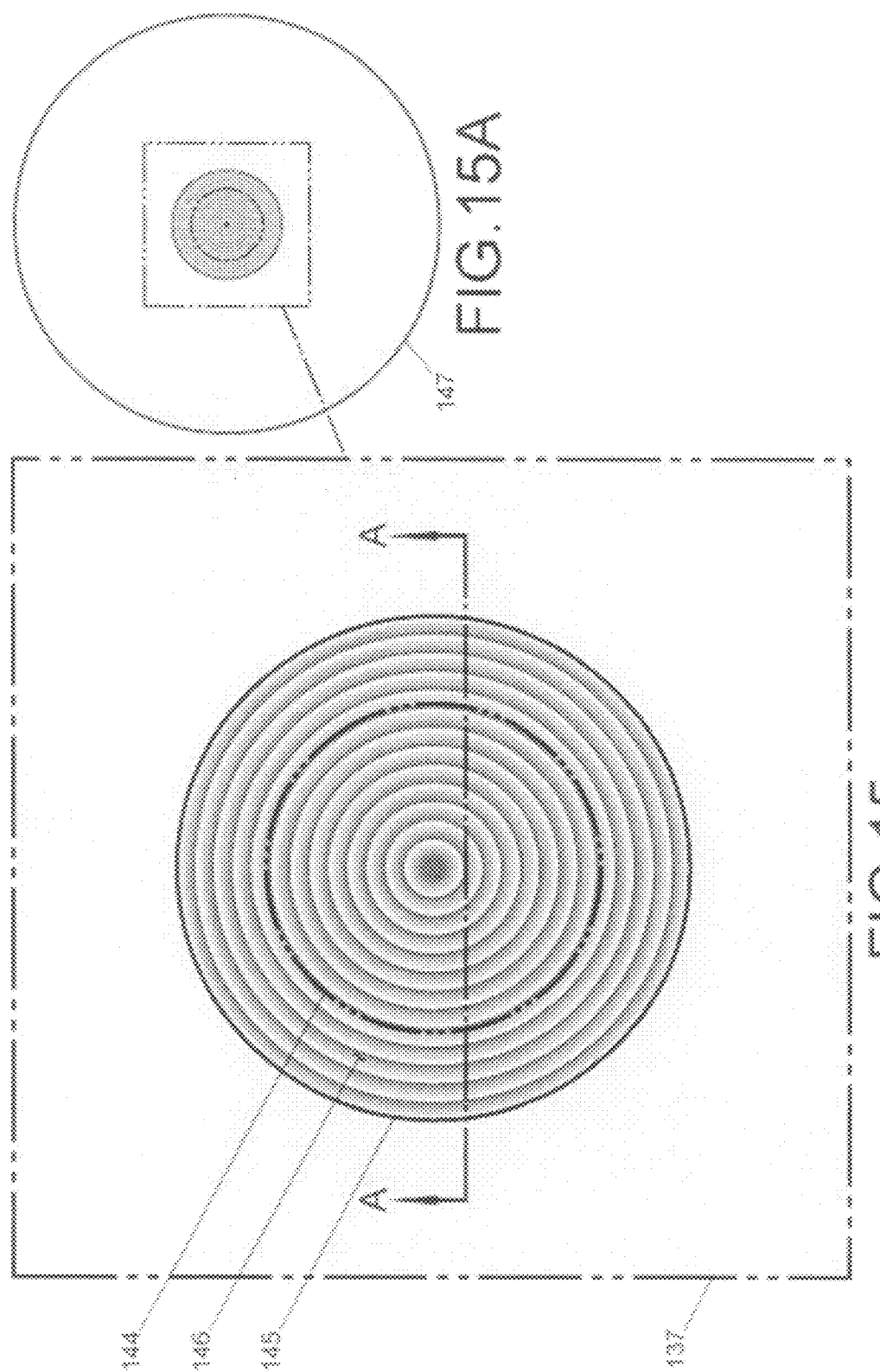
FIG. 15 is a bottom plan-view illustration of the fifth design configuration of my OPCLD invention, which is shown as comprising a doped substrate member, a peripheral surrounding metal contact ring, and a doped Gaussian mode-providing Fresnel based laser-emission-output mirror.

Upon an up-turned second face of the previously deposited spacer-layer 140 is an epitaxially deposited PCM layer 141 (FIGS. 13, 14, and 14A), which is lithographically (i.e., using grey-scale masking and lithography) formed into a very large array of corner-cube shaped retro-reflecting elements 141 (FIGS. 13, 14, and 14A).

Using a first face of the commercially provided substrate wafer 137, a first reflector 145, 146 (FIGS. 13, 15, and 15A) is formed (i.e., using grey-scale masking and lithography) into a laser-emission-output Fresnel shaped digital mirror 145, 146, which provides for a Gaussian shaped high-power laser-emission-output into a single fundamental transverse spatial cavity mode.

A first N-type or P-type Ohmic contact 142 (FIGS. 13, 14, and 14A) is formed when the appropriate metal alloy is deposited upon the outermost up-turned n++ or p++ surface of the OPCLD's second spacer-layer 140, and later formed into doughnut shaped contact ring 142. While a second N-type or P-type Ohmic contact 147 (FIGS. 13, 14A, and 15A) is formed when the appropriate metal alloy is deposited upon the n++ or p++ outer peripheral surface of the OPCLD's substrate layer 137, which is formed into a cylinder shaped contact ring 147.

Wherein, the first reflector's Gaussian mode providing Fresnel shaped digital mirror 145, 146 (FIGS. 13, 15, and 15A) and the third reflector's optical phase-conjugation providing PCM 141 (FIGS. 13, 16, and 16A) altogether define a hemispherically confined optical field 145 with a waistband location 144 that is symmetrically centered within in the OPCLD's laser cavity, and further provides for a high-power laser-emission-output (i.e., $\geqq$100-mW of cw output for a gain-region having a diameter$\geqq$60-μm) into a low-order fundamental transverse spatial cavity mode (i.e., preferably the transverse cavity mode $TEM_{00}$).

Please note that spacer-layers 138 and 140 (FIG. 13) are drawn as gradiently filled rectangles as a means to illustrate how and to what extent they have their alloys gradiently configured. For the OPCLD's spacer-layers dark colored areas graphically represent where the semiconductor alloy exhibits a lower bandgap, while a higher bandgap exists is graphically illustrated by the light colored areas.

Figure 16:
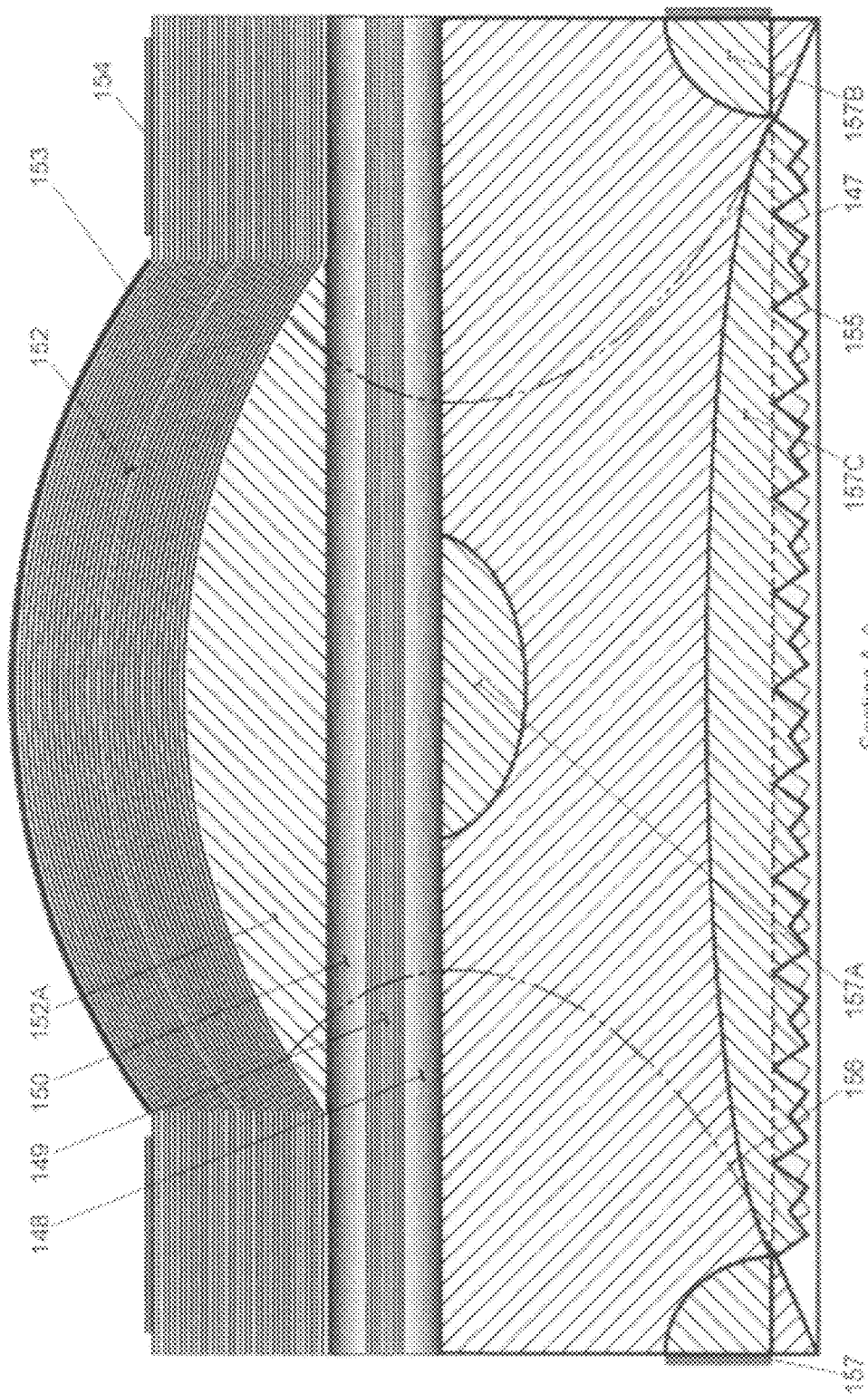
FIG. 16 is a Section A-A side-view illustration of a sixth design configuration of my OPCLD invention, which is shown as comprising a doped substrate member, an undoped corner-cube array based PCM, a doped epilayered gain-region, an undoped Gaussian mode providing convex shaped DBR based laser-emission-output mirror, a highly++ doped current guiding member, a highly++ doped current guiding doughnut shaped member, a collimating lens, a trench deposited doughnut shaped metal contact, a peripheral surrounding metal contact ring.

In addition, please note that for the sixth alternative OPCLD embodiment, particularly regarding its spacer-layers, doping is heaviest in the dark colored areas of the spacer-layer, while doping is lightest in the light colored areas of the spacer-layer. Further, as illustrated in FIGS. 16, 17, 17A, 18, and 18A, the sixth alternative version of the OPCLD is comprised as having a multiple epilayered structure that is deposited and shaped accordingly and in the following order, which includes:

A commercially obtaining p-doped or n-doped semiconductor substrate wafer 147 (FIG. 16).

The substrate wafer 147 needs to be first etched using grey-scale masking and lithography to form an $N^{th}$ number of hemispheric shaped recessions 157A (FIG. 16) in the up-turned surface of the substrate wafer 147. While a second group of hemispheric shaped recessions 157C (FIG. 16) are formed, using grey-scale masking and lithography, out of the down-turned surface of the substrate wafer 147. With a group of doughnut shaped recessions 157B (FIG. 16) being formed, using grey-scale masking and lithography, out of the down-turned surface of the substrate wafer 147.

Next, recession 157A is filled using MOCVD with the same semiconductor material used to comprise the substrate wafer 147 except the construction material used to fill the recession will be highly n++ or p++ doped, choice of dopant polarity being dependant upon desired type and direction of device's connectivity.

Next, recession 157B is filled using MOCVD with the same semiconductor material used to comprise the substrate wafer 147 except the construction material used to fill the recession will be highly n++ or p++ doped, choice of dopant polarity being dependant upon desired type and direction of device's connectivity.

Next, recession 157C is filled using MOCVD with a lattice-matched semiconductor material, but a semiconductor that has lower-refractive index than the material used to construct the substrate wafer 147, forming therein a soft-apertured collimating lens.

After which, any bulges, bumps, or other irregularities exhibited by the just filled internal lens 157A, 157B, 157C can be smoothed down flat at the substrate's two material boundary interface surfaces, using chemical etching and/or polishing agents or mechanical polishing.

Next, is an epitaxial deposition of a few highly doped surface-smoothing buffer-layers (not illustrated) upon the up-turned second face surface of the previously processed substrate wafer 147. After deposition, the buffer-layers will altogether have a total thickness equaling 100-Å.

Next, is an epitaxial deposition of a first spacer-layer 148 (FIG. 16), which is made to occur upon the upturned outmost surface of the previously deposited buffer-layers and will be comprised as having either a gradiently or non-gradiently doped structure using either a P-type or N-type dopant material; e.g., for an N-type spacer-layer use an electron donating material like Silicon or Carbon, while for an P-type spacer-layer use an electron accepting material like Boron or Zinc.

Upon the up-turned second face surface of the previously formed spacer-layer 148 is an epitaxially deposited a gain-region 149 (FIG. 10), which is comprised as having either a single layered lattice-matched P-doped, N-doped, or un-doped bulk semiconductor layer based gain-region, a single or multilayered strained or unstrained quantum-dot based gain-region, a single or multilayered strained or unstrained quantum super-lattice based gain-region 149, a single or multilayered strained or unstrained quantum-cascade based gain-region 149, a single or multilayered "Organic-Light-Emitting-Diode" (OLED) based gain-region 149, altogether being comprised, for example, from the sputtered deposition of several light-emitting polymers such as a 30-nm layer of TAD (TAD is conventional for triphenyl/diamine), a 15-nm layer of NAPOXA (NAPOXA is conventional for 2-naphtyl-4,5-bis(4-methoxyphenyl)-1,3-oxazole), a 15-nm layer of Alq (Alq is conventional for 8-hydroxyquinolinato aluminum), for synthesis information, please see, U.S. patent application Ser. No. 08/673,864, filed Sep. 3, (1995), by A. Dodabalapur et al., or a single or multilayered strained or unstrained quantum-well based gain-region 149.

Upon an up-turned second face surface of the previously formed gain-region 149 (FIG. 16) is an epitaxially deposited second lattice-matched semiconductor spacer-layer 150 (FIG. 16), which is comprised as having either a gradiently or a non-gradiently doped structure using either P-type or N-type dopant material.

Upon an up-turned second face of the previously deposited second spacer-layer 150 (FIG. 16) is an epitaxially deposited expression layer, which is comprised, using grey-scale lithography and masking, as having an hemispherical shaped configuration that will provide for a hemispherical growth area for epitaxially forming the OPCLD's hemispherical shaped DBR 152, which is to be deposited next.

Upon previously etched hemispherical shaped growth area and the up-turned second face of the previously deposited second spacer-layer 150 (FIG. 16) is an epitaxially deposited second reflector 152 (FIG. 16), which is comprised as having an undoped spherical shaped DBR configured mirror-stack assembly 152 that provides for a partial reflection/partial transmission of intra-cavity stimulated emission.

Using grey-scale masking and lithography, the outmost surface of a previously deposited undoped lower-refractive index material layer is etched into an array of polyhedral shaped retro-reflecting prisms 198 (FIGS. 26, 26A, and 26B) that are altogether used to comprise the device's PCM and first reflector 155, which will provide for the OPCLD's optical phase-conjugating PCM 155.

Figure 17:
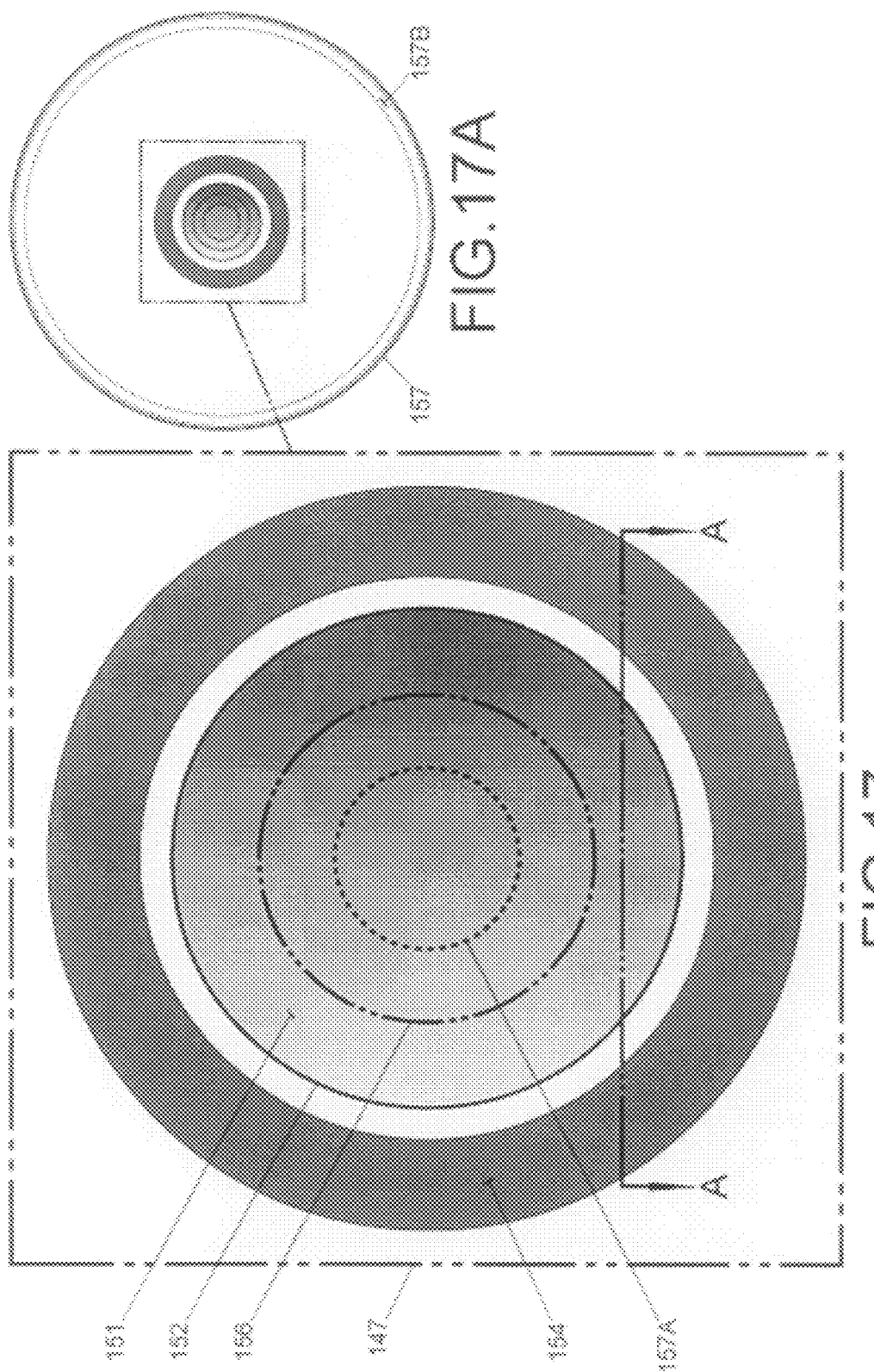
FIG. 17 is a top plan-view illustration of the sixth design configuration of my OPCLD invention, which is shown as comprising a doughnut shaped metal contact, and an undoped Gaussian mode providing convex shaped DBR based laser-emission-output mirror.
Figure 18:
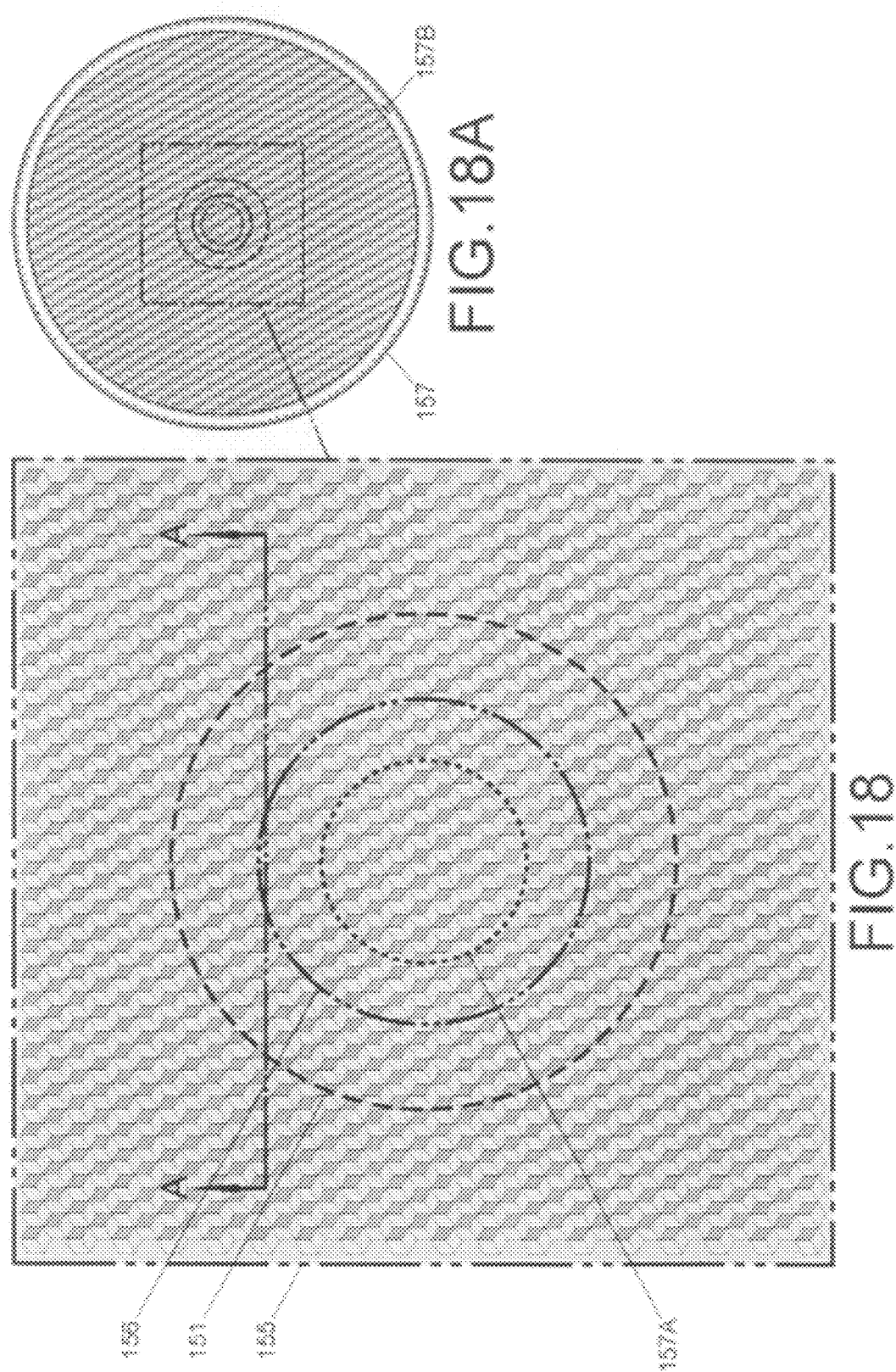
FIG. 18 is a bottom plan-view illustration of the sixth design configuration of my OPCLD invention, which is shown as comprising a corner-cube array based PCM.

A first N-type or P-type Ohmic contact 154 (FIGS. 16, 17, and 17A) is formed when the appropriate metal alloy is deposited into a circular shaped trench that was previously etched all the way through the previously deposited spherical shaped DBR configured mirror-stack assembly 152, where it will be lithographically formed into a doughnut shaped contact layer 154 that provides for electrical connectivity to the top outer-most n++ or p++ doped surface of the OPCLD's second spacer-layer 150. While a second N-type or P-type Ohmic contact 157 (FIGS. 16, 17A, and 18A) is formed when the appropriate metal alloy is deposited upon and around the entire periphery of the bottom outer-most n++ or p++ doped surface edge of the OPCLD's substrate wafer 147, where it will be lithographically formed into short cylinder shaped contact layer 157 (FIGS. 16, 17A, and 18A).

Wherein, the second reflector's spherical shaped DBR Gaussian mode providing mirror-stack assembly 152, 153 (FIGS. 16, 17, and 17A) and the third reflector's optical phase-conjugation providing PCM 155 (FIGS. 16, 18, and 18A) altogether define a hemispherically confined optical field 156 with a waist-band location 156 that is symmetrically centered within in the OPCLD's laser cavity, and further provides for a high-power laser-emission-output (i.e., $\geq$100-mW of cw output for a gain-region having a diameter$\geq$60-$\mu$m) into a low-order fundamental transverse spatial cavity mode (i.e., preferably the transverse cavity mode $TEM_{00}$).

Please note that spacer-layers 148 and 150 (FIG. 16) are drawn as gradiently filled rectangles as a means to illustrate how and to what extent they have their alloys gradiently configured. For the OPCLD's spacer-layers dark colored areas graphically represent where the semiconductor alloy exhibits a lower bandgap, while a higher bandgap exists is graphically illustrated by the light colored areas.

In addition, please note that for the seventh alternative OPCLD embodiment, particularly regarding its spacer-layers, doping is heaviest in the dark colored areas of the spacer-layer, while doping is lightest in the light colored areas of the spacer-layer. Further, as illustrated in FIGS. 22, 23, 23A, 24, and 24A, the seventh alternative version of the OPCLD is comprised as having a multiple epilayered structure that is deposited and shaped accordingly and in the following order, which includes:

A commercially obtaining p-doped or n-doped semiconductor substrate wafer 171 (FIG. 22). The substrate wafer 171 needs to be first etched using grey-scale masking and lithography to form an $N^{th}$ number of hemispheric shaped recessions 182 (FIG. 22) in the up-turned surface of the substrate wafer 171. While a second group of hemispheric shaped recessions 183B (FIG. 22) are formed, using grey-scale masking and lithography, out of the down-turned surface of the substrate wafer 171. With a group of doughnut shaped recessions 183A (FIG. 22) being formed, using grey-scale masking and lithography, out of the down-turned surface of the substrate wafer 171.

Next, recession 182 is filled using MOCVD with the same semiconductor material used to comprise the substrate wafer 171 except the construction material used to fill the recession will be highly n++ or p++ doped, choice of dopant polarity being dependant upon desired type and direction of device's connectivity.

Next, recession 183A is filled using MOCVD with the same semiconductor material used to comprise the substrate wafer 171 except the construction material used to fill the recession will be highly n++ or p++ doped, choice of dopant polarity being dependant upon desired type and direction of device's connectivity.

Next, recession 183B is filled using MOCVD with a lattice-matched semiconductor material, but a semiconductor that has lower-refractive index than the material used to construct the substrate wafer 171, forming therein a soft-apertured lens.

After which, any bulges, bumps, or other irregularities exhibited by the just filled internal lens 183, 183A, 183B can be smoothed down flat at the substrate's two material boundary interface surfaces, using chemical etching and/or polishing agents or mechanical polishing.

Next, is an epitaxial deposition of a few highly doped surface-smoothing buffer-layers (not illustrated) upon the up-turned second face surface of the previously processed substrate wafer 171. After deposition, the buffer-layers will altogether have a total thickness equaling 100-Å.

Next, is a epitaxial deposition of a first spacer-layer 172 (FIG. 22), which is made to occur upon the upturned outmost surface of the previously deposited buffer-layers and will be comprised as having either a gradiently or non-gradiently doped structure using either a P-type or N-type dopant material; e.g., for an N-type spacer-layer use an electron donating material like Silicon or Carbon, while for an P-type spacer-layer use an electron accepting material like Boron or Zinc.

Upon the up-turned second face surface of the previously formed spacer-layer 172 is an epitaxially deposited a gain-region 173 (FIG. 22), which is comprised as having either a single layered lattice-matched P-doped, N-doped, or un-doped bulk semiconductor layer based gain-region, a single or multilayered strained or unstrained quantum-dot based gain-region, a single or multilayered strained or unstrained quantum super-lattice based gain-region 173, a single or multilayered strained or unstrained quantum-cascade based gain-region 173, a single or multilayered "Organic-Light-Emitting-Diode" (OLED) based gain-region 173, altogether being comprised, for example, from the sputtered deposition of several light-emitting polymers such as a 30-nm layer of TAD (TAD is conventional for triphenyl/diamine), a 15-nm layer of NAPOXA (NAPOXA is conventional for 2-naphtyl-4,5-bis(4-methoxyphenyl)-1,3-oxazole), a 15-nm layer of Alq (Alq is conventional for 8-hydroxyquinolinato aluminum), for synthesis information, please see, U.S. patent application Ser. No. 08/673,864, filed Sep. 3, (1995), by A. Dodabalapur et al., or a single or multilayered strained or unstrained quantum-well based gain-region 173.

Upon an up-turned second face surface of the previously formed gain-region 173 (FIG. 22) is an epitaxially deposited second lattice-matched semiconductor spacer-layer 174 (FIG. 22), which is comprised as having either a gradiently or a non-gradiently doped structure using either P-type or N-type dopant material.

Upon an up-turned second face of the previously deposited second spacer-layer 174 (FIG. 22) is an epitaxially deposited second reflector 175 (FIG. 22), which is comprised as having an undoped DBR configured mirror-stack assembly 175 that provides for a partial reflection/partial transmission of intracavity stimulated emission.

Upon an up-turned second face of the previously deposited second reflector 175 (FIG. 22) is an epitaxially deposited undoped mirror spacer-layer 176, which is etched, using grey-scale lithography, to have the recession shape that is next used for the subsequent deposition of a second DBR mirror-stack assembly 177, but one that provides for an anti-guided reflection of the undesired higher-order transverse spatially moded intracavity stimulated-emission and a partial reflection/partial transmission of the much desired lower-order transverse spatially moded intra-cavity stimulated emission.

Upon a second face surface of the previously deposited anti-guiding DBR configured mirror-stack assembly 177 is an epitaxially deposited laser-emission-output layer 178 (FIGS. 22, 23, and 23A), which is lithographically (i.e., using grey-scale masking and lithography) formed into a Gaussian mode providing hemispherical shaped partial-reflection/partial transmission metalized mirror 180, 179 and the device's fourth reflecting structure.

Using grey-scale masking and lithography, the outmost surface of a previously deposited undoped lower-refractive index material layer is etched into an array of polyhedral shaped retro-reflecting prisms 198 (FIGS. 26, 26A, and 26B) that are altogether used to comprise the device's PCM and first reflector 184, which will provide for the OPCLD's optical phase-conjugating PCM 184.

A first N-type or P-type Ohmic contact 181 (FIGS. 22, 23, and 23A) is formed when the appropriate metal alloy is deposited into a circular shaped trench that was previously etched all the way through both reflector number four's deposited construction layer 178 and the two previously deposited DBR configured mirror-stack assemblies 175, 177 where it will be lithographically formed into a doughnut shaped contact layer 181 that provides for electrical connectivity to the top outer-most n++ or p++ doped surface of the OPCLD's second spacer-layer 174. While a second N-type or P-type Ohmic contact 183 (FIGS. 22, 23A, and 24A) is formed when the appropriate metal alloy is deposited upon and around the entire periphery of the bottom outer-most n++ or p++ doped surface edge of the OPCLD's substrate wafer 171, where it will be lithographically formed into short cylinder shaped contact layer 183 (FIGS. 22, 23A, and 24A).

Wherein, the fourth reflector's Gaussian mode providing Fresnel shaped digital mirror 179, 180 (FIGS. 22, 23, and 23A) and the first reflector's optical phase-conjugation providing PCM 184 (FIGS. 22, 24, and 24A) altogether define a hemispherically confined optical field 185 with a waistband location that is symmetrically centered within in the OPCLD's laser cavity, and further provides for a high-power laser-emission-output (i.e., $\geqq 100$-mW of cw output for a gain-region having a diameter$\geqq 60$-µm) into a low-order fundamental transverse spatial cavity mode (i.e., preferably the transverse cavity mode $TEM_{00}$).

Please note that spacer-layers 172 and 174 (FIG. 22) are drawn as gradiently filled rectangles as a means to illustrate how and to what extent they have their alloys gradiently configured. For the OPCLD's spacer-layers dark colored areas graphically represent where the semiconductor alloy exhibits a lower bandgap, while a higher bandgap exists is graphically illustrated by the light colored areas.

Figure 25B:
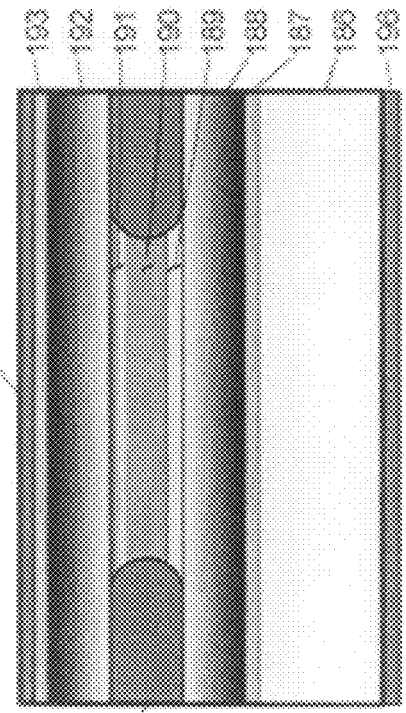
FIG. 25B is a right side-view illustration of the ninth design configuration of my OPCLD invention, which is shown as comprising a doped epilayered gain-region, a distribution feedback providing grating member, two metal contact layers, two proton implant areas, and a partial-reflection edge-emitting cleaved facet laser-emission-output mirror.
Figure 25:
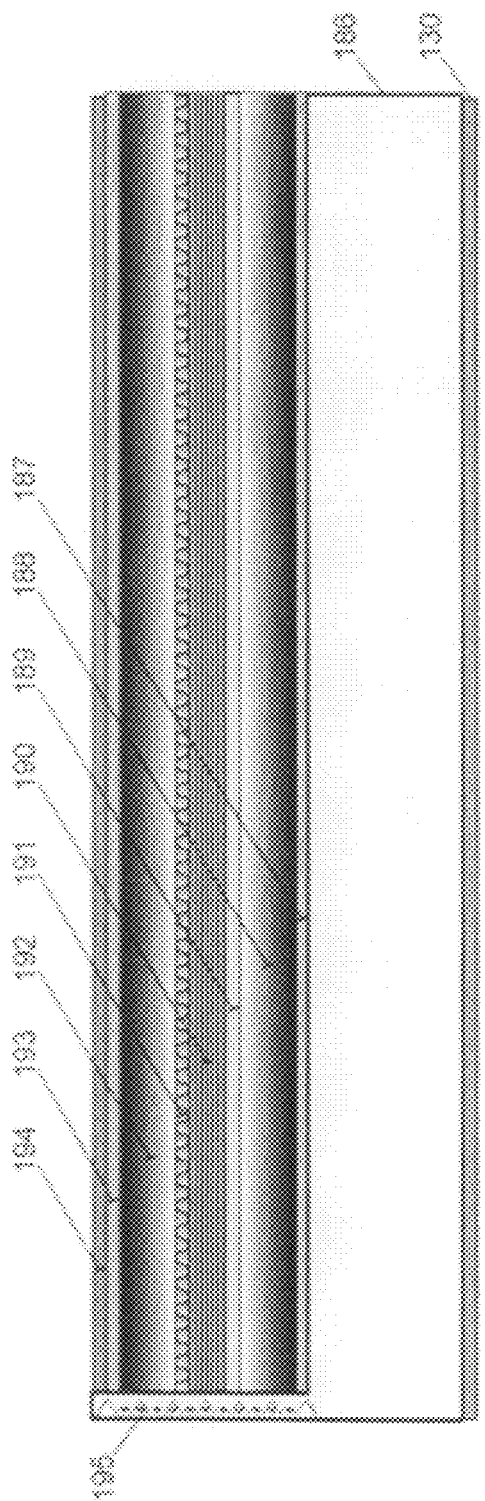
FIG. 25 is a side-view illustration of a ninth design configuration of my OPCLD invention, which is shown as comprising a gain-guided DFB EEL diode configuration, a doped substrate member, a doped epilayered gain-region, a distribution feedback providing grating member, two metal contact layers, a corner-cube array based PCM, two proton implant areas, and a partial-reflection edge-emitting cleave facet laser-emission-output mirror.
Figure 25A:
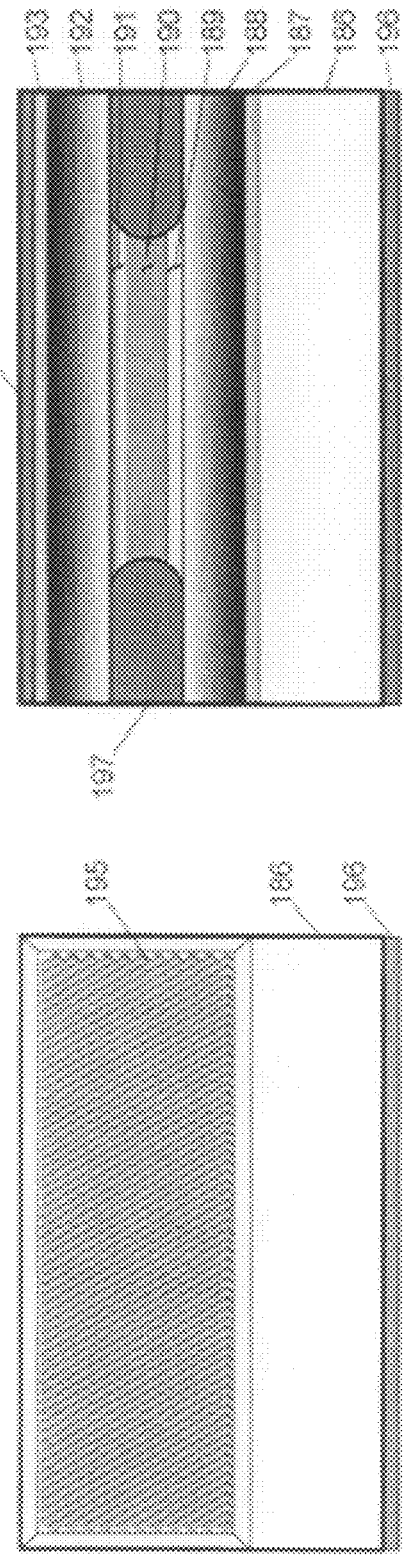
FIG. 25A is a left side-view illustration of the ninth design configuration of my OPCLD invention, which is shown as comprising a gain-guided DFB EEL diode configuration, a doped substrate member, two metal contact layers, a corner-cube array based PCM.
Figure 29:
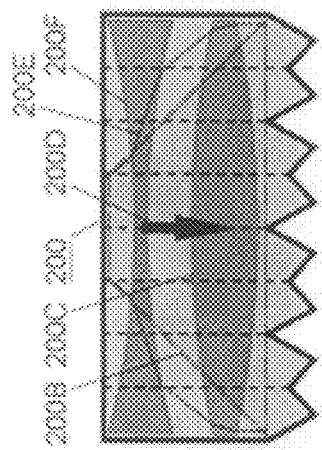
FIG. 29 is a section side-view illustration of the longitudinal geometry of eight hexagon shaped corner-cube retro-reflecting prisms, which are shown along with the relative locations of a concave thermal lens and a convex thermal lens, which are made to form within the OPCLD's cavity in order to expand, flatten, collimate, and distribute intracavity wavefronts planar-flat across the OPCLD's PCM.

In addition, please note that for the eighth alternative OPCLD embodiment, particularly regarding its spacer-layers, doping is heaviest in the dark colored areas of the spacer-layer, while doping is lightest in the light colored areas of the spacer-layer. Further, as illustrated in FIGS. 25, 25A, and 25B, the eighth alternative version of the OPCLD is an EEL version of the OPCLD and is comprised as having a multiple epilayered structure that is deposited and shaped accordingly and in the following order, which includes:

A choice of either commercially obtaining a p-doped or an n-doped semiconductor substrate wafer 186 (FIGS. 25, 25A, and 25B).

Next, using MBE or MOCVD, is the deposition of a few un-doped surface-smoothing buffer-layers (not illustrated) upon the up-turned second face surface of the substrate wafer 186. Further, after deposition, these buffer-layers will typically have a total thickness equaling about 100-Å.

Upon an up-turned second face surface of the previously formed buffer-layers is an epitaxially deposited contact-layer 187, which is comprised as having a n-doped or p-doped configuration and provides for a confinement of both injected carriers and internally produced photons.

Next, is the epitaxial deposition of a lattice-matched first spacer-layer 188 (FIGS. 25, 25A, and 25B), which is made to occur upon the upturned surface of the previously deposited secondary cladding-layer 187 and will be comprised as having either a gradiently or non-gradiently doped structure, using either a P-type or N-type dopant material, e.g. for an N-type spacer-layer use an electron donating material like Silicon or Carbon, while for an P-type spacer-layer use an electron accepting material like Boron or Zinc.

Upon an up-turned second face surface of the lattice-matched first spacer-layer 188 (FIGS. 25, 25A, and 25B) is an epitaxially deposited first secondary-confinement-layer 189, which is comprised as having a n-doped or p-doped configuration, while providing for a confinement of both injected carriers and internally produced photons.

Upon the up-turned second face of the previously deposited first secondary-confinement-layer 189 (FIGS. 25, 25A, and 25B) is an epitaxially deposited gain-region 190 (FIGS. 25 and 25B), which is comprised as having either a single layered lattice-matched P-doped, N-doped, or undoped bulk semiconductor layer based gain-region, a single or multilayered strained or unstrained quantum-dot based gain-region, a single or multilayered strained or unstrained quantum superlattice based gain-region 190, a single or multilayered strained or unstrained quantum-cascade based gain-region 190, a single or multilayered "Organic-Light-Emitting-Diode" (OLED) based gain-region, being comprised, for example, from the deposition of a 30-nm layer of TAD (TAD is conventional for triphenyl/diamine), a 15-nm layer of NAPOXA (NAPOXA is conventional for 2-naphtyl-4,5-bis (4-methoxyphenyl)-1,3-oxazole), a 15-nm layer of Alq (Alq is conventional for 8-hydroxyquinolinato aluminum), for synthesis information, please see, U.S. patent application Ser. No. 08/673,864, filed Sep. 13, (1995), by A. Dodabalapur et al., or a single or multilayered strained or unstrained quantum-well based gain-region 190, and a proton implantation 197 for controlled electrical current distribution.

Upon an up-turned second face surface of the gain-region 190 (FIGS. 25, 25A, and 25B) is an epitaxially deposited periodic waveguide-layer 191, which is comprised as having a n-doped or p-doped configuration, while providing for a distributed feedback of internally produced photons.

Upon an up-turned second face of the previously deposited periodic waveguide-layer 191 is an epitaxially deposited second spacer-layer 192 (FIGS. 25, 25A, and 25B), which is comprised as having either a gradiently or a non-gradiently doped structure using either P-type or N-type dopant material.

Upon an up-turned second face of the previously deposited spacer-layer 192 is an epitaxially deposited contact-layer 193 (FIGS. 25, 25A, and 25B), which provides for electrical connectivity to the EEL version of the OPCLD invention.

A first N-type or P-type Ohmic contact 196 (FIGS. 25, 25A, and 25B) is formed when the appropriate metal alloy is deposited upon the outermost down turned n++ or p++ surface of the OPCLD's substrate-layer 186. While a second N-type or P-type Ohmic contact 194 (FIGS. 25, 25A, and 25B) is formed when the appropriate metal alloy is deposited upon the n++ or p++ doped outer most surface of the OPCLD's second contact-layer 193.

Using grey-scale masking and lithography, the outmost surface end of a previously deposited undoped lattice-matched material layer is etched into an array of polyhedral shaped retro-reflecting prisms 195 (FIGS. 25, 25A, and 25B) that are altogether used to comprise the device's PCM and first reflector 195, which will provide for the EEL OPCLD's optical phase-conjugating PCM 195.

While the EEL version of the OPCLD has its laser-emission-output mirror formed as a cleaved internal reflecting facet when the EEL version of the OPCLD undergoes its dicing.

Please note that spacer-layers 188 and 192 (FIGS. 25 and 25B) are drawn as gradiently filled rectangles as a means to illustrate how and to what extent they have their alloys gradiently configured. For the OPCLD's spacer-layers dark colored areas graphically represent where the semiconductor alloy exhibits a lower bandgap, while a higher bandgap exists is graphically illustrated by the light colored areas.

In addition, there are four alternative embodiments to the preferred hexagon apertured hexahedral shaped corner-cube array configured PCM included next. Further, as illustrated in FIGS. 30, 30A, 30B, 31A, 31B, 33, and 34, the first alternative embodiment comprises an array of hemispherical apertured domed shaped retro-reflecting elements 209 (FIGS. 30, 30A, and 30B). Further, as illustrated in FIGS. 31A and 31B, for a pseudo phase-conjugate retro-reflecting array based PCM 211, the base of the wavefront leads the crest of the wavefront in the reflected wavefront 216 by a same phase as the crest 219 regardless it leading the base in the incident wavefront 213, i.e., prior to reflection from the pseudo phase-conjugate mirror 211. Further, FIG. 31B further describes a wavefront incident 213 at a retro-reflective array 211 (direction of propagation indicated by the arrow 212 pointing towards the retro-reflective array 211), and the wavefront after reflection 216 from the retro-reflective array 211 (direction of propagation indicated by the arrow 217 point away from the retro-reflective array 211).

Moreover, as illustrated in FIG. 31B, segments 219 of the wavefront 216 are phase-conjugated due to a total shift in phase that is caused by the astigmatismic kind of total internal reflection occurring for each hemispherical apertured domed shaped retro-reflecting element 209 (FIGS. 30, 30A, and 30B) within the retro-reflecting array 211, while the segments 214, 219 of the reflected wavefront 216 themselves generally relationally conform to the shape of the wavefront if reflected from a conventional mirror, as illustrated by the envelope 216, which is shown as connecting the wavefront segments 219. Further, as such, the base of the wavefront leads the crest of the wavefront, but only in its degree of phase shift, which approximates a true conjugated wavefront whose base would lead the wavefront crest 215 of the original incident wavefront 213, i.e., prior to reflection from the retro-reflective array 211.

More specifically, for a pseudo phase-conjugate retro-reflecting corner-cube array, each adjacent hemispherical apertured domed shaped retro-reflecting element 209 (FIGS. 30, 30A, and 30B) is arranged along a substantially planar substrate. Wherein, FIGS. 31A and 31B, both illustrate an incident wavefront 213 (direction of propagation indicated by the arrow 212 pointing to the right toward the mirror 211) and a reflected wavefront 216 (direction of propagation indicated by the arrow 217 pointing to the left away from the mirror 211), respectively.

Furthermore, as illustrated in FIG. 31B, the relative phases 219 of points 214 (i.e., the relative optical boundary 218 of each finite domed shaped retro-reflecting element 209) along the incident 213 and reflected 216 wavefronts are temporally not being distributed equally upon their reflection from the PCM 211. Moreover, true optical phase conjugation can be described simply as $k_{out} = -k_{in}$, which is demonstrated when the crest of an incident wavefront 213 leads the base of an incident wavefront 213, while the base of a reflected wavefront 215 leads the crest of a reflected wavefront 215 upon reflection from a true phase-conjugate mirror. Contrariwise, wavefront reflection from a conventional mirror can be described as $k_{in} = k_x \hat{x} + k_y \hat{y} + k_z \hat{z}$ and $k_{out} = k_x \hat{x} + k_y \hat{y} + k_z \hat{z}$.

Figure 34:
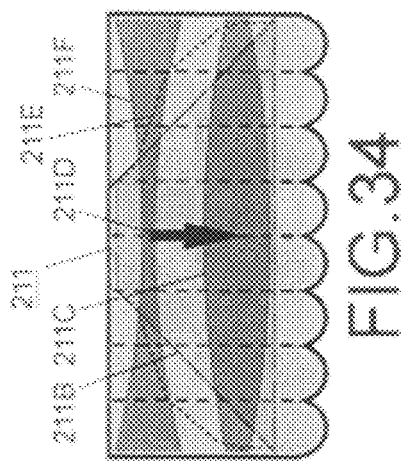
FIG. 34 is a section side-view illustration of the longitudinal geometry of eight dome shaped retro-reflecting mirrors, which is shown along with the relative locations of a concave shaped thermal lens and a convex shaped thermal lens, which are made to form within the OPCLD's cavity and used to expand, flatten, collimate, and distribute intracavity wavefronts planar-flat across the OPCLD's PCM.
Figure 33:
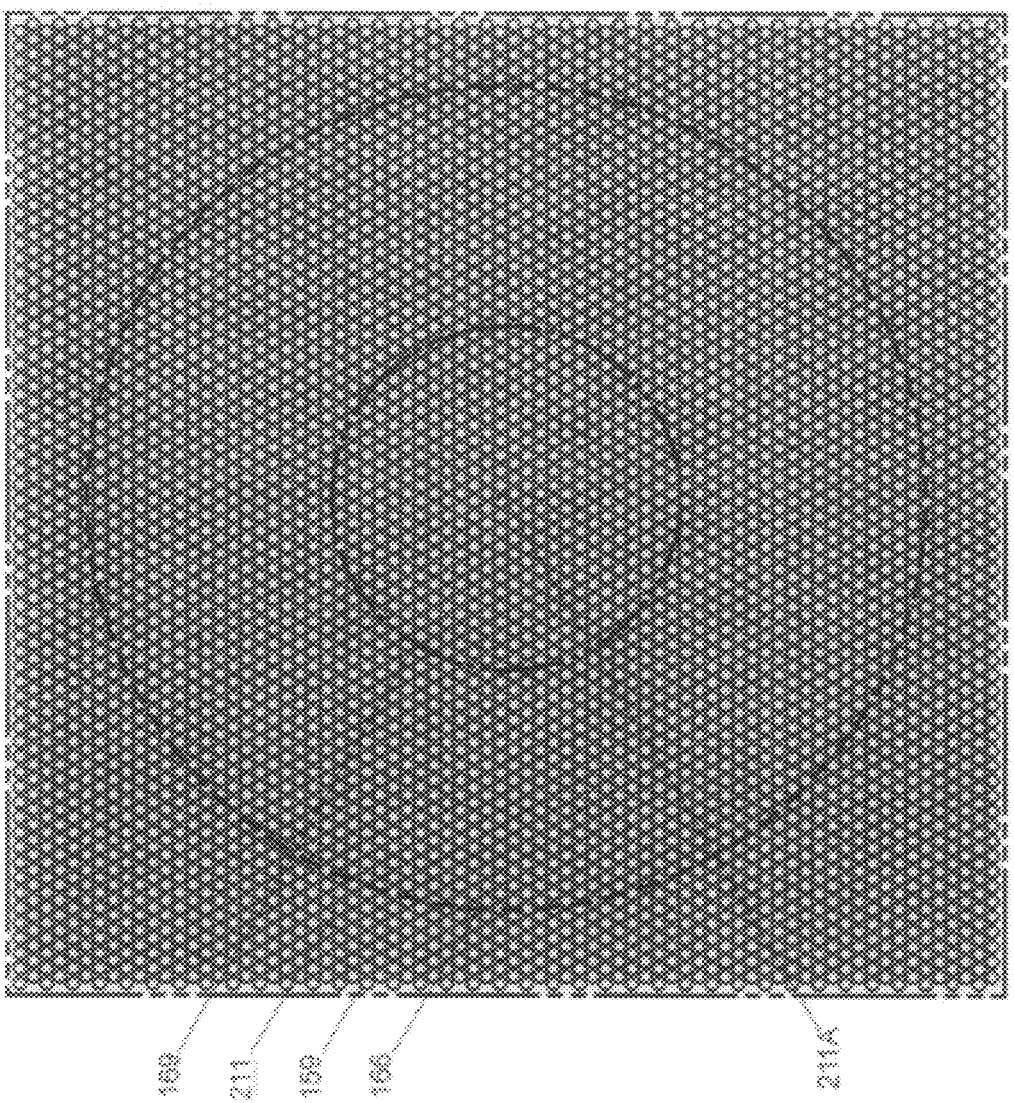
FIG. 33 is a plan-view illustration of a high-density array of dome shaped retro-reflecting mirrors altogether used to comprise an alternate version of the OPCLD's PCM, which is shown along with an on-axis laser-beam intensity waistband distribution profile and location.

Moreover, to obtain cooperative (i.e., coherent) imaging from all adjacent hemispherical apertured domed shaped retro-reflecting element 209 (FIGS. 30, 30A, and 30B) will require that only very small phase shifts occur between the wavefronts 219 being reflected by all adjacent hemispherical apertured domed shaped retro-reflecting elements 209 (FIGS. 30, 30A, and 30B). For a linear array of N structures illuminated by a spherical wavefront with radius R, the relation $$\Delta = \frac{2\pi(Nh)^2}{2R\lambda} = 2\pi \tag{70}$$

should be satisfied for cooperative diffraction image formation near the diffraction limit. One way to satisfy this relation is to transform the wavefront 213 (FIG. 31A) into a plane-wave at the entrance to the array with a collimating lens 211C. (FIG. 34). However, any quadratic phase variation across the wavefront originating from a single object point accumulated during free-space propagation may not satisfy the condition of Equation (70) and hence, may have a wavefront disrupting effect following retroreflection 216. The performance of a pseudo phase-conjugating system may be improved by correcting for any deterministic (quadratic) phase, which can be predetermined. Further, this is done by inserting a collimating lens 211C. (FIG. 34), which is chosen to collimate the wavefront onto the array 211, which is explained in detail in a latter section below.

Moreover, suffice it to say, the purpose of a concave lens 211F (FIG. 34), e.g. a wavefront spreading thermal lens, a wavefront spreading Fresnel lens, or a smooth positive aperturing concave lens, is to spread incoming 211D wavefronts 211B, both transversely and laterally, until they are made sufficiently enlarged as to be made incident upon the entire normal surface area of the OPCLD's PCM 211. While the purpose of a convex lens 211C (FIG. 34), e.g. wavefront collimating thermal lens, a wavefront collimating Fresnel lens, or a wavefront collimating smooth positive aperturing convex lens, is to collimate incoming 211D wavefronts 211B, both transversely, and laterally until they are made sufficiently planar-flat across the normal dimension of the OPCLD's PCM 211. Wherein, both lens 211C, 211F are used in combination to affect a zero length path difference Δ=0 from the object image to all adjacent hemispherical apertured domed shaped retro-reflecting elements 209 (FIGS. 30, 30A, and 30B) present within the PCM, thus eliminating the phase errors at the image.

Further, as illustrated in FIGS. 35, 35A, 35B, 36, 36A, 36B, 37, and 38, the second alternative embodiment comprises an array of prism apertured tetrahedral shaped retro-reflecting elements 220 (FIGS. 35, 35A, and 35B). Further, as illustrated in FIGS. 36A and 36B, for a pseudo phase-conjugate retro-reflecting array based PCM 222, the base of the wavefront leads the crest of the wavefront in the reflected wavefront 230, but only by a same phase 226 as the crest regardless it leading the base in the incident wavefront 224, i.e., prior to reflection from the pseudo phase-conjugate mirror 222. Further, FIG. 36B further describes a wavefront incident 224 at a retro-reflective array 222 (direction of propagation indicated by the arrow 223 pointing towards the retro-reflective array 211), and the wavefront after reflection 227 from the retro-reflective array 222 (direction of propagation indicated by the arrow 228 point away from the retro-reflective array 222).

Moreover, as illustrated in FIG. 36A, segments 226 of the wavefront 227 are phase-conjugated due to a total shift in phase that is caused by the kind of total internal reflection occurring for each prism apertured tetrahedral shaped retro-reflecting element 220 (FIGS. 35, 35A, and 35B) present within the retro-reflecting array 222, while the segments 225 of the reflected wavefront 227 themselves generally relationally conform to the shape of the wavefront if reflected from a conventional mirror, as illustrated by the envelope 227, which is shown as connecting the wavefront segments 226. Further, as such, the base of the wavefront leads the crest of the wavefront, but only in its degree of phase shift, which approximates a true conjugated wavefront whose base would lead the wavefront crest 230 of the original incident wavefront 224, i.e., prior to reflection from the retro-reflective array 222.

More specifically, for a pseudo phase-conjugate retro-reflecting prism apertured tetrahedral array, each prism apertured tetrahedral retro-reflecting element 220 (FIGS. 35, 35A, and 35B) is arranged along a substantially planar substrate. Wherein, FIGS. 36A and 36B, both illustrate an incident wavefront 224 (direction of propagation indicated by the arrow 223 pointing to the right toward the mirror 222) and a reflected wavefront 227 (direction of propagation indicated by the arrow 228 pointing to the left away from the mirror 222), respectively.

Furthermore, as illustrated in FIG. 36B, the relative phases 226 of points 225 (i.e., the relative optical boundary 229 of each finite prism apertured tetrahedral shaped retro-reflecting element 220, 221 along the incident 224 and reflected 227 wavefronts are temporally not being distributed equally upon their reflection from the PCM 222. Moreover, true optical phase conjugation can be described simply as $k_{out} = -k_{in}$, which is demonstrated when the crest of an incident wavefront 224 leads the base of an incident wavefront 224, while the base of a reflected wavefront 230 leads the crest of a reflected wavefront 230 upon reflection from a true phase-conjugate mirror. Contrariwise, wavefront reflection from a conventional mirror can be described as $k_{in} = k_z\hat{x} + k_y\hat{y} + k_z\hat{z}$ and $k_{out} = k_z\hat{x} + k_y\hat{y} - k_z\hat{z}$.

Figure 38:
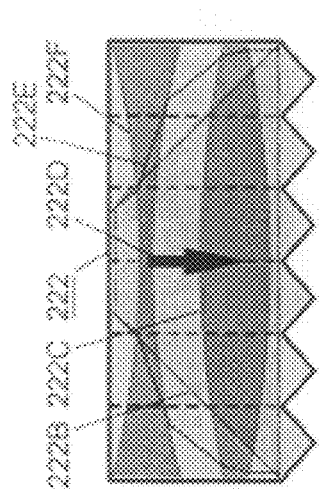
FIG. 38 is a section side-view illustration of the longitudinal geometry of an eight dome shaped retro-reflecting array, which is shown along with the relative locations of a concave shaped thermal lens and a convex shaped thermal lens, which are made to form within the OPCLD's cavity and used to expand, flatten, collimate, and distribute intracavity wavefronts planar-flat across the OPCLD's PCM.
Figure 37:
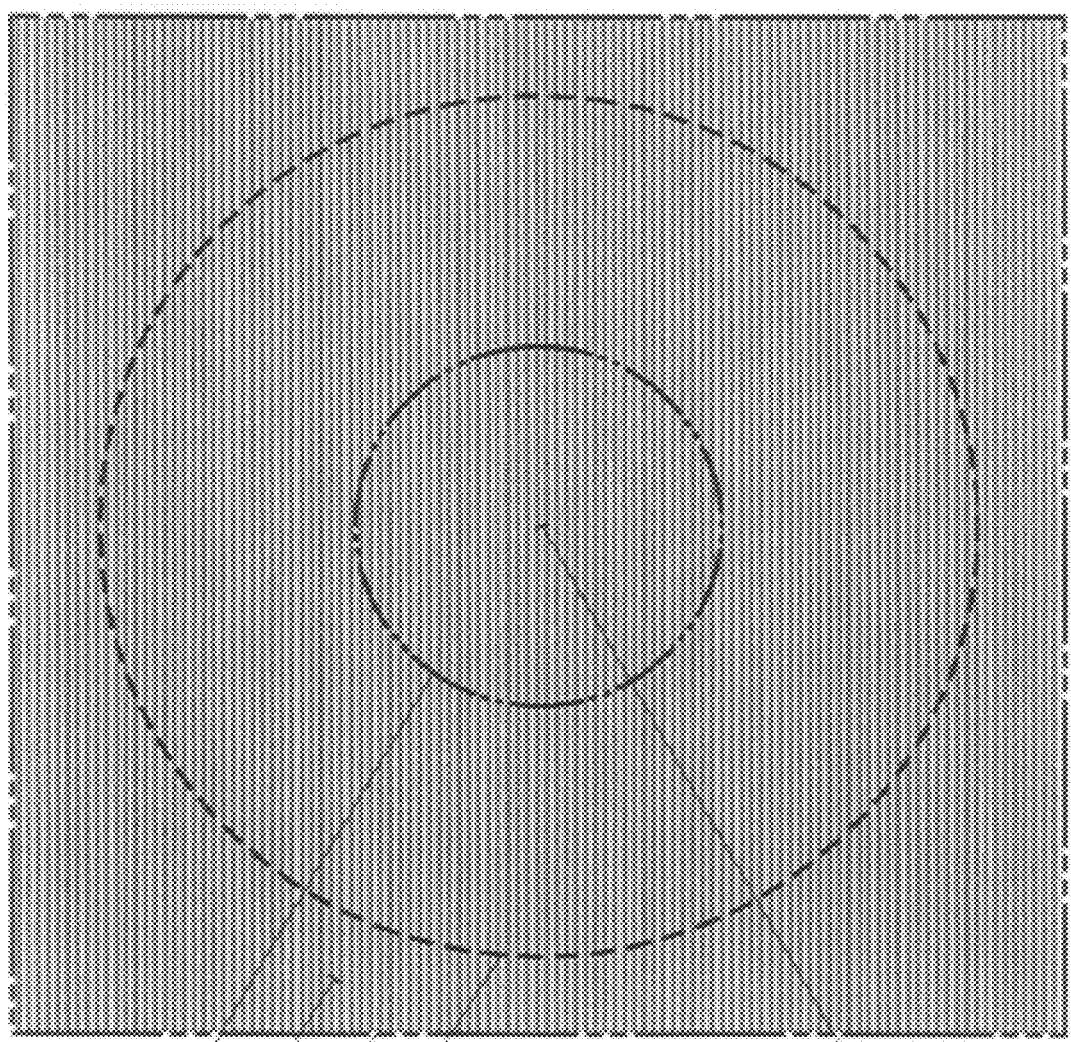
FIG. 37 is a plan-view illustration of a high-density array of roof shaped retro-reflecting prisms used to comprise an alternate version of the OPCLD's PCM, which is shown along with an on-axis laser-beam intensity waistband distribution profile and location.

Moreover, to obtain cooperative (coherent) imaging from all prism apertured tetrahedral shaped retro-reflecting elements 220, 221 (FIGS. 35, 35A, and 35B) will require that only very small phase shifts occur between the wavefronts 227 being reflected by all adjacent prism apertured tetrahedral shaped retro-reflecting elements 220, 221 (FIGS. 35, 35A, and 35B). For a linear array of N structures illuminated by a spherical wavefront with radius R, the relation $$\Delta = \frac{2\pi(Nh)^2}{2R\lambda} = 2\pi \tag{71}$$

should be satisfied for cooperative diffraction image formation near the diffraction limit. One way to satisfy this relation is to transform the wavefront 234 (FIG. 36A) into a plane-wave at the entrance to the array with a collimating lens 222C (FIG. 38). However, any quadratic phase variation across the wavefront originating from a single object point accumulated during free-space propagation may not satisfy the condition of Equation (71) and hence, may have a wavefront disrupting effect following retroreflection 227. The performance of a pseudo phase-conjugating system may be improved by correcting for any deterministic (quadratic) phase, which can be predetermined. Further, this is done by inserting a collimating lens 222C (FIG. 38), which is chosen to collimate the wavefront onto the array 222, which is explained in detail in a latter section below.

Moreover, suffice it to say, the purpose of a concave lens 222F (FIG. 38), e.g. a wavefront spreading thermal lens, a wavefront spreading Fresnel lens, or a smooth positive aperturing concave lens, is to spread incoming 222D wavefronts 211B, both transversely and laterally, until they are made sufficiently enlarged as to be made incident upon the entire normal surface area of the OPCLD's PCM 222. While the purpose of a convex lens 222C (FIG. 38), e.g. wavefront collimating thermal lens, a wavefront collimating Fresnel lens, or a wavefront collimating smooth positive aperturing convex lens, is to collimate incoming 222D wavefronts 222B, both transversely, and laterally until they are made sufficiently planar-flat across the normal dimension of the OPCLD's PCM 222. Wherein, both lens 222C, 222F are used in combination to affect a zero length path difference Δ=0 from the object image to all adjacent prism apertured tetrahedral shaped retro-reflecting elements 220, 221 present within the PCM, thus eliminating the phase errors at the image.

Further, as illustrated in FIGS. 39, 39A, 39B, 40, 40A, 40B, 41, and 42, the third alternative embodiment comprises an array of tetragon apertured tetrahedral shaped retro-reflecting corner-cube elements 223 (FIGS. 39, 39A, and 39B). Further, as illustrated in FIGS. 40A and 40B, for a pseudo phase-conjugate retro-reflecting array configured PCM 226, the base of the wavefront leads the crest of the wavefront in the reflected wavefront 233, but only by a same phase 230 as the crest regardless it leading the base in the incident wavefront 228, i.e., prior to reflection from the pseudo phase-conjugate mirror 226. Further, FIG. 40B further describes a wavefront incident 228 at a retro-reflective array 226 (direction of propagation indicated by the arrow 227 pointing towards the retro-reflective array 226), and the wavefront after reflection 231 from the retro-reflective array 226 (direction of propagation indicated by the arrow 232 point away from the retro-reflective array 226).

Moreover, as illustrated in FIG. 40A, segments 230 of the wavefront 231 are phase-conjugated due to a total shift in phase that is caused by three total internal reflections that occurs for each tetragon apertured tetrahedral shaped retro-reflecting corner-cube element 223 (FIGS. 39, 39A, and 39B) present within the retro-reflecting array 226, while the segments 229 of the reflected wavefront 231 themselves generally relationally conform to the shape of the wavefront if reflected from a conventional mirror, as illustrated by the envelope 231, which is shown as connecting the wavefront segments 230. Further, as such, the base of the wavefront leads the crest of the wavefront, but only in its degree of phase shift, which approximates a true conjugated wavefront whose base would lead the wavefront crest 233 of the original incident wavefront 228, i.e., prior to reflection from the retro-reflective array 226.

More specifically, for a pseudo phase-conjugate retro-reflecting tetragon apertured tetrahedral corner-cube array, each tetragon apertured tetrahedral retro-reflecting corner-cube element 223 (FIGS. 39, 39A, and 35B) is arranged along a substantially planar substrate. Wherein, FIGS. 40A and 40B, both illustrate an incident wavefront 228 (direction of propagation indicated by the arrow 227 pointing to the right toward the mirror 226) and a reflected wavefront 231 (direction of propagation indicated by the arrow 232 pointing to the left away from the mirror 226), respectively.

Furthermore, as illustrated in FIG. 40B, the relative phases 230 of points 229 (i.e., the relative optical boundary 234 of each finite tetragon apertured tetrahedral corner-cube shaped retro-reflecting element 223) along the incident 228 and reflected 231 wavefronts are temporally not being distributed equally upon reflection away from the PCM 226. Moreover, true optical phase conjugation can be described simply as $k_{out} = -k_{in}$, which is demonstrated when the crest of an incident wavefront 228 leads the base of an incident wavefront 228, while the base of a reflected wavefront 231 leads the crest of a reflected wavefront 233 upon reflection from a true phase-conjugate mirror. Contrariwise, wavefront reflection from a conventional mirror can be described as $k_{in} = k_x \hat{x} + k_y \hat{y} + k_z \hat{z}$ and $k_{out} = k_x \hat{x} + k_y \hat{y} - k_z \hat{z}$.

Figure 42:
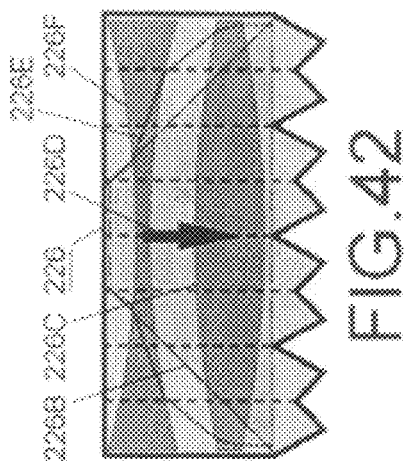
FIG. 42 is a section side-view illustration of the longitudinal geometry of eight tetragon shaped corner-cube retro-reflecting prisms, which is shown along with the relative locations of a concave shaped thermal lens and a convex shaped thermal lens, which are made to form within the OPCLD's cavity and used to expand, flatten, collimate, and distribute intracavity wave-fronts planar-flat across the OPCLD's PCM.

Moreover, to obtain cooperative (coherent) imaging from all adjacent tetragon apertured tetrahedral corner-cube shaped retro-reflecting elements 223 (FIGS. 39, 39A, and 39B) will require that only very small phase shifts occur between the wavefronts 230 being reflected by all adjacent tetragon apertured tetrahedral corner-cube shaped retro-reflecting elements 223 (FIGS. 39, 39A, and 39B). For a linear array of N structures illuminated by a spherical wavefront with radius R, the relation $$\Delta = \frac{2\pi (Nh)^2}{2R\lambda} = 2\pi \tag{72}$$

should be satisfied for cooperative diffraction image formation near the diffraction limit. One way to satisfy this relation is to transform the wavefront 228 (FIG. 40A) into a plane-wave at the entrance to the array with a collimating lens 222C (FIG. 42). However, any quadratic phase variation across the wavefront originating from a single object point accumulated during free-space propagation may not satisfy the condition of Equation (72) and hence, may have a wavefront disrupting effect following retroreflection 231. The performance of a pseudo phase-conjugating system may be improved by correcting for any deterministic (quadratic) phase, which can be predetermined. Further, this is done by inserting a collimating lens 226C (FIG. 42), which is chosen to collimate the wavefront onto the array 226, which is explained in detail in a latter section below.

Moreover, suffice it to say, the purpose of a concave lens 226F (FIG. 42), e.g. a wavefront spreading thermal lens, a wavefront spreading Fresnel lens, or a smooth positive aperturing concave lens, is to spread incoming 226D wavefronts 226B, both transversely and laterally, until they are made sufficiently enlarged as to be made incident upon the entire normal surface area of the OPCLD's PCM 226. While the purpose of a convex lens 226C (FIG. 42), e.g. wavefront collimating thermal lens, a wavefront collimating Fresnel lens, or a wavefront collimating smooth positive aperturing convex lens, is to collimate incoming 226D wavefronts 226B, both transversely, and laterally until they are made sufficiently planar-flat across the normal dimension of the OPCLD's PCM 226. Wherein, both lens 226C, 226F are used in combination to affect a zero length path difference Δ=0 from the object image to all adjacent tetragon apertured tetrahedral corner-cube shaped retro-reflecting elements 223 (FIGS. 39, 39A, and 39B) present within the PCM, thus eliminating the phase errors at the image.

Further, as illustrated in FIGS. 43, 43A, 43B, 44, 44A, 44B, 45, and 46, the fourth alternative embodiment comprises an array of circular apertured conical shaped retro-reflecting elements 235 (FIGS. 43, 43A, and 43B). Further, as illustrated in FIGS. 44A and 44B, for a pseudo phase-conjugate retro-reflecting array based PCM 237, the base of the wavefront leads the crest of the wavefront in the reflected wavefront 247 in propagation, but only by a same phase 241 as the crest regardless it leading the base in the incident wavefront 239, i.e., prior to reflection from the pseudo phase-conjugate mirror 237. Further, FIG. 44B further describes a wavefront incident 239 at a retro-reflective array 237 (direction of propagation indicated by the arrow 238 pointing towards the retro-reflective array 237), and the wavefront after reflection 242 from the retro-reflective array 237 (direction of propagation indicated by the arrow 243 point away from the retro-reflective array 237).

Moreover, as illustrated in FIG. 36A, segments 226 of the wavefront 227 are phase-conjugated due to a total shift in phase that is caused by the kind of total internal reflection occurring for each circular apertured conical shaped retro-reflecting element 235 (FIGS. 43, 43A, and 43B) pre-sent within the retro-reflecting array 237, while the segments 240 of the reflected wavefront 242 themselves generally conform to the shape of the wavefront if reflected from a conventional mirror, as illustrated by the envelope 242, which is shown as connecting the wavefront segments 241. Further, as such, the base of the wavefront leads the crest of the wavefront, but only in its degree of phase shift, which approximates a true conjugated wavefront whose base would lead the wavefront crest 247 of the original incident wavefront 239, i.e., prior to reflection from the retro-reflective array 237.

More specifically, for a pseudo phase-conjugate retro-reflecting circular apertured conical shaped prism array, each circular apertured conical shaped retro-reflecting element 235 (FIGS. 43, 43A, and 43B) is arranged along a substantially planar substrate. Wherein, FIGS. 44A and 44B illustrate an incident wavefront 239 (direction of propagation indicated by the arrow 238 pointing to the right toward the mirror 237) and a reflected wavefront 242 (direction of propagation indicated by the arrow 243 pointing to the left away from the mirror 237), respectively.

Furthermore, as illustrated in FIG. 44B, the relative phases 241 of points 240 (i.e., the relative optical boundary 246 of each finite circular apertured conical shaped retro-reflecting element 235) along the incident 239 and reflected 242 wavefronts are temporally not being distributed equally upon their reflection away from the PCM 237. Moreover, true optical phase conjugation can be described simply as $k_{out} = -k_{in}$, which is demonstrated when the crest of an incident wavefront 239 leads the base of an incident wavefront 239, while the base of a reflected wavefront 247 leads the crest of a reflected wavefront 247 upon reflection from a true phase-conjugate mirror. Contrariwise, wavefront reflection from a conventional mirror can be described ask $k_{in} = k_x\hat{x} + k_y\hat{y} + k_z\hat{z}$ and $k_{out} = k_x\hat{x} + k_y\hat{y} - k_z\hat{z}$.

Figure 46:
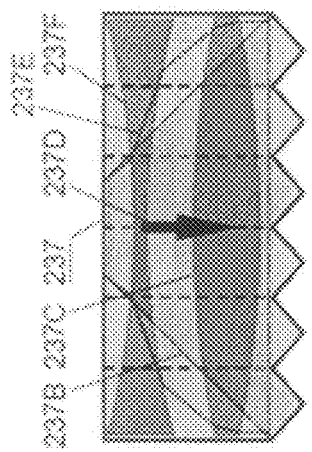
FIG. 46 is a section side-view illustration of the longitudinal geometry of six cone shaped retro-reflecting prisms, which is shown along with the relative locations of a concave shaped thermal lens and a convex shaped thermal lens, which are made to form within the OPCLD's cavity and used to expand, flatten, collimate, and distribute intracavity wave-fronts planar-flat across the OPCLD's PCM.
Figure 45:
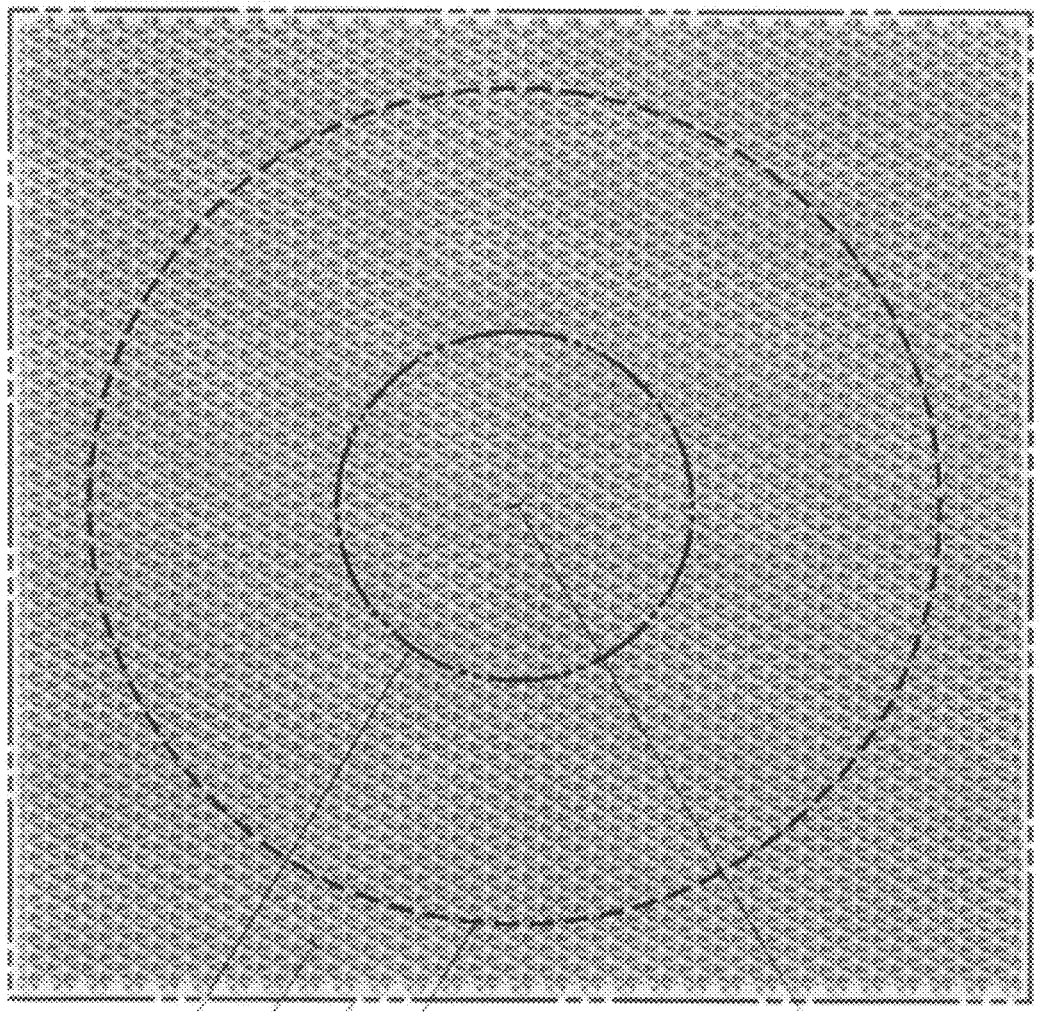
FIG. 45 is a plan-view illustration of a high-density array of the cone shaped retro-reflecting prisms used to comprise an alternate version of the OPCLD's PCM, which is shown along with an on-axis laser-beam intensity waistband distribution profile and location.
Figure 54:
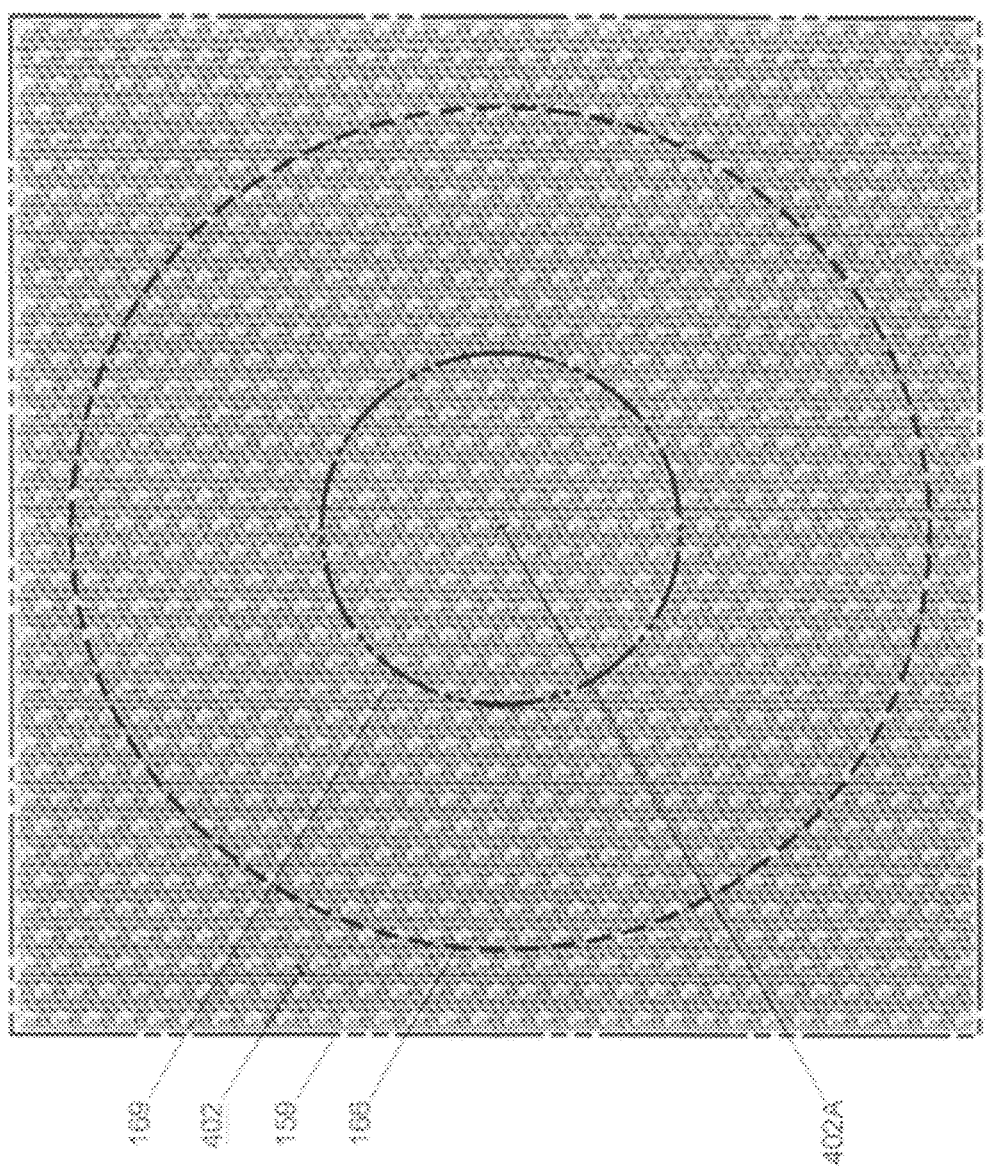
FIG. 54 is a plan-view illustration of a combined array of tetragon shaped corner-cube and hexagon shaped corner-cube retro-reflecting prisms, which are altogether used to comprise a phase-locking alternate version of the OPCLD's PCM, which is shown along with an on-axis laser-beam intensity waistband distribution location profile.
Figure 58:
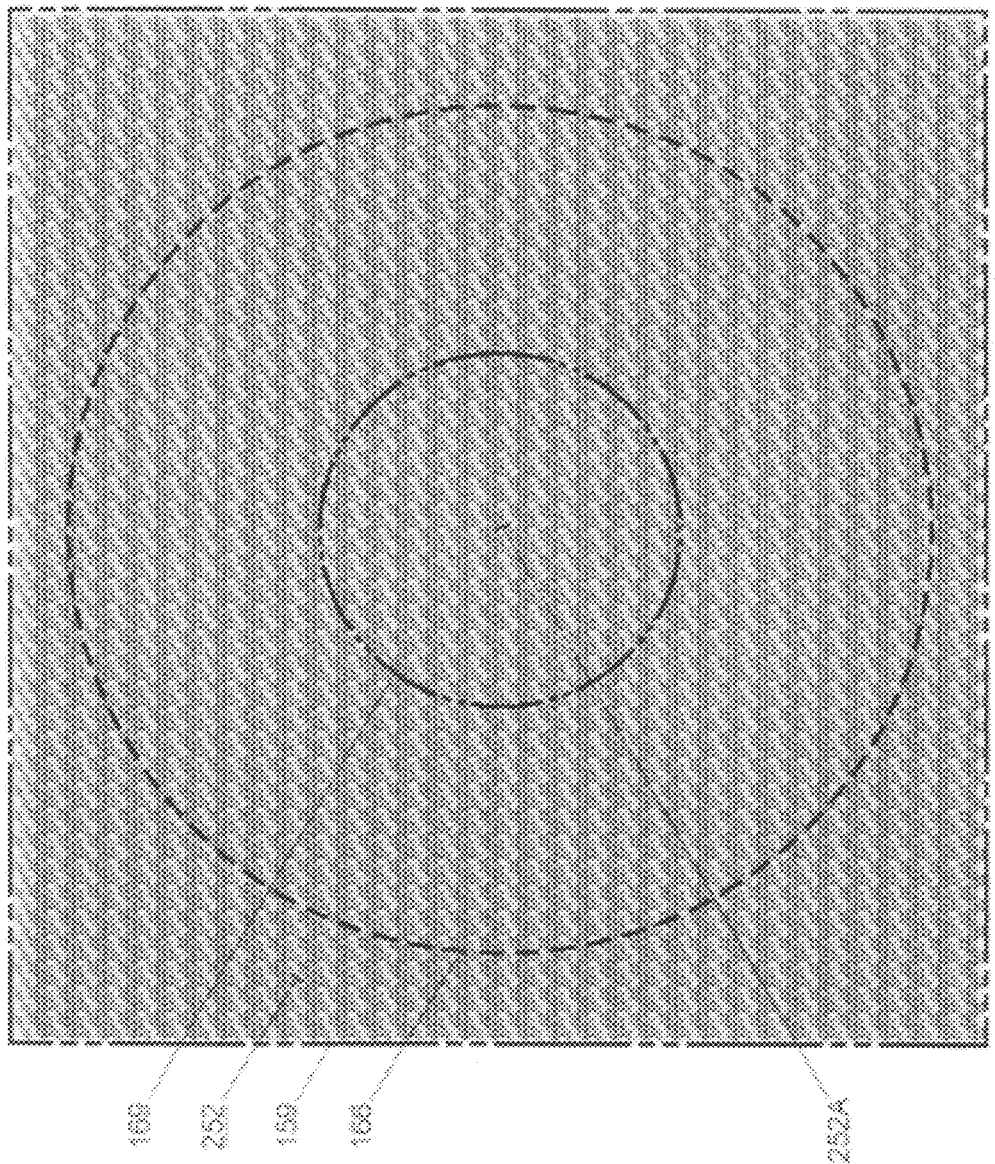
FIG. 58 is a plan-view illustration of a combined hexagon apertured pyramid shaped retro-reflecting prisms and hexagon shaped corner-cube retro-reflecting prisms that are altogether used to comprise a phase-locking alternate version of the OPCLD's PCM, which is shown along with an on-axis laser-beam intensity waistband distribution profile and location.
Figure 62:
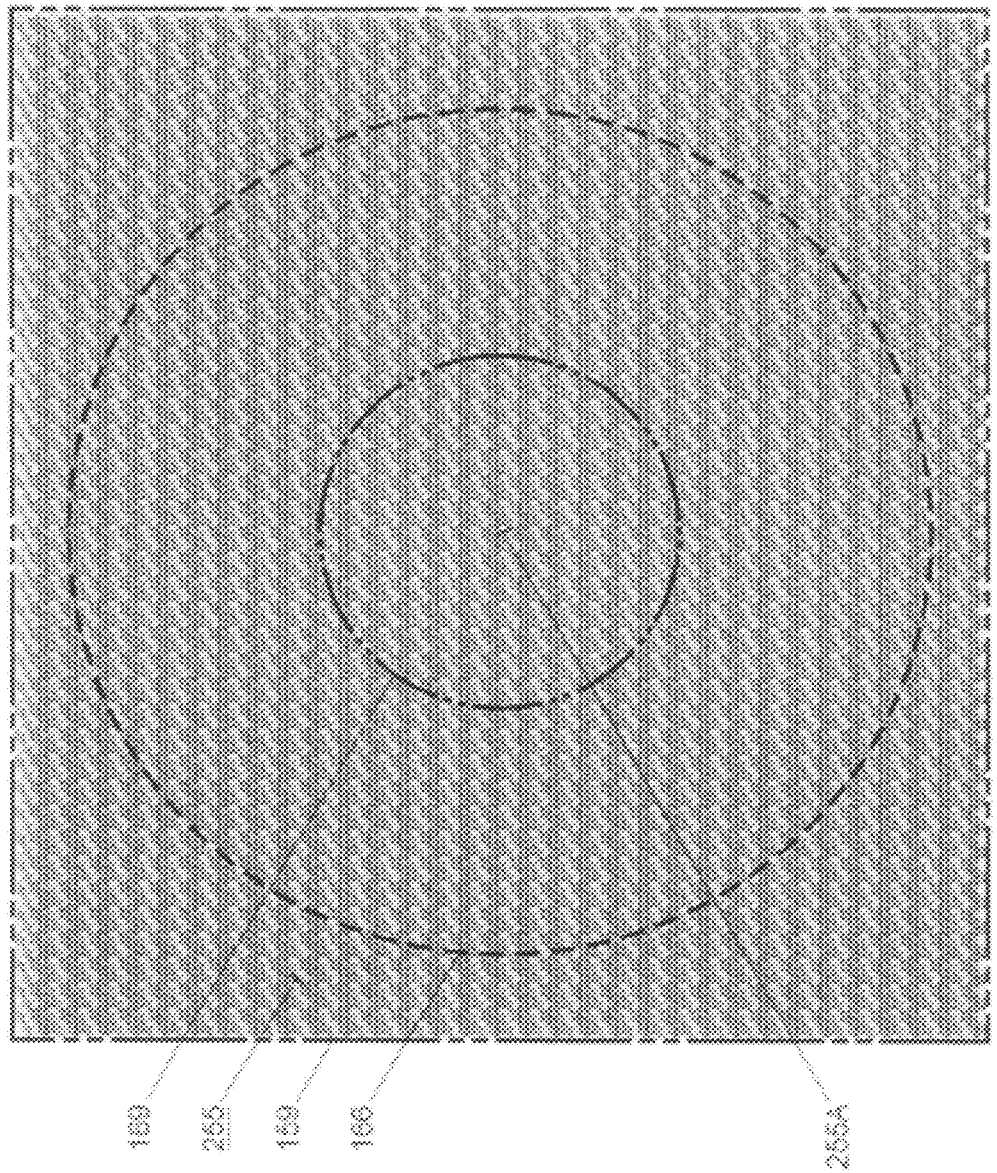
FIG. 62 is a plan-view illustration of a combined very-large array of tetragon shaped corner-cube retro-reflecting prisms and hexagon shaped corner-cube retro-reflecting prisms that are altogether used to comprise a phase-locking alternate version of the OPCLD's PCM, which is shown along with an on-axis laser-beam intensity waistband distribution profile and location.

Moreover, to obtain cooperative (coherent) imaging from all adjacent circular apertured conical shaped retro-reflecting element 235 (FIGS. 43, 43A, and 43B) will require that only very small phase shifts occur between the wavefronts 241 being reflected by all adjacent circular apertured conical shaped retro-reflecting element 235 (FIGS. 43, 43A, and 43B). For a linear array of N structures illuminated by a spherical wavefront with radius R, the relation $$\Delta = \frac{2\pi(Nh)^2}{2R\lambda} = 2\pi \qquad (73)$$

should be satisfied for cooperative diffraction image formation near the diffraction limit. One way to satisfy this relation is to transform the wavefront 239 (FIG. 44A) into a plane-wave at the entrance to the array with a collimating lens 237C (FIG. 46). However, any quadratic phase variation across the wavefront originating from a single object point accumulated during free-space propagation may not satisfy the condition of Equation (73) and hence, may have a wavefront disrupting effect following retroreflection 242.

Moreover, the performance of a pseudo phase-conjugating system may be improved by correcting for any deterministic (quadratic) phase, which can be predetermined. Further, this is done by inserting a collimating lens 237C (FIG. 46), which is chosen to collimate the wavefront onto the array 237, which is explained in detail in a latter section below.

Moreover, suffice it to say, the purpose of a concave lens 237F (FIG. 46), e.g. a wavefront spreading thermal lens, a wavefront spreading Fresnel lens, or a smooth positive aperturing concave lens, is to spread 237E incoming 237D wavefronts 237B, both transversely and laterally, until they are made sufficiently enlarged as to be made incident upon the entire normal surface area of the OPCLD's PCM 237. While the purpose of a convex lens 237C (FIG. 46), e.g. wavefront collimating thermal lens, a wavefront collimating Fresnel lens, or a wavefront collimating smooth positive aperturing convex lens, is to collimate incoming 237D wavefronts 237B, both transversely, and laterally until they are made sufficiently planar-flat across the normal dimension of the OPCLD's PCM 237. Wherein, both lens 237C, 237F are used in combination to affect a zero length path difference $\Delta=0$ from the object image to all adjacent circular apertured conical shaped retro-reflecting element 235 (FIGS. 43, 43A, and 43B) present within the PCM, thus eliminating the phase errors at the image.

One other alternative embodiment of the OPCLD invention incorporates a phase locked array of the OPCLD that is illustrated in FIGS. 19, 20, 20A, 21, and 21A as a means to achieve a single high-power fundamental transverse spatial cavity mode laser-emission-output (i.e., preferably $TEM_{00}$). Further, FIGS. 47 through 66 illustrate in detail five different configurations of a phase-locking PCM design. Wherein, a phased locked OPCLD array would comprise of a multitude of lasing OPCLD elements that emit phase locked laser-beam output that is coupled into a single far lobe beam.

Furthermore, a phased locked array of OPCLDs would comprise a plurality of closely coupled surface emitting laser emitters that were altogether formed upon the same integral structure or substrate 99 (FIG. 19). Moreover, the OPCLD's current confinement means may be interconnected or closely spaced to a degree that the optical mode established in each of the OPCLD's lasing cavities, below a respective current confinement, will couple to its neighboring optical mode; i.e., therein evanescent waves will overlap into adjacent optical lasing cavities. Additionally, the OPCLD's PCM 168 will provides for an phase locked array of the optical fields as the direct result of the phase difference for all adjacent fields always remain zero; thus, causing the lateral radiation pattern in present within the far-field to exhibit a much-desired single lobe laser-emission profile.

Furthermore, a foregoing explanation can be exemplified as follows. An array of OPCLD configured laser diode elements with $N^{th}$ coupled emitters has an $N^{th}$ number of possible coupled modes, which are referred to herein as "supermodes." A supermode is a cooperative lasing of the $N^{th}$ number of optical emitters or filaments made to occur for the OPCLD array. Since there is an $N^{th}$ number of optical emitters, there is an $N^{th}$ number of possible supermodes as well.

Consequently, each supermode has the property that the $1^{st}$ and the $N^{th}$ number supermode have the same intensity pattern and/or envelope profile, the $2^{nd}$ and the $(N-1)^{th}$ have the same intensity envelope, and in general, the $i^{th}$ and $(N-i)^{th}$ have the same intensity envelope profiles. The $1^{st}$ or fundamental supermode has all emitters lasing in phase with an amplitude distribution representative of half a sinusoidal cycle. Further, this is the only supermode pattern that radiates in the single central lobe of the far field pattern as a result of all emitters being phase locked.

Therefore, for a uniformly spaced array of identical emitters, the $1^{st}$ and $N^{th}$ supermode envelopes are half a sinusoidal period, the second and the $(N-1)^{th}$ supermode envelopes are two half-sinusoidal periods, etc. The phase relationship between the individual emitters in the $N^{th}$ number supermodes differ. More specifically, for the $1^{st}$ supermode, all emitters are in phase, and for the $N^{th}$ supermode, the phases alternate between zero and r. Usually the $1^{st}$ stand the $N^{th}$ number supermodes have the lowest current thresholds as compared to all other supermodes because their intensity envelopes do not exhibit nulls near the center of the OPCLD array where the charge density is greater because of current spreading and charge diffusion in the active region of same OPCLD array.

However, as previously indicated, the $N^{th}$ supermode, which radiates in two lobes, has a lower current threshold of operation than the $1^{st}$ supermode. Further, phased arrays of OPCLDs exhibit high-utility due to their high-power output. It is preferred that power be concentrated into a single far lobe profile; i.e., in the $1^{st}$ supermode. The reason being is that a substantial majority of laser applications require that power be concentrated into a single lobe. Further, if lasing is experienced in more than one lobe, measures are taken to diminish or otherwise attempt to eliminate or block off the other operating lobes in the far field pattern.

Moreover, this is accomplished by introducing different geometric light reflecting structures, other than hexagon apertured hexahedral shaped corner-cube retro-reflecting prisms, into the OPCLD's PCM 249, 249A, 402, 402A, 252, 252A, 255, 255A, 258, 258A (FIGS. 49B, 50, 53B, 54, 57B, 58, 61B, 62, 65B, and 66). These different structures will exhibit different aperture sizes, different degree of phase-shift, and different $N^{th}$ number of total internal reflections.

Example number one, as illustrated in FIGS. 47, 47A, 48, 48A, 49, 49A, and 49B, uses the smaller apertured tetrahedral corner-cube prism structure 247 (FIGS. 47, 47A, 49, 49A, and 49B) to diminish and eliminate multiple high-order transverse spatial cavity modes out of the previously mentioned far field pattern. While the larger apertured hexahedral corner cube prism structure 248 (FIGS. 48, 48A, 49, 49A, and 49B) is used to increase and introduce a single low-order fundamental transverse spatial cavity mode into the previously mentioned far field pattern.

Example number two, as illustrated in FIGS. 51, 51A, 52, 52A, 53, 53A, and 53B, uses the smaller apertured tetrahedral corner-cube prism structure 400 (FIGS. 51, 51A, 53, 53A, and 53B) to diminish and eliminate multiple high-order transverse spatial cavity modes out of the previously mentioned far field pattern. While the larger apertured hexahedral corner cube prism structure 401 (FIGS. 52, 52A, 53, 53A, and 53B) is used to increase and introduce a single low-order fundamental transverse spatial cavity mode into the previously mentioned far field pattern.

Example number three, as illustrated in FIGS. 55, 55A, 56, 56A, 57, 57A, and 57B, uses the lossy tetragon apertured hexahedral pyramid shaped retro-reflecting prism 250 (FIGS. 55, 55A, 57, 57A, and 57B) to diminish and eliminate multiple high-order transverse spatial cavity modes out of the previously mentioned far field pattern. While using the low-loss hexagon apertured hexahedral corner cube prism 251 (FIGS. 56, 56A, 57, 57A, and 57B) is used to increase and introduce a single low-order fundamental transverse spatial cavity mode into the previously mentioned far field pattern.

Example number four, as illustrated in FIGS. 59, 59A, 60, 60A, 61, 61A, and 61B, uses the smaller apertured tetrahedral corner-cube prism 253 (FIGS. 59, 59A, 61, 61A, and 61B) to diminish and eliminate multiple high-order transverse spatial cavity modes out of the previously mentioned far field pattern. While using the larger apertured hexahedral corner cube prism 254 (FIGS. 60, 60A, 61, 61A, and 61B) to increase and introduce a single low-order fundamental transverse spatial cavity mode into the previously mentioned far field pattern.

Example number five, as illustrated in FIGS. 63, 63A, 64, 64A, 65, 65A, and 65B, uses the tetragon apertured tetrahedral retro-reflecting corner-cube prism 256 (FIGS. 63, 63A, 65, 65A, and 65B) to diminish and eliminate multiple high-order transverse spatial cavity modes out of the previously mentioned far field pattern. While using the hexagon apertured hexahedral retro-reflecting corner cube prism 256 (FIGS. 64, 64A, 65, 65A, and 65B) is used to increase and introduce a single low-order fundamental transverse spatial cavity mode into the previously mentioned far field pattern.

Furthermore, phase-locked OPCLD arrays, such as the one just described, present several unique applications. If the laser structures are phase locked with non-zero phase differences, the far-field intensity will assume a multi-lobed or at least off-axis pattern with the details of the patterns depending on the number of structures and the relative phase differences between each structure. If, however, the phase differences are controlled, then the intensity pattern can be controlled.

Fortuitously, two-dimensional phased locked arrays of OPCLDs, because they use a PCM solve a major flaw, which due to the phase perturbation contributed by spontaneous emission, the phase difference exhibited by adjacent laser diode regions do not always equal zero, and the laser-emission-output for the majority of laser diodes comprising the array is out of phase (i.e., not phased locked) causing multiple lobes to appear in the far field pattern of a coupled laser-emission-output (i.e., a far field version of a multimode high-order transverse cavity mode intensity pattern).

Moreover, resulting in a high degree of signal noise, which has keep these semiconductor laser diodes from being used in high-value applications; e.g., applications such as Telecommunications, Datacom, and the convergent "Passive Optical Networks" (PONs).

However, because the OPCLD has a PCM configured PCR it can neutralize the phase perturbation contributed by spontaneous emission, and consequently can always provide for a zero phase difference between the adjacent laser diode regions. Which in turn provides for the injection of coupled low-order fundamental transverse spatial cavity mode laser-emission-output into a high-power single lobe far field pattern.

OPERATION OF THE INVENTION

Additional Embodiment

Figure 66B:
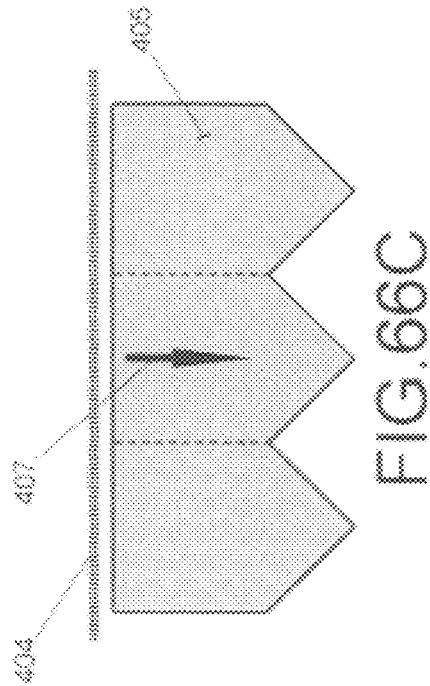
Figure 66C:
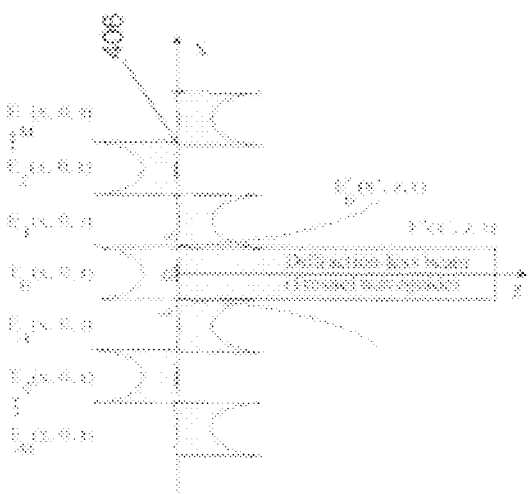
Figure 66A:
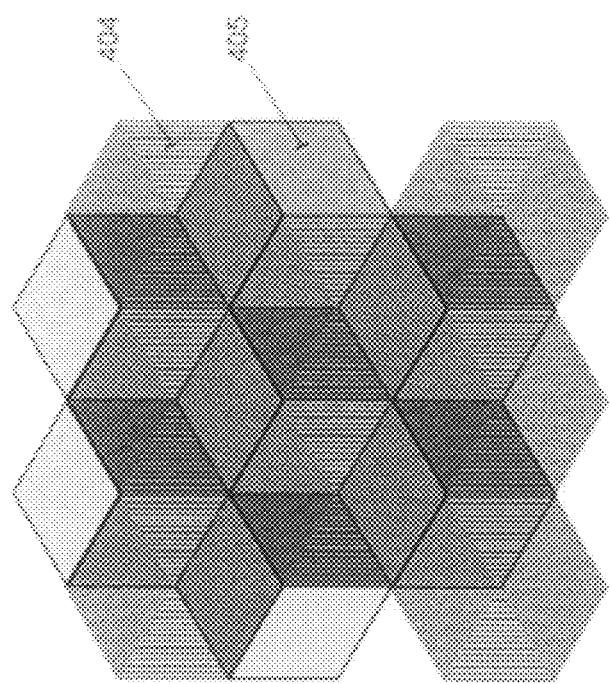
Figure 67:
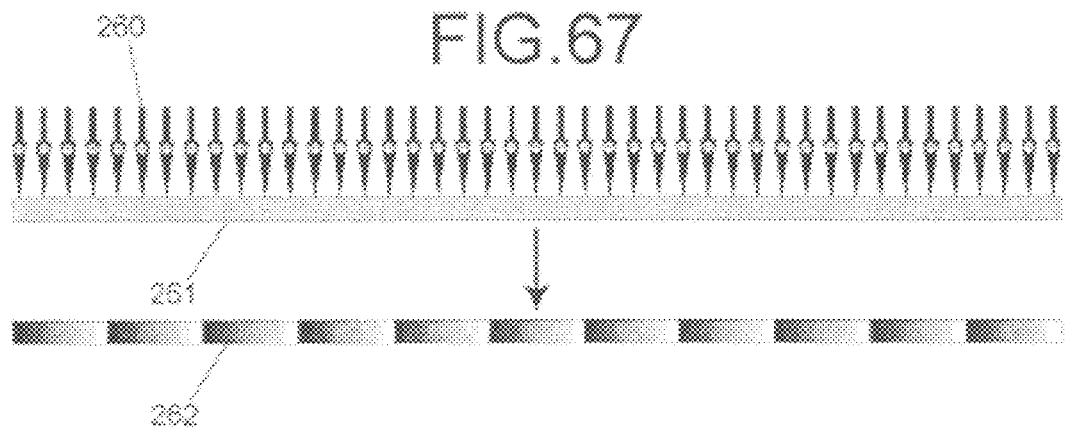
Figure 68:
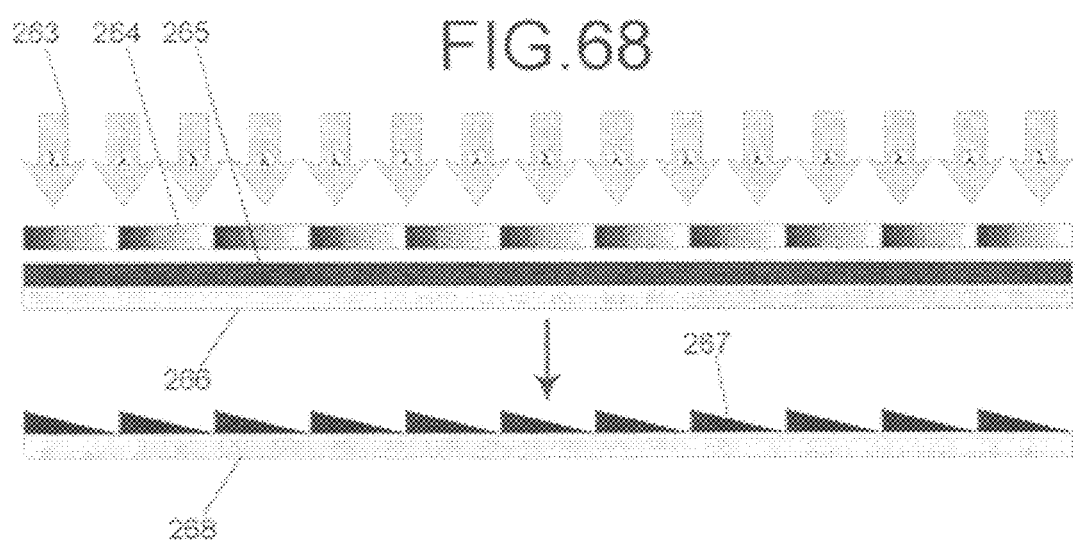

FIGS. 66A, 66B, and 66C

In addition, a retro-reflecting corner-cube array will function as a true phase-conjugator if the incident wavefront is made ≡flat across each retro-reflecting element used in the array. This criteria can be accomplished when every retro-reflecting element within the array is constructed to have an aperture dimension size that is ≦than the material wavelength λ of desired emission. Consequently, corner-cube aperture sizes being ≦the λ of desired emission brings with it a diffractive broadening of subwavelength-sized beams.

However, as will be shown in the following section, the diffractive broadening of subwavelength sized laser beams can be completely avoided by using an approach already inherent in the OPCLD invention. Further, because diffraction is one of the fundamental laws of optical physics it affects all classical and quantum mechanical fields without exception. However, it is impossible in quantum mechanics to define at a given time both the position of a matter wavepacket and its direction to an arbitrary degree of accuracy. Because of the diffraction phenomenon, light spreads out in all directions after passing a slit smaller than its wavelength. The harder one tries to decrease the beam transverse dimension by narrowing the slit, the more it broadens out.

Similarly, the beam width dramatically increases with increasing the distance from the slit. Thus, the diffraction imposes a fundamental limit on the transverse dimension of a beam at a given distance from an aperture and consequently limits the resolution capabilities and makes harder the position requirements of subwavelength-beam optical devices, such as "Near-field Scanning Optical Microscopes" (NSOM) and spectroscopes. Further, subwavelength sized beams propagating without diffractive broadening can be produced in free space via the constructive interference of multiple beams coming from a Fresnel source of a respective high-refraction index waveguide.

Moreover, the results theoretically demonstrate the feasibility of completely diffraction-free subwavelength beam optics, for both continuous waves and ultra-short pulses. Further, the approach involves a recently established relation between totally internal reflection waveguides and free-space optics. However, these areas of optics are usually considered independent of each other, regardless, it has been shown that fields confined by a high-refractive-index waveguide whose width exceeds the wavelength $\lambda$, can be reproduced in free space by a Fresnel source of the waveguide.

Furthermore, the concept of a Fresnel waveguide source of a diffraction-free beam is quite simple, and is mathematically demonstrated below for a plane-parallel waveguide having wall/air boundaries exhibiting total internal reflection. In the approach, the boundaries of the waveguide are replaced by virtual sources. Wherein, a diffraction free beam E'(x', z, t) confined by the waveguide is supported in free space at points (x', z) by the constructive interference of multiple beams $E'_n(x', z, t)$ of a Fresnel source of the waveguide $$E'(x', z, t) = \sum_{n=-M}^{M} E_n(x', z, t) \qquad (74)$$

where the number 2M+1 of the beams $E'_n(x', z, t)$ depends on their widths at the distance z from the source; n=, ±1, ±2, ±M; z>0, and |x'|<a. The beam $E'_n(x', z, t)$ is emerged from the n-th zone of the Fresnel source having the field distribution $$E_n(x,0,t)=E_0(x_n,0,t)\exp(i\pi n) \qquad (75)$$

which is obtained by the periodic ($x_n$=x±2na) translation of the field $E_0(x, 0, t)$ and the $\pi$n-change of its phase; $E_0(x, 0, t)$ is the field at the input aperture; z=0 and |x|<a. Thus, the Fresnel-waveguide $$\sum_{n=-M}^{M} E_n(x', z, t) \qquad (76)$$

is constructed by the periodic translation and the phase-change of the beam $E_0(x, 0, t)$ emerged from the waveguide aperture.

Moreover, the above-described approach, which was originally developed by using the Helmholtz-Kirchhoff integral theorem, fails when the waveguide width is close to the wavelength $\lambda$. Regardless, the approach described above still provides a solution to the problem subwavelength waveguides. Wherein, the Fresnel waveguide $E'_0(x', z, t)$ was constructed by the translation of the single beam $E_0(x', z, t)$ and the periodical change of its phase. The single beam $E'_0(x', z, t)$ is formatted by transmission of a plane monochromatic wave through a subwavelength waveguide (i.e., a thick slit aperture) with perfectly conducting walls, see FIG. 66B.

Furthermore, the equations presented above clearly show that a subwavelength-sized laser-beam can be made to propagate without suffering from diffractive broadening, and can be produced in free space via the constructive interference that occurs between the multiple beams of a Fresnel source of the respective high-refraction index waveguide. Therefore, if we selective etch, using grey-scale masking and lithography, a diffraction grating, or multiple diffraction gratings 404 (FIG. 66A), into the input side of the PCM comprised substrate layer 405 of the OPCLD, we can provide for the constructive interference of all incoming wavefronts 407 (FIG. 66C), which as a result of the constructive interference is also redirected into the phase-conjugating corner-cube array configured PCM 405 (FIG. 66C) of the OPCLD. Consequently, this will effectively transform the OPCLD's PCM into a phase-conjugating Fresnel waveguide source 405 capable of undoing all diffraction loss that occurred for incoming wavefronts that underwent constructive interference at the diffraction grating, while providing for a perturbation neutralizing true phase-conjugated retro-reflection of the input wavefront that is also completely diffraction free regardless its subwavelength propagation.

CONCLUSIONS, RAMIFICATIONS, AND SCOPE

Although my OPCLD invention has been described in detail with references to specific embodiments, various modifications can be made without departing from the scope of the invention. For example, in order to increase the energy, while decreasing the wavelength per-photon of emitted light, the active-region 161 (FIG. 19) could contain 'Phosphorus' in an amount that will form a lattice-matched quaternary material such as "Aluminum-Gallium-Arsenic-Phosphide" (AlGaAsP), while another option could be that an OPCLD's quarter-wave mirror stack assembly 165 (FIG. 19) could be comprised of alternating layers of binary material such as "Aluminum-Arsenide" (AlAs) and/or "Indium-Gallium-Phosphide" (InGaP).

Whereby, the choice between one semiconductor and/or optical material over another for use in constructing the quarter-wave mirror stack assembly 165 (FIG. 19) used by the OPCLD is frequency determined rather than structurally determined. Further, the various semiconductor and optical materials, along with their distribution sizes are wavelength specific and interchangeable within this design; moreover, clearly indicating that the OPCLD design exhibits novelty that is independent of any one particular kind of material or process that could or might be used in the construction of the OPCLD invention.

Moreover, those skilled in the art will appreciate that the embodiments herein can be made subject to numerous adaptations and modifications without departing from the scope and spirit of the invention. Therefore, it is to be understood that, within the scope and spirit of the invention, the invention may be practiced other than as specifically described above. In particular, the invention is to be interpreted in accordance with the appended claims, and equivalents thereof, without limitations being read from the specification above.

What I claim my invention is:

1. An optical phase conjugating laser diode, comprising:
   a) a stimulated-emission source of photons, defining a gain-medium for the optical phase conjugating resonant-cavity of said laser;

b) an optical feedback reflector assembly comprising a pseudo phase-conjugate mirror as a first reflector, which comprises a plurality of retro-reflecting elements that provide for an optical phase conjugated reflection, and a conventional mirror as second reflector, which provides for a partial reflection and c) an electrical pumping source, defining an energy source for pumping said gain-medium of said laser, whereby, said phase-conjugated reflection provides for a high-power laser-emission output into a single fundamental transverse spatial mode of said cavity, and whereby, said phase-conjugated reflection provides for a neutralization of the perturbation causing contribution of spontaneous emission.

2. An optical phase conjugating laser-diode, comprising:
a first reflector comprising a phase-conjugating array, wherein said array comprises a plurality of retro-reflecting elements, which is used to provide for an optical phase conjugation;
a gain-medium sandwiched between said first reflector and a second reflector, which is used to provide for a stimulated-emission and amplification; and
a second reflector, which is used to provide for a partial reflection and laser-emission output.

3. The optical phase conjugation laser-diode of claim 2, wherein the second reflector comprises a distributed bragg mirror-stack assembly.

4. The optical phase conjugation laser-diode of claim 2, further comprising a third reflector providing for a gaussian mode laser-emission output.

5. The optical phase conjugation laser-diode of claim 2, wherein the retro-reflecting elements of the phase conjugating array comprise corner-cube prisms.

6. The optical phase conjugation laser-diode of claim 5, wherein the corner-cube prisms comprise tetrahedral-shaped corner-cubes.

7. The optical phase conjugation laser-diode of claim 2, wherein the retro-reflecting elements of the phase conjugating array comprise hemispherical shaped reflecting structures.

8. The optical phase conjugation laser-diode of claim 2, wherein the retro-reflecting elements of the phase conjugating array comprises pyramid-shaped reflectors.

9. The optical phase conjugation laser-diode of claim 2, wherein the retro-reflecting elements of the phase conjugating array comprises tetragon-shaped reflectors.

10. The optical phase conjugation laser-diode of claim 2, wherein the retro-reflecting elements of the phase conjugating array comprises cone-shaped reflectors.

11. The optical phase conjugation laser-diode of claim 2, wherein the retro-reflecting elements of the phase conjugating array comprises polyhedral-shaped reflectors.

12. The optical phase conjugation laser-diode of claim 2, wherein the phase conjugating array comprises a planar array of retro-reflecting polyhedral-shaped reflectors.

13. The optical phase conjugation laser-diode of claim 12, further comprising a beam expander and collimation lense, which are sandwiched between the gain-medium and the phase-conjugating array.

14. The optical phase conjugation laser-diode of claim 2, wherein the phase conjugating array comprises a curved array of retro-reflecting polyhedral-shaped reflectors.

15. The optical phase conjugation laser-diode of claim 4, wherein the third reflector is deformable.

16. The optical phase conjugation laser-diode of claim 15, further comprising a processor and a detector for controlling the curvature of the third reflector.

17. The optical phase conjugation laser-diode of claim 2, wherein the gain-medium comprises of an organic light-emitting diode material.

18. The optical phase conjugation laser-diode of claim 17, wherein the organic light-emitting diode material further comprises a first layer of triphenyldiamine.

19. The optical phase conjugation laser-diode of claim 18, wherein the organic light-emitting diode material further comprises a second layer of 2-naphtyl-4, 5-bis(4-methoxyphenyl)-1, 3-oxazole.

20. The optical phase conjugation laser-diode of claim 19, wherein the organic light-emitting diode material further comprises a third layer of 8-hydroxyguinolinato aluminum.

21. The optical chase conjugation laser-diode of claim 5, wherein the corner-cube prisms comprise hexagon-shaped corner-cubes.

22. The optical phase conjugation laser-diode of claim 21, wherein the corner-cubes have an aperture diameter size that is equal to or slightly less than one wavelength of the desired laser-emission output of the optical phase conjugation laser-diode, minus the refractive index of the material comprising the retro-reflecting corner-cubes.

23. The optical phase conjugation laser-diode of claim 2, further comprising an electro-absorption modulator, wherein the second reflector lies sandwiched between the gain-medium and said modulator.

24. The optical phase conjugation laser-diode of claim 23, wherein said electro-absorption modulator lies sandwiched between the gain-medium and said second reflector.

25. The optical phase conjugation laser-diode of claim 2, wherein the plurality of retro-reflecting elements comprise:
a first group of retro-reflecting elements that provide a first cavity length; and
a second group of retro-reflecting elements that provide a second cavity length that is different from the first cavity length.

26. The optical phase conjugation of claim 25, wherein the first group of retro-reflecting elements will provide for a first cavity length, and the second group of retro-reflecting elements will provide for a second cavity length slightly shorter than said first cavity length, such that stimulated emissions reflected from said first group and said second group of retro-reflecting elements are phase-locked.

27. An optoelectronic circuit, comprising:
an optical phase conjugation laser-diode; and
a heterojunction transistor that is electrically connected to the optical phase conjugation laser-diode, wherein the optical phase conjugation laser-diode comprises:
a first reflector comprising a phase-conjugating mirror, which comprises a plurality of retro-reflecting polhedral shaped elements;
a second reflector;
a gain-medium sandwiched between the first reflector and the second reflector, which is used to provide a stimulated-emission source of photons, wherein said first reflector provides for optical phase conjugation and said second reflector provides for partial reflection.

28. The optoelectronic circuit of claim 27, wherein the second reflector comprises a distributed bragg mirror-stack assembly.

29. The optoelectronic circuit of claim 27, further providing a third reflector that provides transverse spatial mode control of laser-emission output.

30. The optoelectronic circuit of claim 27, wherein the heterojunction transistor comprises a heterojunction bipolar transistor.

31. The optoelectronic circuit of claim 27, wherein the heterojunction transistor comprises a high-electron mobility transistor.

32. The optoelectronic circuit of claim 27, wherein the optical phase conjugation laser-diode and the heterojunction transistor are formed on a common semiconductor substrate using lattice matched semiconductor material.

33. An optical transceiver comprising:

a transceiver housing;

a circuit mount base assembly connected to the housing;

an optical phase conjugation laser-diode optoelectronic circuit connected to the base assembly, wherein the optical phase conjugation laser-diode optoelectronic circuit comprises:

a photodetector; and an optical phase conjugation laser-diode, wherein the optical phase conjugation laser-diode comprises:

a first reflector comprising a phase-conjugating mirror that comprises a plurality of retro-reflecting elements; a second reflector; and a gain-medium sandwiched between the first reflector and the second reflector, which is used to provide for a stimulated-emission source of photons, wherein the second reflector is partially reflecting; a mux/demux lens assembly located inside the housing; and an optical fiber extending into said housing, such that the mux/demux lens assembly is located between the fiber output and the laser-emission output.

* * * * *